(12) United States Patent
Pacione

(10) Patent No.: US 12,346,028 B2
(45) Date of Patent: Jul. 1, 2025

(54) INTERCONNECTABLE TILING SYSTEM

(71) Applicant: Tac-Fast Systems SA, Zug (CH)

(72) Inventor: Joseph Rocco Pacione, Newmarket (CA)

(73) Assignee: Tac-Fast Systems SA, Zug (CH)

( * ) Notice: Subject to any disclaimer, the term of this patent is extended or adjusted under 35 U.S.C. 154(b) by 0 days.

(21) Appl. No.: 18/399,898

(22) Filed: Dec. 29, 2023

(65) Prior Publication Data
US 2024/0134285 A1  Apr. 25, 2024

Related U.S. Application Data

(63) Continuation of application No. 18/170,388, filed on Feb. 16, 2023, now Pat. No. 11,899,370, which is a continuation of application No. 16/906,912, filed on Jun. 19, 2020, now Pat. No. 11,609,501, which is a
(Continued)

(51) Int. Cl.
| | |
|---|---|
| *G03F 7/42* | (2006.01) |
| *B32B 3/06* | (2006.01) |
| *C11D 1/00* | (2006.01) |
| *C11D 3/00* | (2006.01) |
| *C11D 3/04* | (2006.01) |
| *C11D 3/20* | (2006.01) |
| *C11D 3/30* | (2006.01) |
| *C11D 3/43* | (2006.01) |
| *E04F 15/02* | (2006.01) |

(52) U.S. Cl.
CPC ............... *G03F 7/426* (2013.01); *B32B 3/06* (2013.01); *C11D 1/004* (2013.01); *C11D 3/0073* (2013.01); *C11D 3/048* (2013.01); *C11D 3/2065* (2013.01); *C11D 3/30* (2013.01); *C11D 3/43* (2013.01); *E04F 15/02022* (2013.01); *E04F 15/02038* (2013.01); *B32B 2307/7265* (2013.01); *B32B 2419/04* (2013.01); *C11D 2111/22* (2024.01); *E04F 2201/023* (2013.01); *E04F 2201/044* (2013.01); *E04F 2201/06* (2013.01); *E04F 2201/08* (2013.01)

(58) Field of Classification Search
CPC ... E04F 2201/06; E04F 15/02022; B32B 3/06
See application file for complete search history.

(56) References Cited

U.S. PATENT DOCUMENTS

| | | | | |
|---|---|---|---|---|
| 3,512,324 A | * | 5/1970 | Reed | E04F 15/02405 |
| | | | | 52/586.1 |
| 2009/0049796 A1 | * | 2/2009 | Grau | E04F 15/06 |
| | | | | 52/762 |

(Continued)

FOREIGN PATENT DOCUMENTS

DE   102015121660 A1 *  6/2017 ............ E04F 15/107

*Primary Examiner* — Babajide A Demuren

(57) ABSTRACT

A tile system for covering a surface. The tile system comprises a first tile assembly connected to a second tile assembly by a connector. Each tile assembly comprises a first tile stacked on a second tile, the first tile and the second tile joined to a reinforcing material disposed therebetween. The connector comprises a first component and a second component that is complementary to the first component. The first component is mounted to the first tile assembly, and the second component is mounted to the second tile assembly.

12 Claims, 106 Drawing Sheets

Related U.S. Application Data continuation of application No. PCT/CA2018/051635, filed on Dec. 20, 2018.

(60) Provisional application No. 62/609,561, filed on Dec. 22, 2017.

(56) References Cited

U.S. PATENT DOCUMENTS

| | | | | |
|---|---|---|---|---|
| 2010/0319291 | A1* | 12/2010 | Pervan | E04F 21/22 52/745.21 |
| 2014/0060669 | A1* | 3/2014 | Guo | F24D 3/14 137/362 |
| 2016/0340912 | A1* | 11/2016 | Norris | E04F 15/02038 |

* cited by examiner

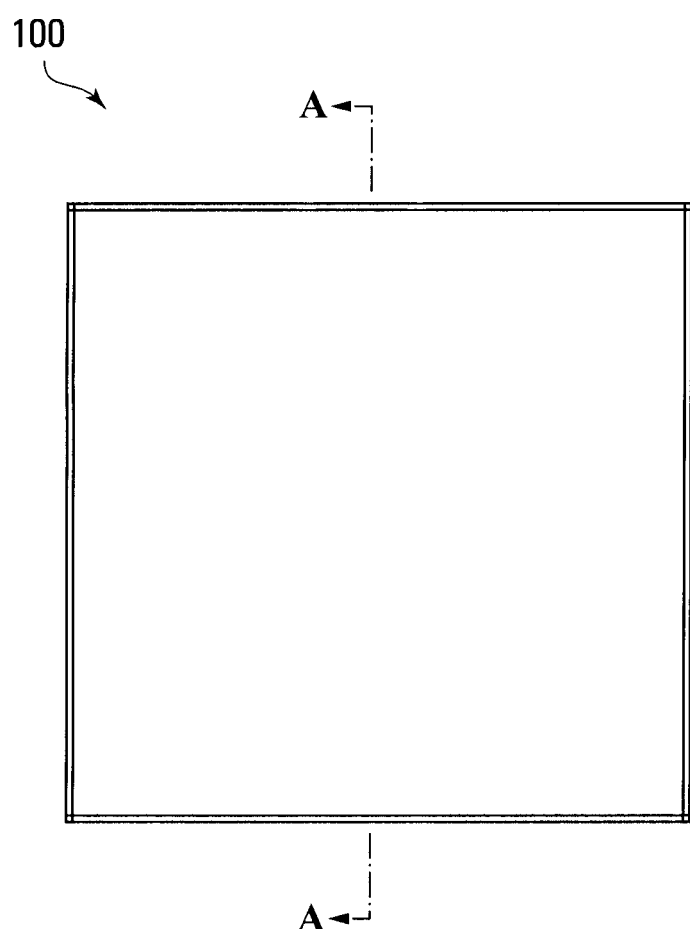
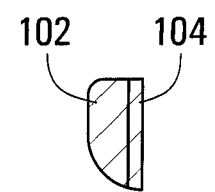
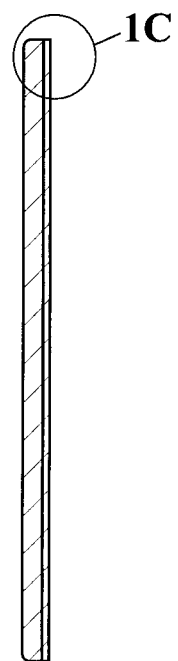
FIG. 1C
FIG. 1B
FIG. 1A

| Process Step | Injection Molding | Variotherm | Press Welding |
|---|---|---|---|
| Cost of tools | Medium | High | Medium |
| Cycle times | Short | Medium | Short (but two separate processes) |
| Risk of tile brakage during process | High | Medium | Low |
| Development risk | High | Medium | Low |
| Development cost | Medium | High | Low |

INTERCONNECTABLE TILING SYSTEM

CROSS-REFERENCE TO RELATED APPLICATIONS

This application is a continuation of U.S. Nonprovisional patent application Ser. No. 18/170,388 filed on Feb. 16, 2023, which is a continuation of U.S. Nonprovisional patent application Ser. No. 16/906,912 filed Jun. 19, 2020 (now issued U.S. Pat. No. 11,609,501), which is a continuation of International PCT Patent Application No. PCT/CA2018/051635 filed Dec. 20, 2018, which claims the benefit of U.S. Provisional Patent Application No. 62/609,561, filed Dec. 22, 2017, all of which are incorporated herein by reference in their entireties.

FIELD OF THE INVENTION

This relates to the field of tiling, and in particular, a tile system having a plurality of tiling assemblies connected together with releasable connectors.

BACKGROUND

Tiles may be installed on a surface of a room, such as the floor or a wall, for functional or aesthetic reasons. Without tiling, it may be unsafe to walk on a floor, which may have an uneven or splintered surface. Tiles may be installed to protect the underlying surface from various damage and wear (e.g. from liquids and impact). The exposed surface of the tile may have a decorative feature, such as colours, patterns, or designs, which increase the aesthetic appeal of the surface upon which the tile is installed.

Unfortunately, existing processes for installing tiles may be costly, labour-intensive, and require the skill and experience of a trained tile installer.

Prior to installing tiles on the surface, the surface may first need to be prepared, such as by cleaning the surface, installing a mesh frame subfloor, and/or applying a layer of mortar to the surface. Installing the tiles may itself be a delicate task. When the tiles are laid down on the surface, adjacent tiles may need to be level and even; otherwise, the raised edges and corners of uneven tiles may provide discomfort or be a safety hazard to those walking on the tiled surface, and tiles that are misaligned or improperly spaced may be aesthetically displeasing. After the tiles are laid down, the tiled surface may need further treatment, such as the application of grout, which may be cumbersome and time-consuming.

Moreover, it may be difficult to replace installed tiles. It may be tedious and messy to remove the installed tiles, which may dislodge hardened mortar and grout, generate dust, and damage the underlying surface. Because the installed tiles are secured to the same surface, it may be difficult to replace only some of the installed tiles without damaging other tiles.

In addition, existing processes for installing tiles may be environmentally unfriendly. In particular, damaged tiles may not be reused, and new tiles need to be manufactured to replace the damaged tiles. Further, water, cement, and sand may be required to prepare sufficient amounts of mortar and grout each time tiles are installed, as it may not be feasible to reuse hardened mortar and grout.

SUMMARY

According to one aspect, there is provided a tile system for installation on a free floating basis to form a surface covering on a substrate without bonding the tile assembly to the substrate, the tile system comprising: a first tile assembly configured for detachable connection to a second tile assembly, each of the first and second tile assemblies comprising: a first tile stacked on a second tile, the first tile and the second tile bonded to a layer of stabilizing material disposed between the first and second tiles; wherein the first tile assembly further comprises a first attachment component comprising at least one magnetic element, and the second tile assembly further comprises a second attachment component comprising at least one magnetic complementary to the magnetic element of the first attachment component, second attachment component being complementary in shape to the first attachment component and configured to receive the first attachment component to form a detachable connection between the first tile assembly and the second tile assembly, the detachable connection having a mechanical resistive force and a magnetic force attracting the first and second tile assemblies.

According to another aspect, there is provided a tile system for covering a surface, comprising: a first tile assembly configured for detachable connection to a second tile assembly, each tile assembly comprising: a first tile stacked on a second tile, the first tile and the second tile joined to a stabilizing material disposed therebetween; wherein the first tile assembly further comprises a first attachment component, and the second tile assembly further comprises a second attachment component, the second attachment component being complementary in shape to the first attachment component.

In some embodiments, the first tile and the second tile are ceramic tiles.

In some embodiments, the first attachment component and the second attachment component are engaged in a friction fit when the first and second tile assemblies are connected.

In some embodiments, the first attachment component is disposed on two adjoining sides of the first tile assembly, and the second attachment component is disposed on two adjoining sides of the second tile assembly.

In some embodiments, the first attachment component is disposed on two opposite sides of the first tile assembly, and the second attachment component is disposed on two opposite sides of the second tile assembly.

In some embodiments, the first attachment component is disposed on all sides of the first tile assembly.

In some embodiments, the second attachment component is disposed on all sides of the second tile assembly.

In some embodiments, the first attachment component is a hook, and the second attachment component is a loop.

In some embodiments, each of the first and second attachment components has at least one magnetic element disposed therein.

In some embodiments, each of the first and second attachment components is a magnet.

In some embodiments, the first attachment component is a tongue and the second attachment component is a groove.

In some embodiments, first attachment component is formed from a polymer material.

In some embodiments, the reinforcing material is an orthotropic glass fiber material.

In some embodiments, an exposed surface of the first tile of the first tile assembly and an exposed surface of the first tile of the second tile assembly are substantially level.

In some embodiments, the tile system comprises a foam pad joined to an exposed surface of the second tile of the first tile assembly.

In some embodiments, the first tile assembly and second tile assembly define a gap therebetween.

In some embodiments, the gap is approximately 3/16".

In some embodiments, the second tile of the first tile assembly has a first coupling surface for releasably mounting the first and second tile assemblies to a second coupling surface complementary to the first coupling surface.

In some embodiments, the first coupling surface has loops.

In some embodiments, the second coupling surface has hooks.

In some embodiments, the first tile has one of a triangular, rectangular, or hexagonal shape.

In some embodiments, the first tile has a polygonal shape.

In some embodiments, the connection between the first and second tile assembly is waterproof.

In some embodiments, the first attachment component is malleable.

According to another aspect, there is provided a tile assembly for installation on a free floating basis to form a surface covering on a substrate without bonding the tile assembly to the substrate, the tile assembly comprising: an exterior facing tile having a plurality of sides; a first attachment component disposed on at least a first side of the plurality of sides; and a second attachment component disposed on at least a second side of the plurality of sides; wherein the first attachment component is configured to engage with a corresponding second attachment component on an adjacent tile, and wherein the second attachment component is configured to engage with a corresponding first attachment component on the adjacent tile.

In some embodiments, the tile assembly further comprises a layer of stabilizing material disposed on an underside of the exterior facing tile.

In some embodiments, the tile assembly further comprises an interior facing tile disposed on the layer of stabilizing material.

In some embodiments, the stabilizing material is one of fiberglass, steel, or aluminum.

In some embodiments, the tile assembly further comprises a layer of sound-absorbing material.

In some embodiments, the sound-absorbing material is cork.

In some embodiments, the first and second attachment components are malleable.

In some embodiments, the tile assembly is resistant to one or more of rolling loads, high impacts, static loads, and shifting and/or settling of the substrate.

In some embodiments, the first and second attachments have one or more magnetic elements disposed therein.

In some embodiments, the first and second attachments form a hook and loop configuration.

In some embodiments, the first and second attachments form a click and lock configuration.

According to another aspect, there is provided a tile assembly for installation on a free floating basis to form a surface covering on a substrate without bonding the tile assembly to the substrate, the tile assembly comprising: a first tile; a second tile; a layer of stabilizing material disposed between the first tile and the second tile; and a plate having a recess configured to accept at least one of the first tile and the second tile, said plate comprising: a first attachment component disposed on at least a first side of said plate, and a second attachment component disposed on at least a second side of said plate, wherein the first attachment component is configured to engage with a corresponding second attachment component on an adjacent plate, and wherein the second attachment component is configured to engage with a corresponding first attachment component on the adjacent plate.

In some embodiments, the tile assembly further comprises a grout for sealing connections between adjacent plates.

According to another aspect, there is provided a tile assembly for installation on a free floating basis to form a surface covering on a substrate without bonding the tile assembly to the substrate, the tile assembly comprising: a first tile; a second tile; a layer of stabilizing material disposed between the first tile and the second tile; and a tray having a recess configured to accept at least one of the first tile and the second tile, said plate comprising: a first attachment component disposed on at least a first side of said tray, and a second attachment component disposed on at least a second side of said tray, wherein the first attachment component is configured to engage with a corresponding second attachment component on an adjacent tray, and wherein the second attachment component is configured to engage with a corresponding first attachment component on the adjacent tray, and wherein the first and second attachment components further include an artificial grout.

According to another aspect, there is provided a connector for connecting a first tile having a plurality of sides to at least a second tile, the grout connector comprising: a plurality of inner faces, each inner face having a shape complementary in shape to a respective side of the plurality of sides of the first tile; at least one first attachment component disposed on an opposite side of at least one of the inner faces; at least one second attachment component disposed on an opposite side of at least another one of the inner faces; wherein the first attachment component is configured to engage with a corresponding second attachment component of an adjacent grout connector, and wherein the second attachment component is configured to engage with a corresponding first attachment component on the adjacent connector.

In some embodiments, the connector further comprises a recess for accepting the first tile.

In some embodiments, the connector is bonded to the first tile with adhesive.

In some embodiments, a connection between the first and second attachment components with the adjacent connector is waterproof.

In some embodiments, the first and second attachment components include at least one of a tongue and groove connection, or a click and lock connection.

In some embodiments, the first and second attachment components comprise at least one magnetic element for strengthening the connection between the connector and the adjacent connector when connected.

According to another aspect, there is provided a method of manufacturing a tile assembly, the method comprising: joining a first tile to a layer of reinforcing material; and applying pressure to the first tile and the layer of reinforcing material.

In some embodiments, the method further comprises: joining a second tile to the layer of reinforcing material.

In some embodiments, the method further comprises: joining a soundproof material to the second tile.

In some embodiments, the method further comprises: joining a first attachment component to a first side of the first tile; and joining a second attachment component to a second side of the first tile.

In some embodiments, the method further comprises placing one or more of the first tile and the layer of reinforcing material into a tray or plate having a recess dimensioned to accept the one or more of the first tile and the layer of reinforcing material.

In some embodiments, the method further comprises bonding the reinforcing material to the tray or plate.

In some embodiments, the method further comprises placing one or more of the first tile, second tile, and reinforcing material into a tray or plate having a recess dimensioned to accept the one or more of the first tile, second tile, and reinforcing material.

In some embodiments, the method further comprises bonding the second tile to the tray or plate.

In some embodiments, the first and second attachment components include at least one of a tongue and groove connection, or a click and lock connection.

In some embodiments, the first and second attachment components include at least one magnetic element.

According to another aspect, there is provided a method of covering a substrate with interlocking tile assemblies without bonding the interlocking tile assemblies to the substrate, the method comprising: engaging a first attachment feature of a first tile assembly with a second attachment feature of a second tile assembly, the first attachment component being complementary in shape to the second attachment component; and engaging a second attachment feature of the first tile assembly with a first attachment feature of the second tile assembly.

In some embodiments, the first and second tile assemblies comprise a first tile and a layer of stabilizing material on an underside of the first tile.

In some embodiments, the first and second attachment components include at least one of a tongue and groove connection, or a click and lock connection.

In some embodiments, the first and second attachment components include at least one magnetic element.

In some embodiments, an exposed surface of the first tile assembly and an exposed surface of the second tile assembly are substantially level.

In some embodiments, the method further comprises defining a gap between the first tile assembly and the second tile assembly upon connecting the first tile assembly with the second tile assembly.

In some embodiments, the gap is approximately ³⁄₁₆".

In some embodiments, the method further comprises: mounting the tiling assembly to the substrate by connecting a first coupling surface of the first tile assembly to a second coupling surface of the substrate, the second coupling surface being complementary in shape to the first coupling surface.

In some embodiments, the first coupling surface has loops.

In some embodiments, the second coupling surface has hooks.

According to another aspect, there is provided a reinforced tile assembly, the tile assembly comprising: a first tile; a second tile; and a layer of stabilizing material disposed between the first and second tiles.

In some embodiments, the first tile has a plurality of sides, and the tile assembly further comprises a first attachment component disposed on at least a first side of the plurality of sides, and a second attachment component disposed on at least a second side of the plurality of sides, wherein the first attachment component is configured to engage with a corresponding second attachment component on an adjacent tile assembly, and wherein the second attachment component is configured to engage with a corresponding first attachment component on the adjacent tile assembly.

In some embodiments, the stabilizing material is one of fiberglass, polyethylene terephthalate, steel, aluminum, or foam.

According to another aspect, there is provided a tile system for covering a surface, comprising: a first tile assembly connected to a second tile assembly by a connector, each tile assembly comprising a first tile stacked on a second tile, the first tile and the second tile joined to a reinforcing material disposed therebetween; wherein the connector comprises a first component and a second component that is complementary to the first component; the first component is mounted to the first tile assembly, and the second component is mounted to the second tile assembly.

In some embodiments, the first tile and the second tile are ceramic tiles.

In some embodiments, a side of the first tile assembly having the first component is opposite a side of the second tile assembly having the second component when the first tile assembly and the second tile assembly are connected.

In some embodiments, the first tile assembly has the first component on two adjoining sides of the first tile assembly, and the second tile assembly has the second component on two adjoining sides of the second tile assembly.

In some embodiments, the first tile assembly has the first component on two opposite sides of the first tile assembly, and second tile assembly has the second component on two opposite sides of the second tile assembly.

In some embodiments, the first tile assembly has the first component on all sides of the first tile assembly.

In some embodiments, the second tile assembly has the second component on all sides of the second tile assembly.

In some embodiments, the first component of the connector is a hook, and the second component of the connector is a groove.

In some embodiments, the first component of the connector is a tongue and the second component of the connector is a channel.

In some embodiments, the connector is formed from a polymer material.

In some embodiments, the reinforcing material is an orthotropic glass fiber material.

In some embodiments, an exposed surface of the first tile of the first tile assembly and an exposed surface of the first tile of the second tile assembly are level.

In some embodiments, the tile system comprises a foam pad joined to an exposed surface of the second tile of the first tile assembly.

In some embodiments, the first tile assembly and second tile assembly define a gap therebetween.

In some embodiments, the gap is approximately ³⁄₁₆".

In some embodiments, the second tile of the first tile assembly has a first coupling surface for releasably mounting the first and second tile assemblies to a second coupling surface complementary to the first coupling surface.

In some embodiments, the first coupling surface has loops.

In some embodiments, the second coupling surface has hooks.

In accordance with another aspect, there is provided a method of covering a surface, the method comprising: joining pairs of first tiles and second tiles to reinforcing material disposed therebetween, the first tiles stacked on the second tiles, to define a first tile assembly and a second tile assembly; and connecting the first tile assembly with the second tile assembly with a connector to define a tiling system, the connector having a first component and a second component that is complementary to the first component, wherein the first tile assembly has the first component and the second tile assembly has the second component.

In some embodiments, the first tile and the second tile are ceramic tiles.

In some embodiments, a side of the first tile assembly having the first component is opposite a side of the second tile assembly having the second component when the first tile assembly and the second tile assembly are connected.

In some embodiments, an exposed surface of the first tile of the first tile assembly and an exposed surface of the first tile of the second tile assembly are level.

In some embodiments, the method comprises defining a gap between the first tile assembly and the second tile assembly upon connecting the first tile assembly with the second tile assembly.

In some embodiments, the gap is approximately 3/16".

In some embodiments, the method comprises: mounting the tiling assembly to the surface by connecting a first coupling surface of the first tile assembly to a second coupling surface of the surface, the second coupling surface complementary to the first coupling surface.

In some embodiments, the first coupling surface has loops.

In some embodiments, the second coupling surface has hooks.

BRIEF DESCRIPTION OF DRAWINGS

In the figures which illustrate example embodiments,

FIGS. 1A, 1B and 1C are a schematic of a tile assembly;

FIG. 55 is a table outlining features of an injection moulding process, variotherm process, and press welding process;

DETAILED DESCRIPTION

Figure 2A:
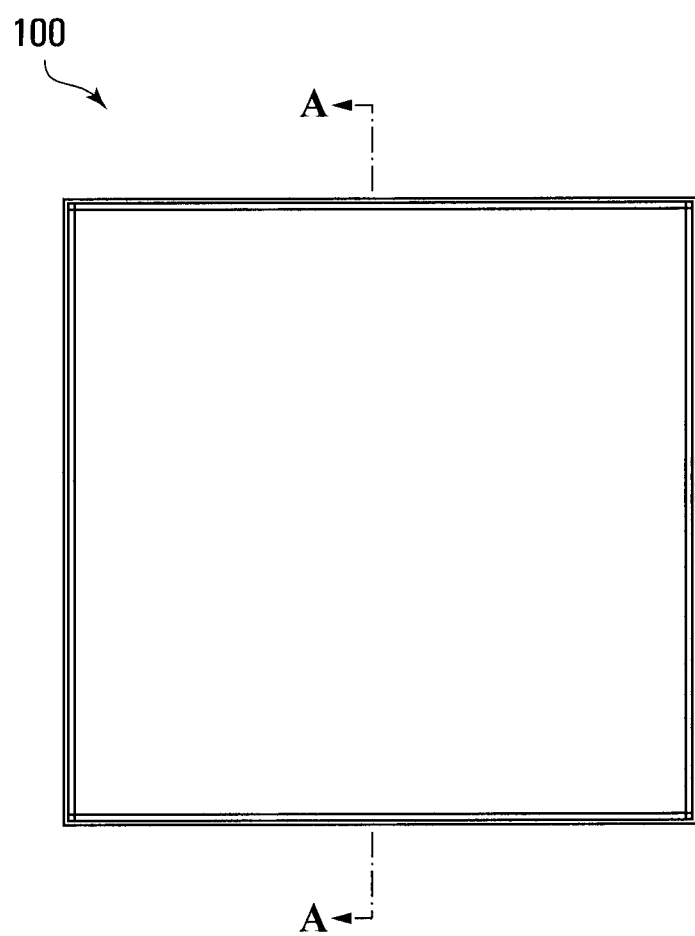
FIGS. 2A, 2B and 2C are a schematic of the tile assembly of FIG. 1 with another attachment feature.

A tile assembly and a tile system are disclosed. The tile assembly may comprise a first tile. The bottom surface of the tile may be joined with a stabilizer for laying the tile assembly on a floor. The tile assembly may comprise connectors having attachment features on the sides of the tile. The attachment features may be integrally formed with the stabilizer or may be separately joined to the tile. The attachment features may be complementary to one another, such that tile assemblies may be joined together to form a tile system. The tile system may comprise two tiles, with a fibre glass stabilizer between the two tiles. The tile system may be used to cover a surface, such as a floor. The tile system may be laid down on the floor without having to use mortar to join the tile system to the floor. Accordingly, the tile system may "free float" and self-level when installed on the floor. Further, the tile system may be mounted to a wall to cover the wall. A mount assembly comprising plates and discs may be mounted to a surface, such as the wall, such that the tile system may be mounted to the mount assembly to cover the surface. The tile assembly may be used as a subsurface or as a surface.

FIG. 1 is a schematic of a tile assembly 100. The tile assembly 100 comprises a tile 102 and a stabilizer 104. As depicted in FIG. 1, the stabilizer 104 is joined to a bottom surface of the tile 102, such that the top surface is exposed when installed on a surface, such as a floor or a wall. The stabilizer 104 may be joined to the tile 102 using moulding (e.g. injection moulding), welding (e.g. press welding, ultrasonic welding, vibration welding, contact welding), adhesive, and the like. When laid on the floor, the stabilizer 104 of the tile assembly 100 may contact one or more points of the floor.

The tile assembly 100 may have different shapes. For example, the tile assembly 100 may be generally square in shape. As another example, the tile assembly 100 may be generally a circle, triangle, rectangle, parallelogram, pentagon, hexagon, heptagon, octagon, an irregular shape, having one or more curves sides, and the like.

Based on the shape of the tile assembly 100, the tile 102 or stabilizer 104 may have a shape similar to the shape of the tile assembly 100. For example, where the tile assembly 100 has a generally square shape, the tile 102 or stabilizer 104 may also have a generally square shape. Where the tile 102 is not generally a square shape, the tile 102 may be joined to a stabilizer 104 having a generally square shape such that the tile assembly 100 has a generally square shape.

The tile 102 may be made of a variety of materials. For example, the tile 102 may be resilient flooring that may be made of marmoleum (sheet goods or modules), vinyl (sheet goods or modules), luxury vinyl tile (LVT; some LVT may have a textured surface and other LVT may have a smooth surface), or vinyl composite tile (VCT). As another example, the tile 102 may be made with narrow or wide width tufted carpet, painted or woven carpet, or carpet tile. The carpet materials may be glued down, double stitched, or pod and smooth out as appropriate. In some embodiments, the tile 102 may be Laminam® tiles. As another example, the tile 102 may be a laminate tile, porcelain tile, ceramic tile, stone tile, marble tile, and the like.

The tile 102 of the tile assembly 100 may be previously cut, or the material for the tile 102 may be purchased to independently fabricate the tile 102 and independently cut the tile 102. The material of the tile (e.g. marble, porcelain, or ceramic in thin sheets) may be cut into thin sheets (veneer concept) and may be joined with the stabilizer 104.

An example size of the tile 102 may range from 3/8"×3/8" to 24"×48", and may be larger or smaller. An example thickness of the tile 102 may range from 1/8" to 1/2", and may be thicker or thinner. For example, the thickness of the tile 102 may be 2 mm-4 mm. The size and thickness of the tile 102 may affect the amount of stress required to break the tile 102. The size and thickness of the tile 102 may be based on the manufacturing process used to make the tile assembly 100. For example, where injection moulding is used to manufacture the tile assembly 100 (e.g. join the tile 102 and the stabilizer 104), the size and thickness of the tile 102 may be such that the tile 102 does not break during the injection moulding process.

The tile assembly 100 may be used in commercial or residential markets. The type of materials used in the tile assembly 100 may be based on the particular market in which it is used.

In addition to being installed on the floor, the tile assembly 100 may be mounted to a wall using a mount assembly, which may comprise plates and discs, as described in greater detail herein. The tile assembly 100 may be designed to have a reduced weight if the tile assembly 100 is to be mounted on a surface off the floor, such as a wall.

In some embodiments, the surface of the tile 102 that may be visually seen or touched may have designs. For example, the surface of the tile 102 may have a colour, a design, a print, a glazing, be smooth, or be textured.

The stabilizer 104 may be joined to the back of the tile 102, such as by co-injection or a second process injection. The stabilizer 104 may have a bubble feature. This bubble feature may provide a water course or moisture course, assist with self-leveling of the tile assembly 100, may assist in ease of connecting a tile assembly 100 to another tile assembly 100, and may improve sound-proofing capabilities of the tile assembly 100. The stabilizer 104 or the bubble feature of the stabilizer 104 may be made from flexible or compressible polymer.

The stabilizer 104 may be molded, extruded, formed, and/or attached to the tile 102.

The stabilizer 104 may be manufactured using a variety of materials. The material of the stabilizer 104 may easily create a strong bond or indestructible bond, may not crack (e.g. a high dependability product polymer or crystalline product), and may be formed into shapes having detailed designs and dimensions (e.g. able to form a small recess at a surface of the tile to the top of the surface of the grout). The stabilizer 104 may be made of foam, or may be made of a polymer, such as polyethylene terephthalate (PET), or fibre glass, or may be a metallic material, such as steel. Where the stabilizer 104 is made of a polymer, the polymer may be flexible and compressible. The stabilizer 104 may comprise an adhesive, such as glue, epoxy, polyester, polyurethane, silicone, cement, or the like, to secure the tile assembly 100 to a surface, such as a wall. In some embodiments, the stabilizer 104 may comprise loops for connecting with hooks of the mount assembly to secure the tile assembly 100 to a surface, such as a wall. In some embodiments, the stabilizer may be steel, aluminum, or a combination thereof.

The stabilizer 104 may be manufactured using moulding, 3D-printing, and the like.

Initial launches of the tile assembly 100 may be based on entire markets or partial markets when some F&Bs and life cycle costs advantages are more important to end user customers.

The tile assembly 100 may replace a portion of carpet tile market with the ability to deliver high performance atmospheric stability with new narrow and wide width carpet products. The stabilizer 104 may comprise loops for connecting with hooks to secure the tile assembly 100 to a surface having the hooks. It may be possible to add various and different features based on the materials used for the tile assembly 100 and the surface on which the tile assembly 100 is installed. It may be possible to add various features for specifically addressing certain specific products in all categories of products.

The tile assembly 100 may replace conventional tiles with "free float" narrow or wide width goods with strategic design for printed or tufted materials. The materials may be physically cut to order.

It some embodiments, it may be possible to replace a portion of carpet tile market with the ability to deliver high performance atmospheric stability with new narrow and wide width carpet products. It some embodiments, an improvement may be made to improve backing material for encapsulation and loop lamination and may initially use generation #2 improved plates and discs.

It some embodiments, it may be possible to use a new generation #2 plate and disc with improvements (e.g. reduce weight add filler) and obtain Class #1 and European equivalent to Class #1. Where the tile 102 is carpet, a new generation #2 plate and disc may be used, with improvements i.e. reduce weight by design and obtain Class #2.

Figure 2B:
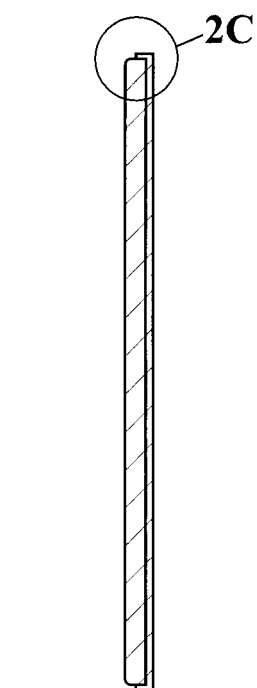
Figure 2C:
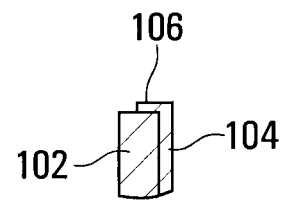
Figure 3A:
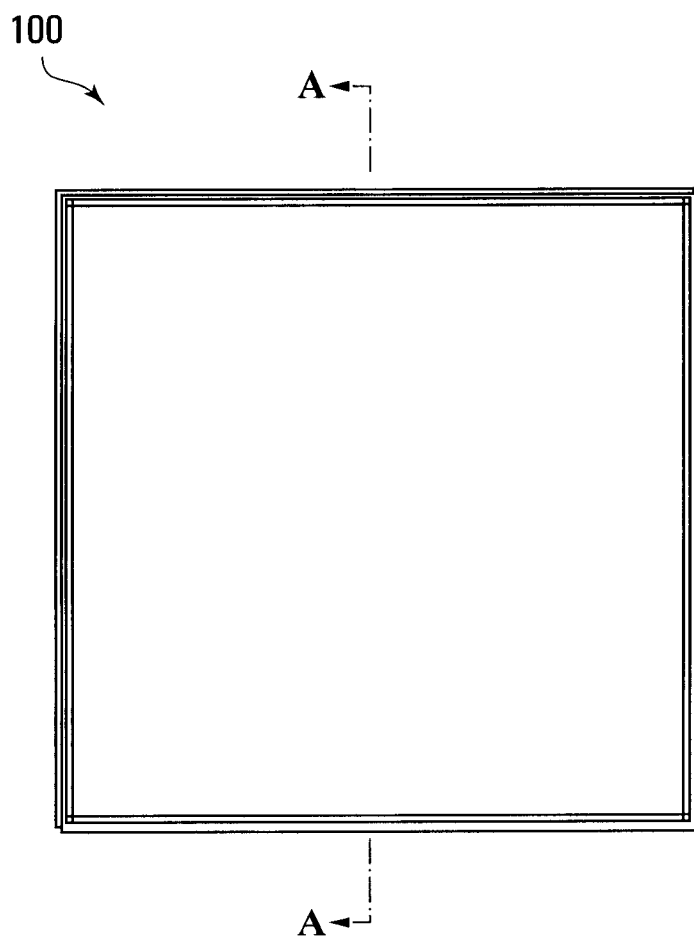
FIGS. 3A, 3B, 3C and 3D are a schematic of the tile assembly of FIG. 1 with another attachment feature.
Figure 3C:
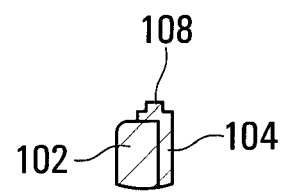
Figure 3B:
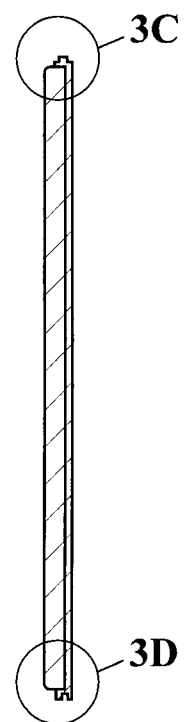
Figure 3D:
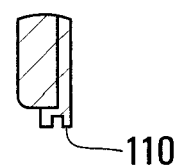

As depicted in FIG. 1, the edge of the stabilizer 104 may be generally flush with the edge of the tile 102. In some embodiments, the stabilizer 104 may extend past the edge of the tile 102, as depicted in FIG. 2.

In some embodiments, the stabilizer 104 may be a loop backing made of standard loop material. In some embodiments, an adhesive, such as a rubber adhesive, may join the stabilizer 104 to the tile 102. In some embodiments, the stabilizer 104 may be attached by hand.

In some embodiments, the tile assembly 100 may comprise an attachment feature 106 that may be complementary to an attachment feature 106 of another tile assembly 100 for connecting the tile assembly 100 to the another tile assembly 100 to define a tile system. The connection between the tile assemblies 100 may be a mechanical connection. The attachment feature 106 of the tile assembly and the attachment feature 106 of the another tile assembly 100 may together form a connector for connecting the tile assembly 100 to the another tile assembly 100.

The attachment feature 106 may allow for mechanical stability when a tile assembly 100 is connected to another tile assembly 100. The attachment feature 106 may bear a similar visual appearance to the grout of conventional tile installations. The attachment feature 106 may provide a degree of ingress protection to water.

The attachment feature 106 of the tile assembly 100 may be dimensioned and designed such that the attachment feature 106 does not extend above the top surface of the tile assembly 100 (which may be defined by the top surface of the tile 102) or does not extend below the bottom surface of the tile assembly 100 (which may be defined by the bottom surface of the tile 102 or the stabilizer 104.

The attachment feature 106 may be water resistant. When the attachment feature 106 of a tile assembly 100 is connected to the attachment feature 106 of another tile assembly 100, the connector may be a watertight seal. In some embodiments, a rubber seal may be applied to the attachment feature 106 or the connector to form a watertight seal or improve water resistance of the attachment feature 106 or the connector. The material used for the attachment feature 106 may keep its shape such that the pressure generated between two tile assemblies 100 upon connection to each other may be maintained.

In some embodiments, the attachment feature 106 may be integrally formed with the stabilizer 104, as depicted in FIG. 2 or FIG. 3. In some embodiments, the attachment feature 106 may be separate from the stabilizer 104.

The attachment feature 106 may be manufactured using, for example, 3D printing or injection moulding, or another generative manufacturing method. In some embodiments, the attachment feature 106 may be injected moulded and then a routing process may be used to form the actual engagement/attachment feature.

The attachment feature 106 may be glued to the tile 102, may be moulded onto the tile 102, or bonded to the tile 102, such as to the edge of the tile 102. In some embodiments, the attachment feature may be made of a magnetic material. In some embodiments, the attachment feature 106 may include one or more magnets or magnetic elements which ensure a connection and/or supplement the resistive forces provided by a mechanical interconnection of two tiles 102.

The attachment feature 106 may be manufactured using a variety of materials that may be similar to the stabilizer 104. The material of the attachment feature 106 may easily create a strong bond or indestructible bond, may not crack (e.g. a high probability product polymer or crystalline product), and may be formed into shapes having detailed designs and dimensions (e.g. able to form a small recess at a surface of the tile to the top of the surface of the grout). The attachment feature 106 may be made of foam, or may be made of a polymer, such as polyethylene terephthalate (PET), magnetic material, or fibre glass, or may be a metallic material, such as steel. Where the attachment feature 106 is made of a polymer, the polymer may be flexible and compressible. The attachment feature 106 may comprise an adhesive to secure to the tile assembly 100.

In some embodiments, loops may be joined to the stabilizer 104 for mounting the tile assembly 100 to corresponding hooks on a surface, such as a mount assembly. In some embodiments, the loops may be adhered to the stabilizer 104, which may be made of foam. The stabilizer 104 may be connected to the tile 102 using an adhesive, and may be connected to the tile 102 by hand.

When designing the attachment feature 106 (e.g. its shape, dimensions, designs, appearance) or joining the attachment feature 106 to the tile 102, the tolerances of the tile 102 (e.g. length, width, angle defined between the length and width) may need to be considered. The cooling or shrinkage of the attachment feature 106 may need to be considered when designing the attachment feature 106 or joining the attachment feature to the tile 102.

The attachment feature 106 may have a variety of designs, such as shape, dimensions, designs, or appearance. The attachment feature 106 may be coloured. The attachment feature 106 may be treated to look like grout. The attachment feature 106 may have a recess for joining to the tile 102 or for joining with another attachment feature 106. In some embodiments, the attachment feature 106 may comprise a corner or lip. The corner or lip may not be seen, and may help to adjust the shape of the tile assembly 100 and may be a new tolerance for the tile 102.

The attachment features 106 of tile assemblies 100 may be complementary to one other for connecting the tile assemblies 100. For example, as depicted in FIG. 3, the attachment feature 106 may be a male attachment feature 108 or a female attachment feature 110. As another example, the attachment feature 106 may have a click-lock feature to lock with another attachment feature 106. The locking of the attachment features 106 may be indicated by a "click" sound. When the attachment features 106 are connected together, the seam defined between the attachment features 106 may be camouflaged. As depicted in FIG. 3, the tile 102 may be set into the stabilizer using, for example, adhesive. The setting of the tile 102 into the stabilizer 104 or grout feature may provide additional stability, such that the attachments between tiling assemblies 100 may stay relatively level even when on uneven surfaces or in the presence of a height difference between tiling assemblies 100.

The design of the attachment feature 106 may be such that large forces may not be required for connecting the tile assemblies 100 and to assemble the tile system, or no big holding forces may be necessary. Further, the attachment feature 106 may have a robust design so that the tile assembly 100 may be used in rough conditions, such as construction areas. The attachment feature 106 may be designed such that connected tile assemblies 100 may be disconnected or disassembled without damaging the tile assemblies 100 so the tile assemblies 100 may be reused again or several times.

In some embodiments, the length of the attachment feature 106 extending from the edge of the tile 102 may be no greater than $3/8$", or no greater than $3/16$", thereby providing for an artificial grout. In some embodiments, the length of the attachment feature 106 extending from the edge of the tile 102 may be $3/16$". The length of the attachment feature 106 extending from the edge of the tile 102 may be based on the location that the tile assembly 100 may be used. For example, the length of the tile attachment feature 106 may be such that typical wheels (e.g. of a machine, a bicycle, stroller, etc.) may roll over the attachment feature 106 or high heels of a stiletto may step on the attachment feature 106, and the stress experienced by the attachment feature 106 may be such that the attachment feature 106 does not break or become damaged or cause the connected tile assemblies 100 to break or become damaged.

In some embodiments, the attachment feature 106 may be on all sides of the tile assembly 100. In some embodiments, opposite or adjacent sides of the tile assembly 100 may have the attachment feature 106. In some embodiments, the attachment feature 106 may have a click-lock feature. In some embodiments, the attachment feature 106 may have a tongue and groove feature.

In some embodiments, the tile 102 and the attachment feature 106 may be injection moulded together in one process. In some embodiments, the attachment feature 106 may be joined to the tile 102 on the bottom surface of the tile 102 and the edge of the tile 102. In some embodiments, the attachment feature 106 may be joined to the edge of the tile 102.

During the manufacturing process (e.g. injection moulding) of the tile assembly 100, the components of the tile assembly 100 (e.g. tile 102, stabilizer 104, attachment feature 106, etc.) should be able to withstand the stresses of the manufacturing process without damage, breaking, or failure. The tile assembly 100 should be able to withstand high impact and rolling loads when installed on the surface, such as the floor or wall.

In some embodiments, the attachment feature 106 may be injection moulded to the tile 102 against the bottom surface of the tile 102 and the edge of the tile with or without the stabilizer 104. For example, the tile 102 may be 2 mm, 4 mm, or 8 mm thick.

During manufacturing of the stabilizer 104 or the attachment features 106, shrinkage or cooling factors may need to be considered, such that there may not be unwanted concave or convex issues.

In some embodiments, the attachment feature 106 may be joined to the tile 102 with one injection moulding process, or may use a secondary process to provide a realistic visual effect of grout. When the attachment features 106 of tile assemblies 100 are joined together, the attachment features 106 may define a line on the top surfaces of the attachment features 106. In some embodiments, the line may meet at one of the far edges where the tile assemblies 100 come together thereby hiding the potential for visual noticing of the grout line.

The top surface of the attachment feature 106 may have a micro feature to help create the look of conventional grout. The top surface of the attachment feature 106 may be recessed from the top surface of the tile 102. The attachment feature 106 (e.g. click-lock, tongue and groove) may lock tile assemblies 100 together sufficiently to perform under high stress and demanding conditions. The attachment feature 106 may be designed to allow tile assemblies 100 to be separated from each other without damaging the attachment feature in instances where the tile assembly 100 may be disengaged for replacement, repair, or cleaning. The material (e.g. polymer) used to create the stabilizer 104 or attachment feature 106 may be able to maintain integrity when they engage with other attachment features 106 and put under high stresses or rolling stresses.

If there is a void or dip in the floor beneath the tile assembly 100 or tile subsystem (or the floor beneath the tile assembly 100 or tile subsystem is generally uneven), the stress experienced by the tile assembly 100 from a particular force may be greater compared to when the floor beneath the tile assembly 100 is relatively even. The material used for the stabilizer 104 or attachment feature 106 may be such that the material maintains its integrity and not crack or be damaged if the floor beneath the tile assembly 100 or tile subsystem is uneven.

In some embodiments, the attachment feature 106 may frame the tile 102. For example, where the tile 102 is a square, the attachment feature 106 may have four sides similar to the tile 102, and opposite or adjacent sides of the attachment feature 106 may have the connections for connecting with another tile assembly 100.

As depicted in FIG. 2, the attachment feature 106 may be a generally flat surface. To join with another tile assembly 100, the attachment feature 106 may have an adhesive, a hook or loop, or another feature that may cooperate with the attachment feature 106 of the other tile assembly 100 to join the tile assemblies 100 together.

As depicted in FIG. 3, the attachment features 106 of tile assemblies 100 may be complementary to one other for connecting the tile assemblies 100. For example, the attachment feature 106 may be a male attachment feature 108 or a female attachment feature 110. As depicted in FIG. 3, on one end of the tile assembly 100 is the male attachment feature 108, and on the opposite end of the tile assembly 100 is the female attachment feature 110. In some embodiments, the male attachment feature 108 and female attachment feature 110 may be on adjacent sides of the tile assembly 100. The male attachment feature 108 of one tile assembly 100 may be received in the female attachment feature 110 of another tile assembly 100 to join the tile assemblies 100 together.

Figure 4:
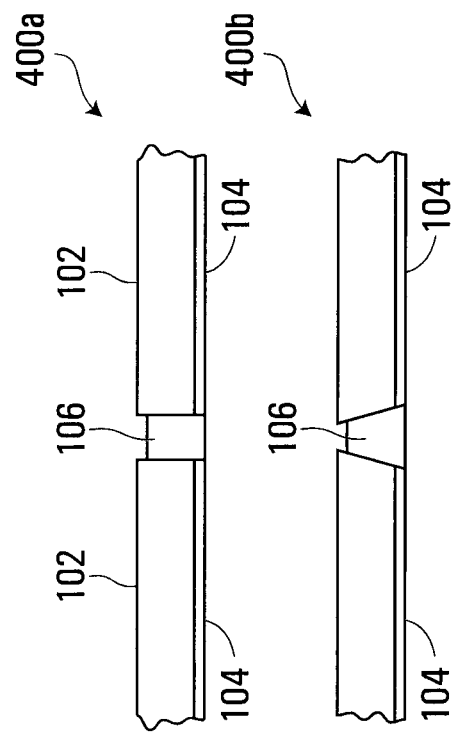
FIG. 4 is a schematic of a cross-sectional view of a tile system.
Figure 4:
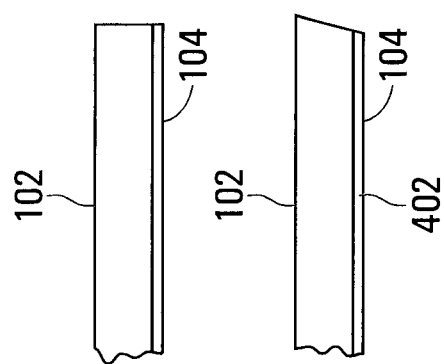

FIG. 4 is a schematic of a cross-sectional view of a tile system 400*a* and a tile system 400*b*. Tile system 400*a* comprises two tile assemblies 100 having tiles 102 and stabilizers 104 joined together with attachment features 106. Tile system 400*b* is generally similar to tile system 400*a*, except that the tiles 102 of tile system 400*a* have no tapered edge, and the tiles 102 of the tile system 400*b* have tapered edges 408. Accordingly, the attachment features 106 may be designed such that it may adhere to the tapered edge 408. In some embodiments, attachment features 106 include magnetic elements which enhance the strength of connections between tile systems 400*a*, 400*b*. In any of the embodiments described herein, various attachments 106 and male 108 and female 110 connectors may be made entirely of magnetic materials, or include magnetic elements for enhancing the force of attraction between connected tile systems.

The attachment features 106 of the tile assembly 100 may be pre-fabricated and may be used with free-float installations of stabilized tiles 102. The attachment features 106 may be pre-attached in a factory or on site, or not attached to the tile 102 at all.

In some embodiments, the attachment features 106 of the tile assembly 100 may be a single piece separate from the tile assemblies 100 that joins tile assemblies 100 together. The attachment feature 106 may be designed and configured to contact the tile assemblies 100 and connect with the tile assemblies 100.

In some embodiments, the attachment feature 106 may be pre-fabricated. In some embodiments, the attachment feature 106 may be liquid or partly liquid and may be applied on site.

The stabilizer 104 may comprise a feature for mounting to a surface (e.g. hook or loop, or adhesive). The stabilizer 104 may be connected to a surface having the other of the hook or loop, or may be joined to a surface by the adhesive. In some embodiments, the adhesive may be on the surface, and the tile assembly 100 may be joined to the surface.

In some embodiments, the tile assembly 100 may not have a stabilizer 104. In some embodiments, stabilizer 104 may be present if required (e.g. if the surface on which the tile assembly 100 is installed is uneven).

In some embodiments, the stabilizer 104 may be embedded in the tile 102 (e.g. in the center of the tile 102). In some embodiments, the stabilizer 104 may be installed between two tiles 102.

In some embodiments, where the exist floor substrate is reasonably flat, it may be possible to use pre-fabricated attachment features 106, either pre-attached to the tile 102 or attached on site during installation, on at a least two sides of tile 102 to enable the tile assembly 100 to be installed without any attachment to the floor or existing substrate. In such embodiments, a resilient, sound proof, leveling layer could be used either separately or attached (e.g. as shown in FIG. 118).

Figure 118:
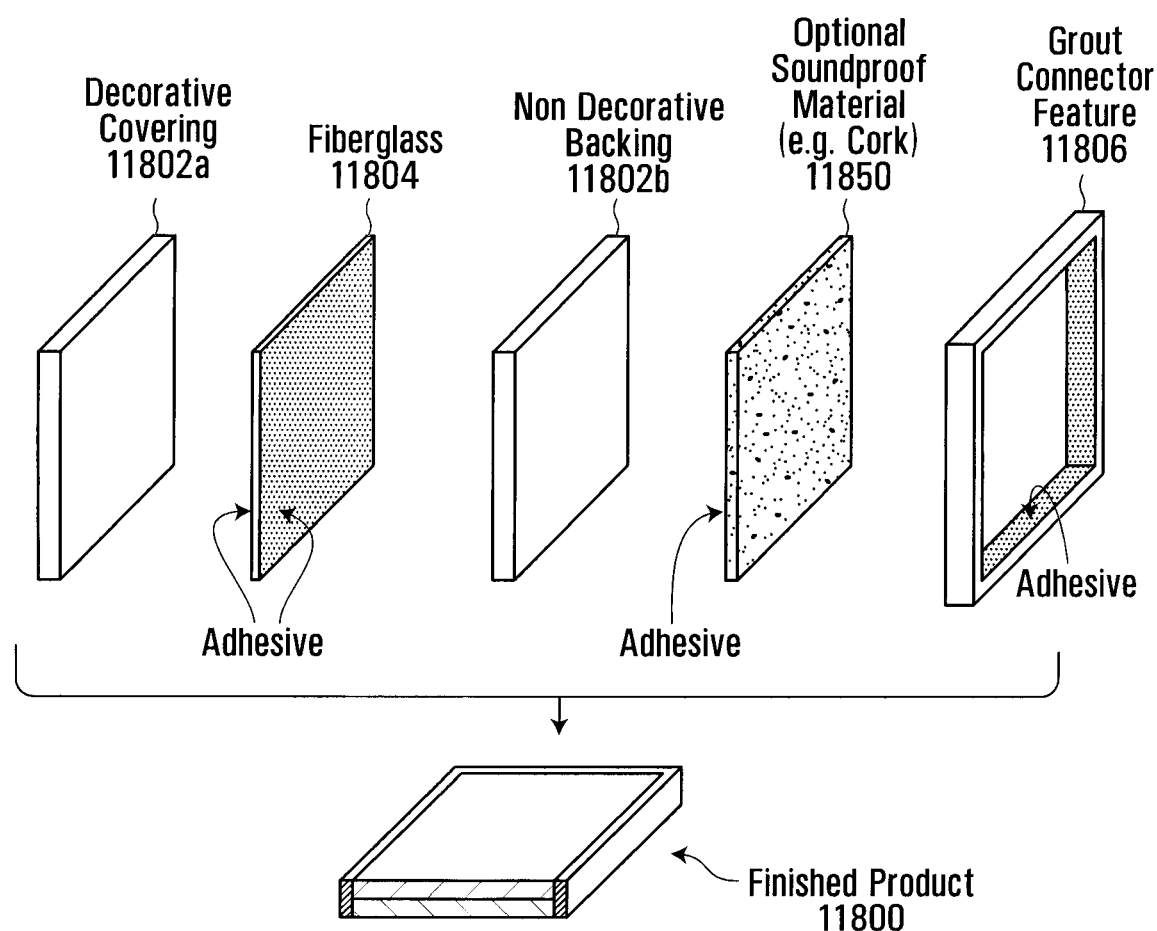
FIG. 118 is a schematic of an example embodiment of a tile assembly.

FIG. 118 is an example embodiment of a tile assembly 11800. As depicted, tile assembly 11800 includes a first tile 11802*a*, a second tile 11802*b* separated by a stabilizing layer 11804, and an optional soundproofing layer 11850, all encased by attachment feature 11806. In some embodiments, first tile 11802*a* may have a decorative covering. In some embodiments, stabilizer 11804 may be a fiberglass layer, with adhesive on one or both sides for bonding to the tiles. In some embodiments, the soundproofing layer 11850 is made of cork or another material suitable for soundproofing. In some embodiments, the attachment feature 11806 has adhesive on an inner surface to bond with the other elements 11802a, 11802b, 11804, 11850. In some embodiments, the first tile 11802a, stabilizing layer 11804 and second tile 11802b may have a thickness, when stacked, of approximately 50-75 mm More particularly, the stacked thickness may be approximately 0.5-1.0 inches. More particularly, the thickness may be approximately 5-7 mm. In some embodiments, the stabilizing layer 11804 may be a compressible polymer, foam, polyethylene terephthalate (PET), or a metallic material such as steel or aluminum.

In some embodiments, the attachment feature 106 may be pre-applied on site and adhesively attached on site, could be pre-applied offsite or onsite, could be pre-fabricated on the tile 102, or could be joined with the tile 102 with pressure and without use of adhesive.

Figure 5:
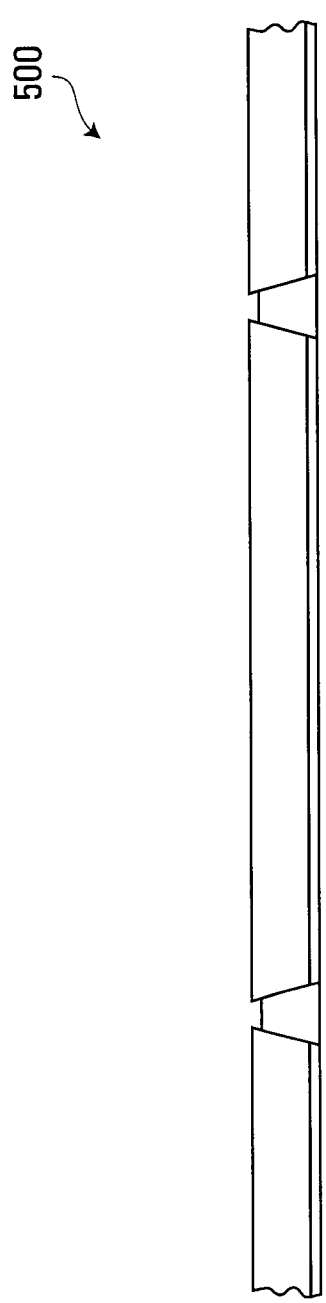
FIG. 5 is a schematic of a cross-sectional view of a tile system.

FIG. 5 is another schematic of a cross-sectional view of a tile system 500. The tiles of the tile system 500 have tapered edges.

Figure 6:
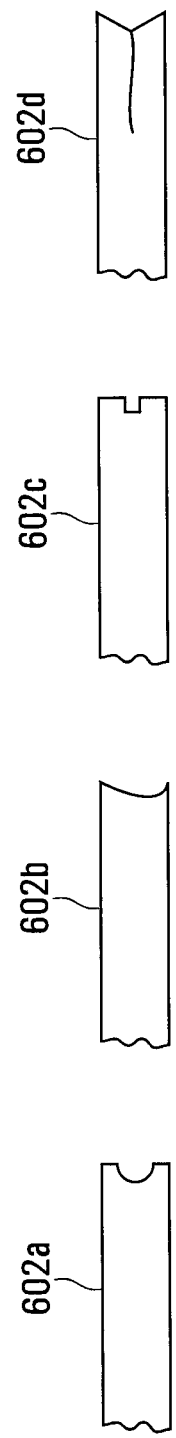
FIG. 6 is a schematic of the edges of a tile.

FIG. 6 is a schematic of example edges of a tile 102 of a tile assembly 100.

Different types of edges are possible. For example, as illustrated in FIG. 6, tile 602a has a recess in its edge, tile 602b has a curved edge, tile 602c has a smaller recess in its edge, and tile 602d has a V-shape edge.

Figure 7:
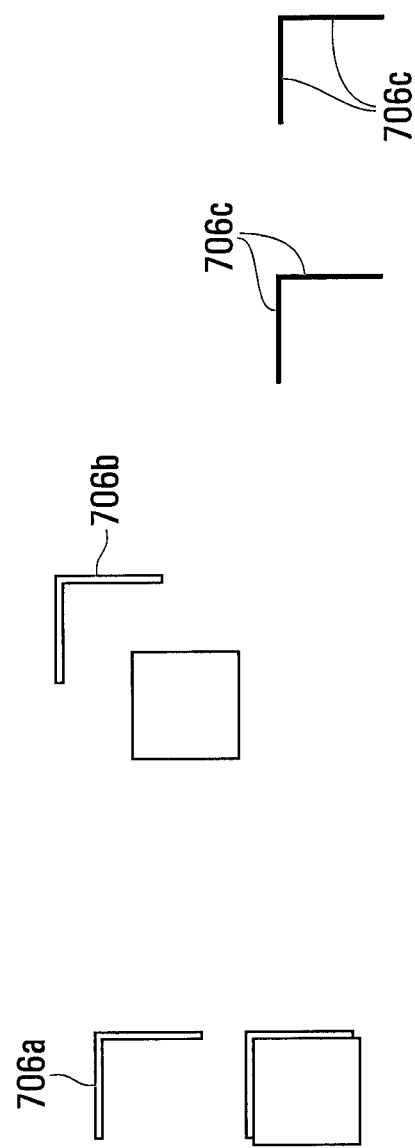
FIG. 7 is a schematic of the attachment feature of the tile.

FIG. 7 is a schematic of the attachment feature of the tile 102. For example, attachment feature 706a may be pre-fabricated and may be pre-attached to the tile 102. For example, attachment feature 706b may be pre-fabricated and may or may not have an adhesive layer for joining with the tile 102. For example, attachment feature 706c may have an adhesive layer on both sides to join with the tile 102 and with the attachment feature of another tile assembly 100.

Figure 8:
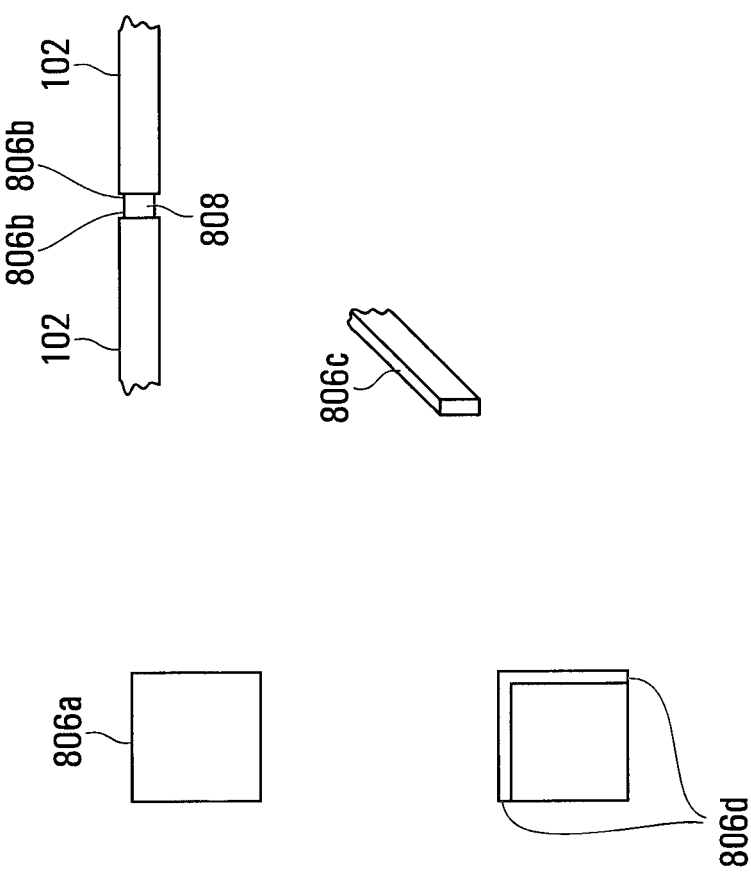
FIG. 8 is a schematic of an attachment feature of the tile assembly.

FIG. 8 is a schematic of the attachment feature of the tile 102. In some embodiments, attachment feature 806a may be pre-fabricated and on all sides of the tile 102, either pre-attached or attached on site. As depicted, tile 102 is square, so each of the four sides of the tile has the attachment feature 806a. In some embodiments, attachment features 806b of tile assemblies 100 may define a seam 808 therebetween. The seam 808 may or may not have an adhesive for connecting the tile assemblies 100 together. In some embodiments, attachment feature 806c may be pre-fabricated and may have a hook and loop or adhesive to improve ease of installation and reduce possibility of capillary action upward. In some embodiments, attachment feature 806d may extend past the edge of the tile 102 to produce additional "pressure" for tightly joining the tile assemblies 100 or camouflaging the seam defined by the attachment features 106 of the tile assemblies 100.

The attachment feature 106 may be made of rigid or flexible material. In some embodiments, the attachment feature 106 may have some flexibility and/or resilience to allow for pressuring when one tile assembly 100 is installed side by side to another tile assembly 100. Flexibility and/or resilience of the attachment feature 106 may also provide for some movement between tile assemblies 100 to absorb when installed.

In some embodiments, a slip sheet may be used to provide for the ability to pressure a tile 102 against a flexible pre-fabricated or moulded attachment feature 106. This may work with attachment features 106 of various shapes or designs.

Moulds of stabilizer 104 may be used for one or two step manufacturing of the tile assembly 100, and may be with or without attachment feature 106 on the mould.

In some embodiments, the surface of the attachment features 106 that may be visually seen or touched may have designs. For example, the surface of the attachment features 106 may have a colour, a design, a print, a glazing, be smooth, or be textured.

In some embodiments, the tile assembly 100 may be waterproof or may be applied with a material so it may be water proof. In some embodiments, the tile assembly 100 may be installed on a wall, for example in a shower stall, to protect the wall from liquids.

Figure 9:
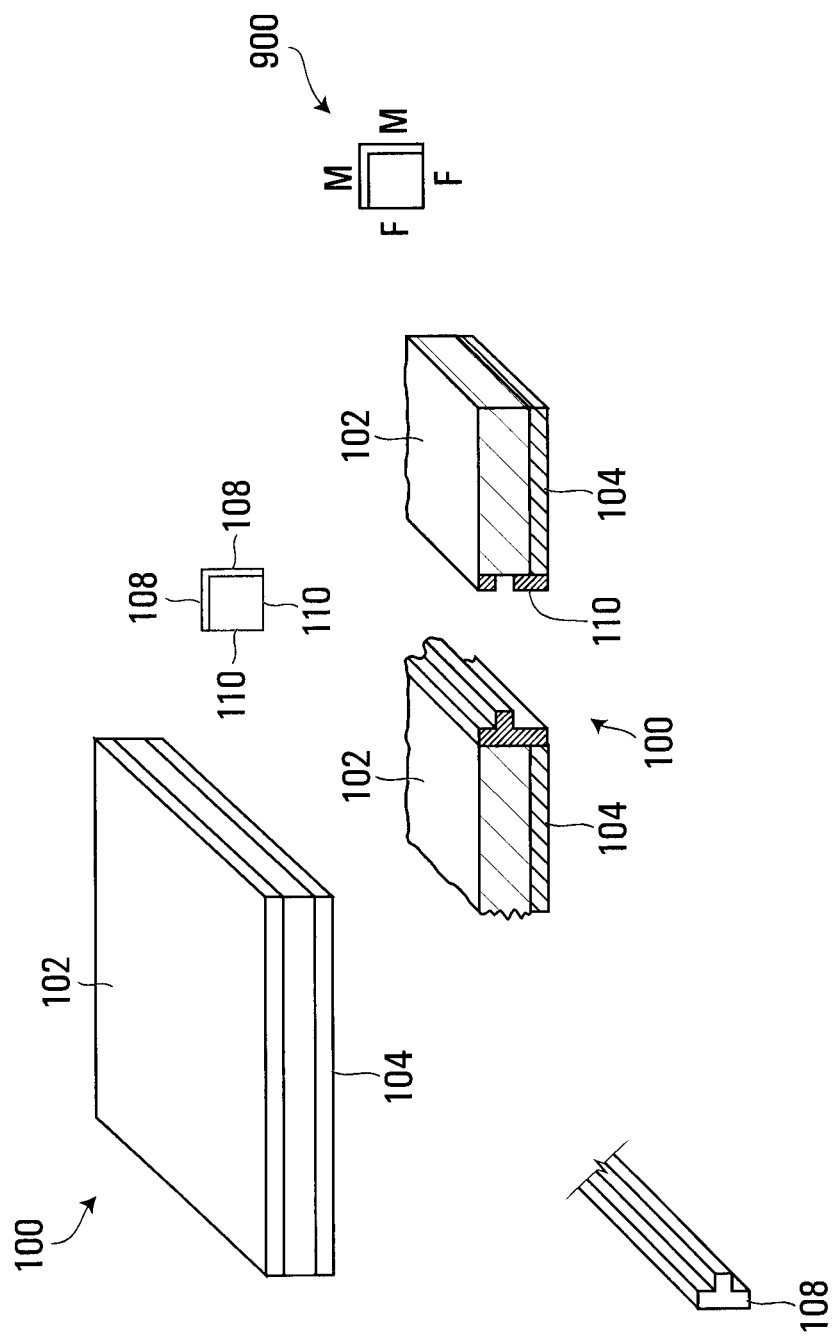
FIG. 9 is a schematic of an attachment feature of the tile assembly.

FIG. 9 is a schematic of an attachment feature 106 of the tile assembly 100. The tile assembly 100 may have a tile 102, a stabilizer 104 (which may be made of a polymer such as PET), and an attachment feature 106. Two tile assemblies 100 may be connected together using attachment features 106 to be a tile system 900. As depicted in FIG. 9, the attachment feature 106 may be a male attachment feature 108 or a female attachment feature 110. Some sides of the tile assembly 100 may have the male attachment feature 108, and other sides of the tile assembly 100 may have the female attachment feature 110. For example, as depicted in FIG. 9, where the tile assembly 100 has four sides such as a square shape, the male attachment features 108 may be on adjacent sides and the female attachment features 110 may be on adjacent sides, or the side having the male attachment feature 108 opposes the side having the female attachment feature 110. Two tile assemblies 100 may be connected together, using a male attachment feature 108 and a female attachment feature 110, to form a tile assembly 900.

Figure 10:
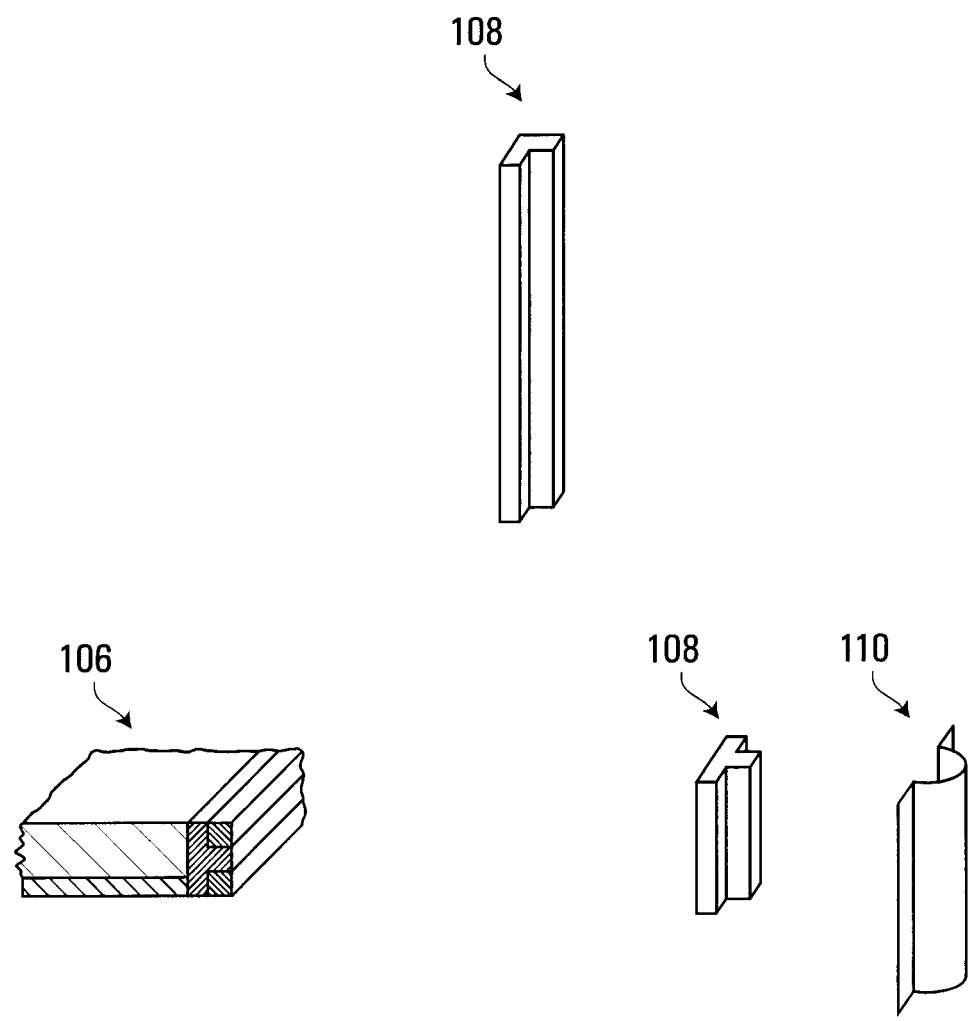
FIG. 10 is a schematic of an example male attachment feature and an example female attachment feature.

FIG. 10 is a schematic of an example male attachment feature 108 and an example female attachment feature 110. As depicted in FIG. 10, the male attachment feature 108 may have a protrusion with adjacent sides that are perpendicular. The male attachment feature 108 may have a generally rectangular protrusion. Similarly, the female attachment feature 110 may have a recess with adjacent sides that are perpendicular. The female attachment feature 110 may have a generally rectangular recess. In some embodiments, as depicted in FIG. 10, the attachment features 106 (e.g. male or female attachment feature 106 or 108) of the tile assembly 100 may extend along the entire side of the tile assembly 100. In some embodiments, the attachment features 106 (e.g. male or female attachment feature 106 or 108) may be only at certain positions of the side of the tile assembly 100. For example, the female attachment feature 110 may extend along an entire side of the tile assembly 100. As another example, the male attachment feature 108 may only be at one or more discrete positions of the side of the tile assembly 100.

Figure 11:
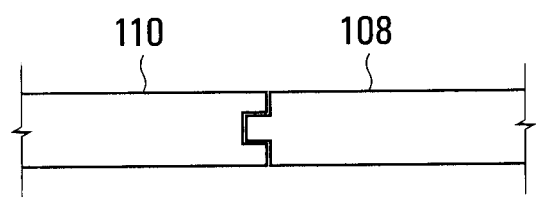
FIG. 11 is a schematic of an example male attachment feature and an example female attachment feature connected together.

FIG. 11 is a schematic of an example male attachment feature 108 and an example female attachment feature 110 connected together.

FIG. 12 is a schematic of other example attachment features of the tile assembly 100. The tile assemblies 1200a and 1200b have click-lock attachment features 106. As depicted in FIG. 12, a curved portion of an attachment feature 106 may be received in a curved portion of another attachment feature 106. The tile assembly 1200a or the tile assembly 1200b may have to be angled relative to the other to slide the tile assemblies 1200a and 1200b together for the attachment features 106 to connect. When the attachment features 106 connect, the tile assembly 1200a or the tile assembly 1200b may be lowered relative to the other. Upon lowering of the tile assembly 1200a or the tile assembly 1200*b* relative to the other, the click-lock attachment features 106 may engage. Their engagement may be indicated by a "click sound". As depicted in FIG. 12, the attachment features 106 of the tile assembly 1200*a* and 1200*b* may be joined at the edge of the tiles 102 of the tile assembly 1200*a* and 1200*b*.

Figure 12A:
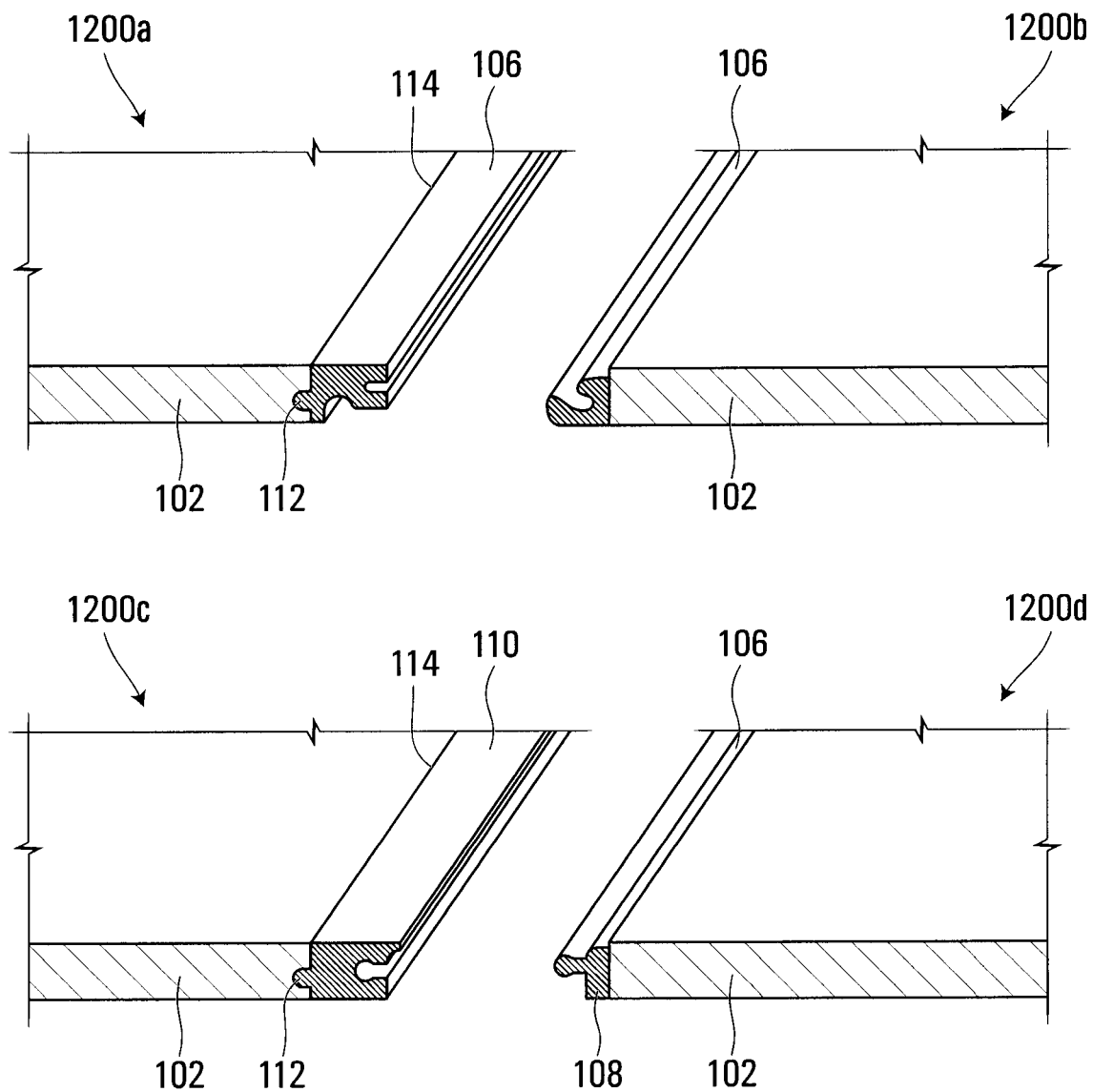
FIG. 12A is a schematic of another attachment feature of the tile assembly.

As depicted in FIG. 12A, the tile assemblies 1200*c* and 1200*d* have tongue and groove male and female attachment features 108 and 110. The male attachment feature 108 on tile assembly 1200*d* has a generally ground protrusion. Similarly, the female attachment feature 110 on tile assembly 1200*c* has a generally ground recess. The opening of the recess of the female attachment feature 110 may be smaller than the largest part of the male attachment feature 108. In some embodiments, the male attachment feature 108 may elastically deform when the male attachment feature 108 is being received in the female attachment feature 110. When the male attachment feature 108 is received in the female attachment feature 110, the male attachment feature 108 may return to its original shape. This may increase the tightness of the connection between the male and female attachment features 108 and 110, and may require additional force to separate the tile assemblies 1200*c* and 1200*d*. As depicted in FIG. 12, the attachment feature 110 of the tile assembly 1200*c* may be joined at the edge of the tile 102 and at the bottom of the tile 102 of the tile assembly 1200*c*. the attachment feature 108 of the tile assembly 1200*d* may be joined at the edge of the tile 102 of the tile assembly 1200*d*.

As depicted in FIG. 12A, the attachment feature 106 of tile assembly 1200*a* and the attachment feature 110 of tile assembly 1200*c* may have an edge that extends from the tile assembly 1200*a* and tile assembly 1200*c* to tile assembly 1200*b* and tile assembly 1200*d*, respectively. In some embodiments, the edge of the attachment features 106 and 110 may abut the edge of the tile 102 of the tile assembly 1200*b* and tile assembly 1200*d* to hide or camouflage the attachment feature line or seam, which may provide a clean and aesthetically pleasing finish when the tile assemblies 1200*a*, 1200*b*, 1200*c*, or 1200*d* are installed on a surface.

As depicted in FIG. 12A, there may be a routed recess 112 in the edge of the tiles 102 of the tile assemblies 1200*a* and 1200*c*. The recess 112 may be along one or more edges of the tiles of the tile assemblies 1200*a* and 1200*c*. The recess 112 may be along all edges of the tiles of the tile assemblies 1200*a* and 1200*c*. In some embodiments, the attachment feature attached to the edge of the tile 102 having the recess 112 may have a corresponding protrusion to be received in the recess 112 to connect the attachment feature to the tile 102. As depicted in FIG. 12A, the attachment feature 106 of tile assembly 1200*a* and the attachment feature 110 of the attachment feature 1200*c* has such a protrusion received in the recess 112 of the tiles 102 of the tile assembly 1200*a* and the tile assembly 1200*c*.

In some embodiments, when the tile and the attachment feature of a tile assembly are joined together, there may be a recess 114 defined between the top surface of the tile and the top surface of the attachment feature. For example, as depicted in FIG. 12 in tile assembly 1200*a* and tile assembly 1200*c*, the top surfaces of the tiles 102 and the top surfaces of the attachment features 106 and 110 define a recess 114. This may provide an appearance of conventional grout when the tile assemblies are installed on a surface. In some embodiments, the recess may be camouflaged (e.g. by scoring) to achieve an appearance similar to that of conventional grout.

Figure 12B:
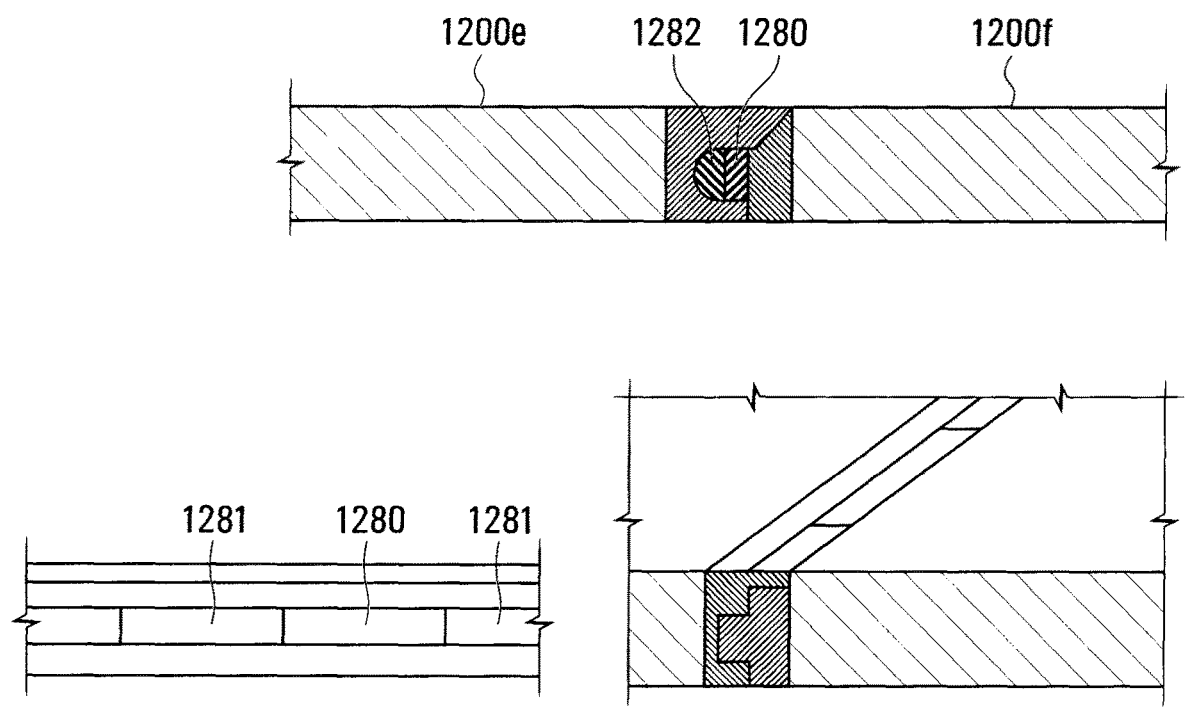
FIG. 12B is a schematic of another attachment feature of an example embodiment of a tile assembly.

FIG. 12B is a schematic of an alternative embodiment of a tongue and groove attachment feature of a tile assembly, in accordance with some embodiments. In the example embodiment of FIG. 12B, the tongue and groove attachment feature includes magnetic elements. As depicted, the tongue is a continuous tongue which is interspersed with magnets 1280 and polymers 1281 along the length of the tongue to form a solid tongue. Likewise, the groove attachment includes complementary magnets 1282, which facilitate the creation of a solid and strong connection between the tile assemblies 1200*e*, 1200*f*. In some embodiments, the connection between tile assemblies 1200*e*, 1200*f* may be sufficiently strong to prevent vertical lift between tile assemblies 1200*e*, 1200*f* in situations where the substrate beneath the tiling system is uneven. In some embodiments, the magnetic elements may be 1 mm thick, 2-3 mm wide, and 10-20 mm long and incrementally placed approximately every 3-4 inches. The foregoing dimensions represent merely an example embodiment, and that configurations with other dimensions are possible and contemplated herein. In particular, configurations may be chosen to meet whatever is required for a particular situation or layout.

Figure 13:
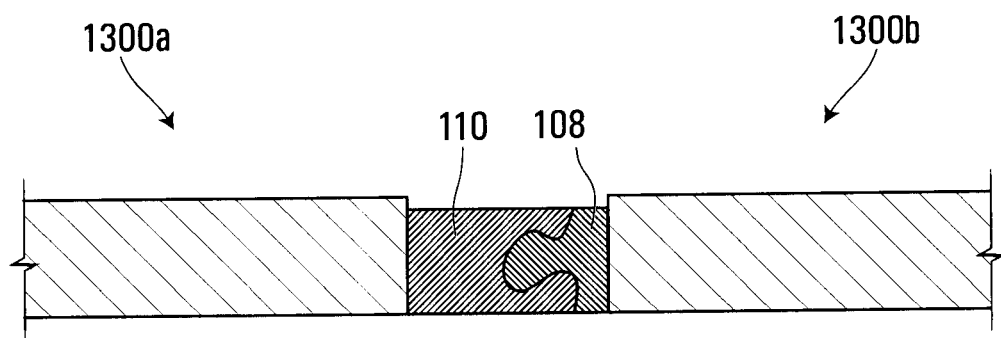
FIG. 13 is a schematic of another attachment feature of the tile assembly.

FIG. 13 is a schematic of another tongue and groove attachment feature of the tile assembly. The tile assembly 1300*a* has a female attachment feature 110, and the tile assembly 1300*b* has a male attachment feature 108. The male attachment feature 108 has a generally round protrusion, and the female attachment feature 110 has a generally round recess. The attachment features 108 and 110 may be designed so as to provide attachment sufficient to prevent disengagement during normal use, yet it may be possible to disengage the tile assemblies 1300*a* and 1300*b* by angular pressure without damaging the attachment features 108 and 110.

As depicted in FIG. 13, as an example, the maximum length of the connector defined by the attachment features 108 to 110 may be 3/16"-3/8".

Figure 14:
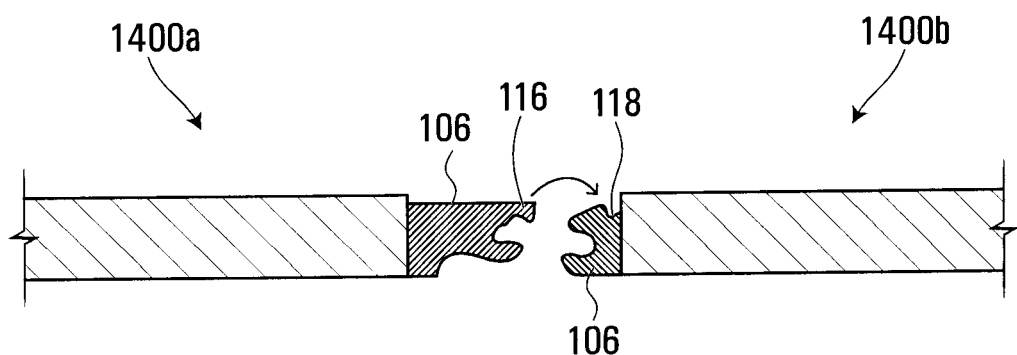
FIG. 14 and FIG. 15 are schematics of another attachment feature of the tile assembly.
Figure 15:
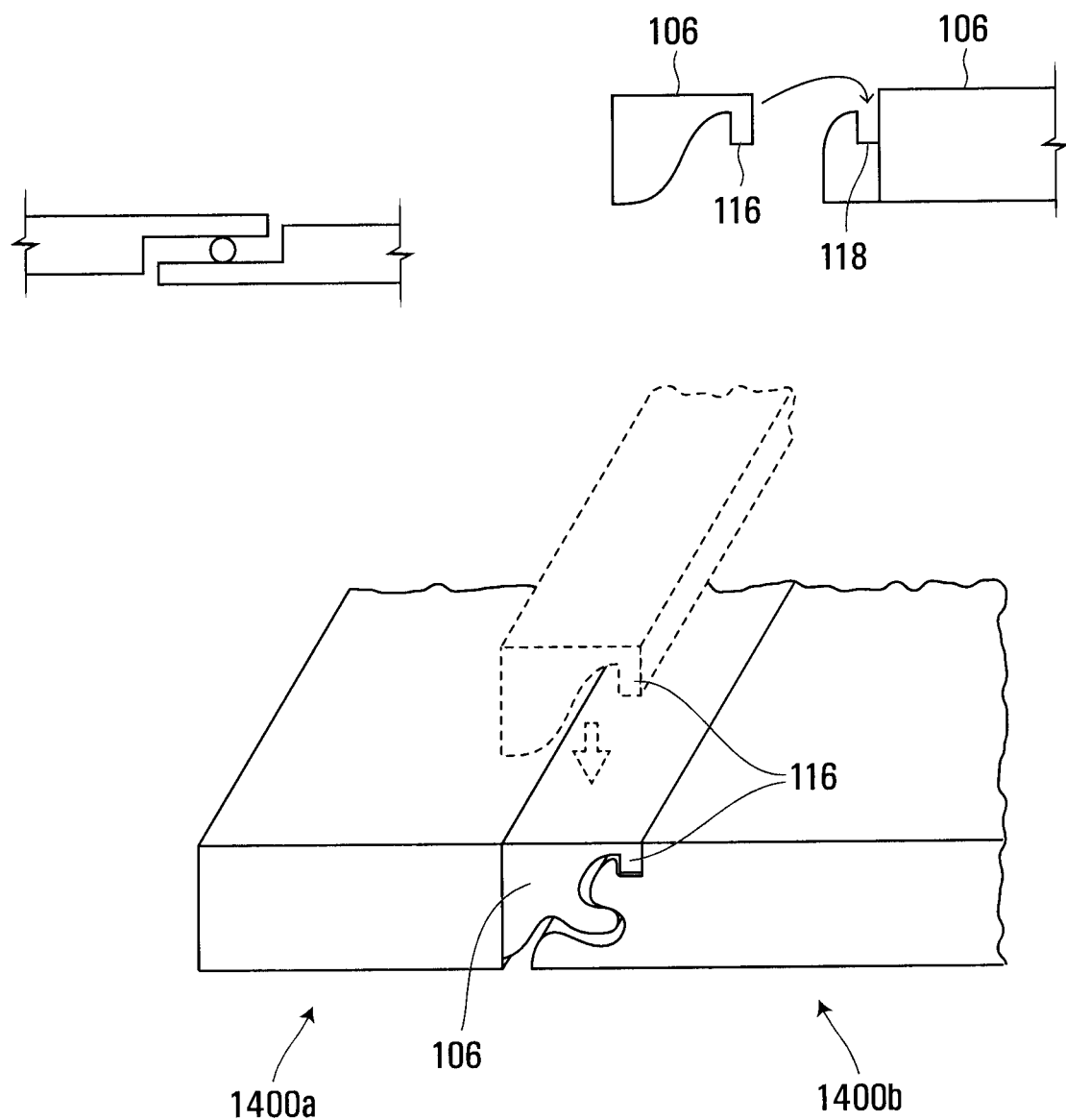

FIG. 14 and FIG. 5 are schematics of another attachment feature of the tile assembly. As depicted in FIG. 14, the tile assembly 1400*a* and the tile assembly 1400*b* has attachment features 106 that are complementary to each other. The attachment features 106 may have a click-lock feature. In some embodiments, as depicted in FIG. 14, the attachment feature 106 of the tile assembly 1400*a* may comprise a flange or lip 116 so as to maintain pressure and create a water seal or increase water resistance of the connection between the attachment features 106. The attachment feature 106 of the tile assembly 1400*b* may have a channel 118 for receiving the flange or lip 116.

Figure 16:
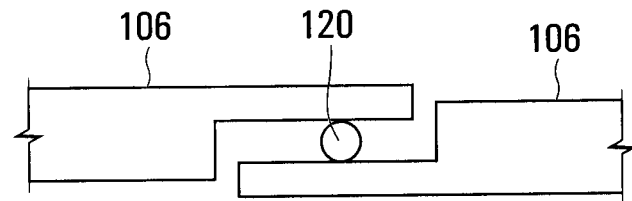
FIG. 16 is a schematic of another attachment feature of the tile assembly.
Figure 16:
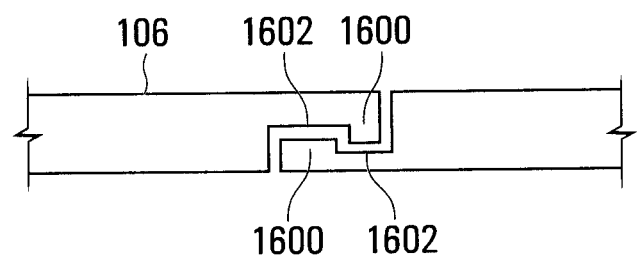

FIG. 16 is a schematic of another attachment feature of the tile assembly. The attachment features 106 of tile assemblies may be complementary and cooperatively configured to connect tile assemblies together to form a tile system. In some embodiments, an adhesive 120 may be used between the attachment features 106 to promote connection of the tile assemblies.

In some embodiments, the attachment features 106 may have flanges 1600. The flange 1600 of one attachment feature 106 may engage with the flange 1600 of another attachment feature 106 to promote connection of the tile assemblies. The flanges may be received in recesses 1602 defined in the attachment features 106.

Figure 17:
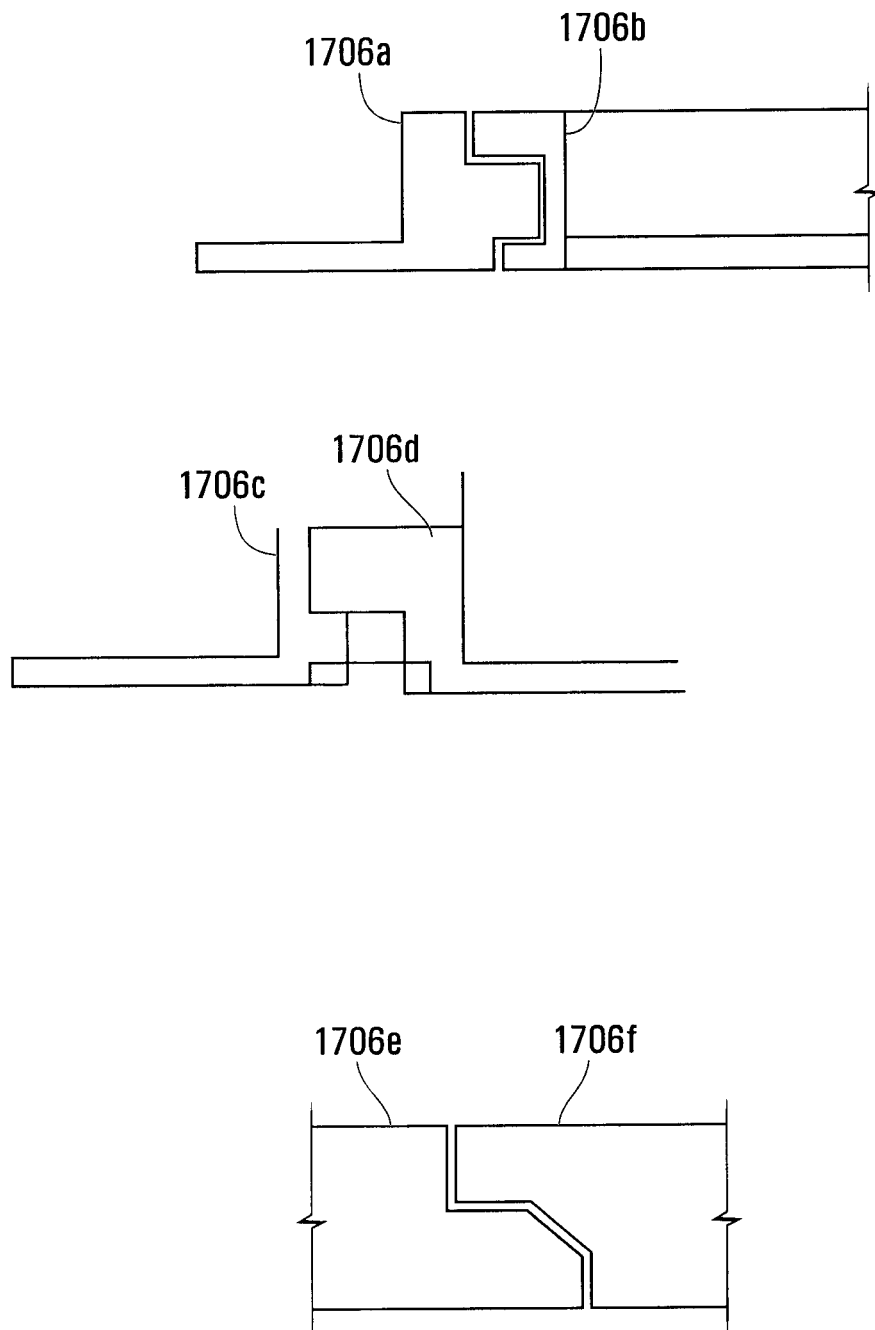
FIG. 17 is a schematic of other example attachment features of the tile assembly.

FIG. 17 is a schematic of other example attachment features of the tile assembly. As depicted in FIG. 17, attachment features 1706*a* and 1706*b* each have protrusions, and recesses for receiving the protrusions of the other. As depicted, the protrusion of attachment feature 1706*a* is below the protrusion of attachment feature 1706*b*, and the recess of attachment feature 1706*a* is above the recess of attachment feature 1706*b*.

As depicted in FIG. 17, attachment features 1706*c* and 1706*d* may be generally similar to attachment features 1706*a* and 1706*b*, except the attachment features 1706*c* and 1706*d* further comprise a hook and loop or pressure-sensitive adhesive (PSA) for connecting attachment features 1706*c* and 1706*d* together. One of attachment features 1706*c* and 1706*d* may have the hook or loop or PSA, and the other one of attachment features 1706*c* and 1706*d* may have the corresponding hook or loop or PSA. In some embodiments, the hook and loop or PSA for connecting attachment features may include one or more magnetic elements. In some embodiments, the hook and loop may be made entirely of magnetic elements. In some embodiments, magnetic elements may be interspersed in the hook and loop together with other materials. The magnetic elements may be arranged so as to provide complementary magnets to generate an attractive force between the hook and loop.

As depicted in FIG. 17, attachment features 1706*e* and 1706*f* may be beveled, chamfered, or otherwise shaped to promote connecting the attachment features 1706*e* and 1706*f* together.

Figure 18:
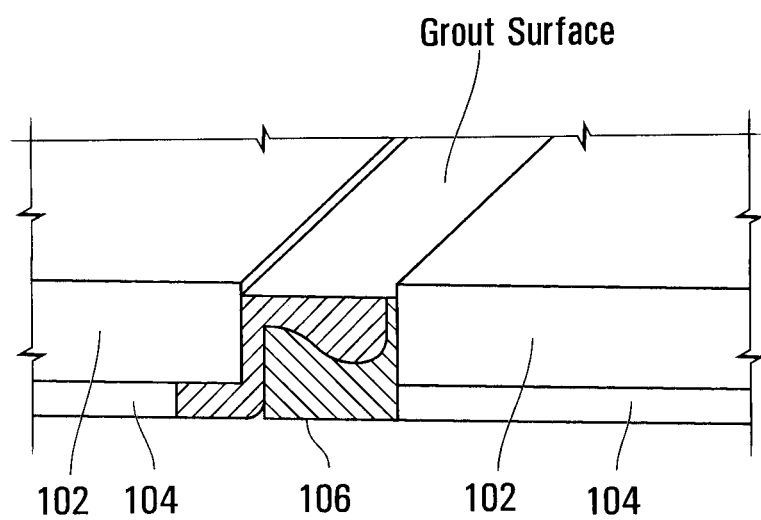
FIG. 18 is a schematic of another attachment feature of the tile assembly.

FIG. 18 is a schematic of another attachment feature of the tile assembly. The attachment features 106 depicted in FIG. 18 may be made of polymer, and may have a "click-lock" feature. As depicted in FIG. 18, the attachment features 106 may be integrally formed with the stabilizer 104. The stabilizer 104 and the attachment features 106 may be joined to the tiles 102. In some embodiments, the thickness of the stabilizer 104 may be less than 1/32" or may be greater than 1/32". In some embodiments, the thickness of the stabilizer 104 may be from 1/8" to 3/4". In some embodiments, the thickness of the tile 102 may be approximately 2 mm. In some embodiments, the thickness of the tile 102 may be greater than 2 mm, such as approximately 4 mm. In some embodiments, all bonds between the tile 102 and the stabilizer 104 and/or attachment feature 106 may be strong, and may keep the tile assemblies connected together when forces are applied on the tile assemblies.

In some embodiments, it may be desirable to eliminate or reduce the visible line where the attachment features 106 come together on the top surface of the connector or grout surface.

Figure 19:
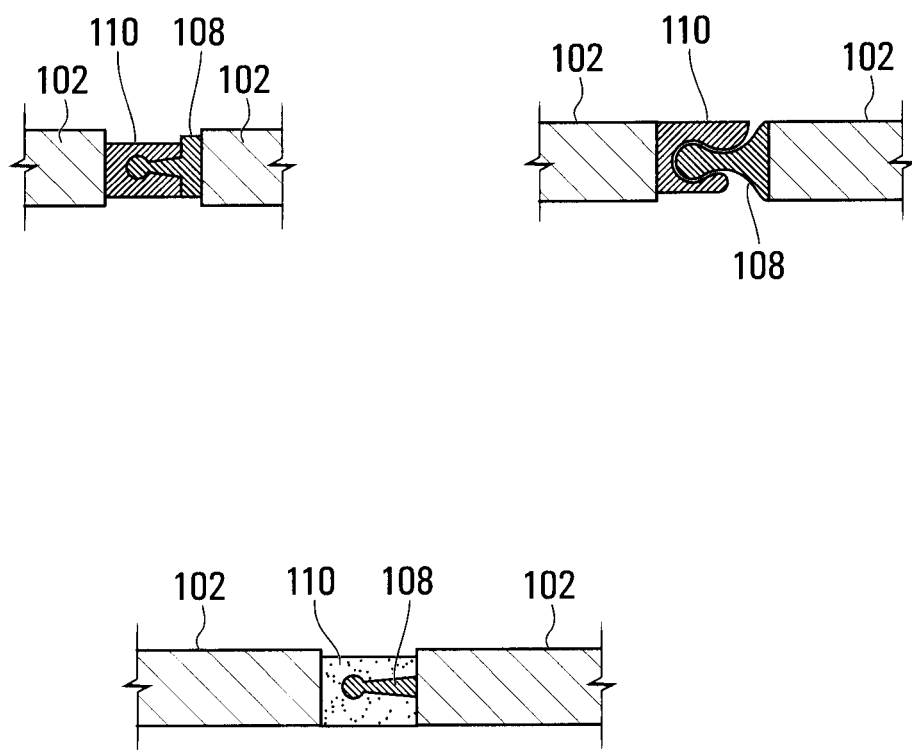
FIG. 19 is a schematic of another attachment feature of the tile assembly.

FIG. 19 is a schematic of three example attachment features of the tile assembly. The attachment features 106 depicted in FIG. 19 may be cooperative male and female attachment features 108 and 110. The male attachment feature 108 may have a bulbous protrusion, and the female attachment feature 110 may have a similarly shaped recess for receiving the male attachment feature 108. As depicted in FIG. 19, it may be possible at the entire attachment features 108 and 110 may be contained within the side or edge of the tile 102, such that the attachment features 108 or 110 do not extend beyond the top or bottom surface of the tile 102. In some embodiments, the attachment features 108 and 110 may not be injection moulded to the tile 102.

Figure 20:
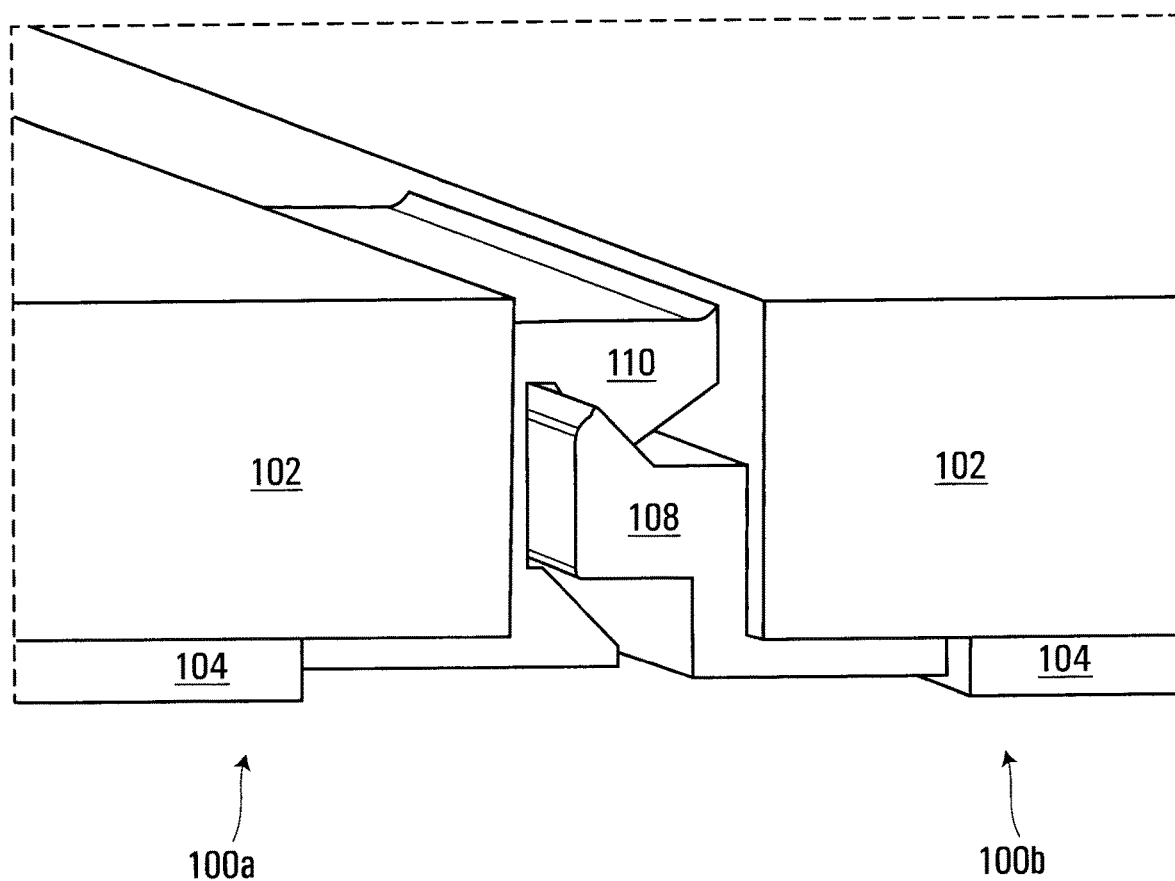
FIG. 20 is a schematic of two tile assemblies connected together with attachment features.

FIG. 20 is a schematic of two tile assemblies 100*a* and 100*b* connected together with attachment features. FIG. 20 depicts complementary attachment features 108 and 110. The attachment features 108 and 110 may have a click-lock feature. The attachment feature 108 may have a ridge received in a corresponding channel of the attachment feature 110. As depicted in FIG. 20, the attachment features 108 and 110 may only be at one part of the edge of the tile 102, rather than extend along the entire edge of the tile 102.

In some embodiments, as depicted in FIG. 20, the attachment features 108 and 110 may be connected to the edge of the tile 102 and the bottom of the tile 102, and may be separate from the stabilizer 104, which may also be connected to the bottom of the tile 102.

Figure 21:
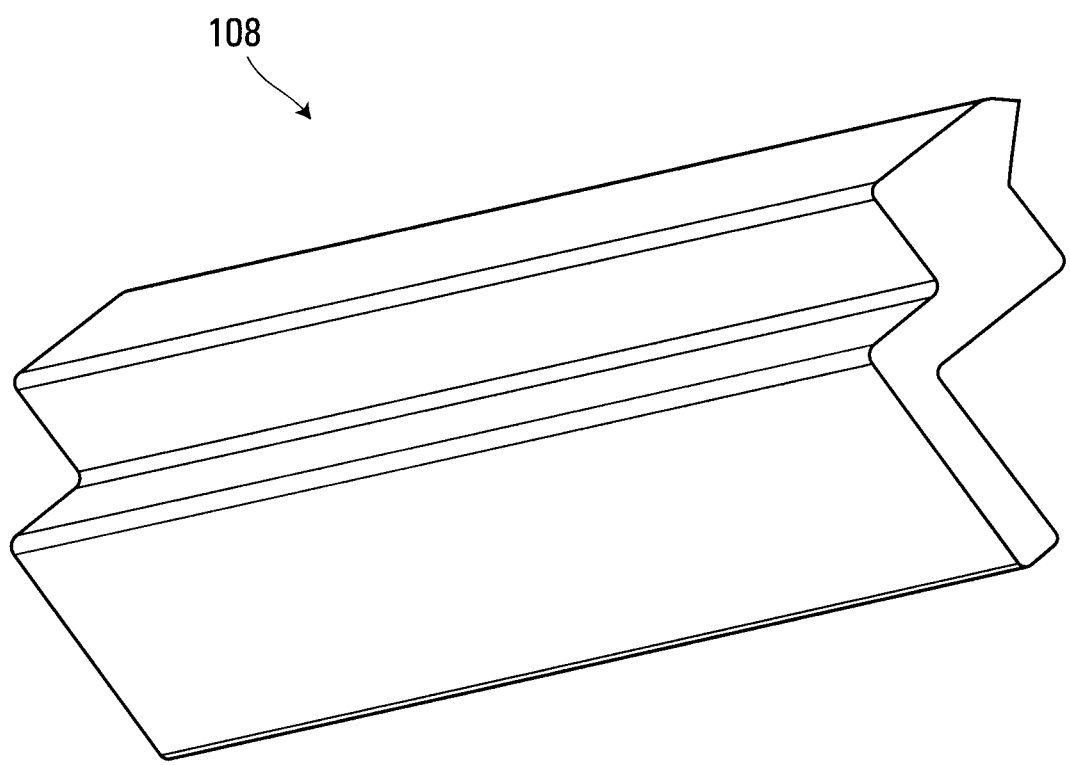
FIG. 21 is a schematic of the male attachment feature of FIG. 20.

FIG. 21 is a schematic of the attachment feature 108 of FIG. 20.

Figure 22:
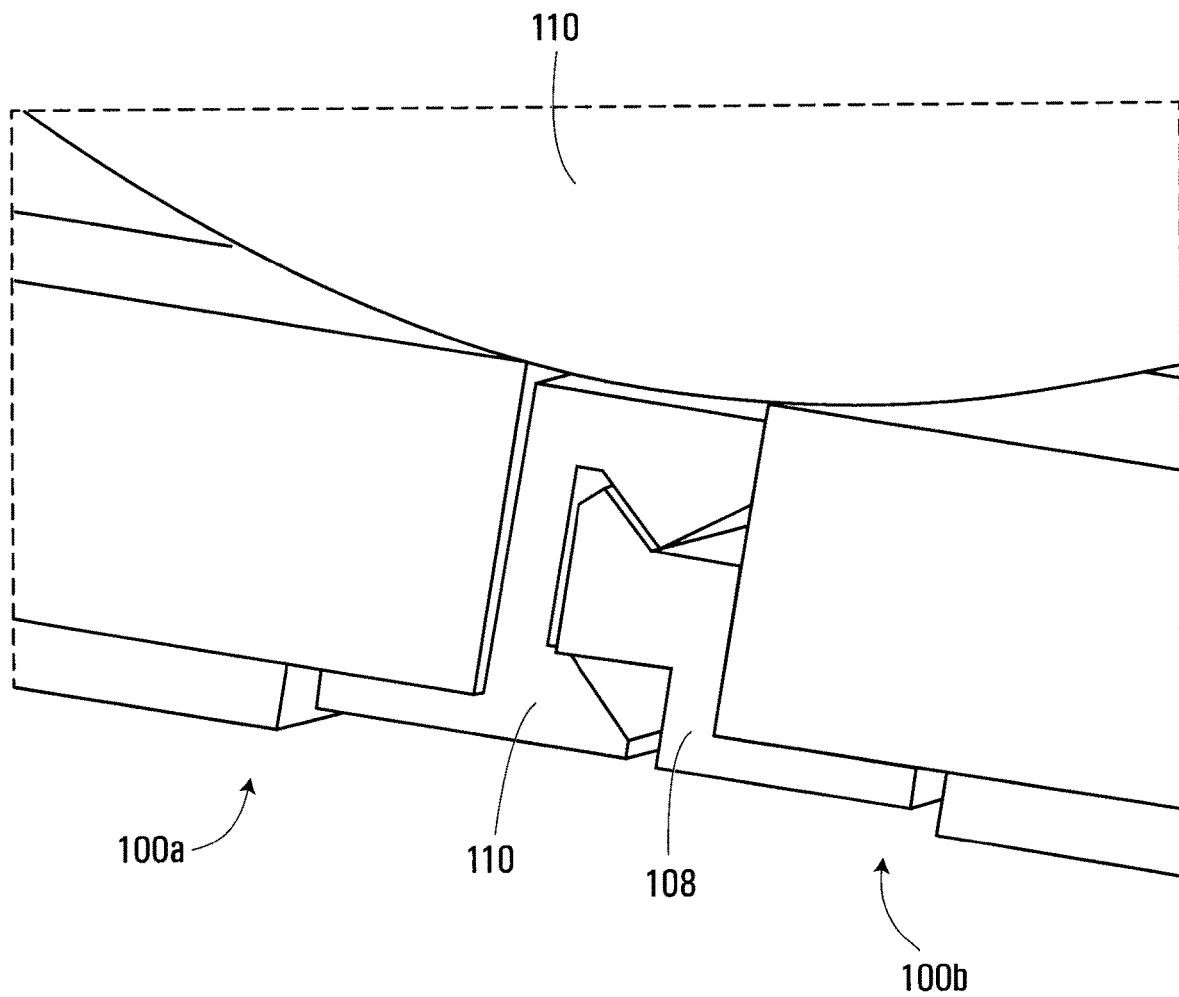
FIG. 22 is a schematic of attachment features connecting two tile assemblies together.

FIG. 22 is a schematic of the attachment features 108 and 110 connecting two tile assemblies 100*a* and 100*b* together. As depicted, a wheel is rolling over the connector defined by the attachment features 108 and 110. In some embodiments, the connection of the attachment features 108 and 110 may be able to remain connected and maintain connection of the tile assemblies when a rolling load or rolling stress is applied.

Figure 23:
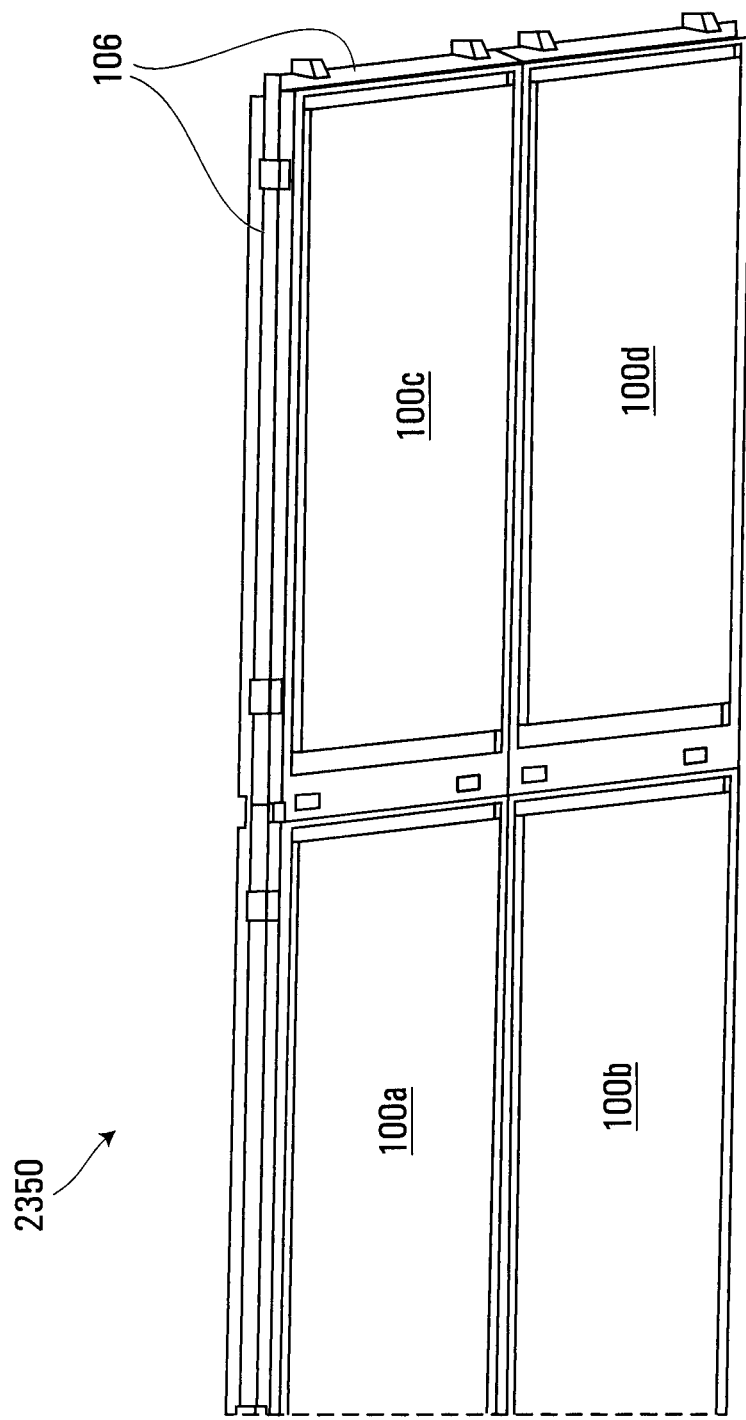
FIG. 23 is a schematic of a tile system formed from four tile assemblies.

FIG. 23 is a schematic of a tile system 2350 formed from four tile assemblies 100*a*-100*d*. As depicted, the attachment features 106 may extend along the entire edges of the tile assemblies.

Figure 24:
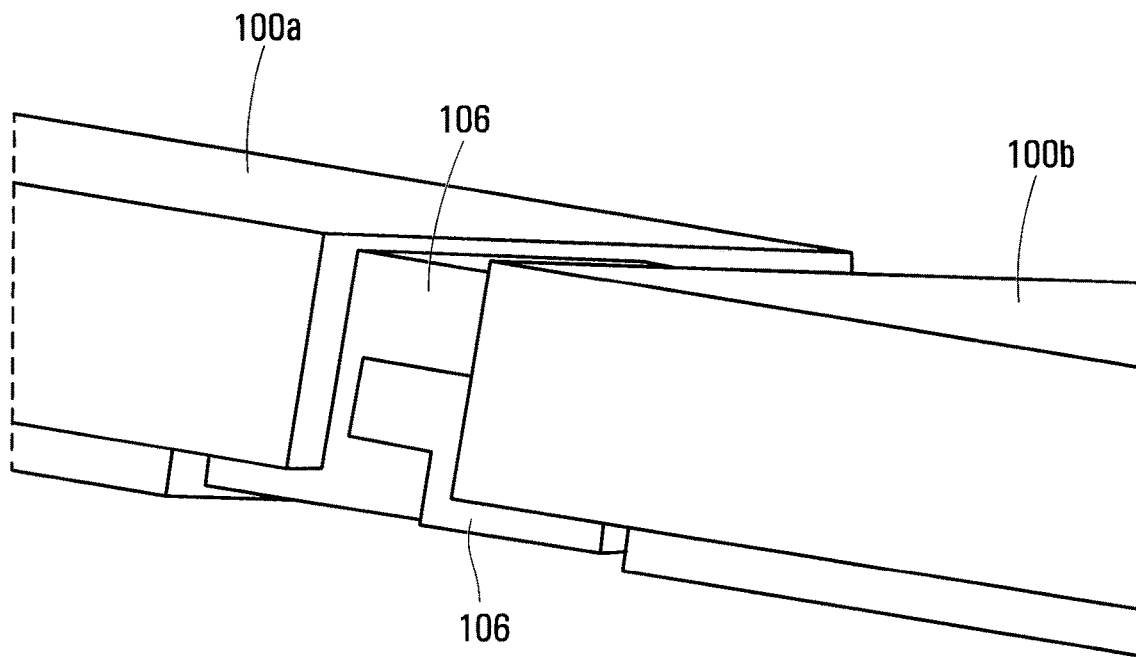
FIG. 24 is a schematic of two tile assemblies joined together with attachment features.

FIG. 24 is a schematic of two tile assemblies 100*a* and 100*b* joined together with attachment features 106.

Figure 25:
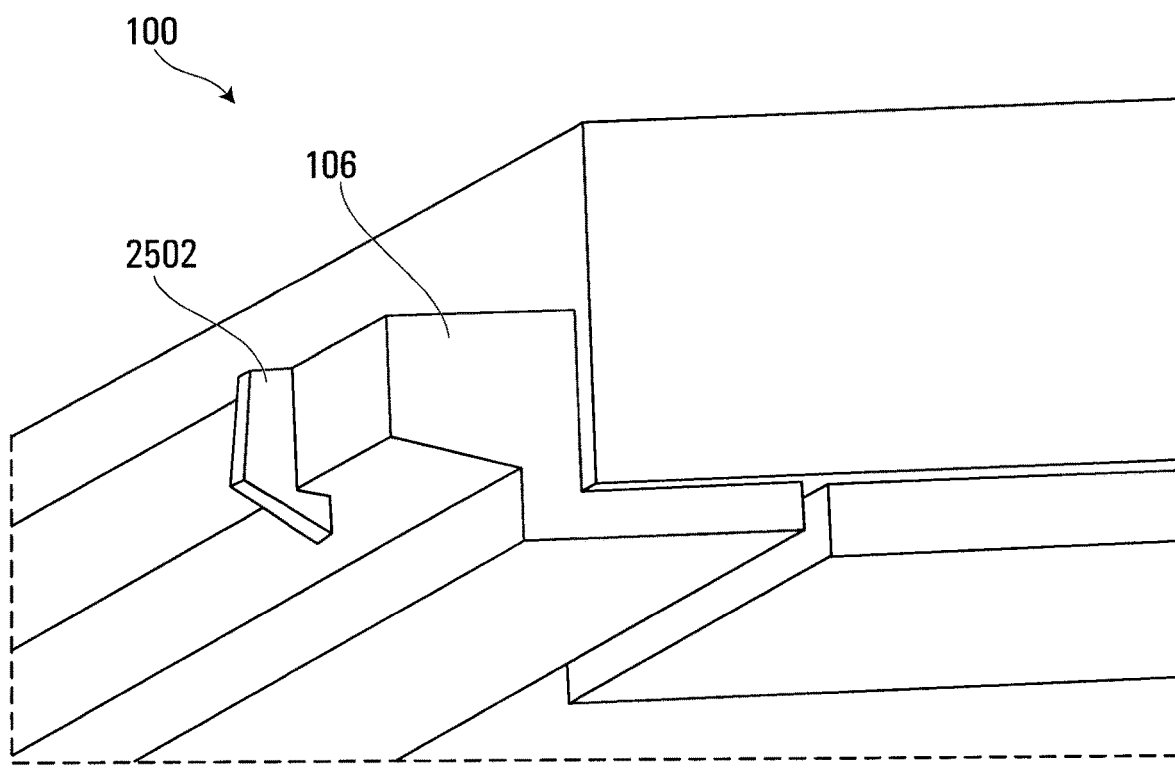
FIG. 25 is a schematic of a tile assembly having an attachment feature.

FIG. 25 is a schematic of a tile assembly 100 having an attachment feature 106. As depicted in FIG. 25, the attachment feature 106 may comprise a rib 2502 to promote connecting with a corresponding attachment feature 106 on another tile assembly.

Figure 26:
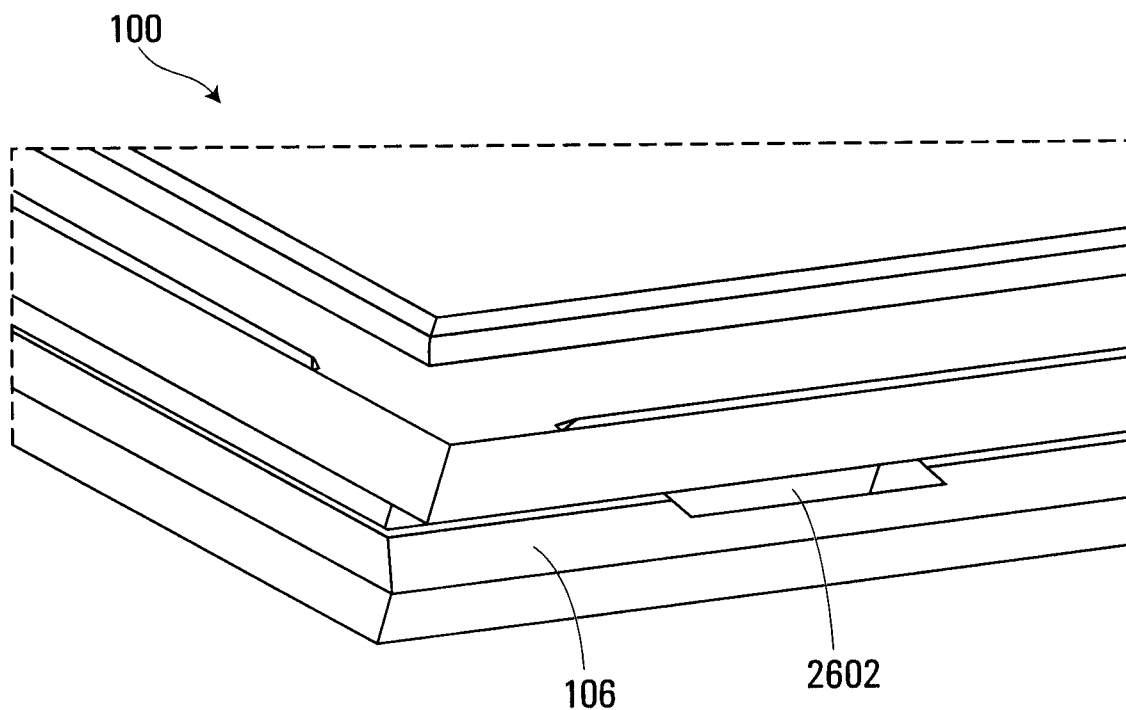
FIG. 26 is a schematic of a tile assembly having an attachment feature.

FIG. 26 is a schematic of a tile assembly 100 having an attachment feature 106. As depicted in FIG. 26, the attachment feature 106 may comprise a slot 2602 to promote connecting with a corresponding attachment feature 106 on another tile assembly.

Figure 27:
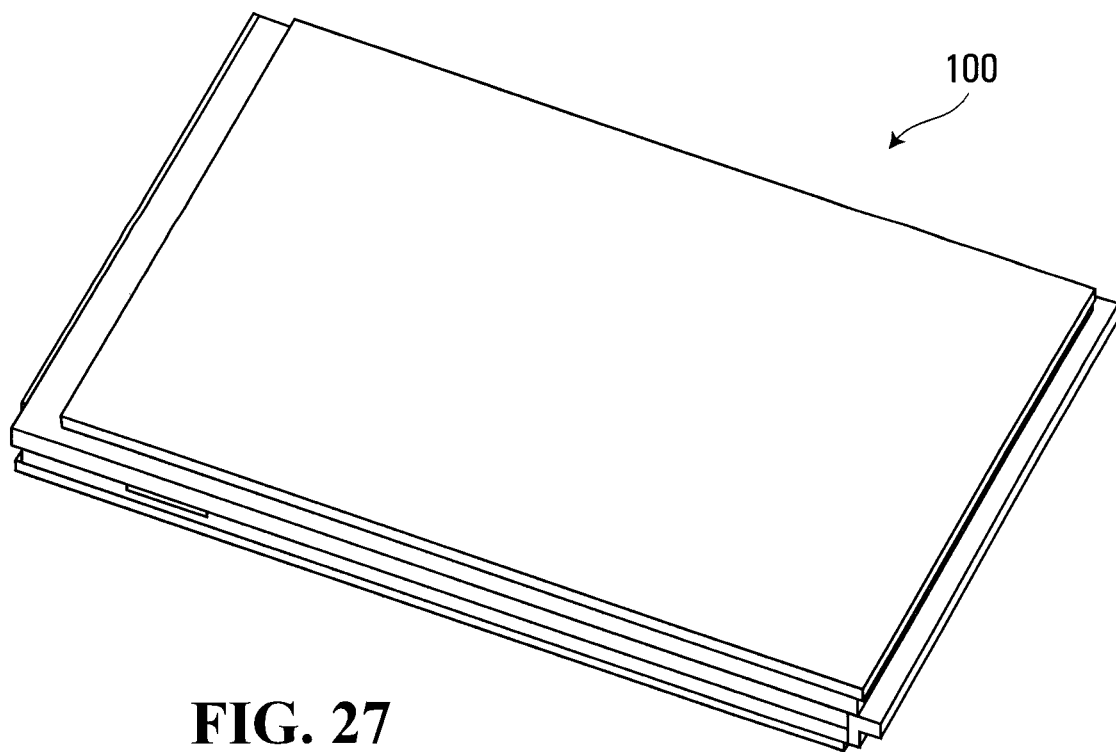
FIG. 27 is a schematic of a tile assembly.

FIG. 27 is a schematic of a tile assembly 100.

Figure 28:
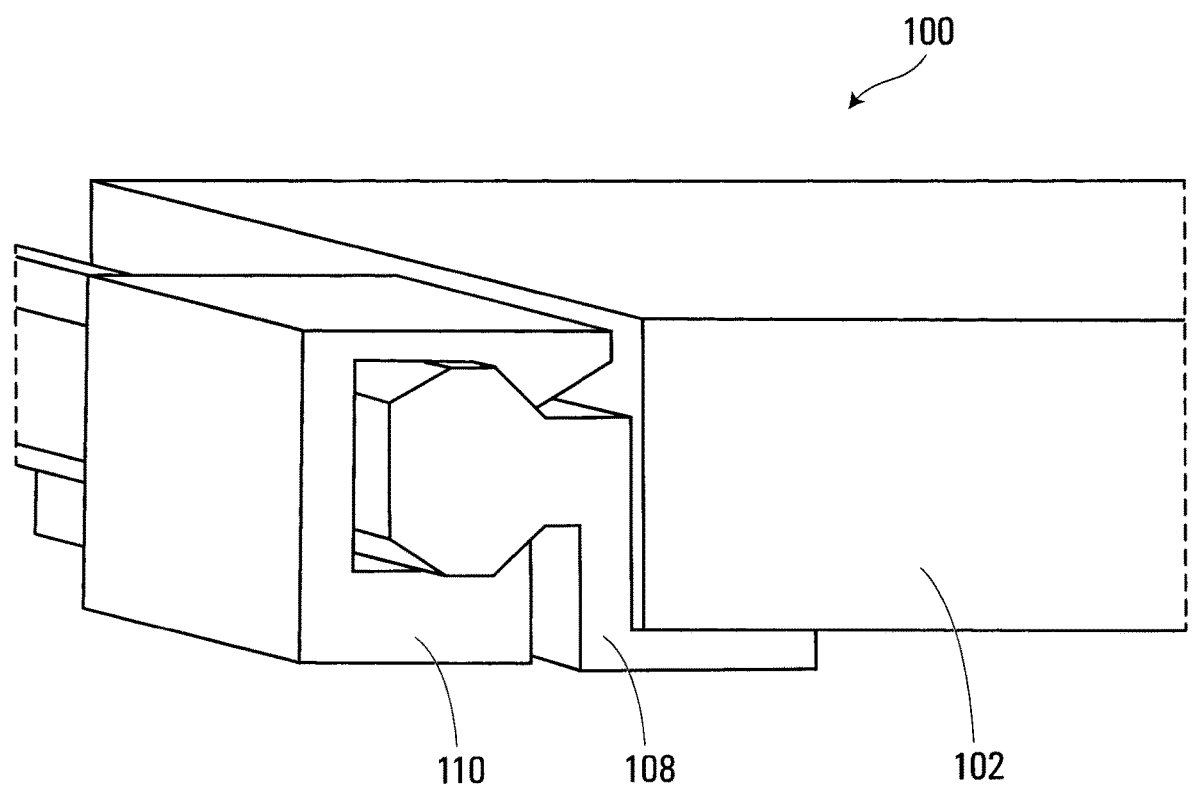
FIG. 28 is a schematic of a tile assembly having a male attachment feature that is connected with a female attachment feature.

FIG. 28 is a schematic of a tile assembly 100 having a male attachment feature 108 that is connected with a female attachment feature 110. As depicted in FIG. 28, the male attachment feature 108 has a bulbous protrusion that may be generally round, and may have chamfered or bevelled sides for fitting into a recess of the female attachment feature 110 having a generally similar shape.

As depicted in FIG. 28, in some embodiments, one of the attachment features may extend along an entire side or a portion of an entire side of a tile, and the other of the attachment features may be at discrete positions along the side of the tile. For example, the female attachment feature 110 depicted in FIG. 28 may be at discrete positions along a side of a tile. There may be one or more such female attachment features 110 along a side of the tile. These female attachment features 110 may not be connected or joined together, and the male attachment feature 110 depicted in FIG. 28 may extend along a side or a portion of a side of a tile 102. Accordingly, when connecting two tile assemblies together, there may be a male attachment feature 108 for attaching with the one or more female attachment features 110 even if the tile assemblies are not perfectly aligned with each other during installation, which may promote connection of the two tile assemblies and ease of use of the tile assemblies.

Figure 29:
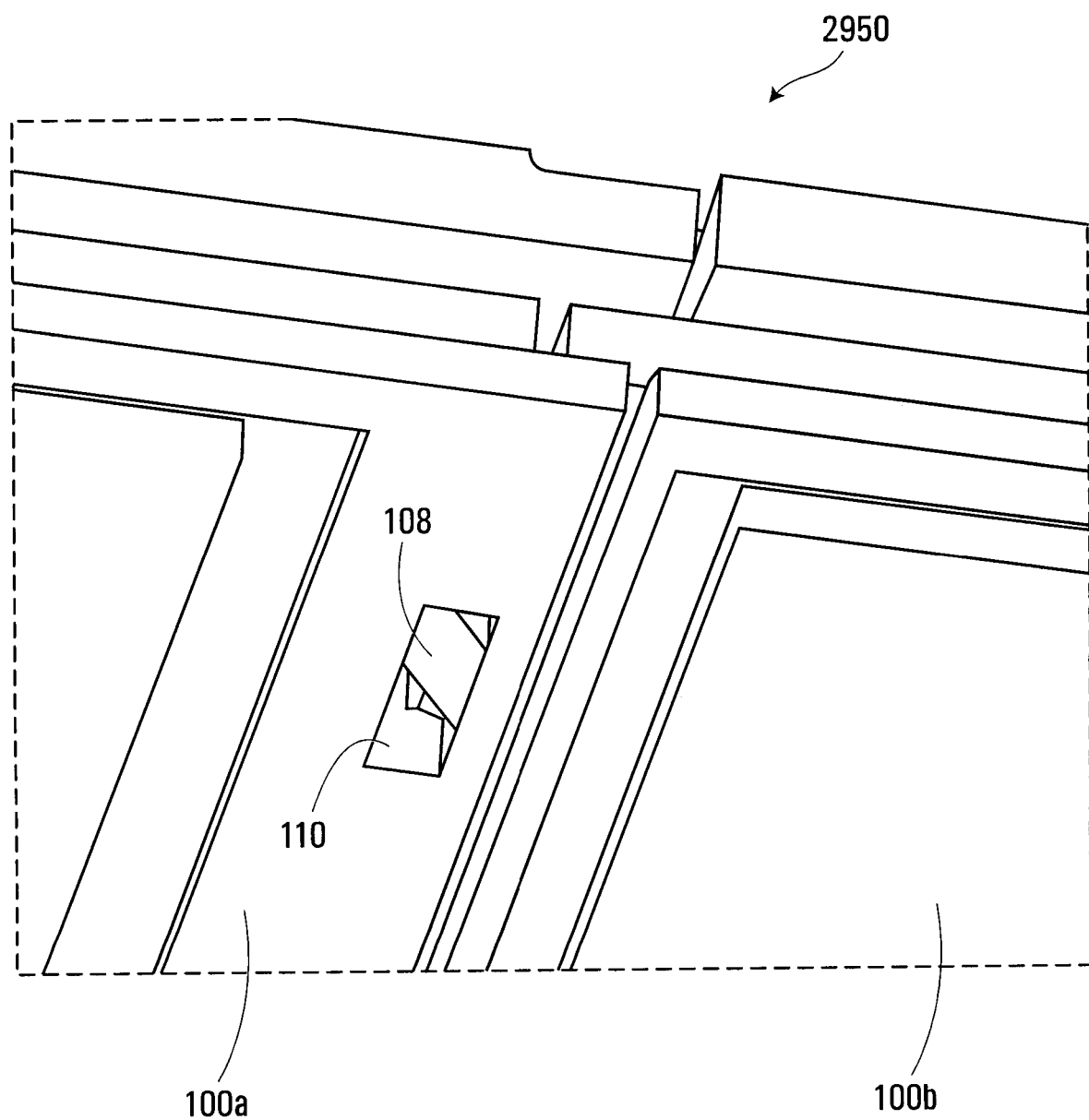
FIG. 29 is a schematic of two tile assemblies connected together by a male attachment feature and a female attachment feature to form a tile system.
Figure 30:
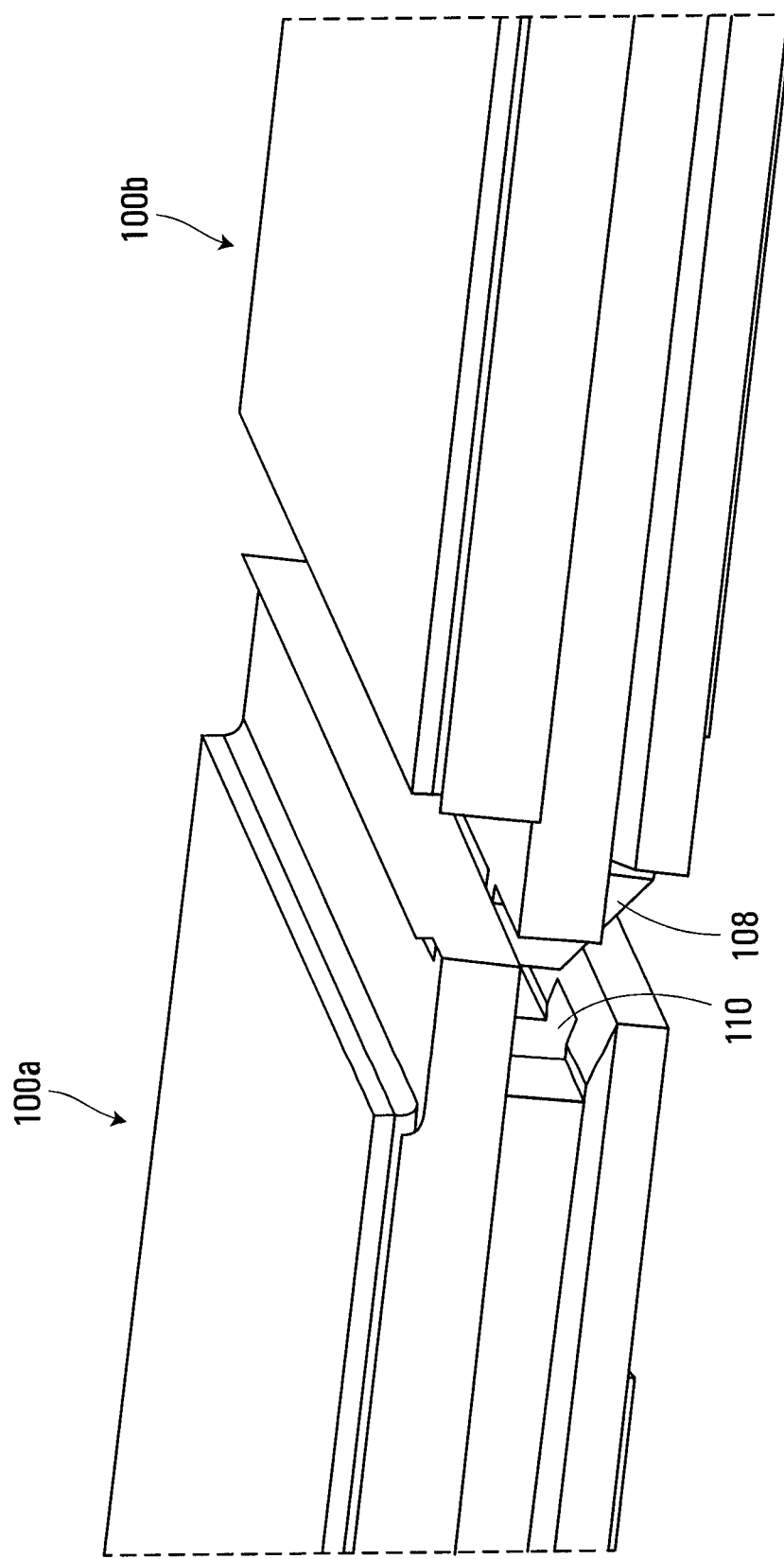
FIGS. 30-34 depict the tile assemblies of FIG. 29 separated from each other.
Figure 31:
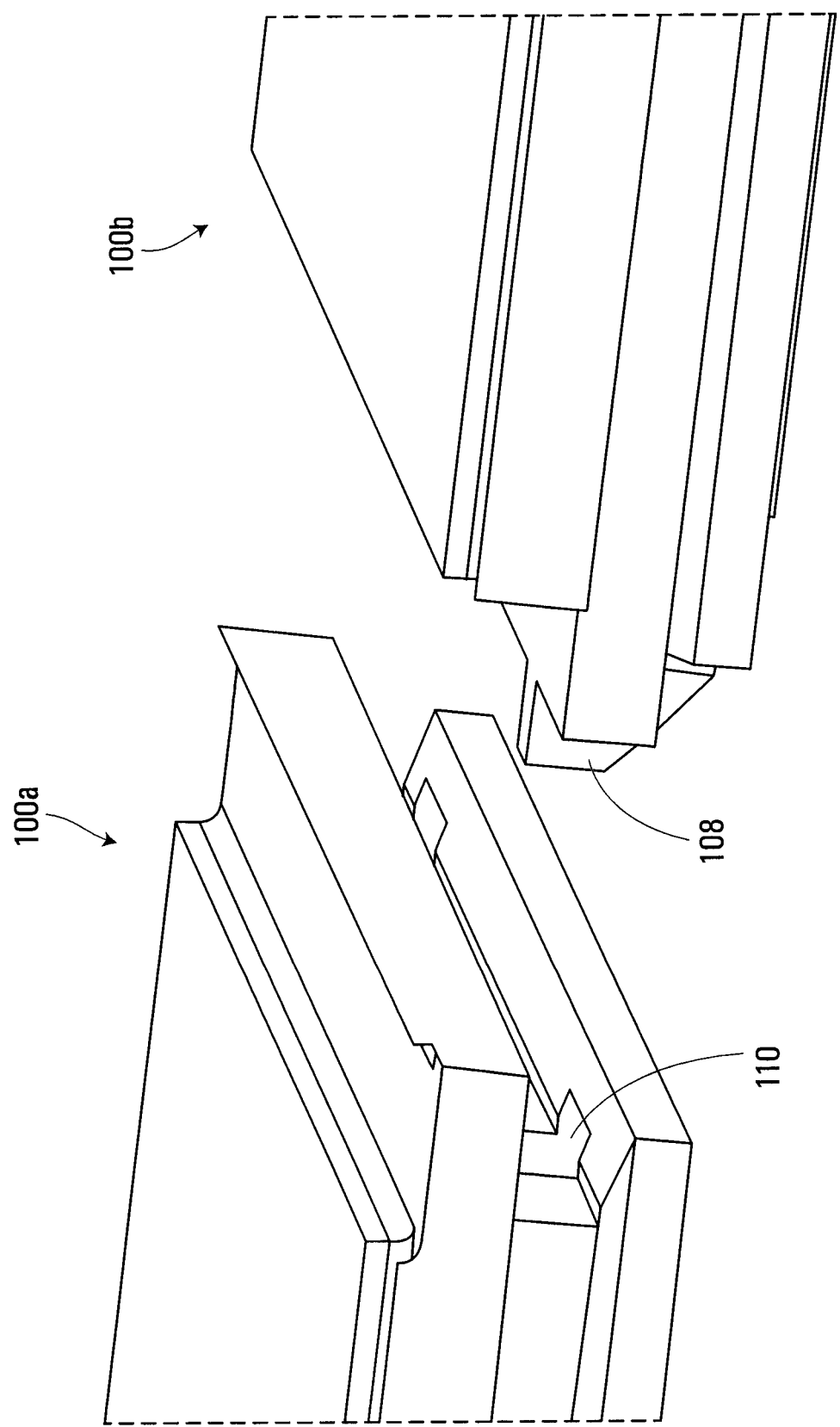
Figure 32:
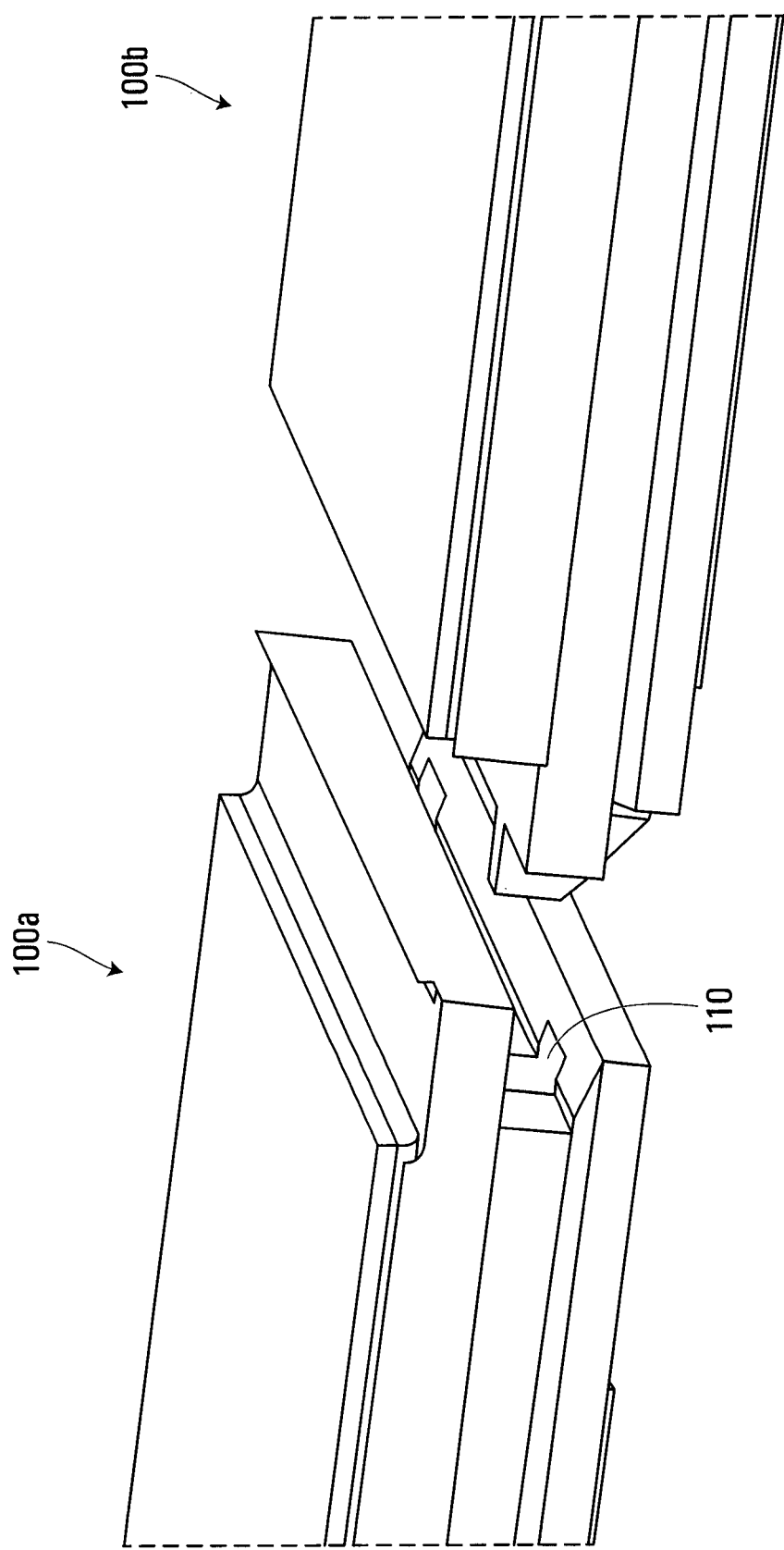
Figure 33:
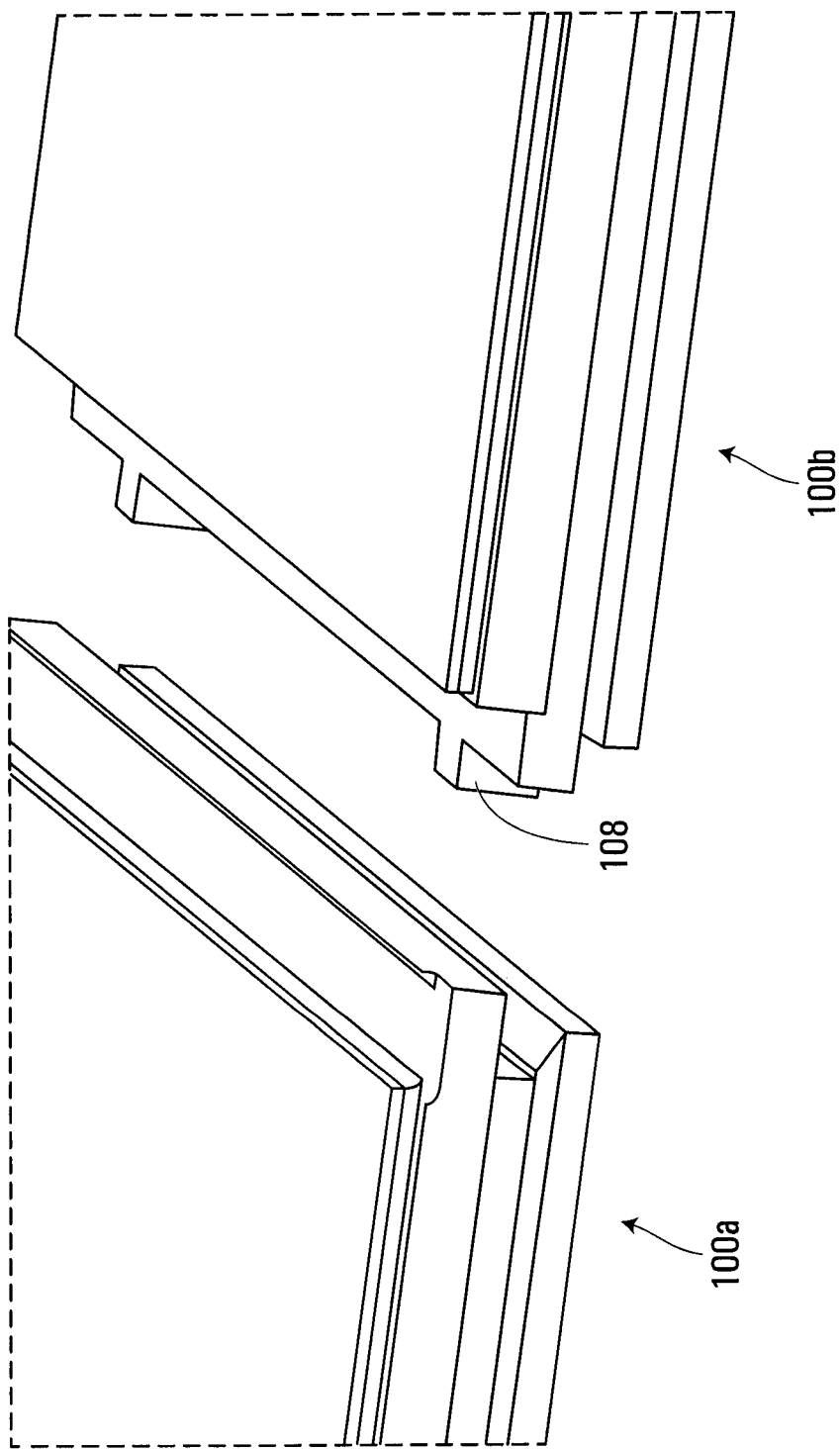
Figure 34:
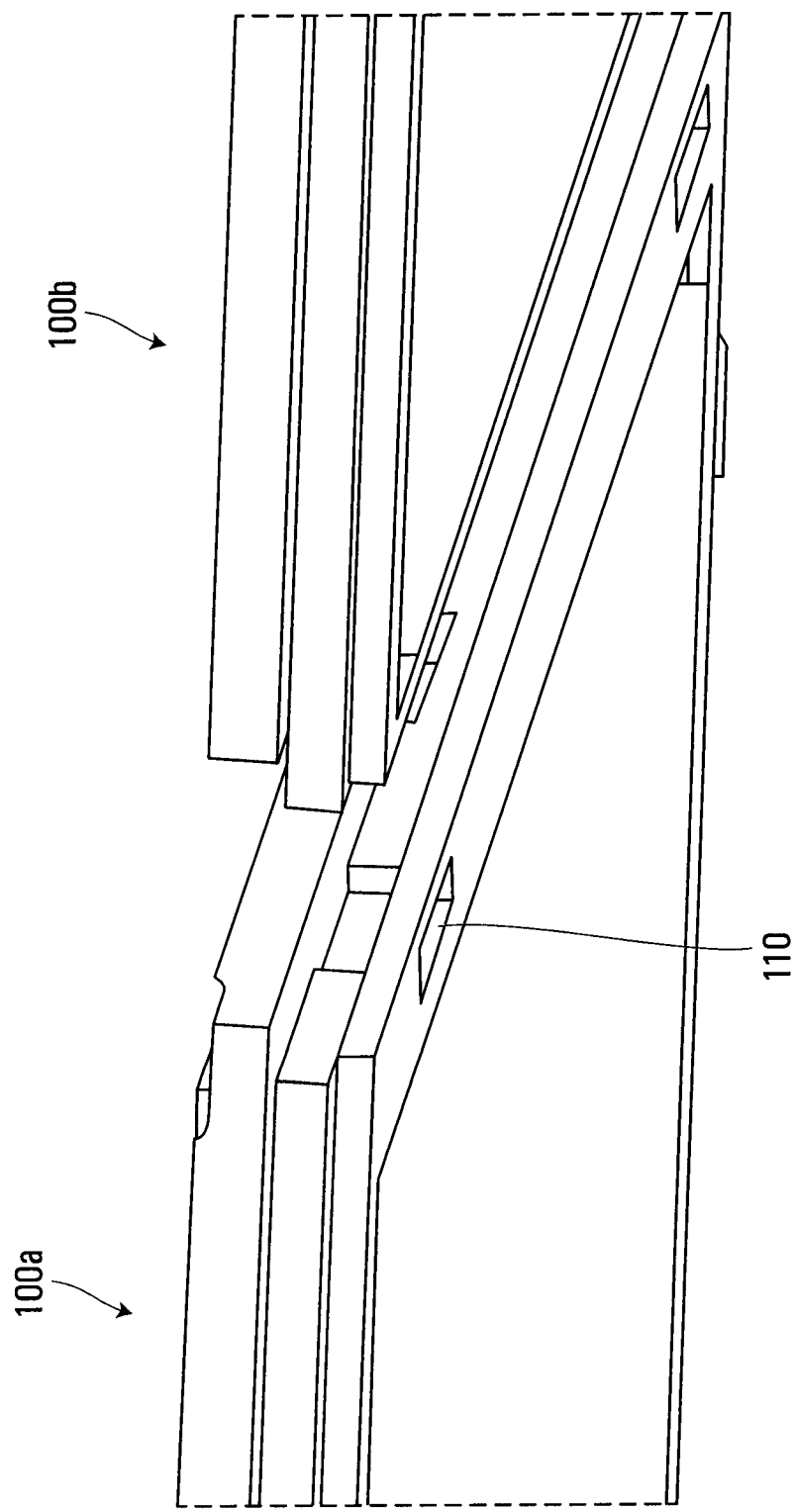

FIG. 29 is a schematic of two tile assemblies 100*a* and 100*b* connected together by male attachment feature 108 and female attachment feature 110 to form a tile system 2950.

FIGS. 30-34 depict the tile assemblies 100*a* and 100*b* of FIG. 29 separated from each other. As depicted in FIGS. 30-34, the male attachment feature 108 may have a ridge, lip, or tongue, on a protrusion that may be received in a slot or channel of the female attachment feature 110. The protrusion of the male attachment feature 108 may be received in a recess of the female attachment feature 110 having a similar shape as the protrusion. The top surface of the female attachment feature 110 way extend from tile assembly 100a to tile assembly 100b such that the leading edge of the female attachment feature 110 is proximate to the tile assembly 100b to camouflage or hide this leading edge. As depicted, the top surface of the female attachment feature 110 is below the top surfaces of the tiles of tile assembly 100a and tile assembly 100b, such that the connector or grout formed between the tile assemblies 100a and 100b may have a recessed appearance. As depicted, the tile assemblies 100a and 100b have discrete male and female attachment features 108 and 110 that do not extend along an entire side of the tile. Rather, there may be one or more than one male and female attachment features 108 and 110 for connecting the two tile assemblies 100a and 100b.

Figure 35:
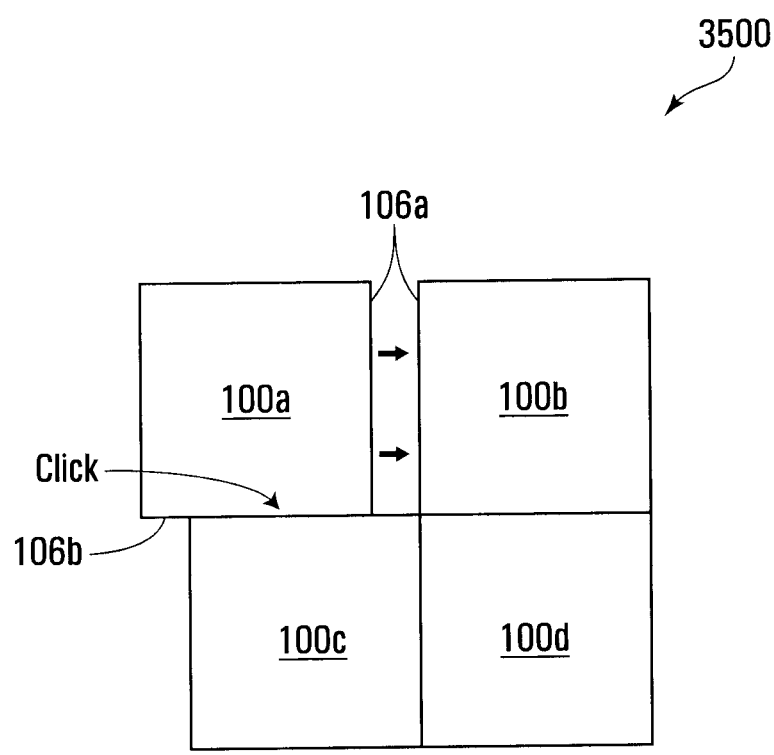
FIG. 35 is a schematic of attaching a tile assembly to another tile assembly to form a tile system.

FIG. 35 is a schematic of attaching a tile assembly 100a to other tile assembles 100b and 100c to form a tile system 3500. In some embodiments, as depicted in FIG. 35, the edge of tile assembly 100a facing tile assembly 100b may comprise an attachment feature 106a that may be a tongue or a groove corresponding to the attachment feature on tile assembly 100b facing tile assembly 100a, and the edge of tile assembly 100a facing tile assembly 100c may comprise an attachment feature 106b that may have a click-lock feature corresponding to the attachment feature on tile assembly 100c facing tile assembly 100a.

To connect the tile assembly 100a to the assemblies 100b and 100c, in some embodiments, the tile assembly 100a may first be connected to tile assembly 100c by angling the tile assembly 100a relative to the tile assembly 100c and connecting the attachment feature 106b to the corresponding attachment feature of tile assembly 100c. After the attachment feature 106b of tile assembly 100a connects with the corresponding attachment feature of tile assembly 100c, the tile assembly 100a may be lowered to be generally level with the tile assembly 100c. Then, the tile assembly 100a may be moved towards tile assembly 100b, while maintaining connection with tile assembly 100c. Then, the attachment feature 106a may connect the tile assembly 100a to tile assembly 100b by connecting with the corresponding attachment feature of tile assembly 100b. In some embodiments, tile assembly 100a may not be directly connected to tile assembly 100d, but tile assembly 100d may be connected to tile assemblies 100b and 100c. With the tile assemblies connected together, the tile assemblies may form a tile system 3500.

Figure 36:
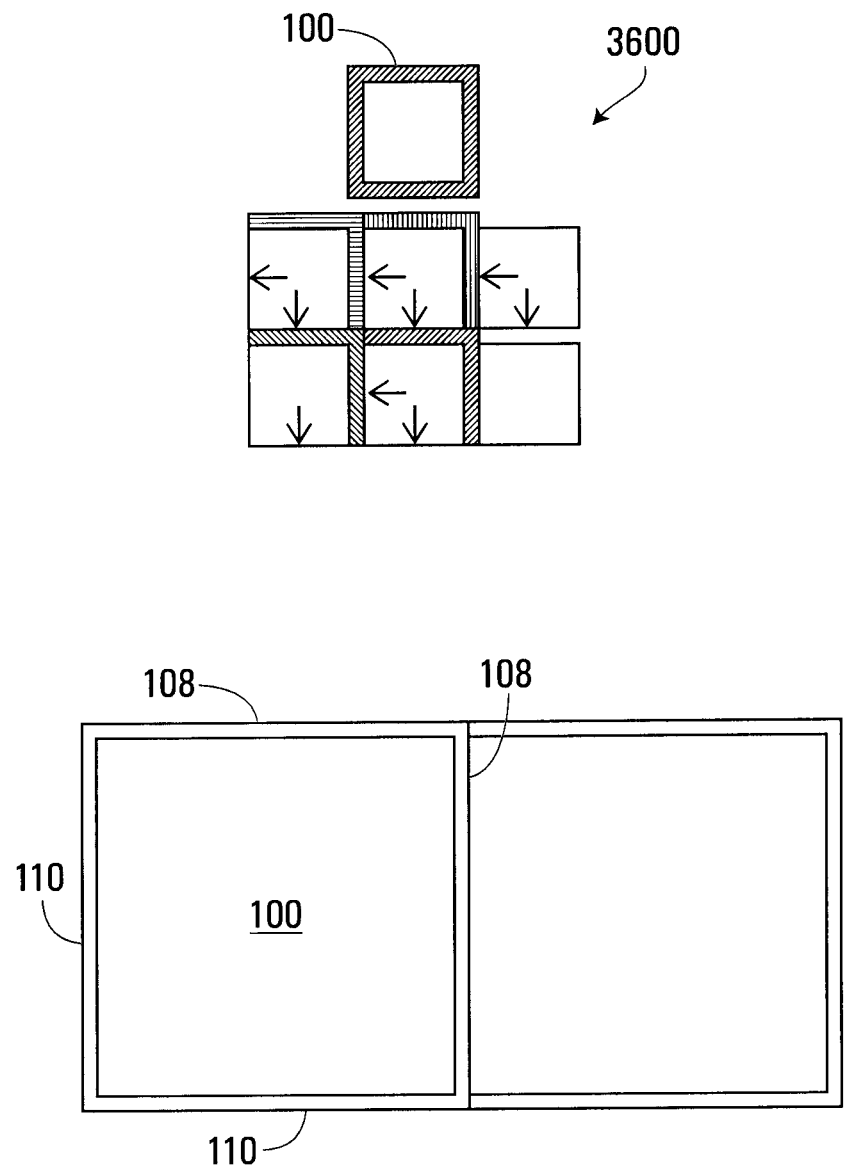
FIG. 36 is a schematic of attaching a tile assembly to another tile assembly to form a tile system.

FIG. 36 is a schematic of attaching a tile assembly 100 to another tile assembly to form a tile system 3600. FIG. 36 depicts an example sequence of attachment of down and left to assemble the tile system 3600. A tile assembly 100 may be moved generally downward until it connects with another tile assembly, and then moved to the left until it connects with another tile assembly. When the tile assembly 100 is connected to two tile assemblies, the tile assembly 100 is secured as part of the tile system 3600. In some embodiments, sequence of attachment may be down and right, left and down, right and down, up and left, up and right, left and up, and right and up. The configuration and positioning of the attachment features of the tile assemblies of the tile system may correspond to the sequence of attachment to assemble the tile system.

As depicted in FIG. 36, the tile assembly 100 may comprise a male attachment feature 108 on the top and right edges and a female attachment feature on the left and bottom edges. In some embodiments, the male attachment feature 108 may be on opposing edges or the female attachment feature 110 may be on opposing edges. In some embodiments, more edges of the tile assembly 100 may have one kind of attachment feature, and fewer edges may have another kind of attachment feature.

Figure 37:
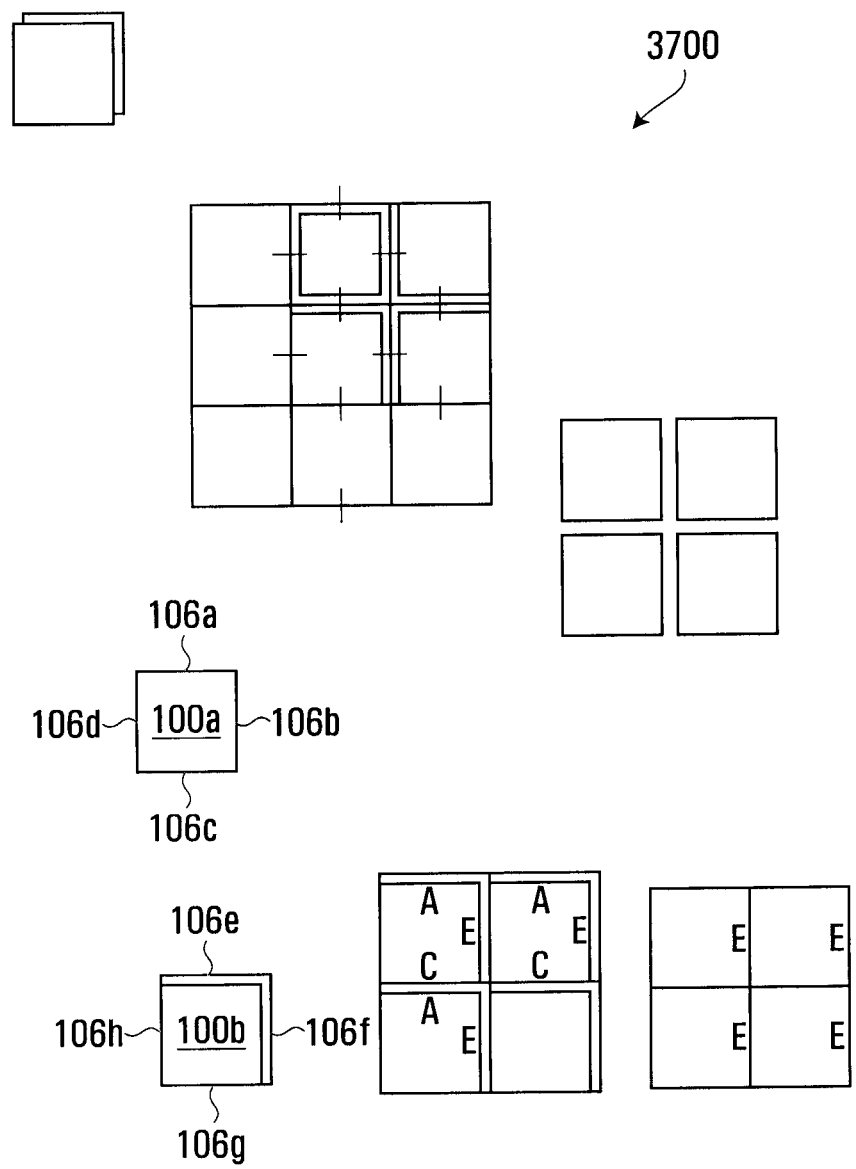
FIG. 37 is a schematic of attaching a tile assembly to another tile assembly to form a tile system.

FIG. 37 is a schematic of attaching a tile assembly to another tile assembly to form a tile system 3700. As depicted in FIG. 37, the tile system 3700 has 9 tile assemblies 100. In some embodiments, the tile assembly of the tile system 3700 may be tile assembly 100a. Tile assembly 100a may have attachment features 106a and 106c that may have a click-lock feature, and may have attachment features 106b and 106d that may have a tongue and groove feature. In some embodiments, the tile assembly of the tile system 3700 may be tile assembly 100b. Tile assembly 100b may have attachment features 106e and 106f that may be male attachment features, and may have attachment features 106g and 106f that may be female attachment features. The configuration, design, and positioning on the sides of the tile assembly 100 of the attachment features 106 may be changed as appropriate to suit the installation method.

Figure 38:
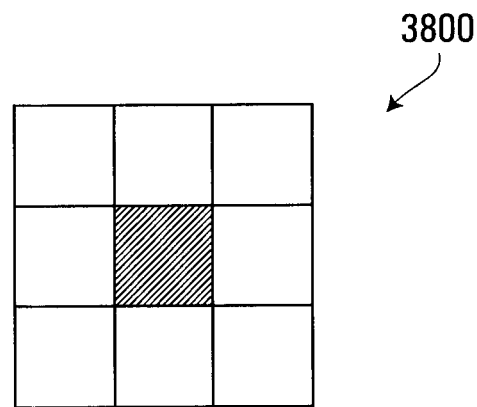
FIG. 38 is a schematic of a tile system.

FIG. 38 is a schematic of a tile system 3800. As depicted in FIG. 38, additional tile assemblies may be connected to the tile system 3800, such that the tile system 3800 may extend longitudinally, laterally, or a combination thereof.

Figure 39:
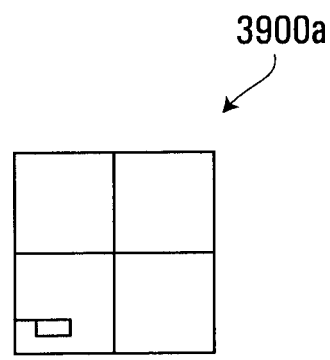
FIG. 39 is a schematic of attaching a tile assembly to another tile assembly to form a tile system.
Figure 39:
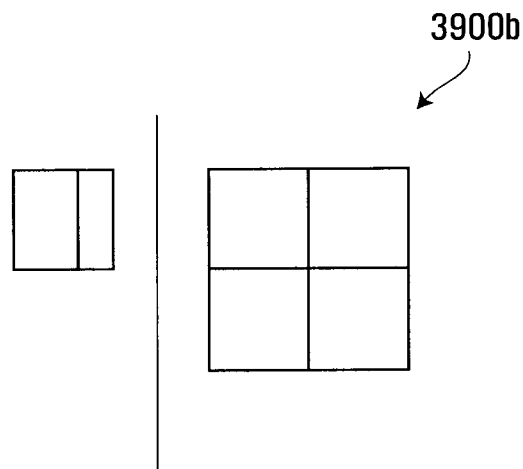

FIG. 39 is a schematic of a tile system 3900. The tile system 3900, as depicted, comprises 4 tile assemblies. In some embodiments, such as depicted in tile system 3900a, the tile assemblies of the tile system 3900a may be generally the same size and shape. In some embodiments, such as depicted in tile system 3900b, some of the tile assemblies of the tile system 3900b may have a size and shape different from others. For example, the tile system 3900b has some tile assemblies that are generally square in shape and other tile assemblies that are generally rectangular in shape.

In some embodiments, the bottom surface of the tile 102 may be a coupling surface for releasably mounting the tile assembly 100 to another coupling surface that is complementary to coupling surface of the tile 102. The coupling surface of the tile 102 may be hooks or loops, and the another coupling surface may be the other of hooks or loops.

In some embodiments, the tile assembly 100 may be designed with tolerances for installation. For example, there may be gaps in locking laps to determine forgiveness, such as when sliding vertically or horizontally. In some embodiments, the gaps may be $1/32^{nd}$-$118^{th}$ of an inch. More particularly, the gaps may be $1/16^{th}$-$1/4^{th}$ of an inch. More particularly, the gaps may be $3/16^{th}$ of an inch.

In some embodiments, the tile assembly 100 may be cut on site. The tile assembly 100 may be scored or cut, for example, with a wet saw.

The tile assemblies described above in FIGS. 1-39 comprise a tile joined to a stabilizer and a connector. In some embodiments, the tile assemblies may comprise more than one tile.

Figure 40:
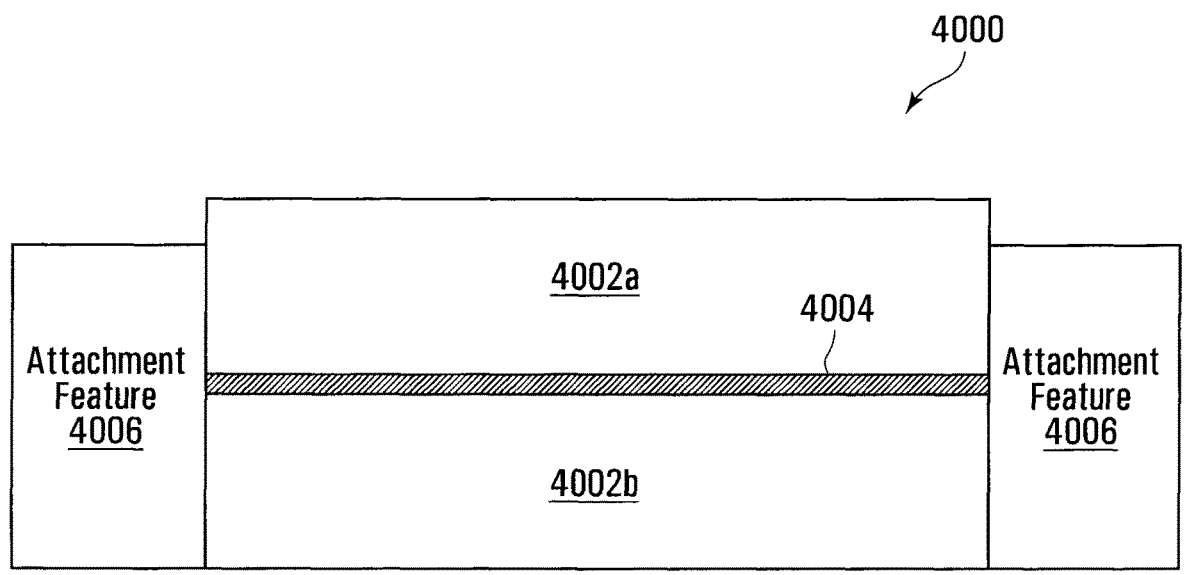
FIG. 40 is a schematic of a tile assembly having two tiles.

FIG. 40 is a schematic of a tile assembly 4000 that may be generally similar to the tile assemblies described herein in FIGS. 1-39 (e.g. tile assembly 100), except tile assembly 4000 has two tiles 4002a and 4002b stacked on top of one another with a stabilizer 4004 between the two tiles 4002a and 4002b. As depicted in FIG. 40, tile assembly 4000 comprises attachment features 4006 that mechanically connects tile assemblies 4000 together.

Although FIG. 40 depicts attachment features 4006 at the sides of tiles 4002a, 4002b, it should be appreciated that other configurations are possible. For example, the attachment feature 4006 may extend through to part of the underside of the tile assembly in addition to some or all of the sides of the tile assembly. The attachment feature 4006 may also extend through the entire underside of the tile assembly. The attachment feature 4006 may also extend through the entire underside of the tile assembly and also up some or all of the sides of the tile assembly.

In some embodiments, the attachment feature 4006 may be made of materials which are malleable, including polyurethane, rubber, silicone, ionomer, thermoplastic elastomer, polyvinyl chloride (PVC), low-density polyethylene (LDPE), or the like. The malleable nature of the attachment feature 4006 may allow for individual tile assemblies connected to one another to form an entire floor system, as the malleable nature of the tiles would enable the tile assemblies to conform to the contours of the underlying floor, as well as allow for some tolerance of expansion and contraction (e.g. for different temperatures, humidity levels, or the like). In embodiments where the tile assembly is used as a wall covering, the malleable nature of the attachment feature 4006 may allow the tiling system to leverage the natural gravitational force acting on tiles to use the weight of the tiles to engage the connections between tiles to a point where the connections between tile assemblies are substantially waterproof.

In some embodiments, the attachment feature 4006 may be laminated to the side of the tile assembly. In some embodiments, the attachment feature may be laminated to more than one side of the tile assembly, and in some embodiments may be laminated to each side of the tile assembly (e.g. as shown in FIG. 118). In some embodiments, the tile assembly may be cut to precisely fit together with the attachment feature 4006. In some embodiments, cutting is carried out using water jet cutting. In some embodiments, 3D printing may be used to ensure a precise fit between tile assembly and attachment feature. In some embodiments, the attachment feature 4006 is first attached to the side of the tile assembly and is then milled to form the appropriate geometry for connection to other attachment features. In some embodiments, the attachment feature is formed using injection molding.

In some embodiments, the tile assembly 4000 may be two tiles (e.g. laminated tiles) of exterior cladding with a stabilizer 4004 made of fibre glass in the centre. The fibre glass may be a fibre glass cloth.

In some embodiments, the tiles 4002*a*, 4002*b* may be made of porcelain, and in particular of double-glazed porcelain. Tile 4002*a* may be produced using a double glazing porcelain production process. Conventional double layer porcelain manufacturing has typically not allowed for much flexibility in terms of finishes, chiefly because conventional manufacturing methods do not allow for printing options capable of producing a wide range of colours and/or patterns. In conventional double layer manufacturing, the patterning/colouration is done during an initial manufacturing process, and not as a secondary step. As such, many manufacturers are opting not to use double layer manufacturing because it is a relatively expensive process, which typically necessitates large batches in order to render the process cost-effective, and does not provide much flexibility or capability for different visual surface finishes. However, in some embodiments, it is possible to use ink-jet printing technologies to print on the other surface of double-layered products.

In some embodiments, the modified double layer porcelain manufacturing process may allow for the possibility of the insertion of a fiberglass (or other stabilizing layer) layer between two layers of porcelain. In some embodiments, once the fiberglass layer is inserted onto the first layer of porcelain powder/paste, pressure may be applied so as to allow the fiberglass to embed well and reduce the possibility of air pockets.

In embodiments in which a second tile 4002*b* is placed on the both sides of the stabilizer 4004 (e.g. fiberglass), pressure may be applied to the first layer of porcelain powder/paste and fiberglass prior to the second layer of porcelain paste/powder being applied. In some embodiments, the modified double layer porcelain manufacturing process may allow for tiles with a thickness of 9 mm or less. By introducing a layer of fiberglass (or other stabilizer) in between layers of porcelain during the manufacturing process, this may provide a lower-cost method of manufacturing tiles than those presently known.

In some embodiments, the tile 4000*a* may be porcelain (veneer) rectified and the tile 4000*b* may be ceramic tile rectified.

In some embodiments, the tile assembly 4000 may be a composite tile, comprising two ceramic layers (e.g. two tiles) on the outside and one orthotropic glass fibre layer in the middle.

In some embodiments, the tiles 4000*a* and 4000*b* may be laminated together with polyurethane and fibre glass.

In some embodiments, the tile assembly 4000 may comprise a backing material, such as foam, loops, or polymer. Where the tile assembly 4000 is to be installed on a floor, the backing material may be foam. Where the tile assembly 4000 is to be installed on a wall, the backing material may have a material for mounting or connecting the tile assembly 4000 to the wall, such as loops. The backing material may be sufficiently suitable to withstand high stress applied to the tile assembly 4000 (e.g. from a focused point like the heel of a stiletto). The backing material may be reinforced with fibre glass.

In some embodiments, the stabilizer 4000 may be a metallic material such as steel.

In some embodiments, the tile assembly 4000 may be connected to other tile assemblies 4000 to form a tile system. This tile system may be installed on a surface, such as a floor or a wall. When the tile system comprising tile assemblies 4000 is installed on a floor, the tile assemblies 4000 of the tile system may "free float" on the floor, and the tile system comprising tile assemblies 4000 may be stabilized on the floor.

In some embodiments, the tile assembly 4000 may be difficult to break.

The tile assembly 4000 may be used as a subsurface or as a surface.

In some embodiments, the load applied to the tile assembly 4000 may be distributed to its components, such as to first tile 4002*a*, second tile 4002*b*, stabilizer 4004, attachment feature 4006, or a combination thereof.

After the tile assemblies 4000 are connected together to form a tile system, the tile assemblies 4000 may be separate for replacement, repair, cleaning, and the like.

In some embodiments, the tile assembly 4000 may be manufactured with two tiles, each having at least one generally flat surface, and a reinforcing fibre fabric that may be laminated to the two tiles. The reinforcing fabric may be joined to the tiles using a resin. In some embodiments, the tile 4000*b* may be a thin Laminam® tile.

In some embodiments, the stabilizer 4004 (e.g. the fibre glass) between the two tiles 4002*a* and 4002*b* may disallow the stress required to crack the tile 4002*a* or tile 4002*b* due to stiffness of the stabilizer 4004. When the stabilizer 4004 is fibre glass, the stabilizer 4004 may have a stiffness that is higher than the stiffness of the tiles 4002*a* or 4002*b*.

Where the stabilizer 4004 is fibre glass, there may be vertical or horizontal stiffness.

In some embodiments, there may be more than one layer of stabilizer 4004 between the two tiles 4002a or 4002b.

In some embodiments, where the stabilizer 4004 is fibre glass, the fibre glass may be tightened to reduce the gaps in the wave of the fibre glass. This may avoid stiffness loss of the fibre glass.

The tile 4002a or the tile 4002b may have a thickness such that the tiles do not break during harsh conditions, such as conditions with high stress. The thickness of the tile assembly 4000 may be based on its use. For example, where the tile assembly 4000 is to be installed on a floor or near a door, the tile assembly 4000 may not be so thick so as to obstruct movement of doors.

In some embodiments, the tile 4002a or tile 4002b may be square.

In some embodiments, the stabilizer 4004 between the tile 4002a and tile 4002b may be foam.

In some embodiments, the attachment features 4006 may be between the top and bottom surfaces of the tile assembly 4000. When attachment features 4006 of tile assemblies are connected together to connect the tile assemblies 4000, the connector defined by the connected attachment features 4006 may be water resistant, water tight, or durable.

In some embodiments, the fibre glass stabilizer 4004 may extend past the dimensions of the tile 4002a or tile 4002b. In some embodiments, the fibre glass stabilizer 4004 may not extend past the dimensions of the tile 4002a or tile 4002b and terminate at the edge of the tile 4002a or tile 4002b.

In some embodiments, a Mayor machine may laminate a fibre glass stabilizer 4004 to the tiles 4002a and 4002b.

To join the fibre glass to the tiles 4002a and 4002b, fibre glass on a roll with uncured adhesive may provide alignment with the tiles 4002a and 4002b. A jig may assist with aligning the fibre glass and the tiles 4002a and 4002b.

In some embodiments, it may be difficult to separate the tiles 4002a or 4002b from the stabilizer 4004.

The connection between tile assemblies 4000 may be sufficiently strong such that rolling loads applied to the tile system does not disconnect the tile assemblies 4000 or damage the tile assemblies 4000.

In some embodiments, the components of the tile assemblies 4000 (e.g. tile 4000a, tile 4000b, stabilizer 4004, attachment feature 4006, etc.) that may be visually seen or touched may have designs. For example, the components of the tile assemblies 4000 may have a colour, a design, a print, a glazing, be smooth, or be textured.

In some embodiments, if using a crystalline product, fibre glass may not be needed. In some embodiments, if using crystalline product, fibre glass may be needed.

In some embodiments, the tiles 4002a and/or 4002b may be generally similar to the tiles described herein in FIGS. 1-39 (e.g. tile 102).

As depicted in FIG. 40, the tiles 4002a and 4002b are generally similar in material, size, shape, and thickness. In some embodiments, the tiles 4002a and 4002b may have different material, size, shape, or thickness. For example, the tile 4002a may be thicker than the tile 4002b. As another example, the tile 4002a may be a different material (e.g. different model of tile, different make of tile, etc.) than the tile 4002b.

In some embodiments, the stabilizer 4004 may be generally similar to the stabilizers described herein (e.g. stabilizer 104).

The tile assembly 4000 depicted in FIG. 40 does not have a stabilizer connected to the bottom surface of the tile 4002b.

In some embodiments, a stabilizer, similar to stabilizer 104, may be connected to the bottom surface of the tile 4002b. In some embodiments, the tile 4002b may function as the stabilizer 104. For example, the stabilizer 4004 between the tiles 4002a and 4002b may be fiberglass, and the stabilizer connected to the bottom surface of the tile 4002b may be a polymer, such as polyethylene terephthalate (PET). In some embodiments, a stabilizer 4004 is not present. That is, the tile assembly may, in some embodiments, include tiles 4002a, 4002b and attachment features 4006, without stabilizer 4004. In some embodiments, the tile assembly may not include attachment features. That is, is some embodiments, the tile assembly includes tiles 4002a, 4002b separated by stabilizer 4004.

In some embodiments, attachment feature 4006 may be generally similar to attachment features described herein (e.g. attachment feature 106). For example, the attachment feature 4006 may have a click-lock feature or may have a tongue or groove feature to correspond with the attachment feature 4006 of another tile assembly 4000. In some embodiments, the attachment feature 4006 may be connected to the tiles 4002a or 4002b, connected to the stabilizer 4004, connected to the bottom of the tile 4002b, or a combination thereof. The attachment feature 4006 may be connected to the edge of the tiles 4002a or 4002b, or may be connected to the edge of the tiles 4002a or 4002b and the bottom of the tile 4002b.

In some embodiments, the attachment feature 4006 may be manufactured using moulding extrusion, 3-D printing, and the like. In some embodiments, the attachment feature 4006 may be connected to the tile 4002a, tile 4002b, or stabilizer 4004, for example, by gluing, moulding, or bonding.

In some embodiments, the thickness of the tile assembly 4000 may be approximately 8 mm. The tile 4000a may be approximately 4 mm and the tile 4000b may be approximately 4 mm. The tiles 4000a and 4000b may have different thicknesses.

In some embodiments, the tile assembly 4000 may be waterproof or may be treated with a material so it may be water proof. In some embodiments, the tile assembly 4000 may be installed on a wall, for example in a shower stall, to protect the wall from liquids.

Figure 41:
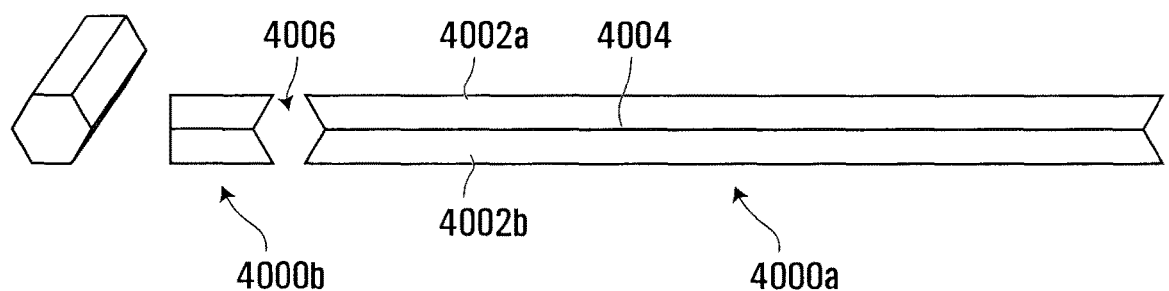
FIG. 41 is a schematic of two tile assemblies having two tiles connected together.

FIG. 41 is a schematic of two tile assemblies 4000a and 4000b having two tiles 4002a and 4002b connected together. The stabilizer 4004 may be fibre glass, metal (e.g. steel or aluminum), polymer, or another material. As depicted in FIG. 41, both tiles 4002a and 4002b have chamfered edges that form an irregular shape when joined together. In some embodiments, the attachment feature 4006 may be a single component that joins the two tile assemblies 4000a and 4000b together. The attachment feature 4006 may be configured to have a shape and design such that it may contact the two tile assemblies 4000a and 4000b and connect with the two tile assemblies 4000a and 4000b.

In some embodiments, the attachment feature 4006 may be pre-fabricated. In some embodiments, the attachment feature 4006 may be liquid or partly liquid and may be applied on site.

In some embodiments, to manufacture the tile assembly 4000, each tile 4000a and 4000b may be manufactured separately. For example, each tile 4000a and 4000b may be cut from material and machined or moulded to have the desired shape, dimensions, edge design, finish, etc. After the tiles 4000a and 4000b have been manufactured, then they may be attached together using a stabilizer 4004, such as fibre glass, metal, polymer, foam, or adhesive.

Figure 42:
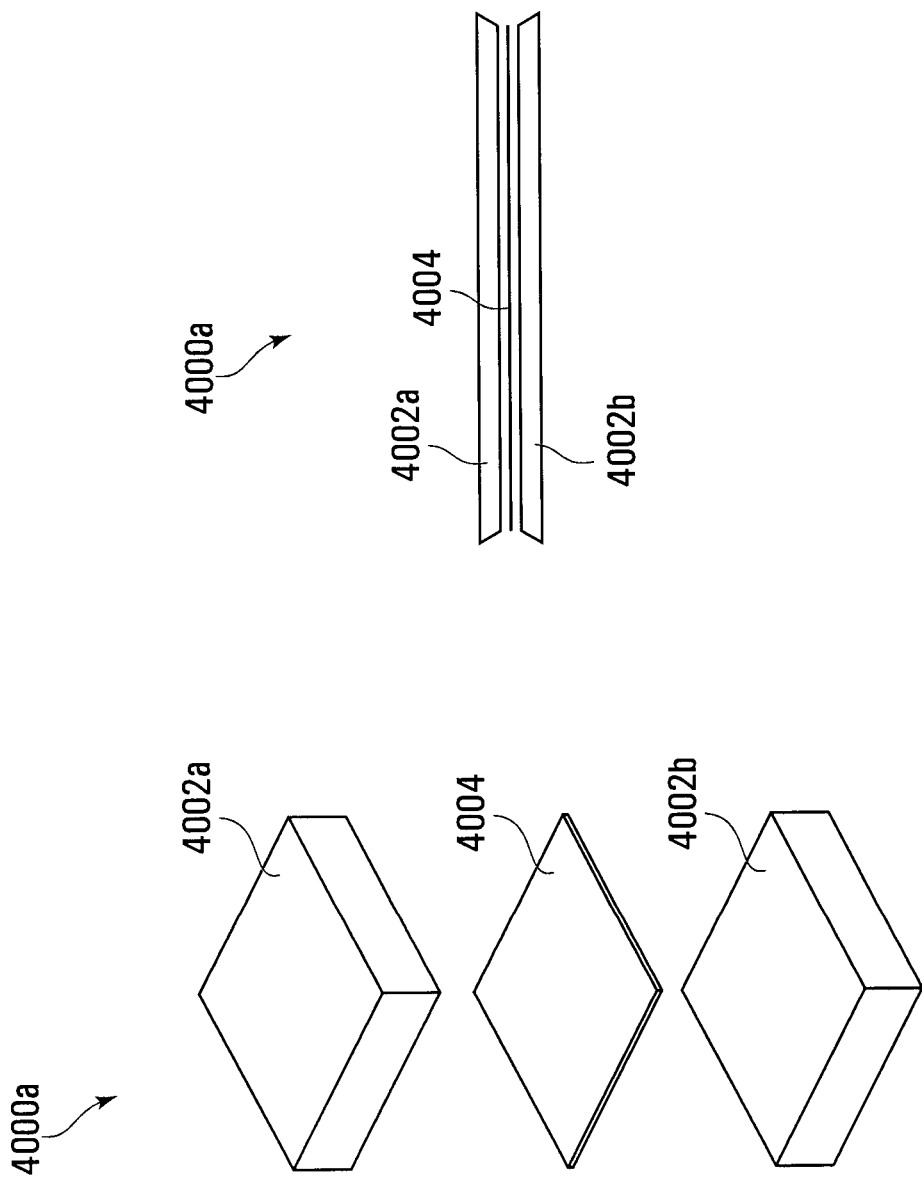
FIG. 42 is two exploded views of a tile assembly having two tiles.

FIG. 42 is two exploded views of a tile assembly 4000 having two tiles 4000a and 4000b.

Figure 43:
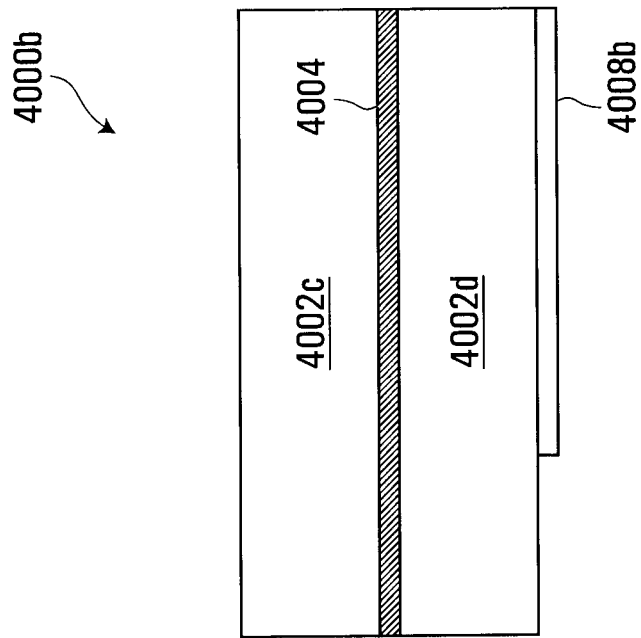
FIG. 43 is a schematic of two tile assemblies having two tiles, with stabilizers connected to the tile assemblies.
Figure 43:
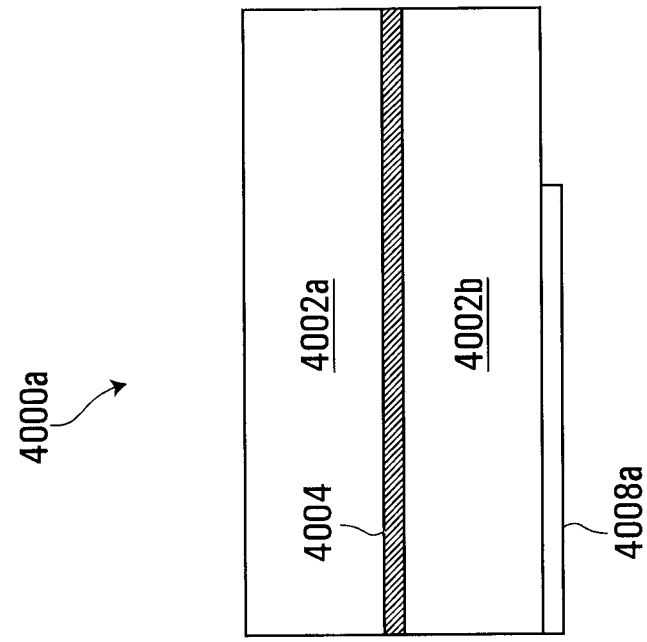

FIG. 43 is a schematic of two tile assemblies 4000a and 4000b each having two tiles 4002, with stabilizers 4004 joined to the two tiles. As depicted in FIG. 43, the tile assembly 4000a has a backing 4008a, and the tile assembly 4000b has a backing 4008b. The backing 4008 may be made with foam, loops, or polymer. Where the tile assembly 4000 is to be installed on a floor, the backing material 4008 may be foam. Where the tile assembly 4000 is to be installed on a wall, the backing material 4008 may have a material for mounting or connecting the tile assembly 4000 to the wall, such as loops. The backing material 4008 may be sufficiently suitable to withstand high stress applied to the tile assembly 4000 (e.g. from a focused point like the heel of a stiletto). The backing material 4008 may be reinforced with fibre glass. In some embodiments, the backing material 4008 may be a second stabilizer similar to the stabilizers described herein (e.g. stabilizer 104, stabilizer 4004).

Figure 44:
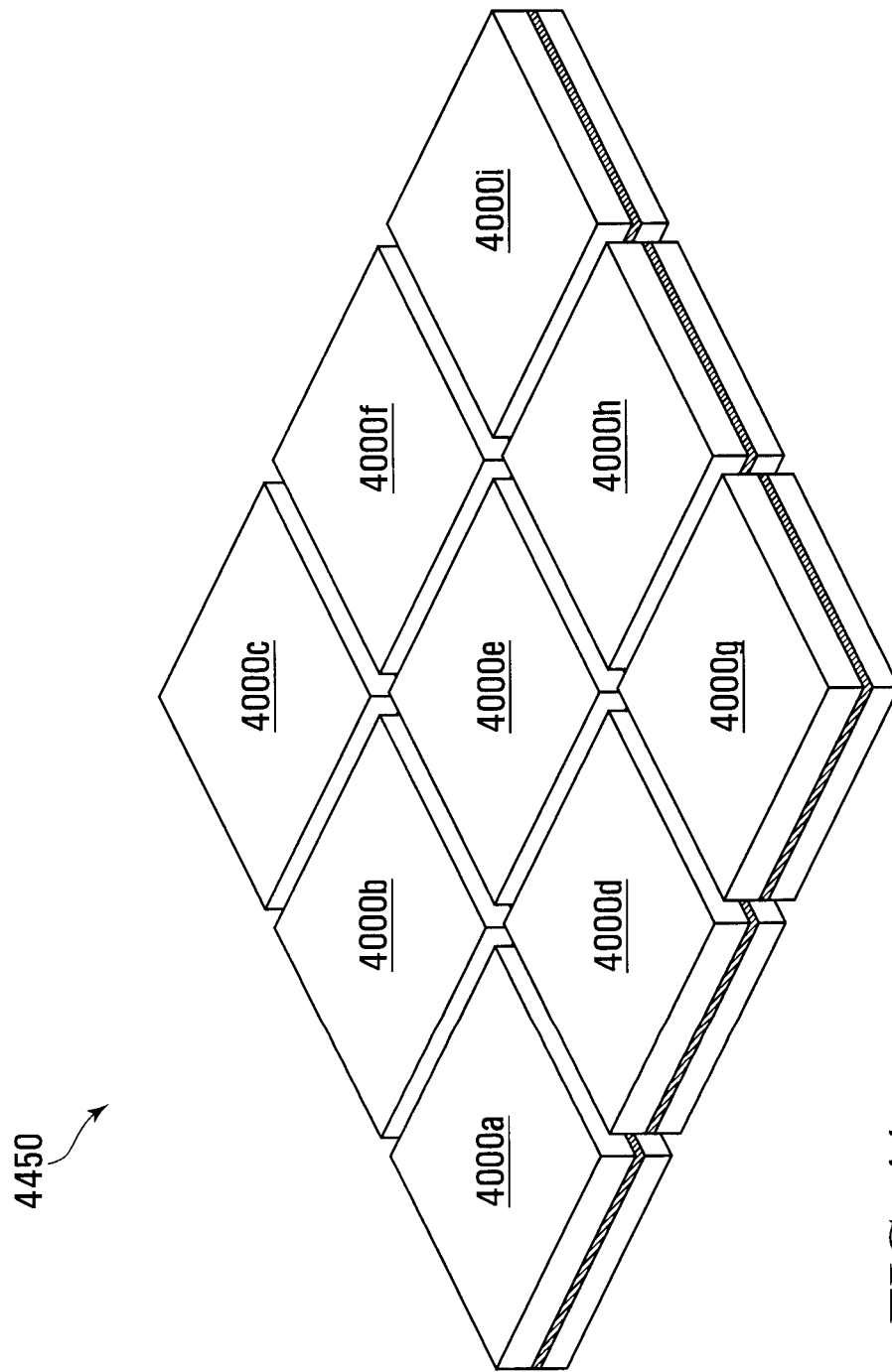
FIG. 44 is a schematic of a tile system having nine tiling assemblies connected together.

FIG. 44 is a schematic of a tile system 4450 having nine tiling assemblies 4000a-4000i connected together. In some embodiments, when a tiling assembly is connected with another tiling assembly to form a tile system, the top surface of the tiling assemblies may be approximately level.

Figure 45:
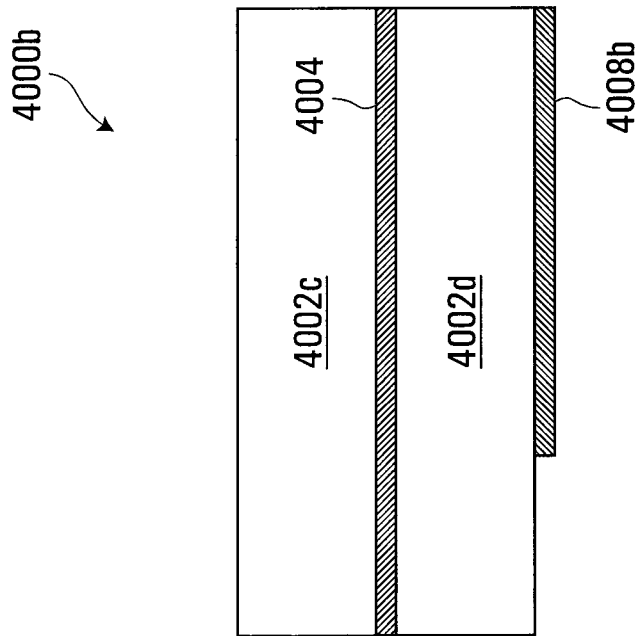
FIG. 45 is a schematic of two tile assemblies having two tiles, with loops connected to the tile assemblies.
Figure 45:
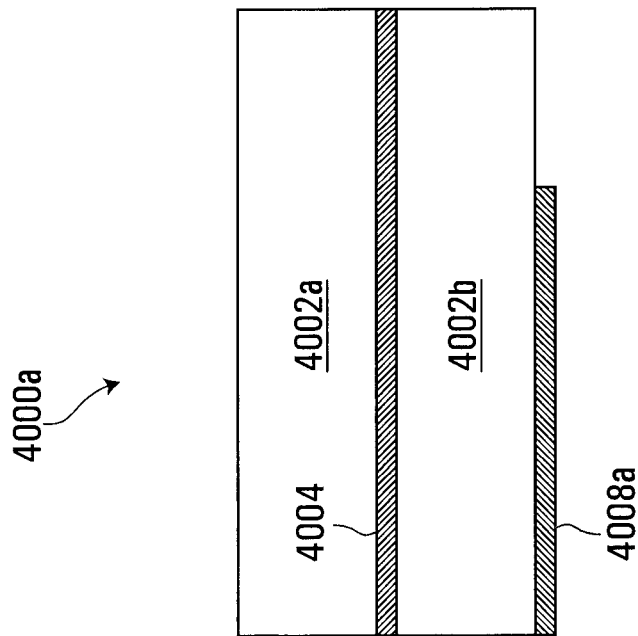

FIG. 45 is a schematic of two tile assemblies 4000a and 4000b having two tiles 4002, with a loop backing 4008a and 4008b connected to the tile assemblies 4000a and 4000b. The tile assemblies 4000a and 4000b having the loop backing 4008a and 4008b may be connected to a surface having corresponding hooks that may engage with the loops of the loop backing 4008a and 4008b.

In some embodiments, the bottom surface of the second tile 4002b may be a coupling surface for releasably mounting the tile assembly 4000 to another coupling surface that is complementary to coupling surface of the tile. The coupling surface of the second tile 4002b may be hooks or loops, and the another coupling surface may be the other of hooks or loops.

In some embodiments, the tile assembly 4000 may be designed with tolerances for installation. For example, there may be gaps in locking laps to determine forgiveness, such as when sliding vertically or horizontally.

In some embodiments, the tile assembly 4000 may be cut on site. The tile assembly 4000 may be scored or cut, for example, with a wet saw.

FIGS. 46-65 depict the manufacturing of a tile assembly 100 with a tile 102. In some embodiments, the manufacturing of a tile 100 may be adapted to manufacturing of a tile assembly 4000 having two tiles 4002a and 4000b.

In some embodiments, the tile assemblies may be manufactured by moulding (e.g. back moulding) the tile with the stabilizer 104 or attachment feature 106. The stabilizer 104 and attachment feature 106 may be integrally formed or may be separate components.

The tile assemblies may be manufactured in a way to reduce vulnerability to cracking, improved ease of installation, improved quality of installation, and improved ease of replacement of damaged tiles.

In some embodiments, the tile assembly may be manufactured by back moulding of tiles 102 and installation with the attachment feature 106, by moulding the attachment feature 106 to the tile 102, by an injection moulding process, or by a variotherm process. Different sizes of tiles 102 may be moulded.

After the part has solidified in the manufacturing tool, the part may be ejected. Suction cups may hold tiles 102 in place prior to moulding. There may be a resilient surface on the side where the tile 102 sits. There may be a sealing element made out of partly resilient material to seal off plastic.

Figure 46:
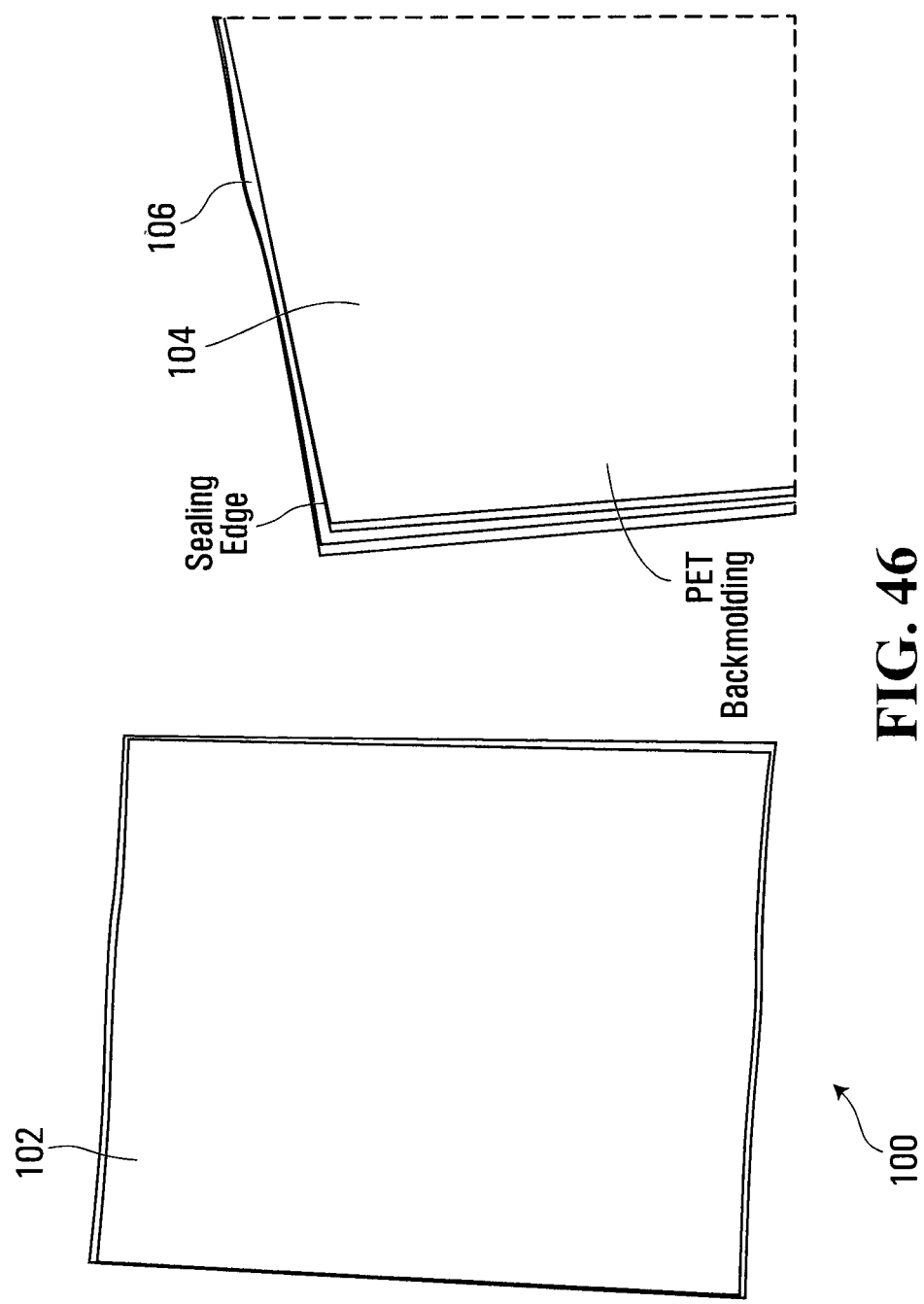
FIG. 46 is a schematic of a tile assembly manufactured with the stabilizer moulded to a tile.

FIG. 46 is a schematic of a tile assembly 100 manufactured with the stabilizer 104 and attachment feature 106 moulded to a tile 102.

Figure 47:
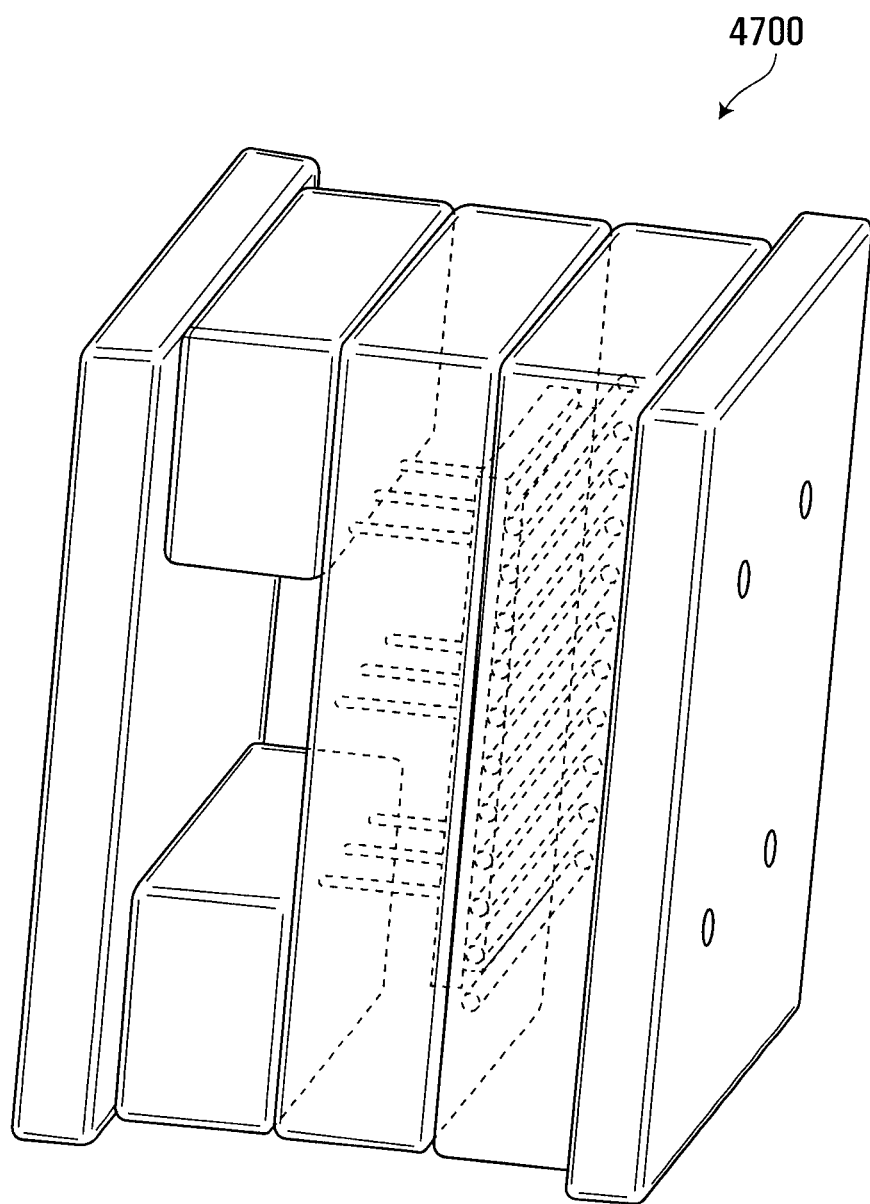
FIG. 47 is a schematic of a tile assembly manufacturing tool.

FIG. 47 is a schematic of a tile assembly manufacturing tool 4700.

Figure 48:
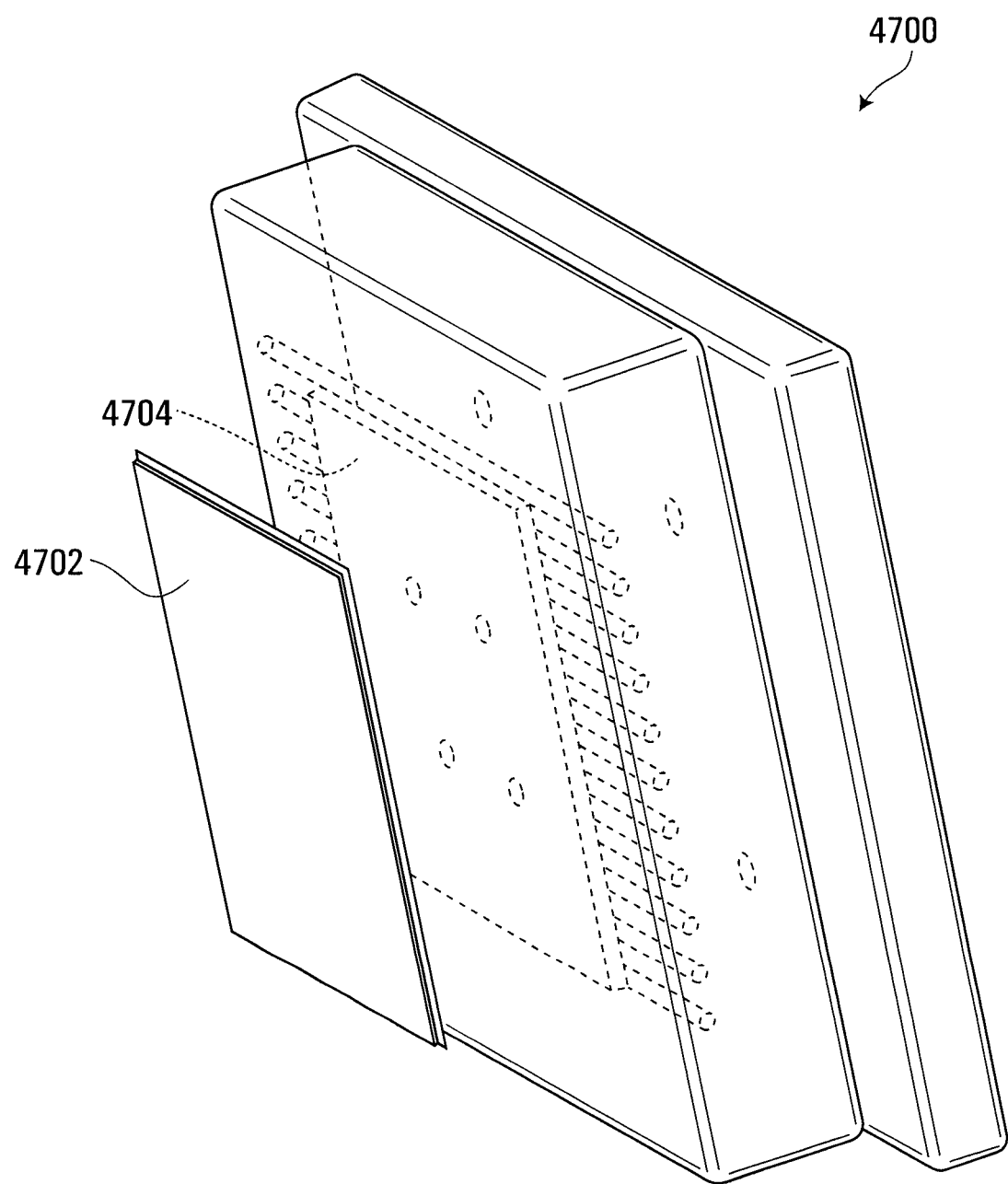
FIG. 48 is a schematic of the tile assembly manufacturing tool of FIG. 47.

FIG. 48 is another schematic of the tile assembly manufacturing tool 4700 with the tool support 4702 separate from the resilient layer 4704.

Figure 49:
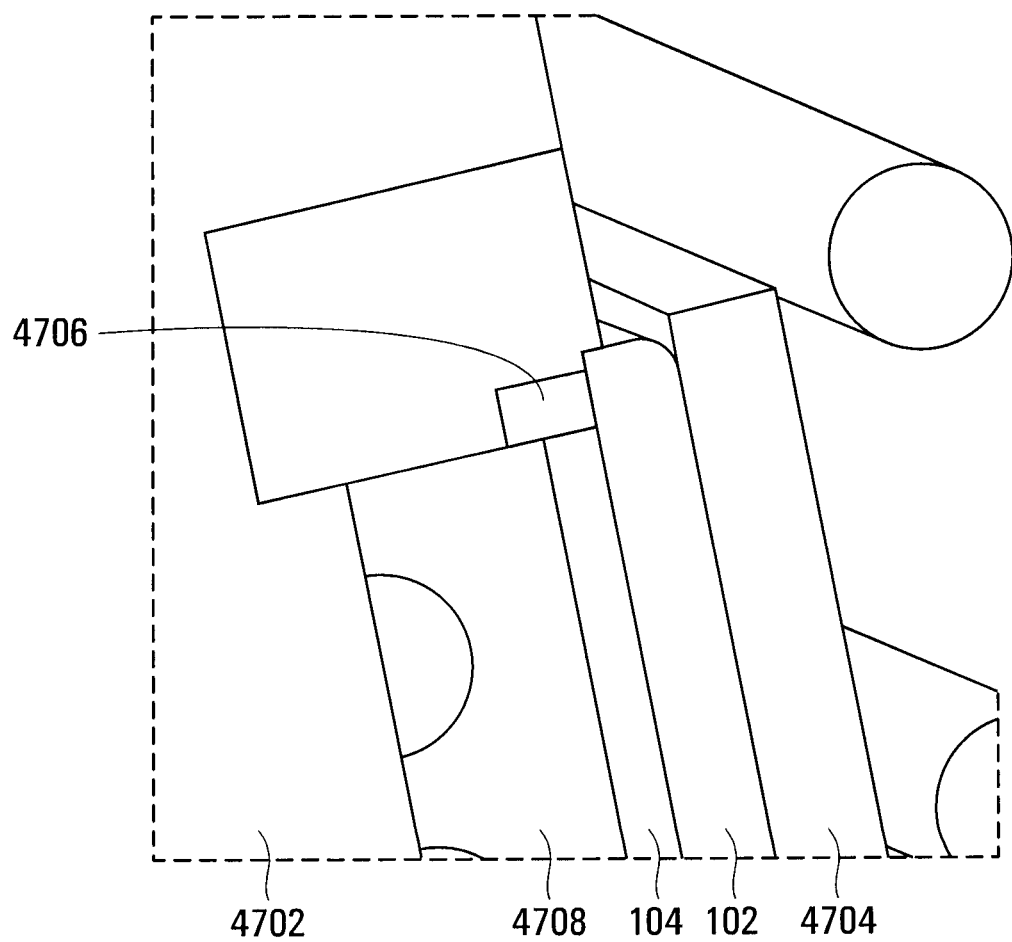
FIG. 49 is a schematic of a tile assembly being manufactured by the tool of FIG. 47.

FIG. 49 is a schematic of a tile assembly 100 being manufactured by the manufacturing tool 4700. The manufacturing tool 4700 may comprise a tool support 4702 for supporting a tool 4708 that may closely contour with the tile assembly and that may be cooled or may be heated. The tool 4700 may also comprise the resilient layer 4704 for protecting the tile 102 from breaking during the manufacturing process. The manufacturing tool 4700 may comprise a sealing frame and seal 4706 to seal off the material and maintain the shape of the tile assembly 100 during manufacturing. As depicted in FIG. 49, the tile 102 is being connected to a stabilizer 104. In some embodiments, the stabilizer 104 may comprise the attachment feature 106.

Figure 50:
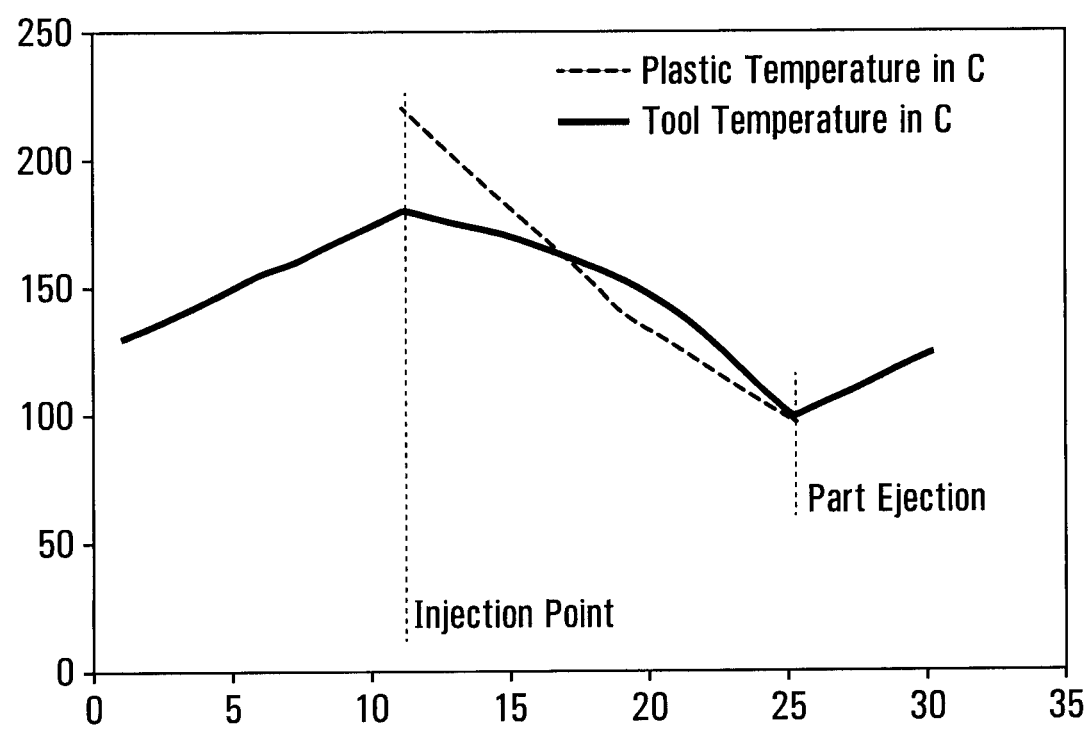
FIG. 50 is a schematic of a temperature plot of the plastic and the tool during the tile assembly manufacturing process.

FIG. 50 is a schematic of a temperature plot of the plastic and the manufacturing tool 4700 during the tile assembly manufacturing process performed by the manufacturing tool 4700. The temperatures of the plastic and tool may be example temperatures. As depicted, the temperature of the plastic increases at the injection point, and slowly decreases until the part is ejected.

In some embodiments, a polymer used for the tile assembly 100 may be PET, recycled PET (rPET), polypropylene (PP), polyethylene (PE), acrylonitrile butadiene styrene (ABS), Acrylnitril-Styrol-Acrylat-Copolymere (ASA), fillers, a foam material, or a combination thereof.

In some embodiments, the tile assembly 100 may be manufactured by press-welding. The backing plate of the tile assembly 100 (e.g. the stabilizer) may be moulded, including the attachment feature 106 (e.g. tongue and groove). The tile 102, which may be a ceramic tile, may be heated. Then, the backing plate and the tile 102 may be press-welded in a separate tool.

Figure 51:
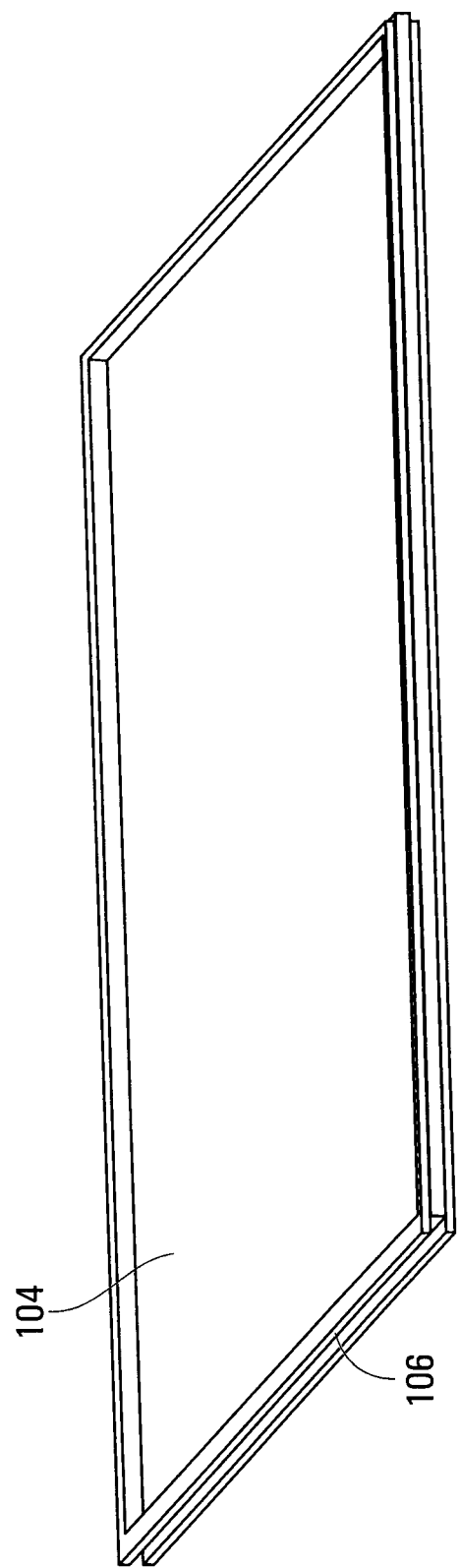
FIG. 51 is a schematic of a moulding backing plate for manufacturing a tile assembly.

FIG. 51 is a schematic of a moulding backing plate for manufacturing a tile assembly 100. The back plate (e.g. stabilizer 104) may include the attachment feature 106. As depicted in FIG. 51, the back plate may have a recess for receiving the tile 102 of the tile assembly 100.

Figure 52:
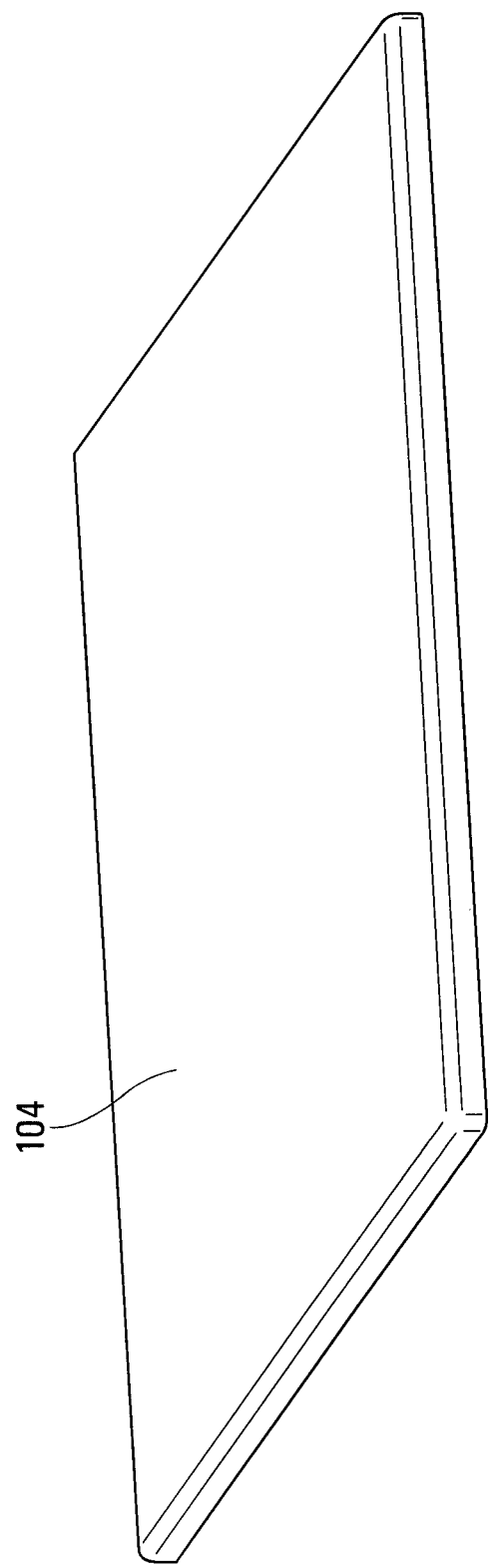
FIG. 52 is a schematic of a tile for manufacturing a tile assembly.

FIG. 52 is a schematic of a tile 102 for manufacturing a tile assembly 100. The tile may be heated during a press-welding process for manufacturing the tile assembly 100.

Figure 53:
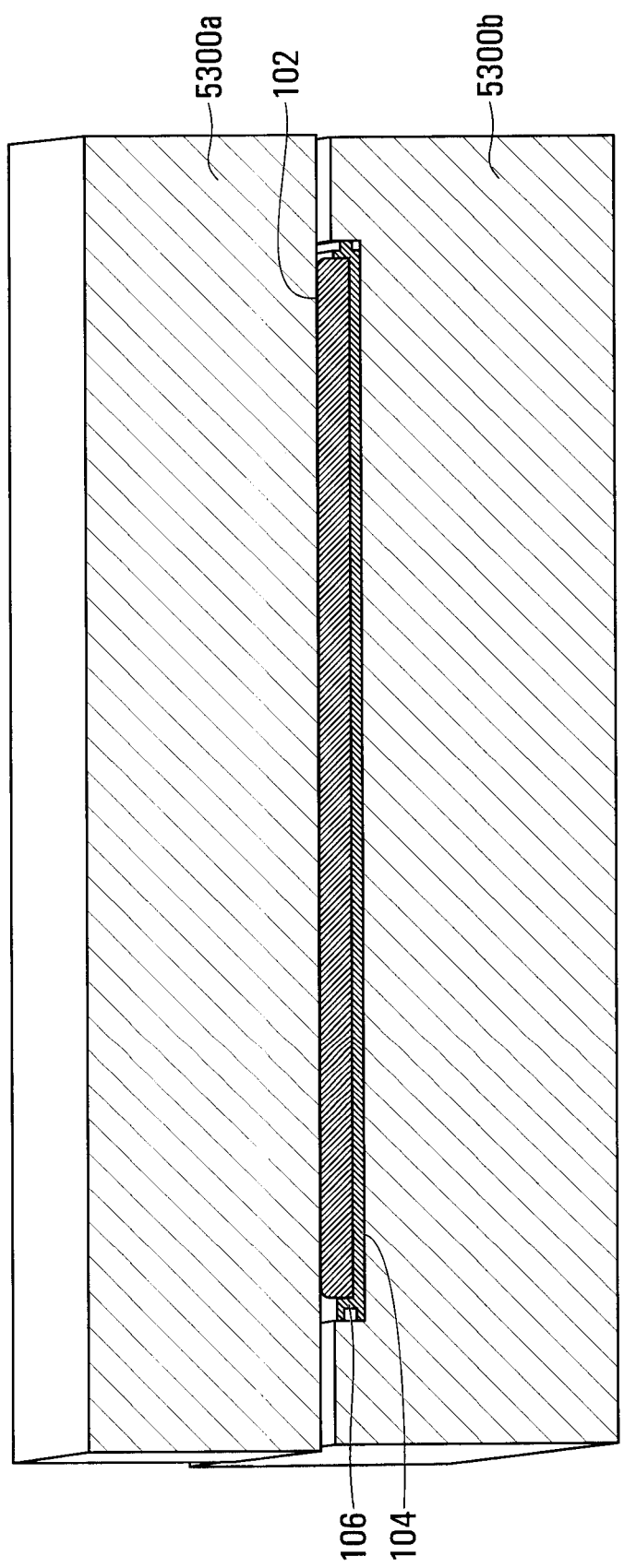
FIG. 53 is a schematic of press welding a tile and a backing plate for manufacturing a tile assembly.

FIG. 53 is a schematic of press welding a tile 102 and a backing plate (e.g. a stabilizer 104, attachment feature 106, or both) for manufacturing a tile assembly 100. In some embodiments, each of the tile 102 and the backing plate may be supported by a mould 5300a and 5300b while the tile 102 and the backing plate are pressed together.

Figure 54:
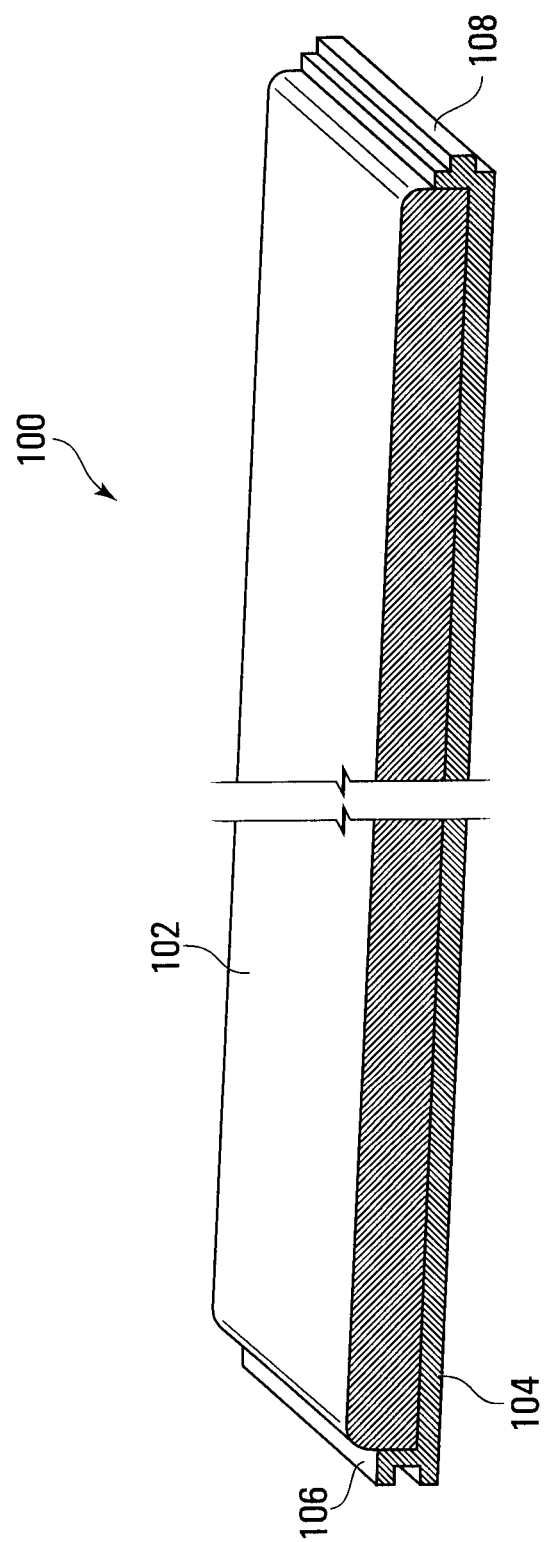
FIG. 54 is a schematic of a manufactured tile assembly.

FIG. 54 is a schematic of a manufactured tile assembly 100. FIG. 54 depicts a tile assembly 100 comprising a tile 102, a stabilizer 104, male attachment feature 108 and female attachment feature 110. Additional tile assemblies 100 may be manufactured, and may be connected together using the male attachment features 108 and female attachment features 110.

In some embodiments, a tile assembly 100 manufactured by a press-welding process may be similar to a tile assembly 100 manufactured by an injection back-moulded tile.

FIG. 55 is a table 5500 outlining features of an injection moulding process, variotherm process, and press welding process. As depicted in the table 5500, the injection moulding process, variotherm process, and press welding process may be compared using cost of tools, cycle times, risk of tile breakage during process, development risk, and development costs. Other metrics for comparing the processes may be possible.

Press-welding may provide a low investment cost solution that may perform a serial process.

In some embodiments, the tile assemblies may be manufactured using a combination of an injection moulding process, variotherm process, and press welding process.

Press-welding may have a relatively low risk of breakage of the tile during manufacturing. The pressure applied to the tile may be relatively low and may be controlled by temperature of the tile or the plastic parts (e.g. by pre-heating the plastic parts). For example, the pressure for press welding may be approximately 1 bar, and the pressure for injection moulding may be greater than 100 bar.

In addition, prototypes of the tile assembly may be close to the serial product.

In some embodiments, the press-welding concept may be injection moulding of backing as a separate process. The welding may occur by heating the tile and pressing the tile against the plastic backing that sits in a tool (to avoid expansion through the pressure).

The surface structure of the back of the tile may not matter during a press-welding process. There may be some design considerations for the plastic component to avoid air traps. The tile may be heated up quickly as they have a very low thermal expansion, so the tile may not warp even if heating is mainly happening on the surface of the tile.

In some embodiments, the polymer used for manufacturing the tile assembly may be a polylactic acid polymer (PLA) or PET, and the tile may be 6" or 8" tiles.

Figure 56:
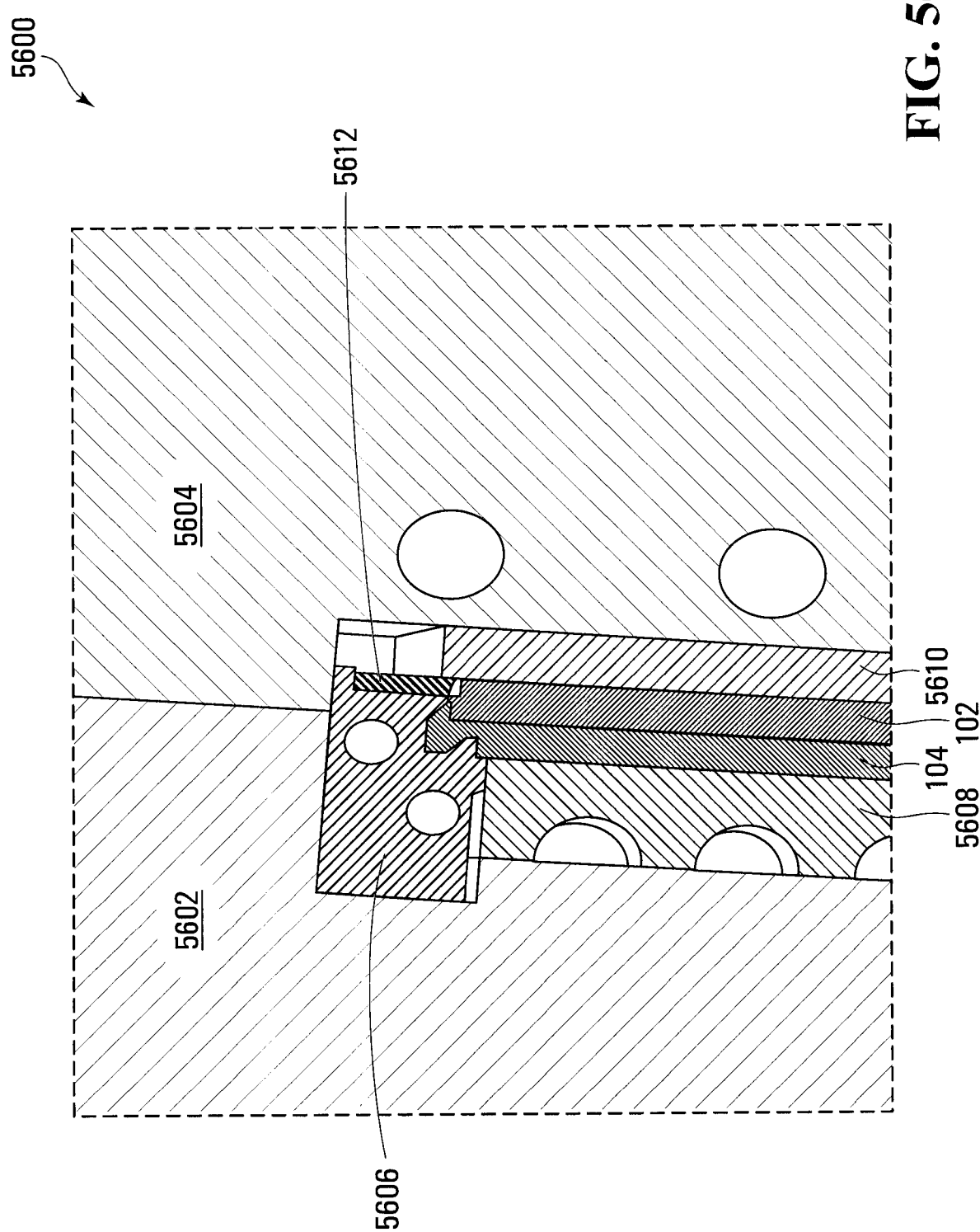
FIG. 56 is a schematic of a tile and a backing plate being press welded together to form a tile assembly.

FIG. 56 is a schematic of a tile 102 and a backing plate being press welded together to form a tile assembly 100. FIG. 56 depicts a manufacturing tool 5600 pressing the tile 102 and the backing plate together. The tool 5600 has an injection side 5602 and an ejection side 5604. The tool 5600 may comprise a cold tool part 5606 for sealing the components of the tile assembly 100 being manufactured to seal off the material and maintain the shape of the tile assembly 100 during manufacturing. The tool 5600 may comprise a hot tool part 5608 that may contact the backing plate. The tool 5600 may comprise a resilient part 5610 for avoiding breakage of tile 102. The tool 5600 may comprise an additional seal 5612 to seal off the material and maintain the shape of the tile assembly 100 during manufacturing.

The tool 5600 may comprise plastics that may surround the tile 102 on its whole perimeter. There may be four cams on each side of the tool that slide away to the outside. The cams may be cold whereas the tool itself may be hot. The cold cams may allow the material to freeze quickly. There may be additional seal material on the cams to compensate for uneven edges in the tiles.

Figure 57:
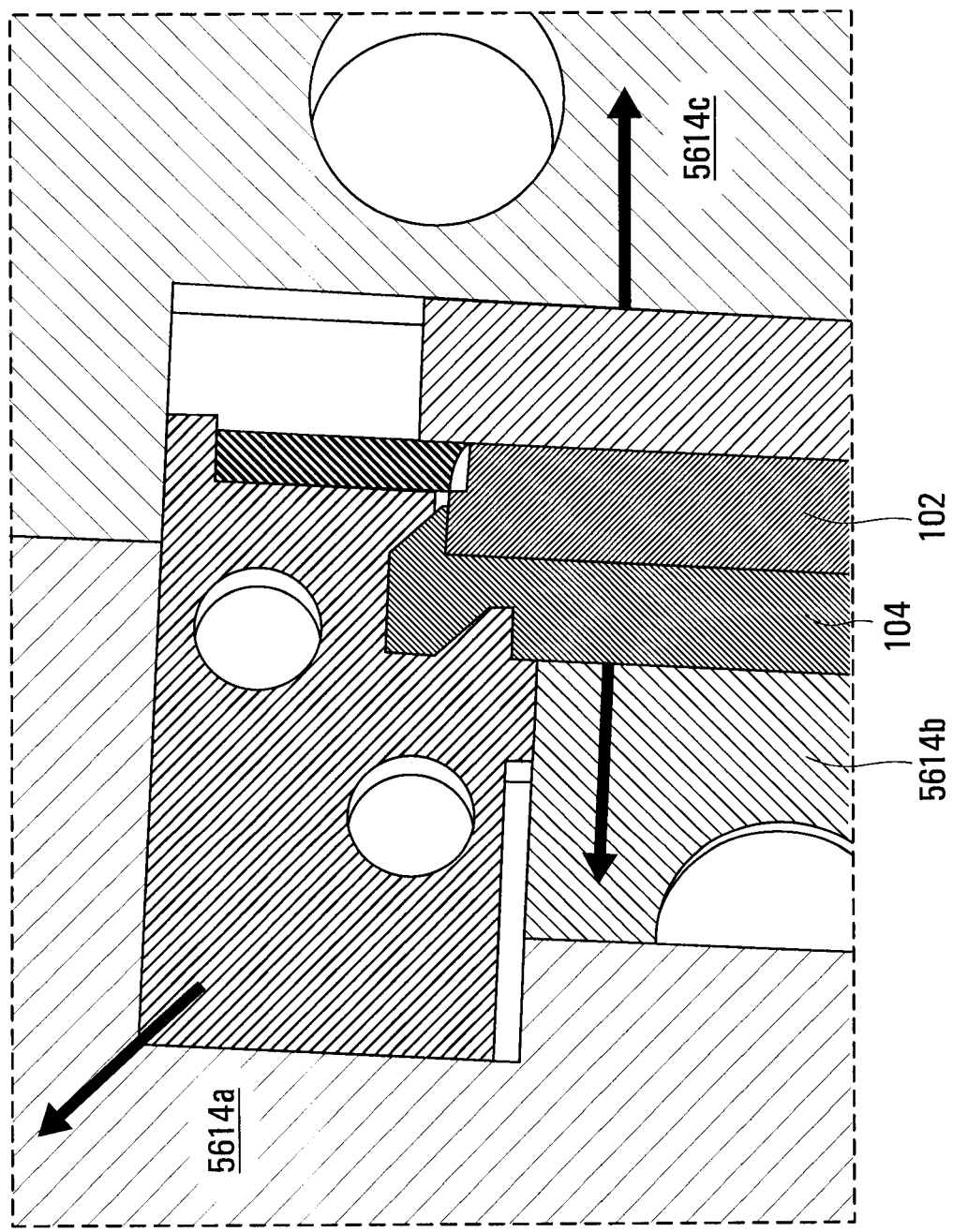
FIG. 57 is a schematic of cams of a tile assembly manufacturing tool.

FIG. 57 is a schematic of cams of a tile assembly manufacturing tool 5600. As depicted in FIG. 57, the cams 5614a, 5614b, 5614c may slide away, for example, at approximately 45°.

Figure 58:
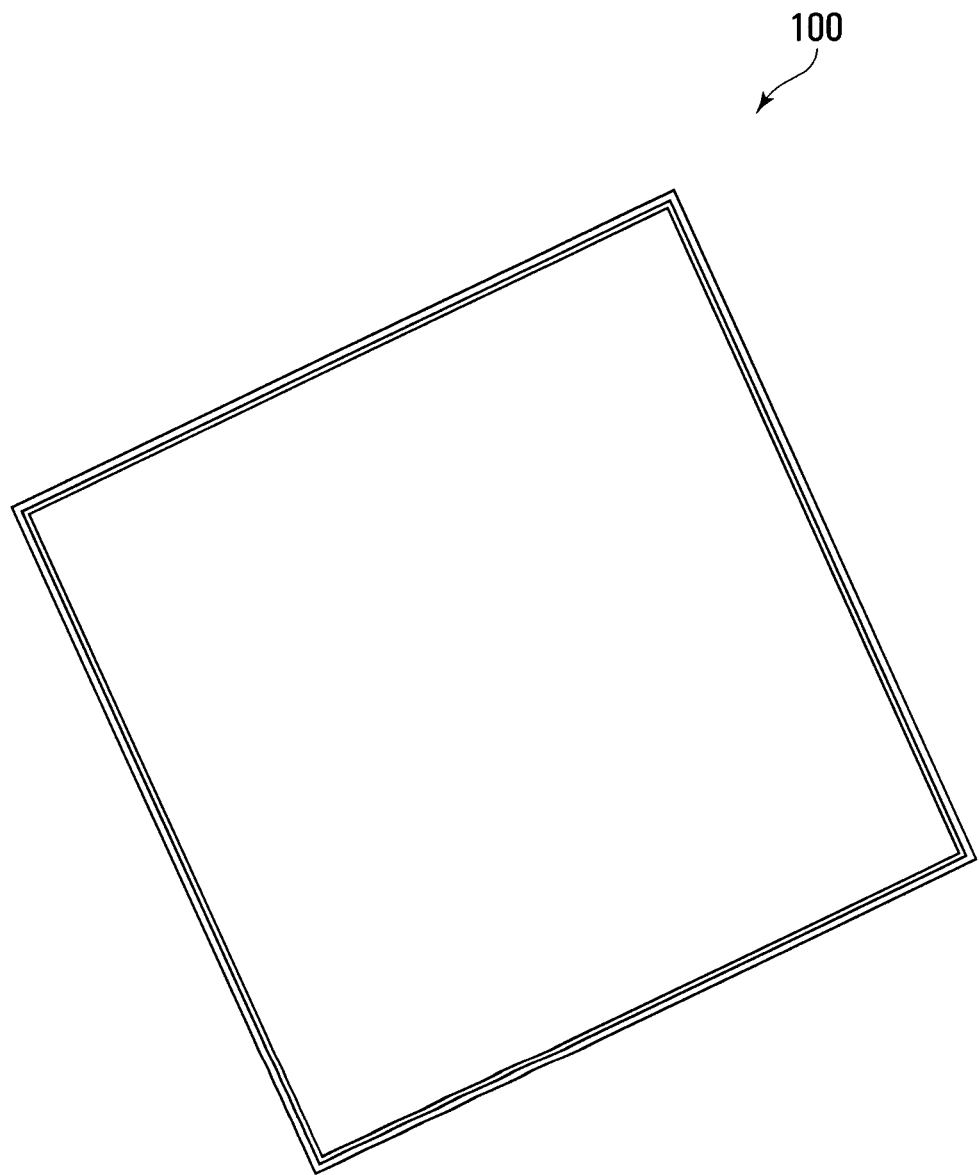
FIG. 58 is a schematic of a press-welded tile assembly.

FIG. 58 is a schematic of an example embodiment of a press-welded tile assembly 100.

FIGS. 59-63 are schematics of example embodiments of attachment features of a press-welded tile assembly.

Figure 59:
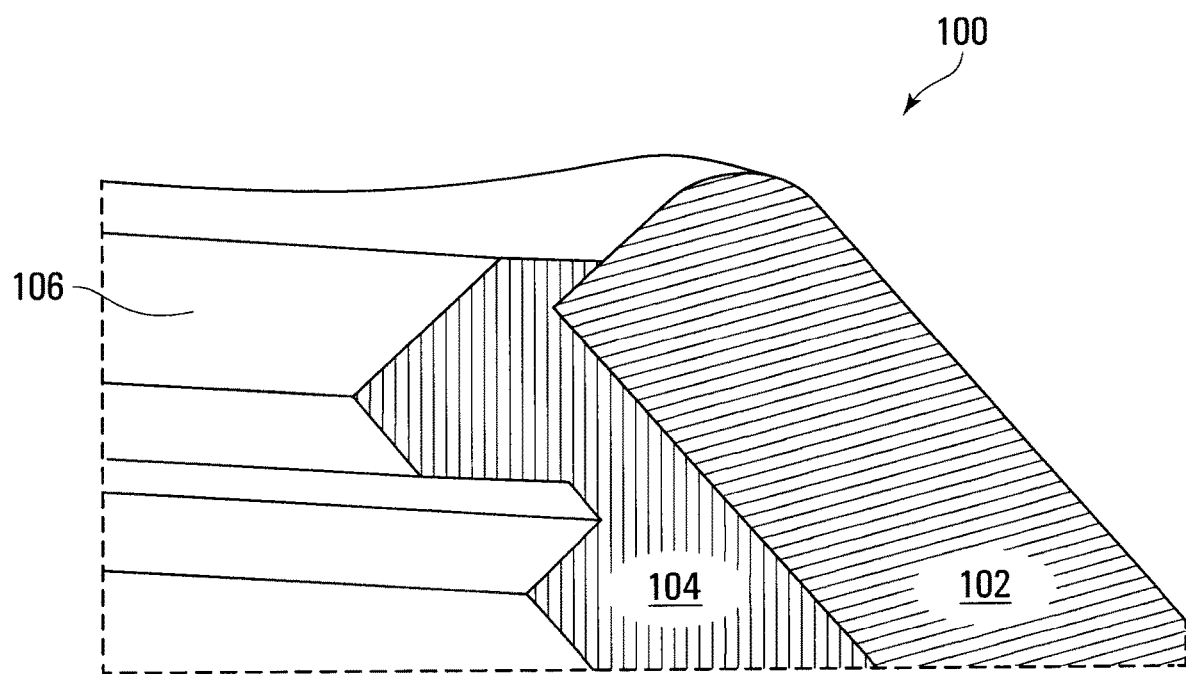
FIGS. 59-63 are schematics of press-welded tile assemblies.

FIG. 59 depicts a tile assembly 100 with a tile 102, a stabilizer 104, and an attachment feature 106. As depicted in FIG. 59, the polymer stabilizer 104 or attachment feature 106 may surround the tile 102.

Figure 60:
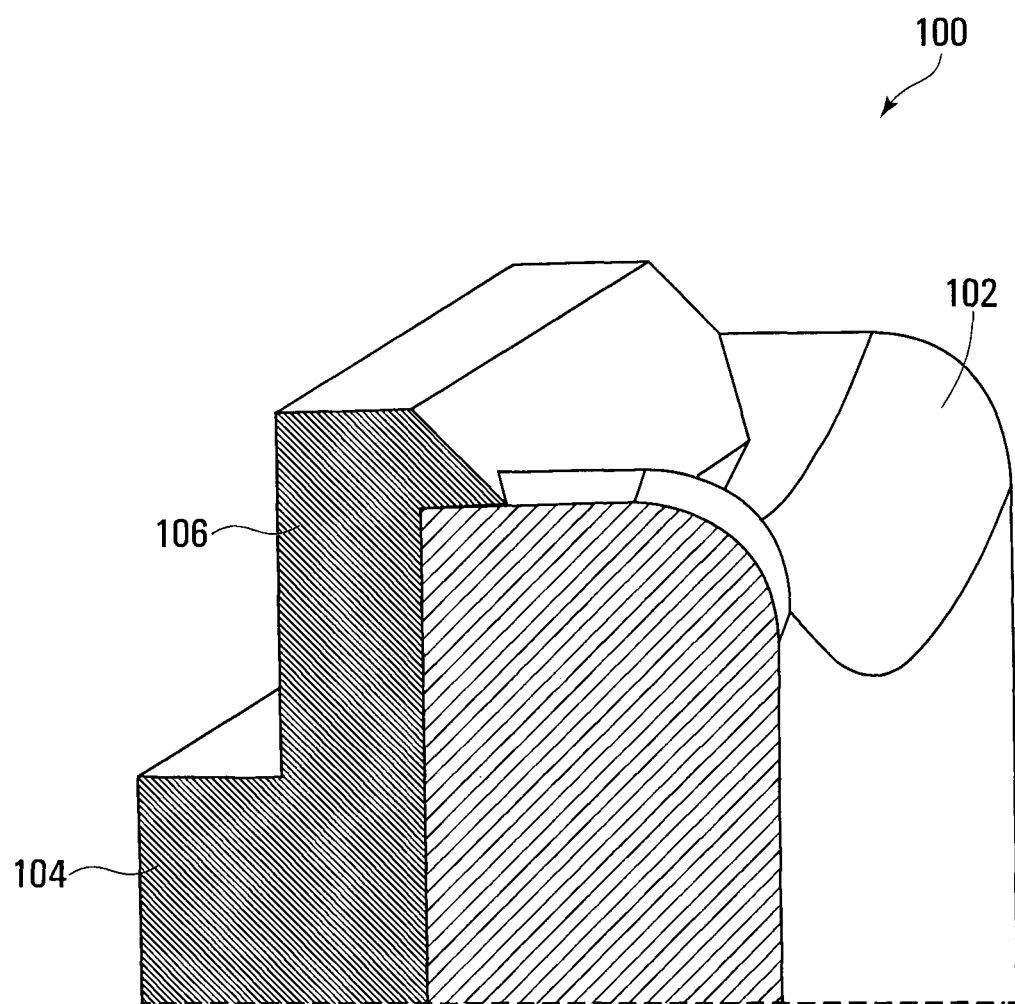

FIG. 60 depicts a tile assembly 100 with a tile 102, a stabilizer 104, and an attachment feature 106. As depicted in FIG. 60, the edge of the tile 102 may be curved.

In some embodiments, to avoid breakage of the tile 102 during manufacturing of the tile assembly 100, a resilient tool material may be provided where the tile 102 meets the tool.

There may be low pressure due to the variotherm process, which may be due to slow filling with little pressure due to hot tool. There may be sufficient injection points to further reduce pressure.

Figure 61:
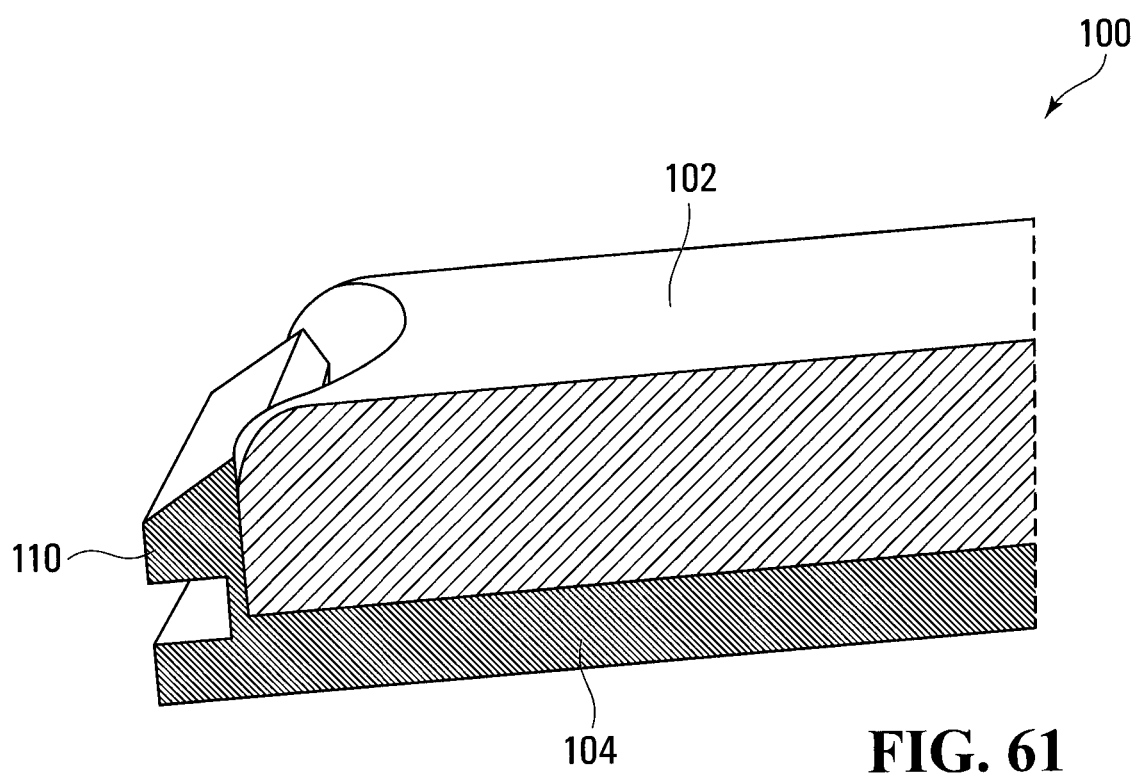

FIG. 61 depicts a tile assembly 100 with a tile 102, a stabilizer 104, and a female attachment feature 110. As depicted in FIG. 60, the length of the female attachment feature 110 extending from the tile may be, for example, 1900 mm.

Figure 62:
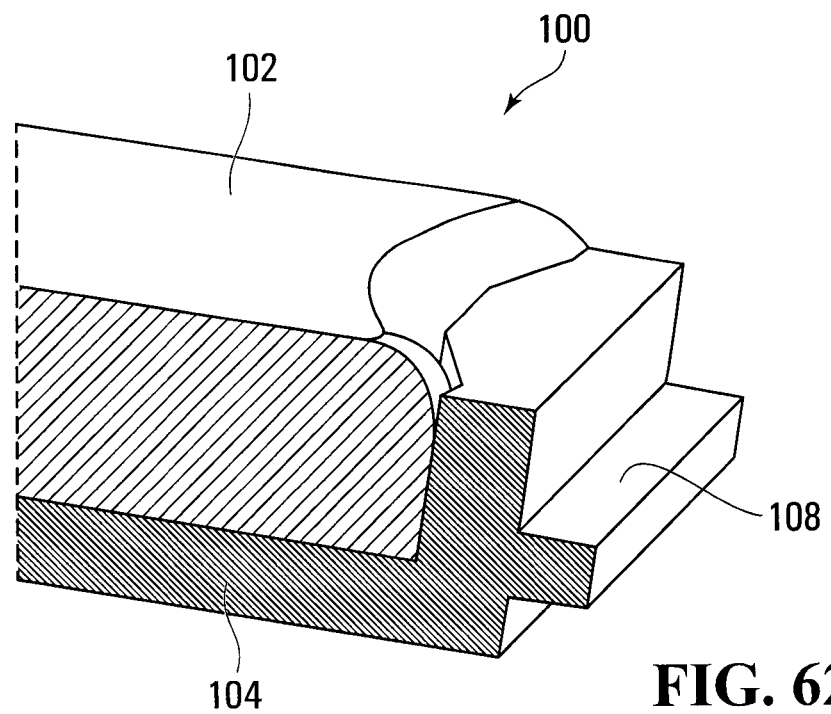

FIG. 62 depicts a tile assembly 100 with a tile 102, a stabilizer 104, and a male attachment feature 108.

Figure 63:
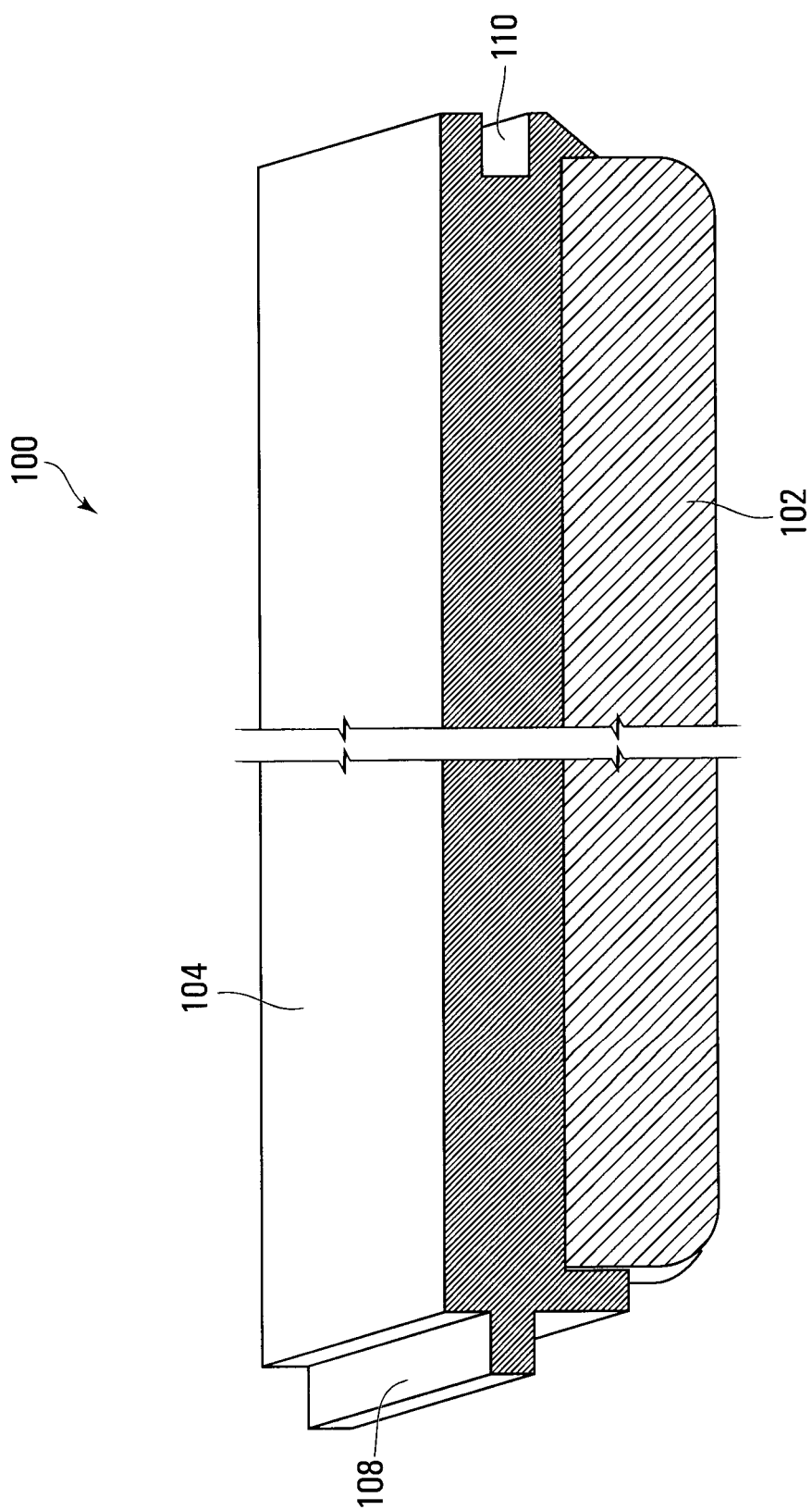

FIG. 63 depicts a tile assembly 100 with a tile 102, a stabilizer 104, a male attachment feature 108 and a female attachment feature 110.

Figure 64:
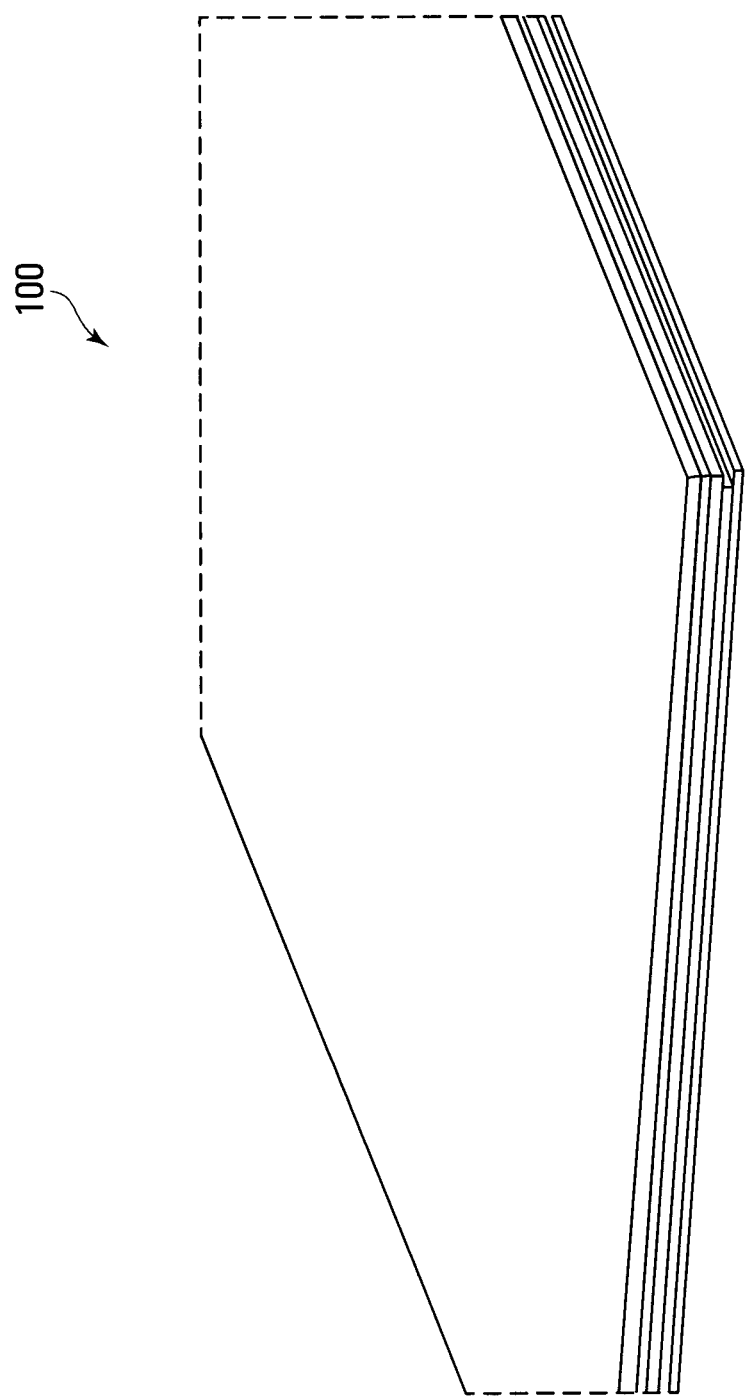
FIG. 64 is a schematic of a press-welded tile assembly.

FIG. 64 is a schematic of a press-welded tile assembly 100.

Figure 65:
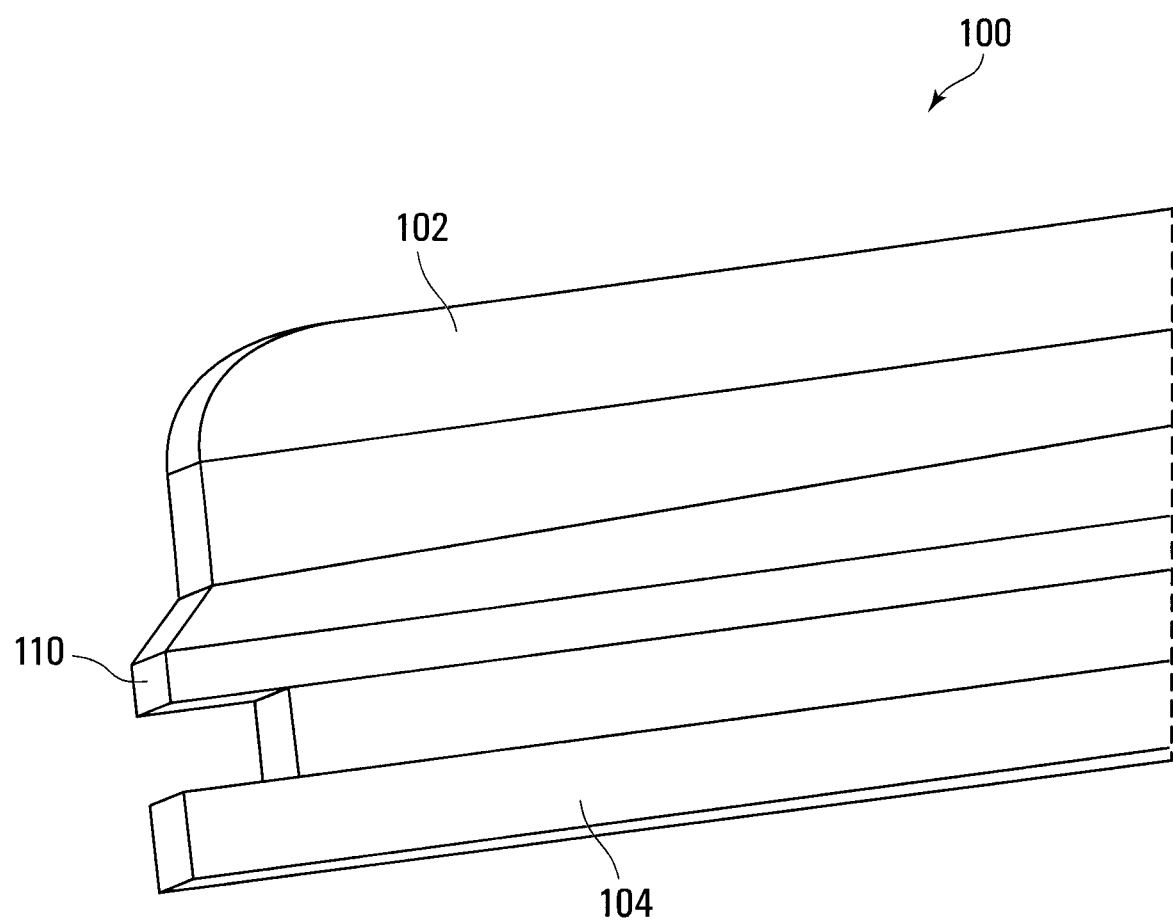
FIG. 65 is a schematic of a tile assembly with a tile, a stabilizer, and a female attachment feature.

FIG. 65 depicts a tile assembly 100 with a tile 102, a stabilizer 104, and a female attachment feature 110. As depicted in FIG. 60, the length of the female attachment feature 110 extending from the tile may be, for example, 1900 mm.

In some embodiments, it may be possible to have multiple moulds manufacturing tile assemblies from a single press. It may also be possible to do this on a lot to lot basis. For example, a certain number of 12" tiles may be moulded, and then some inserts in the tool may be changed or process parameters may be changed to run the 18" tile. This may be more efficient.

In some embodiments, the moulded polymer (e.g. moulded PET) of the tile assembly may be 2 mm thick. In some embodiments, the moulded polymer (e.g. moulded PET) of the tile assembly may be more than 2 mm thick (e.g. 4 mm thick).

In some embodiments, with a slider concept, the tongue and groove attachment feature 106 may be relatively easy to manufacture and for producing a tile assembly 100 with the tongue and groove attachment feature 106.

In some embodiments, for a female attachment feature 110, the depth of the groove may be variable. For example, the depth of the groove may be 2 mm, or may be greater or less than 2 mm.

The tile assemblies discussed herein may be installed on a surface. In some embodiments, to install the tile assembly on a surface, a mount assembly may be first installed on the surface, and the tile assembly may then be connected to the mount assembly to install the tile assembly to the surface.

Figure 66:
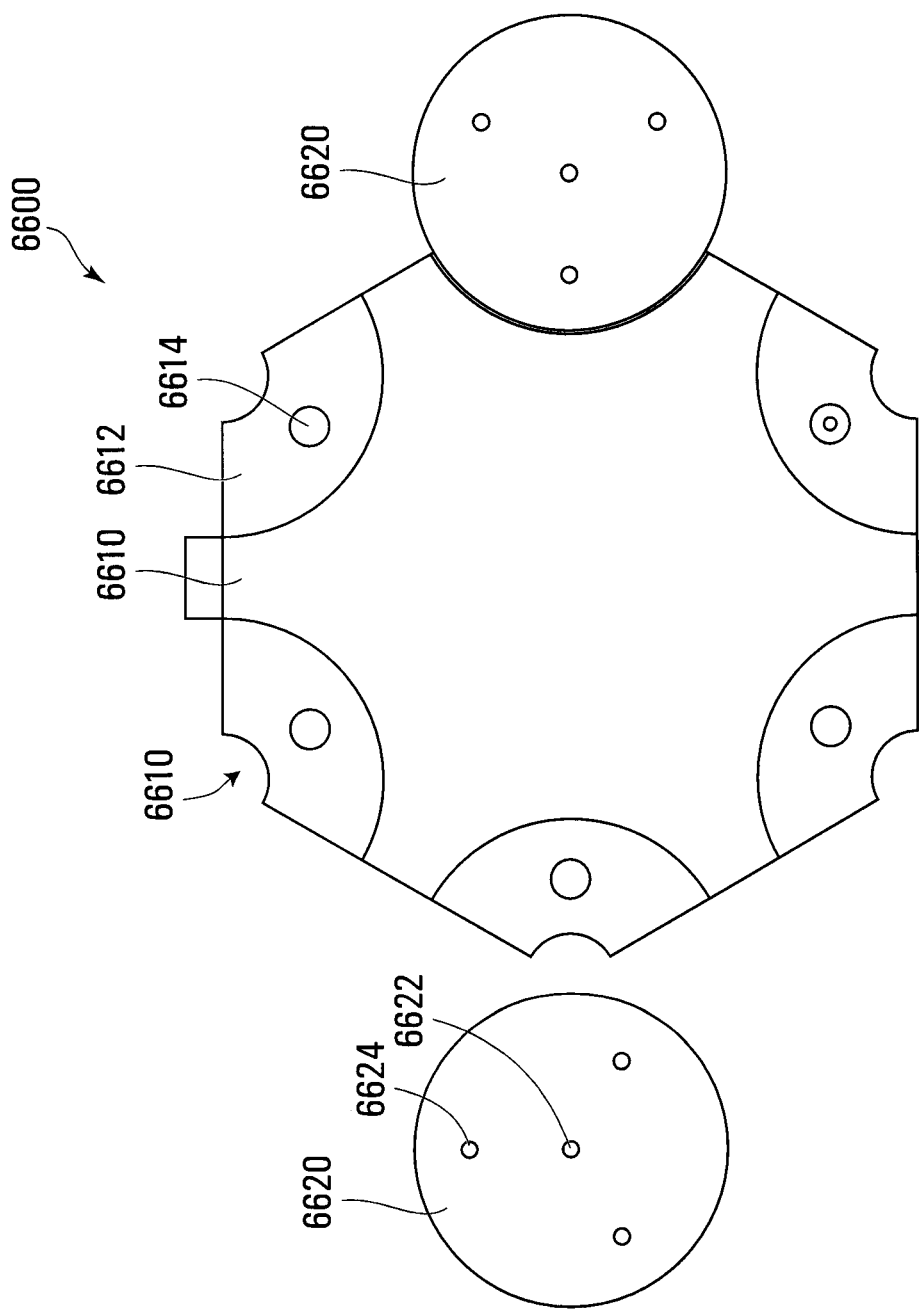
FIG. 66 is a schematic of a mount assembly.

FIG. 66 is a schematic of a mount assembly 6600.

The mount assembly 6600 may comprise a plate 6610. The tile assemblies may be removably connected to the surface of the plate 6610. For example, the surface of the plate 6610 may have hooks to correspond to loops on the bottom surface of the tile assembly, such that the tile assembly may be connected to the plate 6610 and be removable from the plate 6610. As depicted in FIG. 66, the plate 6610 has a generally hexagonal shape. In some embodiments, the plate 6610 may have other shapes. For example, the plate 6610 may have a circle, triangle, square, rectangle, pentagon, heptagon, octagon, an irregular shape, shape with at least one curved side, and the like.

The plate 6610 may have one or more recesses 6612 for receiving a joining component (e.g. a disc) for connecting the plate 6610 to other plates 6610, or for connecting the plate 6610 to the surface under or behind the plate 6610. As depicted in FIG. 66, the plate 6610 has six recesses 6612. In some embodiments, the number of recesses 6612 may depend on the configuration of the plate 6610 and how the plate 6610 is to be connected to the surface under or behind the plate 6610. For example, there may be a recess 6612 at each corner of the plate 6610.

The plate 6610 may have one or more channels 6614 for receiving a connector (e.g. screw, plug, nail, etc.) for securing the plate 6610 to the surface under or behind the plate 6610. The channel 6614 may extend through the plate 6610 between the top and bottom surface of the plate 6610. The size of the channel 6614 may depend on the connector used for securing the plate 6610 to the surface under or behind the plate 6610.

The plate 6610 may have one or more corner channels 6616 for receiving a connector (e.g. screw, plug, nail, etc.) for securing the plate 6610 to the surface under or behind the plate 6610. The corner channel 6616 may extend through the plate 6610 between the top and bottom surface of the plate 6610. The size of the channel 6616 may depend on the connector used for securing the plate 6610 to the surface under or behind the plate 6610.

The dimensions and configurations of the plate 6610, and the location and configurations of the recess 6612, the channel 6614, or the corner channel 6614 may be based on building supports of the surface on which the plate 6610 is to be connected. For example, the dimensions and configurations of the plate 6610, and the location and configurations of the recess 6612, the channel 6614, or the corner channel 6614 may be based on stud spacing of a wall on which the plate 6610 is to be connected. As another example, the dimensions and configurations of the plate 6610, and the location and configurations of the recess 6612, the channel 6614, or the corner channel 6614 may be based on centre to centre on studs of a wall on which the plate 6610 is to be connected.

The mount assembly 6600 may comprise a joining component 6620 for connecting plates 6610 together and for connecting the plates 6610 to the surface under or behind the plates 6610. As depicted in FIG. 66, the joining component 6620 is a circular disc. In some embodiments, the joining component 6620 may be other shapes, such as triangle, square, rectangle, pentagon, heptagon, octagon, an irregular shape, shape with at least one curved side, and the like.

The joining component 6620 may be received in the recess 6612 of the plate 6610. When three plates 6610 are brought together, the joining component 6620 may be received in a circular recess 6613 defined by the recesses 6612 of the three plates 6610.

The thickness of the joining component 6620 may be such that when the joining component 6620 is received in the recess 6612 of the plate 6610, the top surface of the joining component 6620 may be flush with the top surface of the plate 6610.

The joining component 6620 may have a central channel 6622 and one or more peripheral channels 6624 for receiving a connector (e.g. screw, plug, nail, etc.) for securing the plate 6610 and the joining component 6620 to the surface under or behind the plate 6610. As depicted in FIG. 66, the joining component 6620 has three peripheral channels 6624 and one central channel 6622. The channels 6624 and 6622 may extend through the joining component 6620 between the top and bottom surface of the joining component 6620. The size of the central channel 6622 and peripheral channel 6624 may depend on the connector used for securing the plate 6610 and joining component 6620 to the surface under or behind the plate 6610.

In some embodiments, the feature of the top surface of the plate 6610 that connects with the tile assemblies may also be on the top surface of the joining component 6620.

To secure the plate 6610 and the joining component 6620 to a surface, the plates 6610 may be brought together (e.g. brought together at a corner) to define a recess 6613 for receiving the joining component 6620. The joining component 6620 may be received in the recess 6612 or recess 6613. The central channel 6622 may be aligned with the corner channels 6616 of the plates 6610 (which, when the plates 6610 are brought together, the corner channels 6616 of the plate may together define a channel 6618) and the peripheral channels 6624 may be aligned with the channels 6614 of the plates 6610. Then, connectors may be inserted through the central channel 6622 of the joining component 6620, the corner channels 6616 of the plate 6610 defining the channel 6618, the peripheral channels 6624 of the joining component 6620, or the channels 6614 of the plate 6610 to connect the plates 6610 and the joining component 6620 to the surface under or behind the plate 6610.

In some embodiments, the plate 6610 may be hook plate, where the plate 6610 may have one or more hooks on the surface of the plate 6610 for connecting with a tile assembly.

In some embodiments, the plate 6610 or joining component 6620 may be manufactured using a process with low investment cots. For example, the plate 6610 or joining component 6620 may be manufactured using moulding, welding, machining, 3-D printing, and the like.

3-D printing the plate 6610 or joining component 6620 may be beneficial. There may be potential ability to manufacture the hooks on the surface of the plate 6610 or joining component 6620. It may be possible to directly print hooks. The hooks may have various and different shapes and may be optimized.

The technology may be scalable using relatively cheap components. The process may be used for mass production. For examples, a plurality of nozzles side my side may extrude the hooks.

3D-printing may allow the plate 6610 or joining component 6620 to have a hollow inner structure, which may allow for thicker plate 6610 or joining component 6620 without sacrificing weight. In addition, if the plate 6610 or joining component 6620 has a hollow inner structure, it may be easy to cut the plate 6610 or joining component 6620 at a preferable direction.

When 3-D printing the plate 6610 or joining component 6620, their shape and dimensions and configurations may be customized.

In some embodiments, the plate 6610 or joining component 6620 or tile assemblies described herein may be customized. A room may be scanned with a laser-supported 3D camera to get the measurements of the room. The plate 6610 or joining component 6620 or tile assemblies may be generated automatically so on-site adaptation or cutting may not be required.

The mount assembly 6600 may be connectable with a tile assembly. The loops of the tile assembly may be attached to the bottom surface of the tile assembly, such as the bottom surface of the tile assembly, or the stabilizer, or a foam backing.

In some embodiments, the plate 6610 may have an expansion joint in the confines of the plate 6610.

The mount assembly 6600 may be configured to be relatively universally applicable to various surfaces.

The plate 6610 or the joining component 66220 may be hollow, have recesses, or have channels extending through to reduce weight.

In some embodiments, the exterior of the plate 6610 or joining component 6620 may appear the same, and the interior of the plate 6610 or joining component 6620 may be changed for a specific use.

In some embodiments, the plate 6610 may be shaped like a square or hexagon. The plate 6610 or joining component 6620 may be relatively flat.

In some embodiments, a plate 6610 with all hooks may be required for commercial use for vinyl.

In some embodiments, a thin surface veneer may go into mould backed with plastic.

The mount assembly 6600 may be designed with tolerances for installation.

In some embodiments, the raw material for the plate 6610 or joining component 6620 may be a low cost or lowest cost option material. For example, PET may be used to manufacture the plate 6610 or joining component 6620. In some embodiments, additives or filler may be used to optimize features.

In some embodiments, the plate 6610 may be hexagon shape.

In some embodiments, the maximum width or length of the plate 6610 may be 2 feet.

In some embodiments, the maximum thickness of the plate 6610 may be ⅛" or wider to allow for inserts on the side of the plate 6610, such as flanges, tongue and groove, etc.

In some embodiments, the weight of the mount assembly 6600 may be as light as possible while maintaining stability or rigidity optimization. For example, the weight may be 0.4416 pounds or kilograms per square foot.

In some embodiments, on the back of the plate 6610, there may be cut outs for weight optimization. The design of the plate 6610 may consider "coining" and whether flatness may be necessary.

In some embodiments, the connector or fastener for fastening the plate 6610 or joining component 6620 to the surface under or behind the plate 6610 may be screw sights. Where the plate 6610 has a hexagon shape, the corner of 3 plates may come together. In some embodiments, washers may be needed. In some embodiments, other design features may be needed. In some embodiments, the corner of the plate 6610 may have a recess or double recess. In some embodiments, a full cap may be used.

In some embodiments, there may be attachment features for connecting plates 6610 together. The attachment features may be similar to attachment features described herein for tile assemblies. In some embodiments, the attachment features may be tongue and groove, or slots, for positioning and versatility. In some embodiments, there may be tongue and groove flanges at corners and flat surface to surface.

In some embodiments, the joint between plates 6610 may have no space for expansion or contraction. Instead, if required, cut outs as series of holes throughout the plate 6610 may be considered to accommodate expansion or contraction.

In some embodiments, a plate 6610 for mounting to a wall may have different connections with another plate 6610 than a plate 6610 for installing on a floor.

In some embodiments, the wall plate design and floor plate design may be effectively one mound with same or consistent features.

In some embodiments, the plate 6610 may have additional provision for one or more tongue and groove attachment features on all sides of the plate 6610 for waterproof installation. In some embodiments, flanges for side to side attachment may include features for click-lock, snapping, or male and female connections. In some embodiments, the joint between plates 6610 may be tight so as to reduce or eliminate any telegraphy. This may lead to expansion or contraction. Expansion or contraction may be resolved by "acclimatization" or holes with or recesses in or on the plates 6610.

The attachment feature of the plate 6610 may be a slot without two sides with tongue and groove.

In some embodiments, the mount assembly 6600 may be a resilient mount assembly comprising adhesive plates and discs. The mount assembly 6600 may be made with vinly composition tile (VCT), luxury vinyl tile (LVT), marmoleum, rubber, a polymer, or the like. The materials may be sheets.

In some embodiments, the mount assembly 6600 may have a hard surface, such that the mount assembly 6600 comprises hook and loop plates and discs. The mount assembly 6600 may be made with ceramic, porcelain, granite, marble, stone, and the like.

In some embodiments, the mount assembly 6600 may have a soft surface, such that the mount assembly 6600 comprises hook and loop plates and discs. The mount assembly 6600 may be made with carpet, wide width carpet, or carpet tiles.

In some embodiments, the plate 6610 or joining component 6620 may have raised areas for reducing contact area with adhesive backed surfaces.

In some embodiments, the joining component 6620 may be designed to also form raised areas for reduction or elimination of telegraphy.

In some embodiments, the joints where plates 6610 meet may be designed to reduce or eliminate gap to mitigate or avoid cracking and telegraphy.

In some embodiments, the plate 6610 or joining component 6620 may be designed to also use a secondary process. The plate 6610 or joining component 6620 may be designed to avoid coining.

In some embodiments, the materials used for manufacturing the plate 6610 or joining component 6620 may reduce cost of manufacturing the plate 6610 or joining component 6620. The manufacturing of the plate 6610 or joining component 6620 may include filler; recycled polymer, or polymer.

In some embodiments, the mount assembly 6600 may have no rib structure, a hexagonal structure, or a rectangular rib structure, or another kind of rib structure.

In some embodiments, the mount assembly 6600 may be installed vertically, horizontally, or a combination thereof.

In some embodiments, the joining component 6620 may have a certain size and certain functions, such as to manage a vertical load and be laterally flat.

Figure 67:
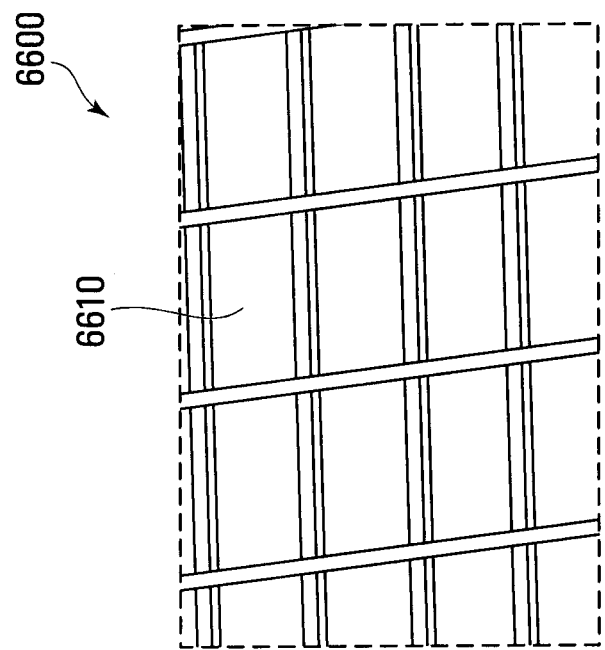
FIG. 67 is a schematic of plates of a mount assembly.
Figure 67:
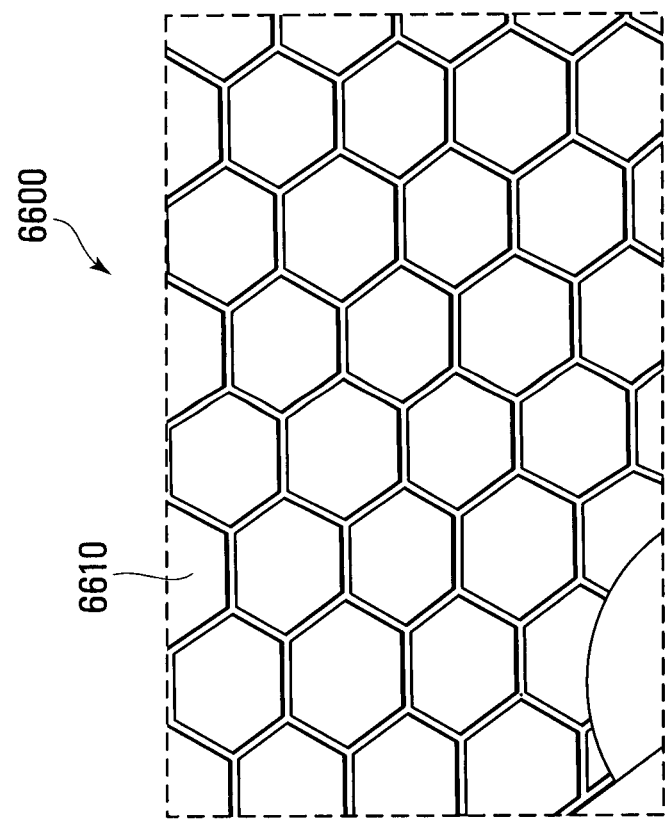

FIG. 67 is a schematic of plates 6610 of mount assemblies 6600. FIG. 67 depicts two plates 6610 having rib structures. In some embodiments, when a plate 6610 is to be installed on a wall, it may be easier to have rib structures compared to a plate that is to be installed on a floor, because there may be less stress applied to the plate 6610 installed on the wall.

In some embodiments, the rib structure of the plate 6610 may have a structure. As depicted in FIG. 67, the plate 6610 may, for example, have a hexagon rib structure or rectangular rib structure. In some embodiments, having a rectangular rib structure may be beneficial for cutting the plate 6610.

Figure 68:
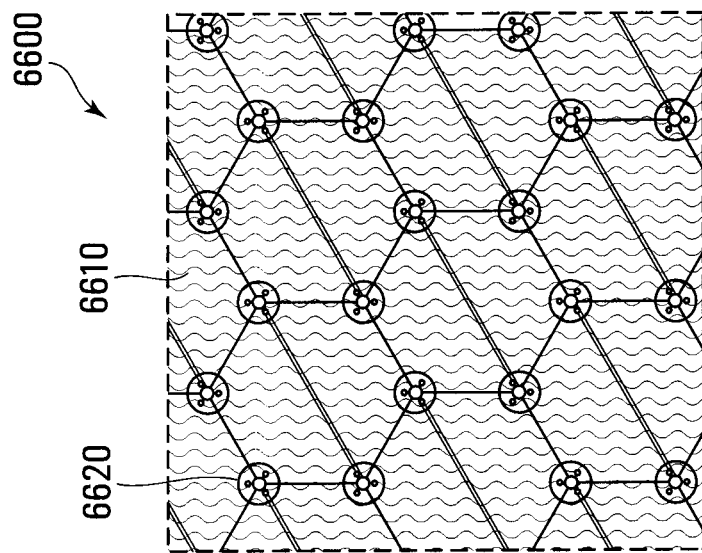
FIG. 68 is a schematic of mount assemblies with plates installed horizontally and vertically.
Figure 68:
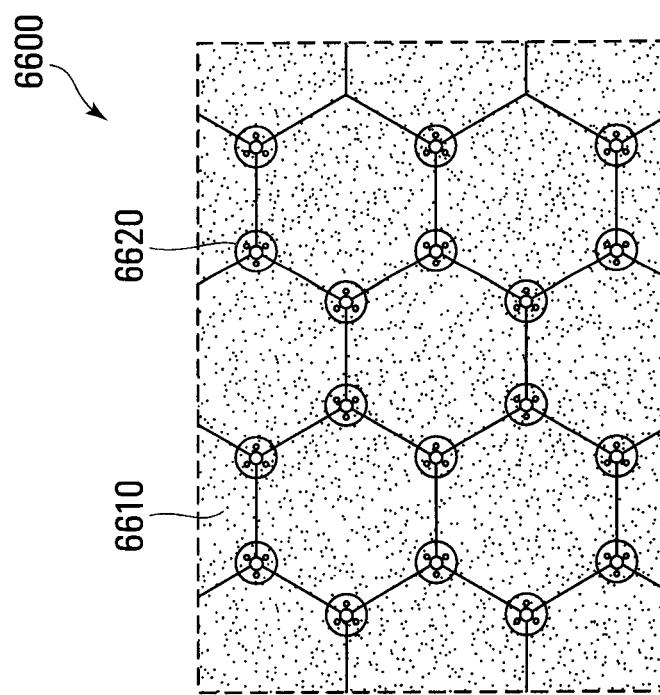

FIG. 68 is a schematic of a mount assembly 6600 with plates 6610 joined by joining components 6620. As depicted in FIG. 68, the plates 6610 may be installed horizontally on the surface with a bottom edge of the plates 6610 aligned generally horizontally, or the plates 6610 may be installed on the surface vertically or "on tip", with a corner of the plates 6610 pointing downwards.

In some embodiments, it may be beneficial to install the plates 6610 vertically or "on tip". Vertical force may be carried by one attachment point (e.g. by a joining component 6620) in the vertical direction. Further, during installation, the plate 6610 may be held in place by two joining components 6620, which may stabilize the plate 6610 and facilitate installation of the mount assembly 6600.

Figure 69:
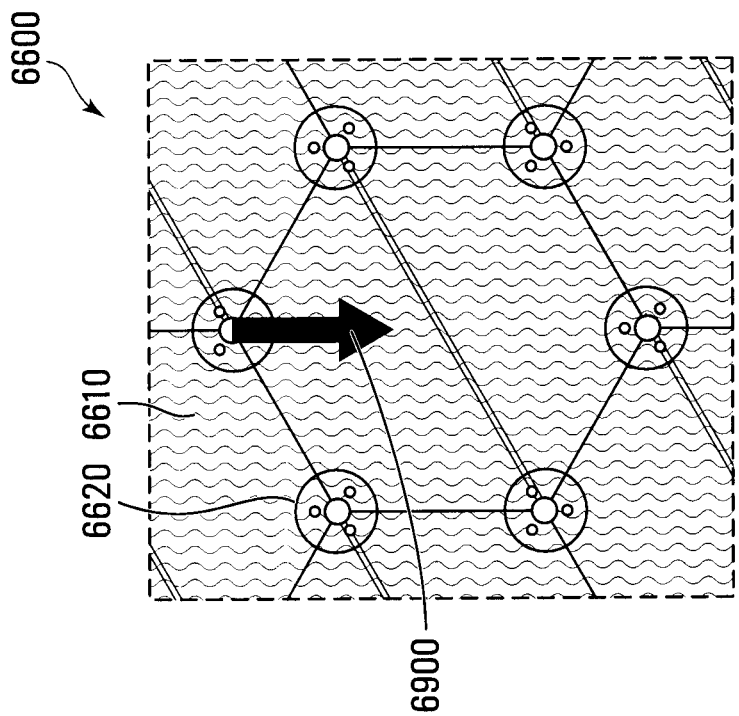
FIG. 69 is a schematic of mount assemblies with plates installed horizontally and vertically.
Figure 69:
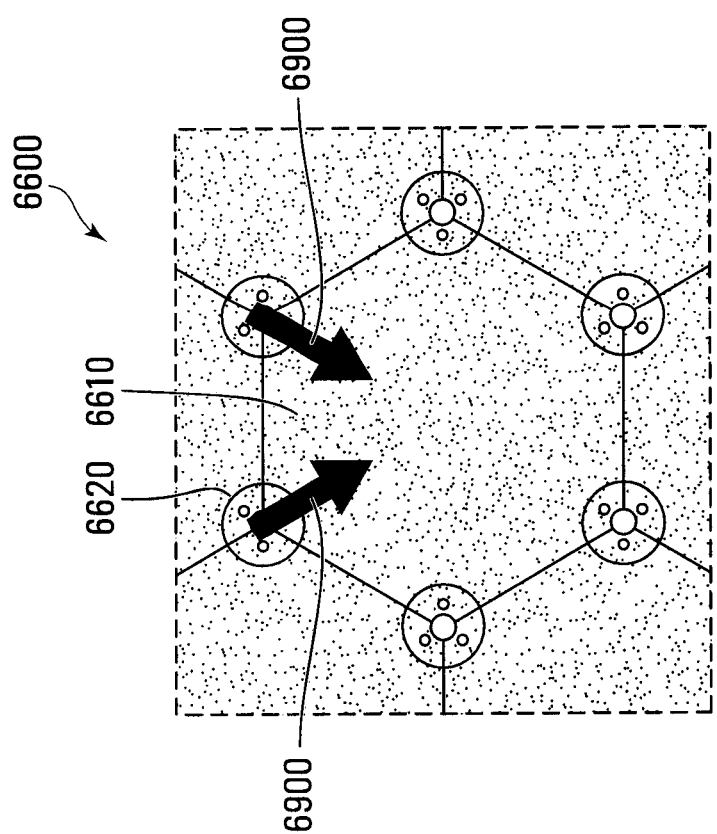

FIG. 69 is a schematic of mount assemblies 6600 with plates 6610 installed horizontally and vertically. Where the plate 6610 is installed vertically, the direction of the force 6900 may be more clearly defined. Where the plate 6610 is installed horizontally, the force 6900 may try to turn the plate 6610 or joining component 6620.

Figure 70:
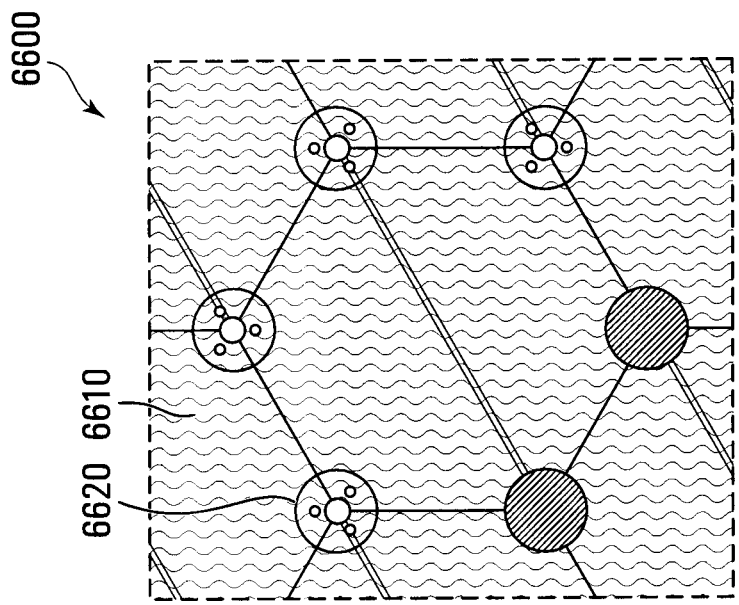
FIG. 70 is a schematic of mount assemblies with plates installed horizontally and vertically.
Figure 70:
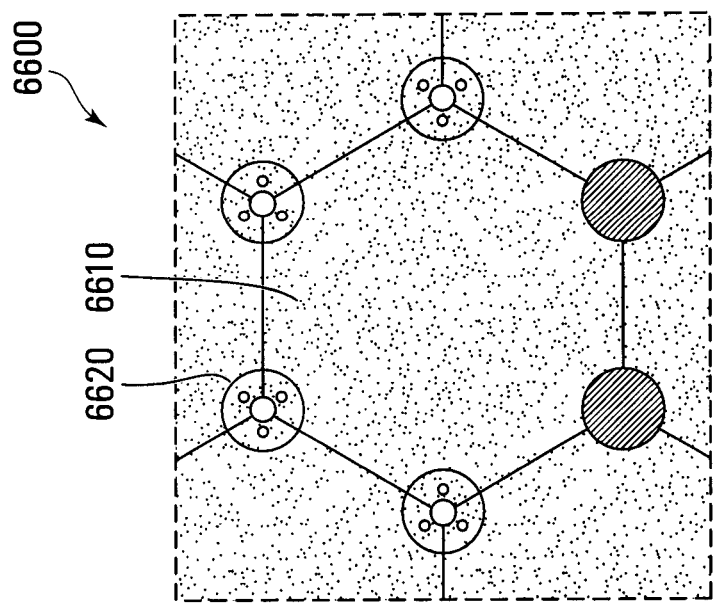

FIG. 70 is a schematic of mount assemblies 6600 with plates 6610 installed horizontally and vertically. When the plates 6610 are installed vertically, they may be more stable, such as during installation of the plates 6610.

Figure 71:
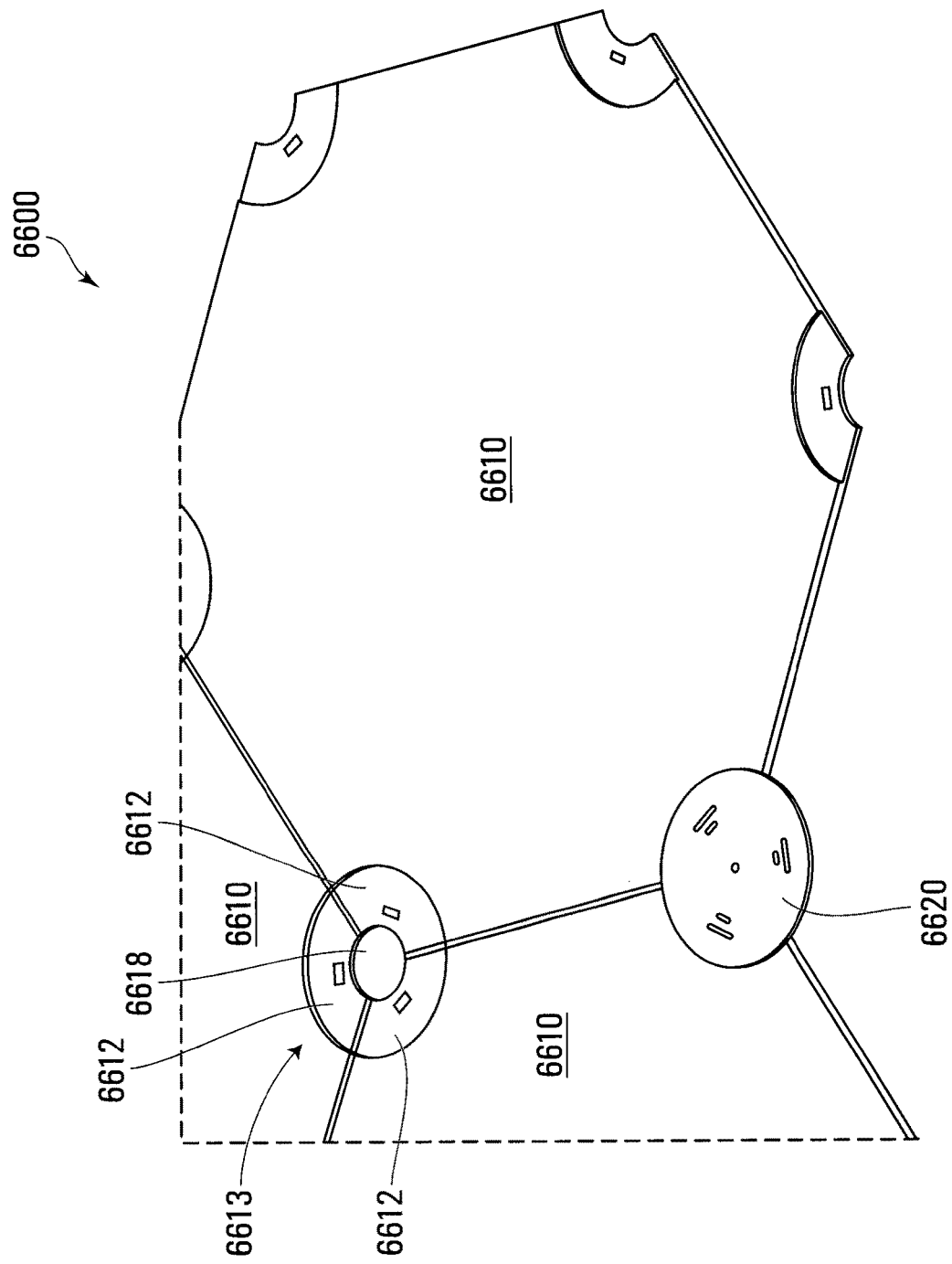
FIG. 71 is a schematic of a plate of a mount assembly.

FIG. 71 is a schematic of a plate of a mount assembly 6600. As depicted in FIG. 71, when installing the mount assembly 6600, the plates 6610 are connected together with a joining component 6620. FIG. 71 depicts the recess 6613 defined by the recesses 6612 of a plurality of plates 6610 brought together for receiving the joining component 6620. FIG. 71 depicts the channel 6618 defined by the corner channels 6616 of a plurality of plates 6610 brought together for receiving a connector to connect the mount assembly 6600 to a surface.

The joining component 6620 may be circular in shape, as depicted in FIG. 71.

The joining component 6620 may be a disc. The joining component 6620 may mount the plates 6610 to a surface, transfer vertical load, or bring lateral flatness to the plates 6610. The size of the joining component 6620 may be such that it may connect with the plates 6610.

Figure 72:
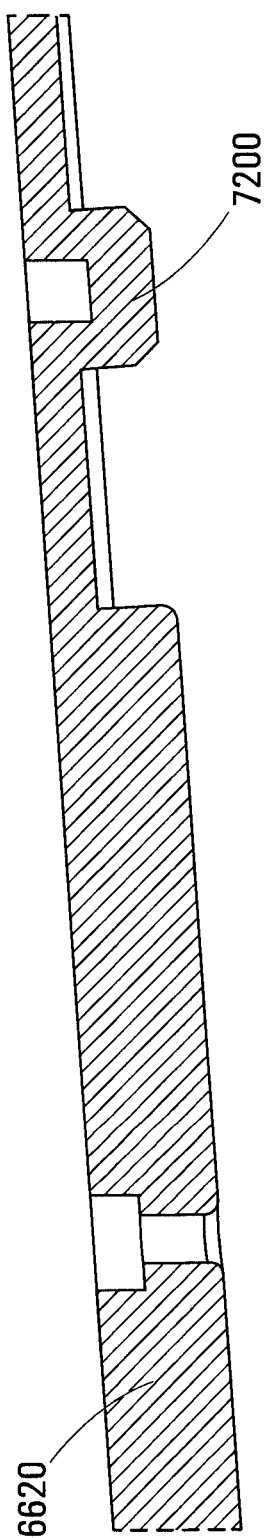
FIG. 72 is a schematic of a joining component of the mount assembly.

FIG. 72 is a schematic of a joining component 6620 of the mount assembly 6600. In some embodiments, the joining component 6620 may comprise a plug 7200 for connecting with the plate 6610 or mounting the mount assembly 6600 to a surface. In some embodiments, the plug 7200 may be received in the channel 6614 or the corner channel 6616 of the plate 6610.

Figure 73:
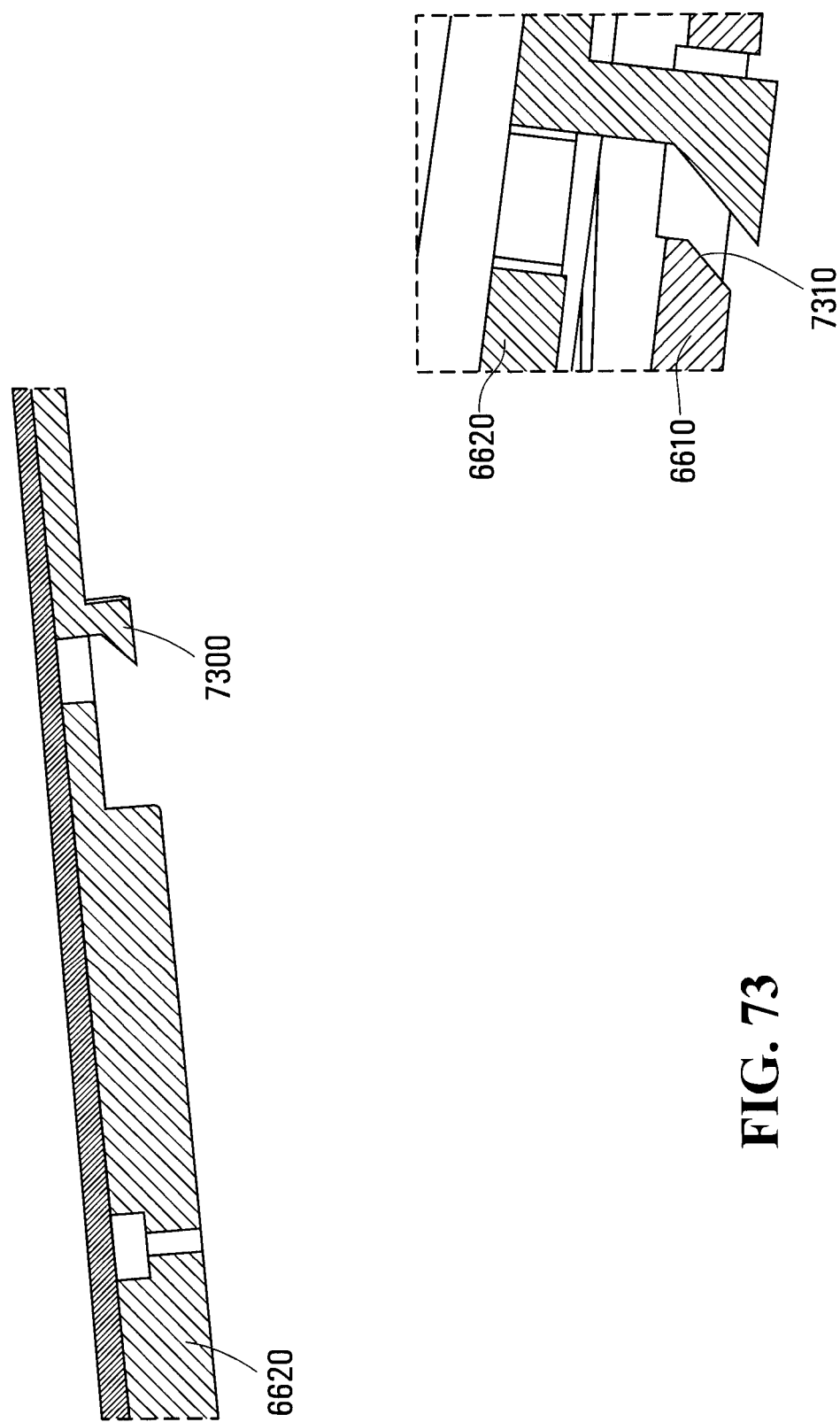
FIGS. 73-74 are schematics of a joining component of the mount assembly.
Figure 74:
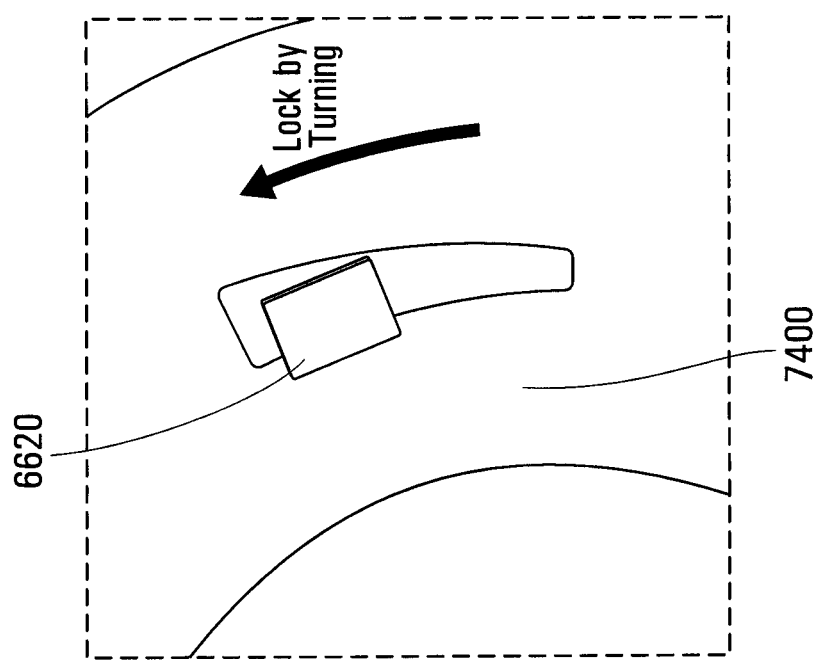
Figure 74:
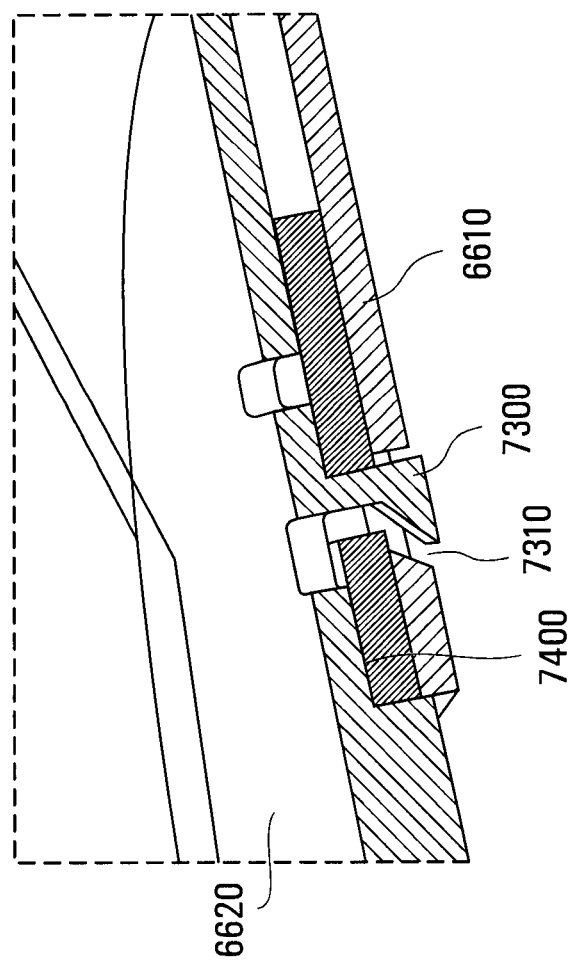

FIGS. 73-74 is a schematic of a joining component 6620 of the mount assembly 6600. In some embodiments, as depicted in FIG. 73, the joining component 6620 may comprise an engaging hook 7300 for engaging with the plate 6610 or mounting the mount assembly 6600 to a surface. The plate 6610 may have a gap 7310 for receiving the engaging hook 7300 for connecting the joining component 6620 and the plate 6610. The hook 7300 may snap engage with the gap 7310. The hook 7300 may receive the force applied to the mount assembly 6600 in this direction.

As depicted in FIG. 74, when the hook 7300 is received in the gap 7310, the hook 7300 and the gap 7310 may be configured such that the joining component 6620 may be twisted to connect with the plate 6610. In some embodiments, there may be a locking feature 7400 between the plate 6610 and the joining component 6620 for promoting connection between the plate 6610 and the joining component 6620.

Figure 75:
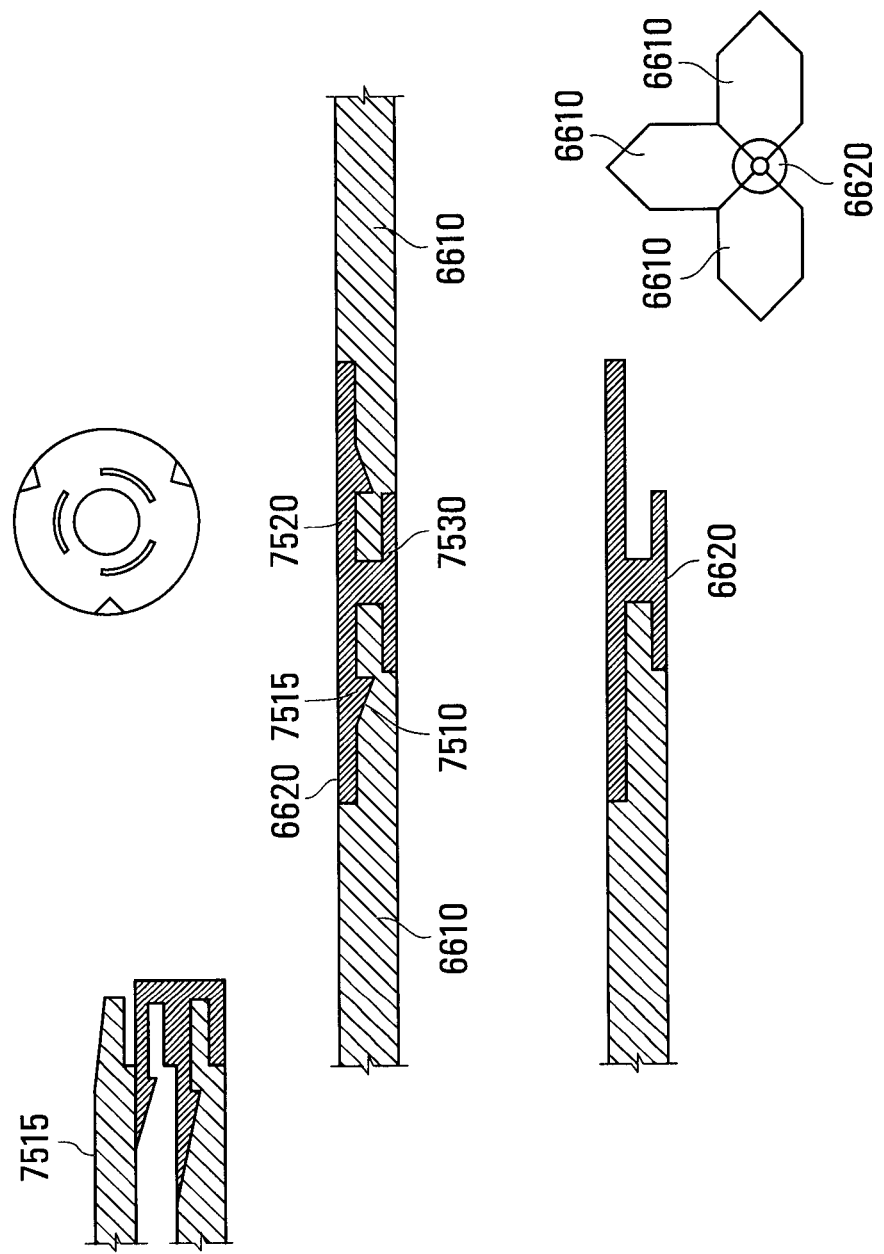
FIG. 75 is a schematic of a joining component of the mount assembly.

FIG. 75 is a schematic of a joining component 6620 of the mount assembly 6600. As depicted in FIG. 75, the joining component 6620 is connecting plates 6610 together. The joining component 6620 as depicted in FIG. 75 may comprise a barb 7510 on a top portion 7520 of the joining component 6620. The joining component 6620 as depicted in FIG. 75 may comprise a bottom portion joined to the top portion by a column 7540. In some embodiments, the plate 6610 may have a corresponding recess 7515 for receiving the barb 7510 of the joining component 6620. The plate 6610 or the joining component 6620 may be configured such that the plate 6610, joining component 6620, the barb 7515, or a combination thereof, may elastically deform when the plate 6610 and the joining component 6620 are connected together by receiving the barb 7510 in the recess 7515. The plate 6610, joining component 6620, the barb 7515, or a combination thereof may return to its original shape after the barb 7510 is received in the recess 7515.

In some embodiments, the edge of the plate 6610 may be a barb or act as a barb when being inserted in a recess defined between the top portion 7520 and bottom portion 7530 of the joining component 6620.

As depicted in FIG. 75, the plate 6610 may be supported between the top portion 7520 and the bottom portion of the 7530 of the joining component 6620.

In some embodiments, the joining component 6620 may have a channel extending through the column 7540 to receive a connector (e.g. nail, screw, plug, etc.) for connecting the plate 6610 and the joining component 6620 to a surface. In some embodiments, the joining component 6620 may be made of a material such that a connector may be driven through the column 7540 for connecting the plate 6610 and the joining component 6620 to a surface.

Figure 76:
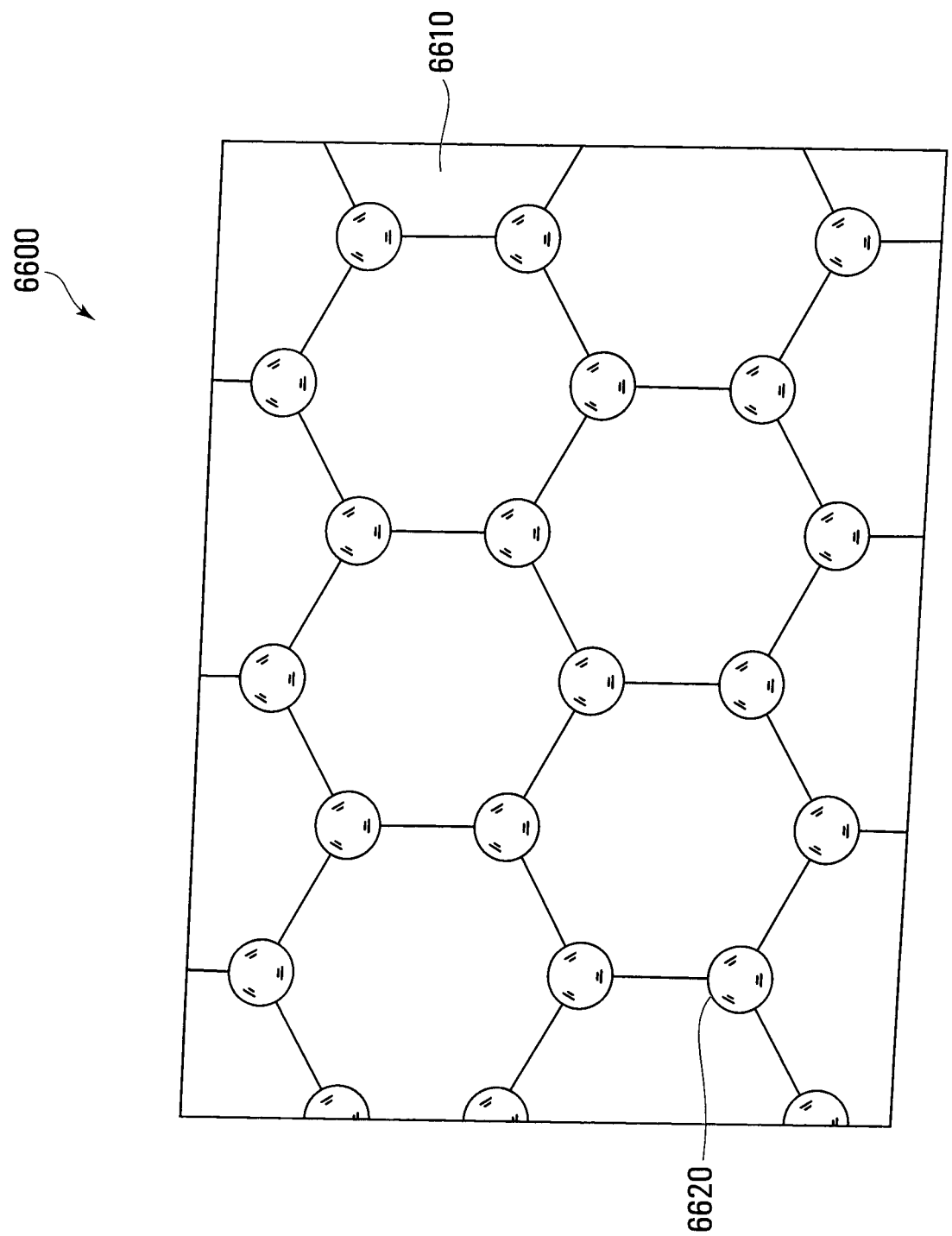
FIG. 76 is a schematic of a mount assembly with the plates and joining components assembled together.

FIG. 76 is a schematic of a mount assembly 6600 with the plates 6610 and joining components 6620 assembled together.

Figure 77:
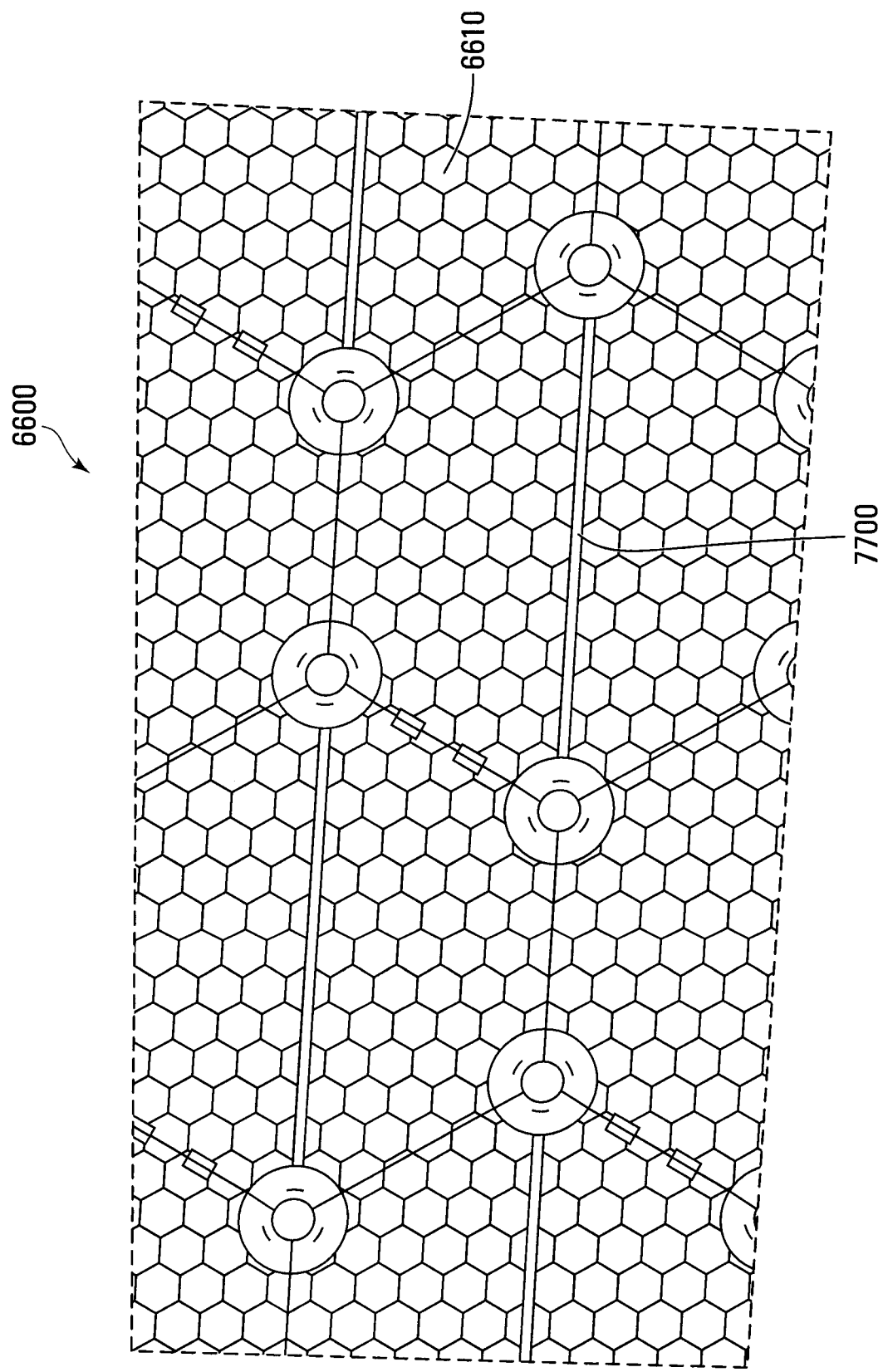
FIG. 77 is a schematic of a mount assembly with gaps on the plates.

FIG. 77 is a schematic of a mount assembly 6600 with gaps 7700 on the plates 6610. The gaps 7700 may allow the plates 6610 to be cut prior to installation.

Figure 78:
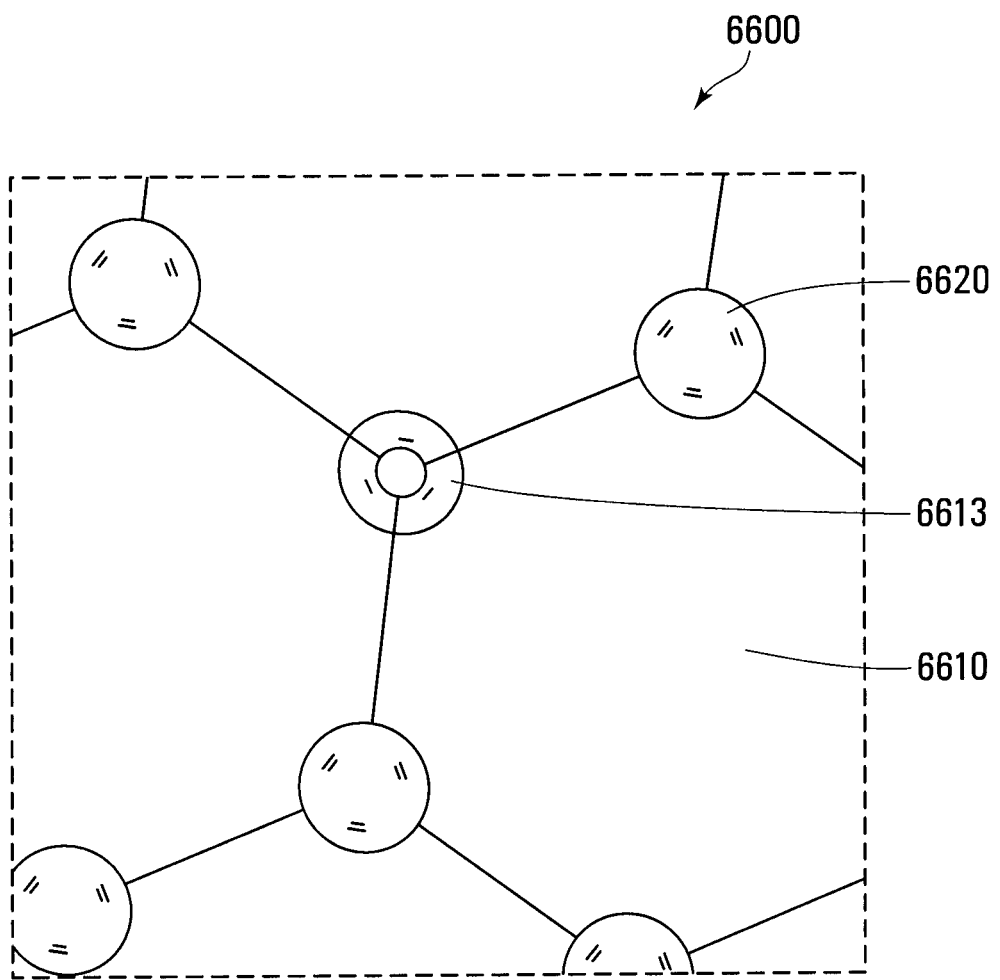
FIG. 78 is a schematic of a mount assembly.

FIG. 78 is a schematic of a mount assembly 6600. As depicted in FIG. 78, the mount assembly 6600 may be secured to a surface without every recess 6613 receiving a joining component 6620. The connection between the mount assembly 6600 and the surface may be sufficiently strong such that the mount assembly 6600 may be secured to the surface without every recess 6613 receiving a joining component 6620 and connected to the surface at that point.

Figure 79:
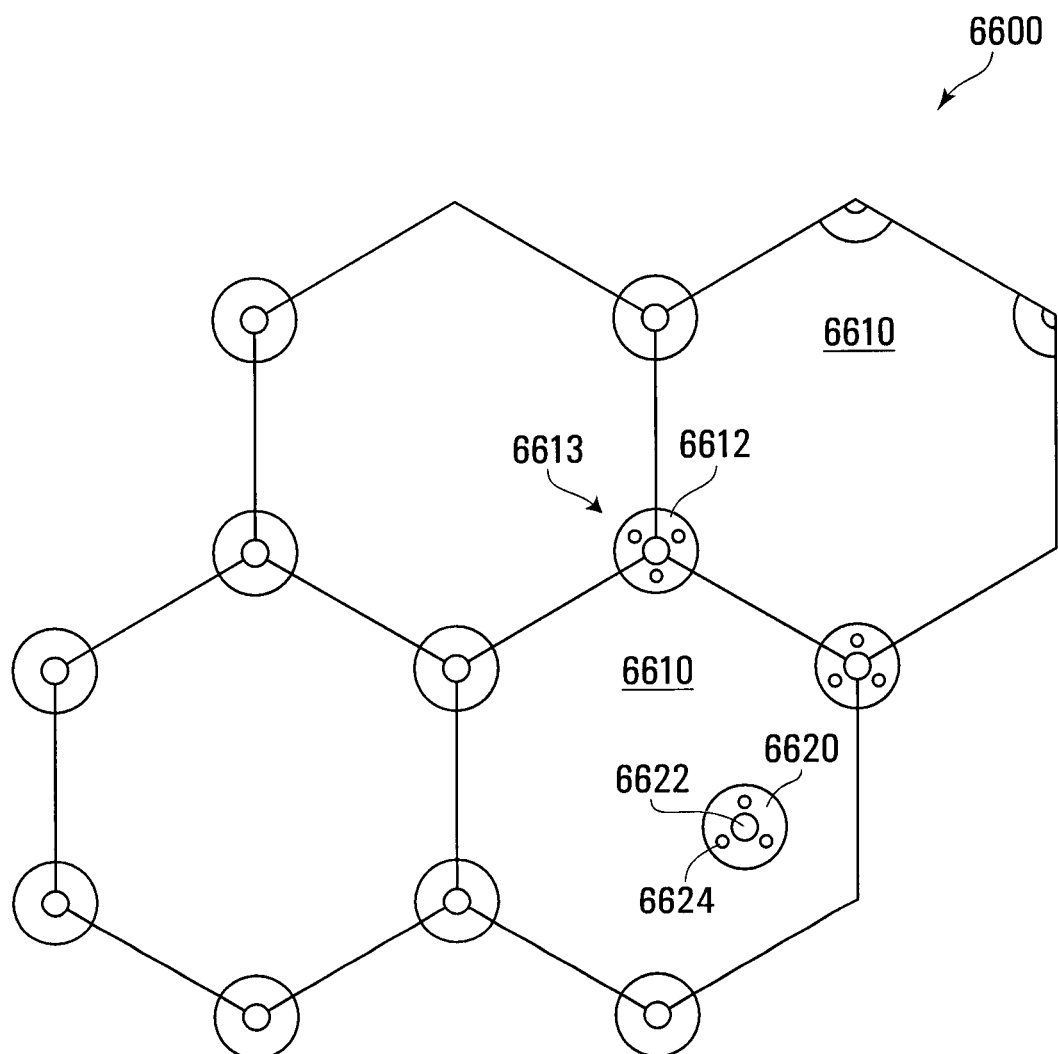
FIG. 79 is a schematic of a mount assembly.

FIG. 79 is a schematic of a mount assembly 6600. Plates 6610 may be brought together, such that the recesses 6612 define a recess 6613. The joining component 6620 may be received in the recess 6613. In some embodiments, a screw may be received in the central channel 6622 of the joining component 6620 to connect the plates 6610 and joining component 6620 to a surface. In some embodiments, a screw may be received in the peripheral channel 6624 of the joining component 6620 to connect the plates 6610 with the joining component 6620, or to connect the plates 6610 and the joining component 6620 to a surface.

Figure 80:
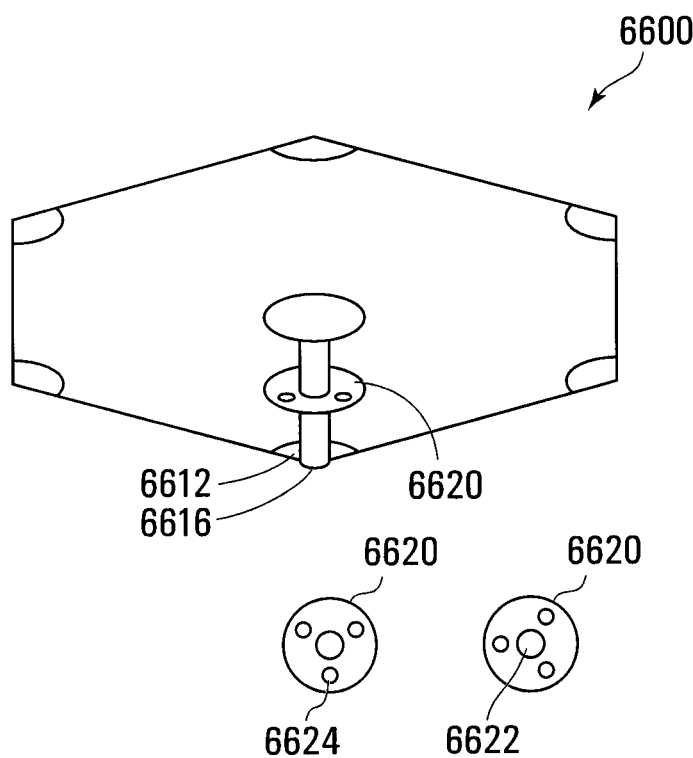
FIG. 80 is a schematic of a mount assembly.
Figure 80:
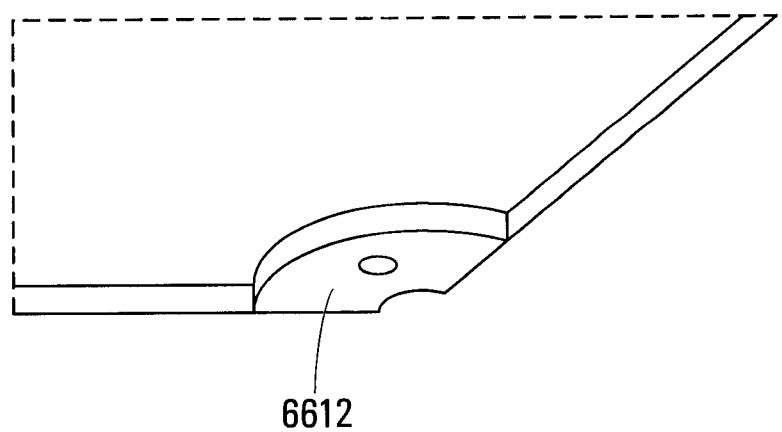

FIG. 80 is a schematic of a mount assembly 6600. As depicted in FIG. 80, the joining component 6620 may be received in a recess 6612 of the plate 6610. A screw may connect the plate 6610 and the joining component 6620 together. The screw may be received in the corner channel 6616. A screw may be received in the channel 6614 to secure the plate 6610 to a surface. Other connectors may be used. In some embodiments, when the central channel 6622 of the joining component 6620 is aligned with the corner channel 6616 of the plate 6610 (or channel 6618 defined by plates 6610 brought together), a connector may connect the plate 6610 and joining component 6620 together. In some embodiments, when the central channel 6622 of the joining component 6620 is aligned with the corner channel 6616 of the plate 6610 (or channel 6618 defined by plates 6610 brought together), a connector may connect the plate 6610 and joining component 6620 together and connect the plate 6610 and joining component 6620 to a surface.

In some embodiments, with the channel 6614 of the plate 6610 aligned with the peripheral channel 6624 of the joining component 6620, a connector may connect the plate 6610 and joining component 6620 together. In some embodiments, with the channel 6614 of the plate 6610 aligned with the peripheral channel 6624 of the joining component 6620, a connector may connect the plate 6610 and joining component 6620 together and connect the plate 6610 and joining component 6620 to a surface.

In some embodiments, the recess 6612 may be at a corner of the plate 6610. In some embodiments, the recess 6612 may be at a side of the plate 6610.

Figure 81:
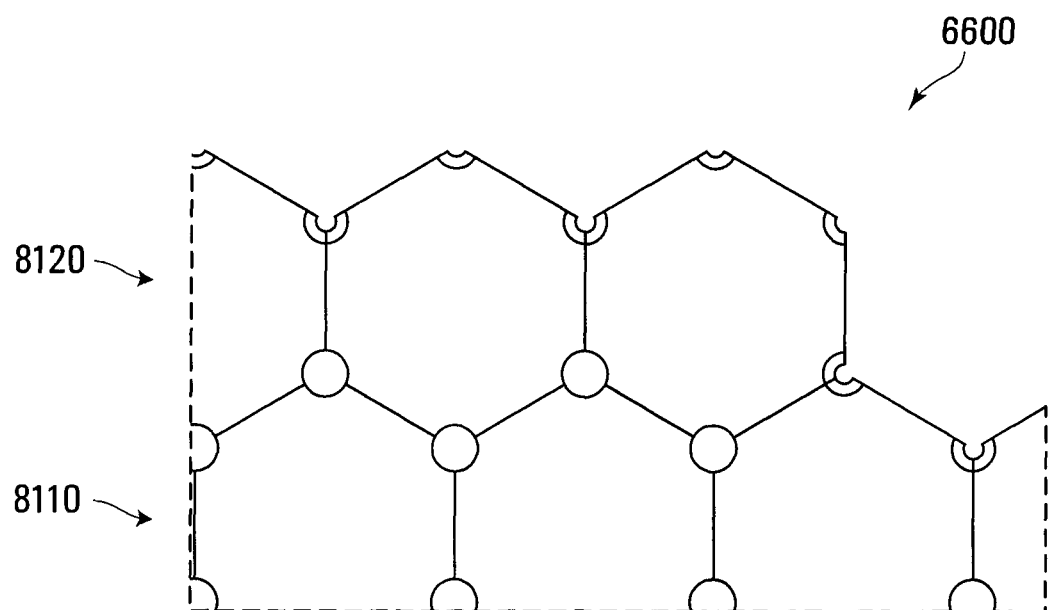
FIG. 81 is a schematic of a mount assembly being assembled.

FIG. 81 is a schematic of a mount assembly 6600 being assembled. As depicted, a first row 8110 is installed on a surface, then a second row 8120 is installed on the surface. In some embodiments, the rows may be installed from the bottom-most row first, then rows are installed upwards. In some embodiments, a first row may be installed, then a second row may be installed relative to the first row.

Figure 82:
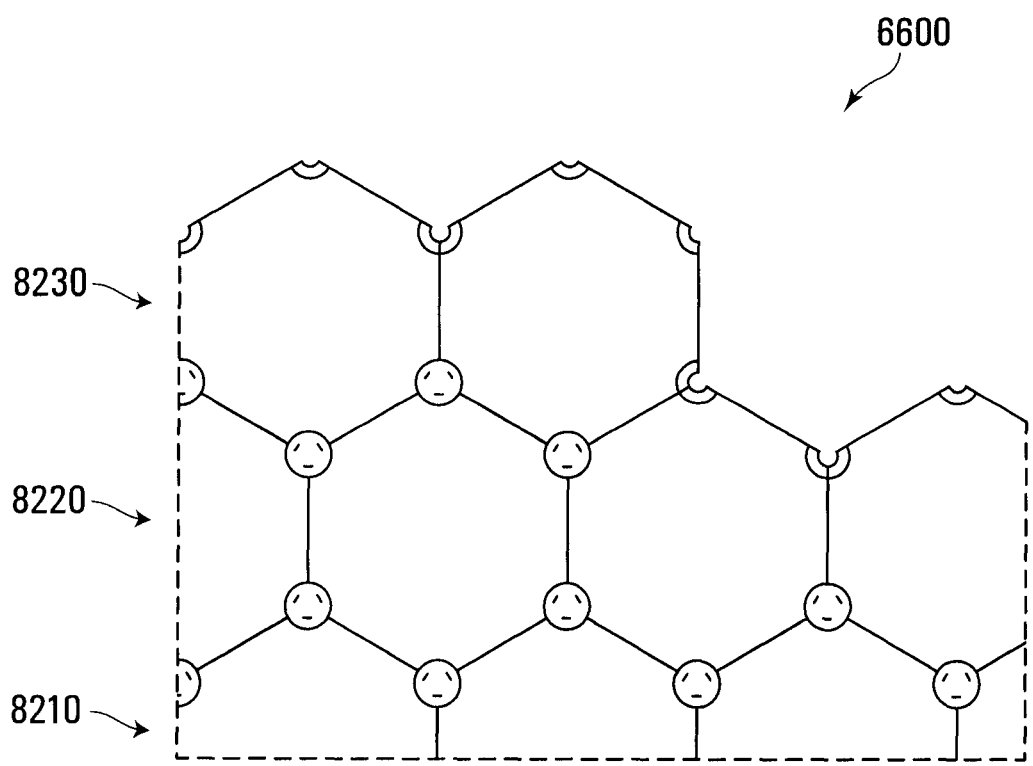
FIG. 82 is a schematic of a mount assembly being assembled.

FIG. 82 is a schematic of a mount assembly 6600 being assembled. As depicted, a first row 8210 is installed on a surface, then a second row 8220 is installed on the surface, then a third row 8230 is installed on the surface. The tiles may be cut to accommodate the surface. For example, if the first row 8210 is installed on a wall, the tiles of the first row 8210 may be cut such that the bottom of the tiles may be flush with the floor that is connected to the tile.

Figure 83:
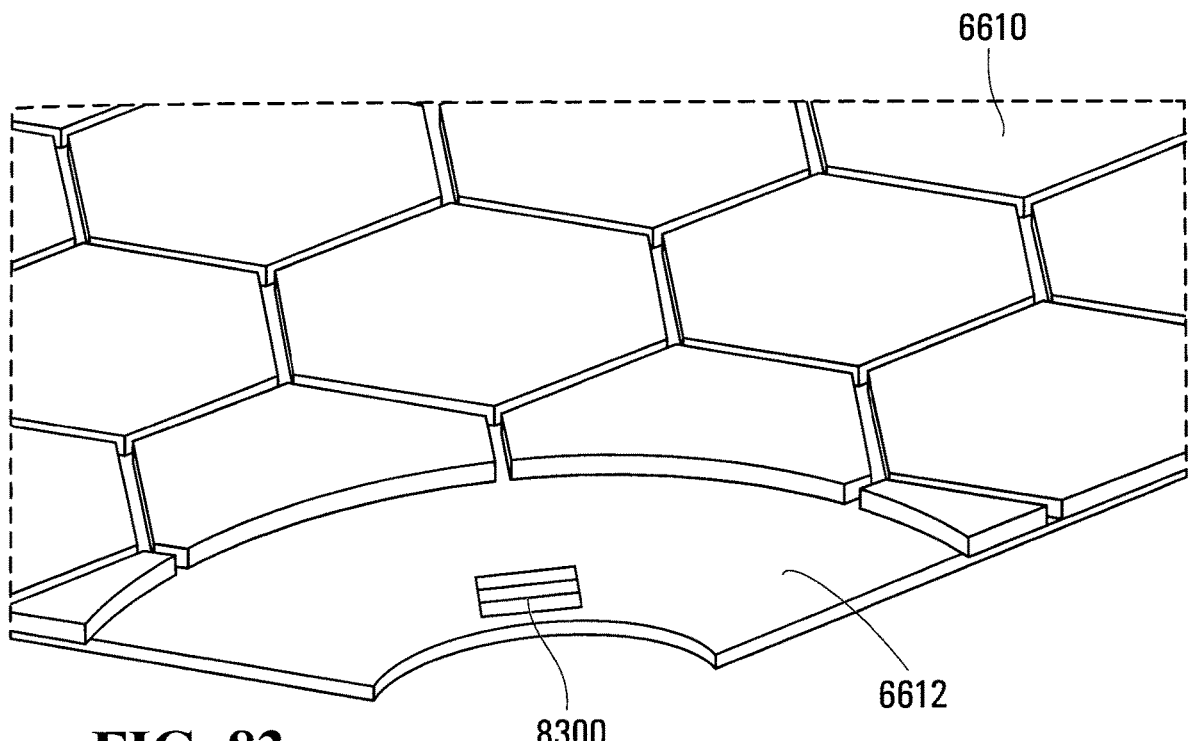
FIG. 83 is a schematic of a corner of a plate of a mount assembly.

FIG. 83 is a schematic of a corner of a plate 6610 of a mount assembly 6600. As depicted in FIG. 83, the recess 6612 of the plate 6610 has a slot 8300 extending through the recess 6612. The slot 8300 may be configured to receive a connector for connecting the plate 6610 to a surface, or may be configured to receive a corresponding feature on a joining component 6620 to connect the plate 6610 to the joining component 6620.

Figure 84:
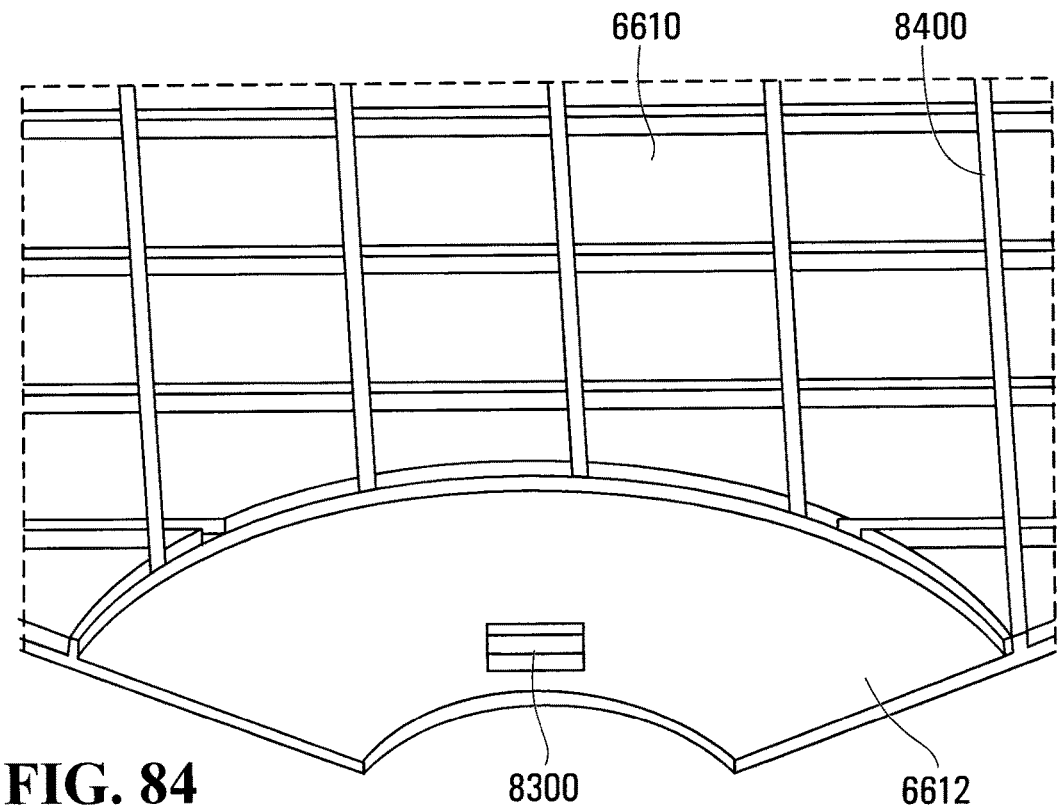
FIG. 84 is a schematic of a corner of a plate of a mount assembly.

FIG. 84 is a schematic of a corner of a plate 6610 of a mount assembly 6600. As depicted in FIG. 84, the recess 6612 of the plate 6610 has a slot 8300 extending through the recess 6612. The slot 8300 may be configured to receive a connector for connecting the plate 6610 to a surface, or may be configured to receive a corresponding feature on a joining component 6620 to connect the plate 6610 to the joining component 6620. In some embodiments, the plate 6610 may have a grid or rib feature 8400 on it.

Figure 85:
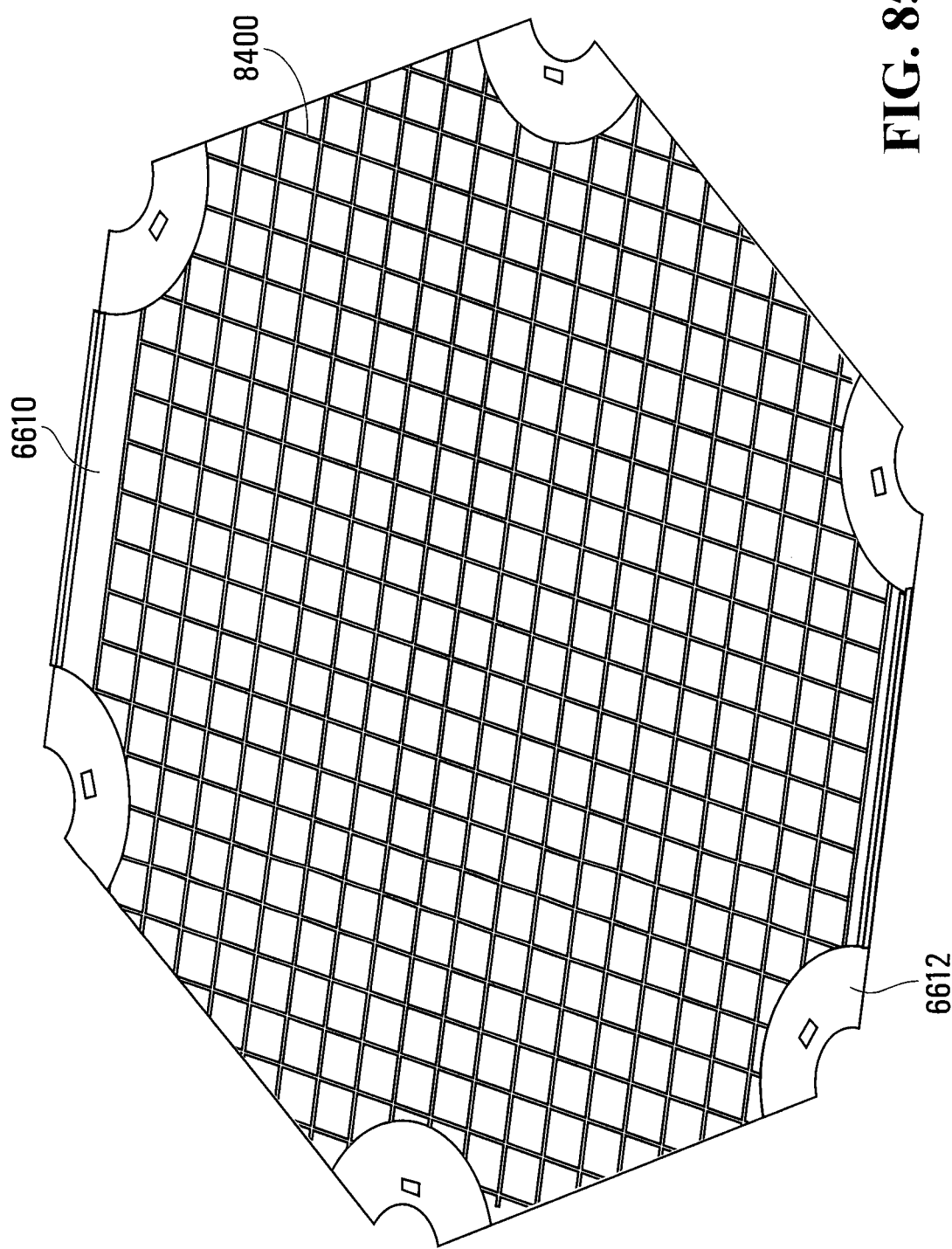
FIG. 85 is a schematic of a plate of a mount assembly.

FIG. 85 is a schematic of a plate 6610 of a mount assembly 6600. As depicted in FIG. 85, the corners of the plate 6610 may be generally similar. For example, each of the corners of the plate 6610 as depicted in FIG. 85 may comprise the slot 8300. The plate 6610 depicted in FIG. 85 may have a grid or rib feature 8400.

Figure 86:
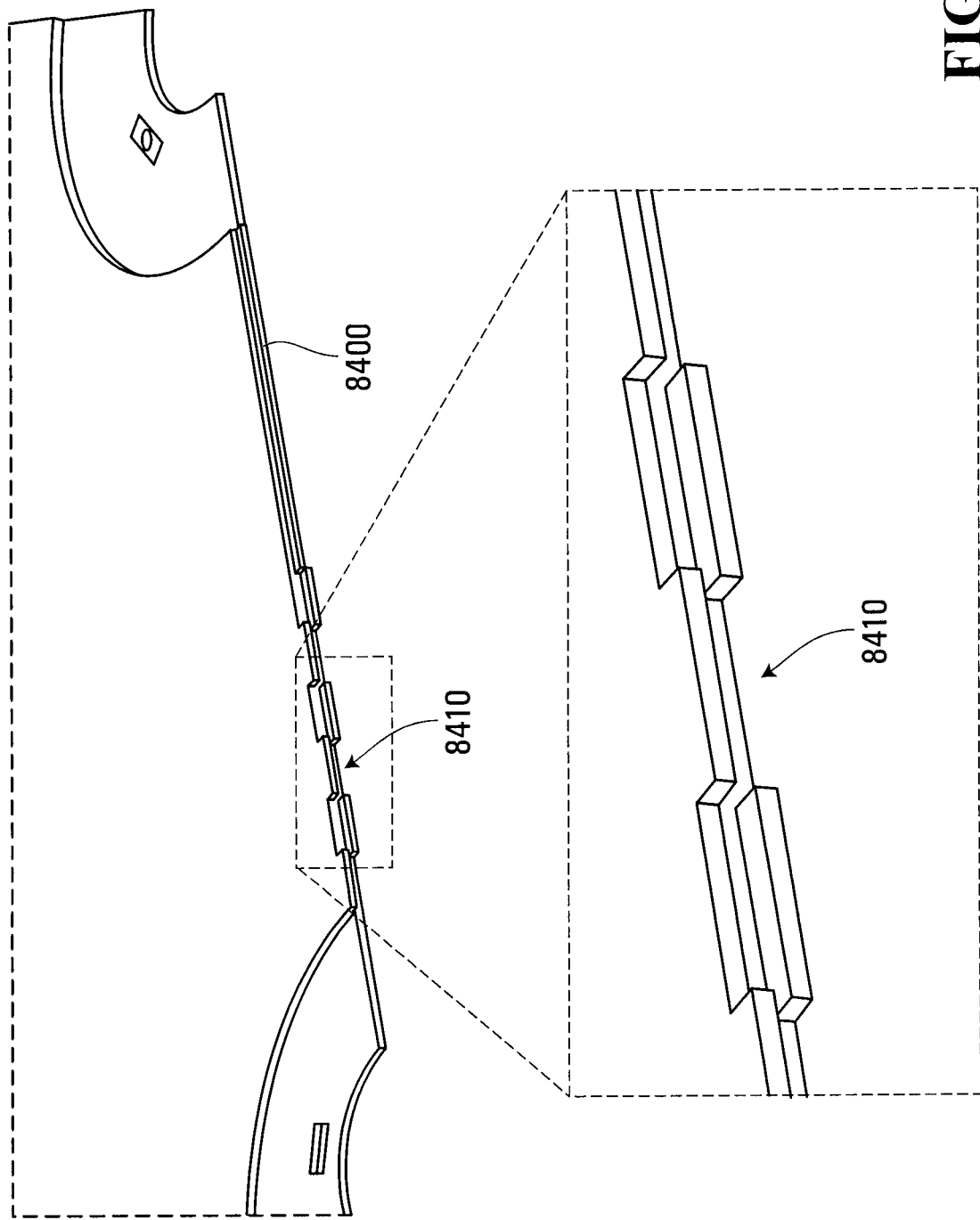
FIG. 86 is a schematic of a mount assembly having another attachment feature.

FIG. 86 is a schematic of a mount assembly 6600 having another attachment feature. As depicted in FIG. 86, the plate 6610 may comprise a tongue 8400 for connecting with a corresponding groove 8410 of another plate 6610 to connect the two plates 6610. In some embodiments, the plate 6610 may comprise a groove 8410. The groove 8410 may be offset to promote manufacturing or moldability. Accordingly, the plates 6610 having a tongue 8400 or groove 8410 may connect to each other using the tongue 8400 and groove 8410.

In some embodiments, the connectors for connecting the plate 6610 to the joining component 6620, or for connecting the plate 6610 and the joining component 6620 to a surface, may be a nail, screw, plug, another fastener, and the like.

In some embodiments, the length of a plate 6610 measured between two opposite corners may be 2 feet.

In some embodiments, there may be a gap between hook areas for connecting plates 6610 together, or for connecting plates 6610 to a surface.

In some embodiments, the plate 6610 and joining component 6620 may be made with a material or dimensioned such that it was reduce sound or improve sound proofing of a room.

In some embodiments, the surface on which the mount assembly 6600 is installed may be a floor or a wall. In some embodiments, the surface may be wood, tile, carpet, foam, drywall, brick, concrete, and the like.

Figure 87:
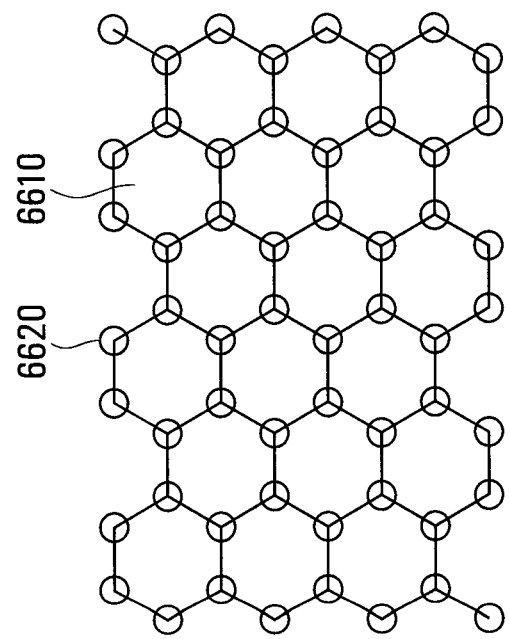
FIG. 87 is a schematic of a plurality of plates and joining components of a mount assembly.

FIG. 87 is a schematic of a plurality of plates 6610 and joining components 6620 of a mount assembly 6600. The mount assembly 6600 may be connected to a surface 8700.

FIGS. 88-92 are schematics of another attachment feature of a plate 6610 of a mount assembly 6600.

Figure 88:
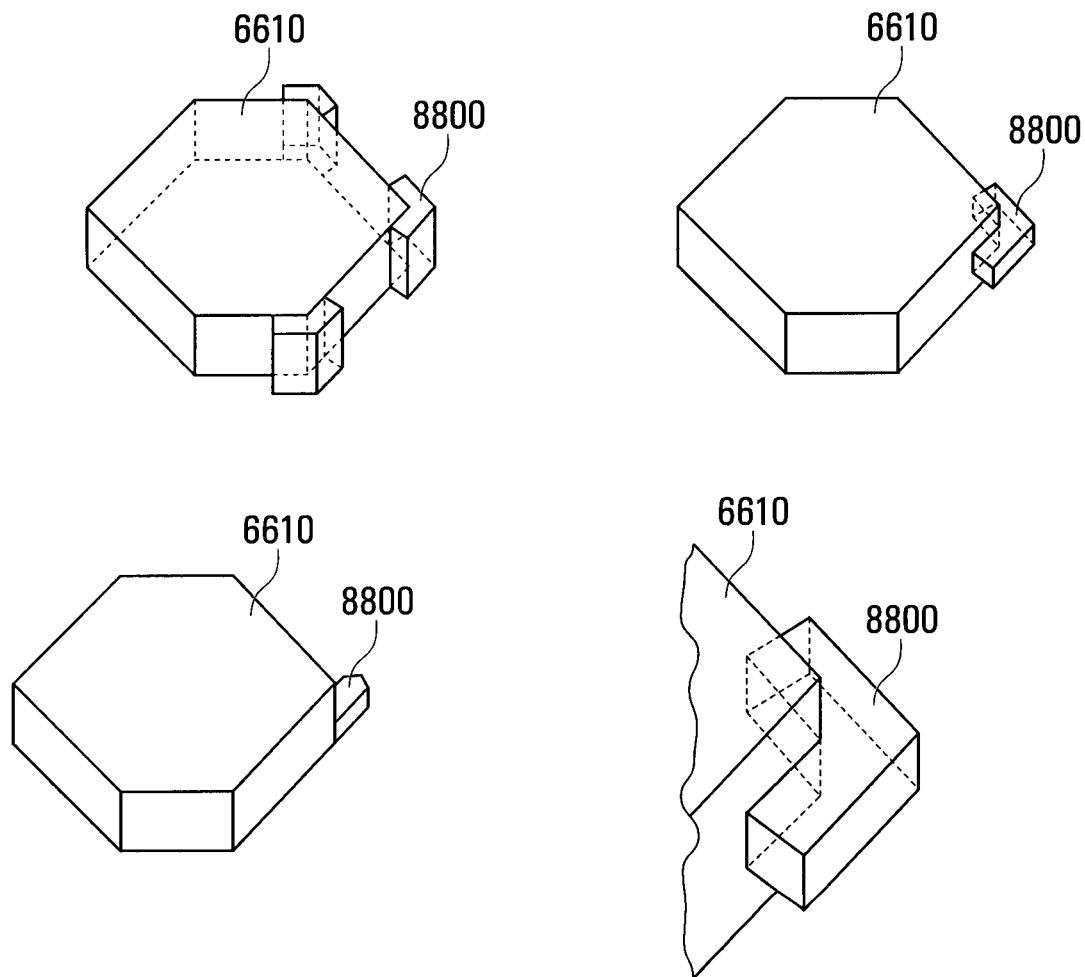
FIGS. 88-92 are schematics of another attachment feature of a plate of a mount assembly.

FIG. 88 depicts a plate 6610 having tongues 8800 extending from the corners of the plate. The tongues 8800 may be received by corresponding grooves of another plate 6610. The tongue 8800 may be a protrusion extending from one or more sides of the plate 6610. As depicted in FIG. 88, the tongues 8800 have a shape generally similar to the sides of the plate 6610 from which the tongues 8800 extend. For example, as depicted in FIG. 88, the tongues 8800 have an arrow shape that point outwardly from the plate 6610. The tongue 8800 may have other shapes, such as shapes similar to attachment features described herein for tile assemblies.

In some embodiments, a tongue 8800 may extend from one or more than one corner of the plate 6610. In some embodiments, a tongue 8800 may extend from one or more than one side of the plate 6610.

Figure 89:
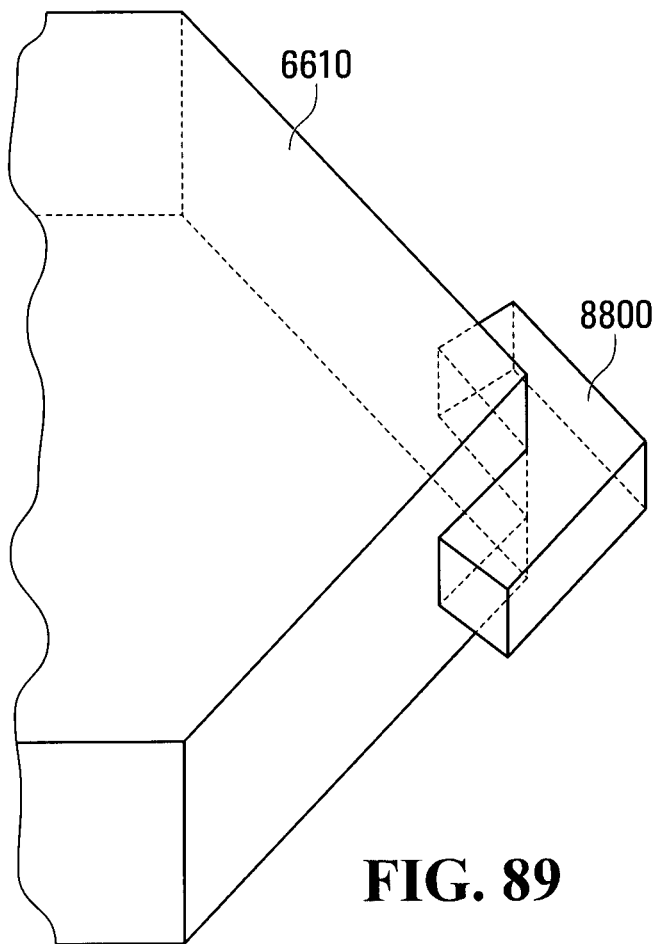

FIG. 89 depicts a plate 6610 having a tongue 8800 extending from a corner of the plate 6610. In some embodiments, the top surface of the tongue 8800 may be lower than the top surface of the plate 6610. In some embodiments, the bottom surface of the tongue 8800 may be higher than the bottom surface of the plate 6610.

In some embodiments, the tongue 8800 may be received in a groove having a shape generally similar to the tongue 8800.

In some embodiments, the tongue may be a flange that connects a plate 6610 to another plate 6610.

Figure 90:
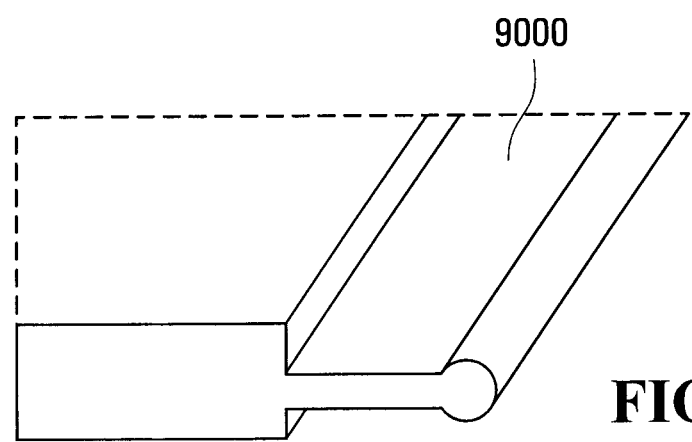

FIG. 90 depicts an example tongue 9000 of a tongue and groove connection. The tongue 9000 may be an attachment feature for tile assemblies or mount assemblies described herein. As depicted, an example thickness of the tongue 9000 may be $1/16$". An example distance between the top surface of the tile or plate and the top surface of the tongue 9000 may be $1/32$". An example distance between the bottom surface of the tile or plate and the bottom surface of the tongue 9000 may be $1/32$". An example thickness of the tile or plate may be $1/8$". In some embodiments, the length of the tongue 9000 extending from the edge of the tile or plate may be such that the tongue and groove for a sufficient connection to connect two tile assemblies together or two plates together.

Figure 91:
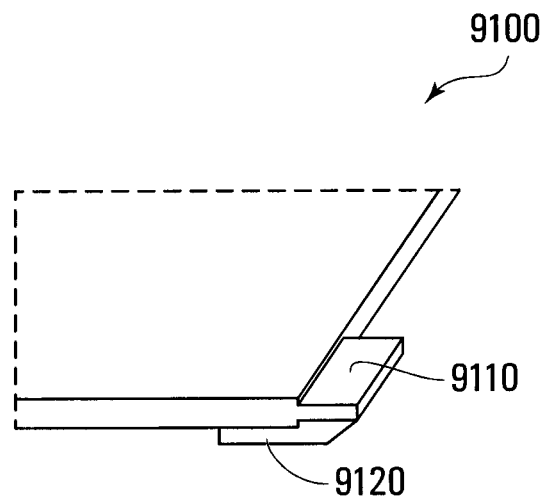
Figure 91:
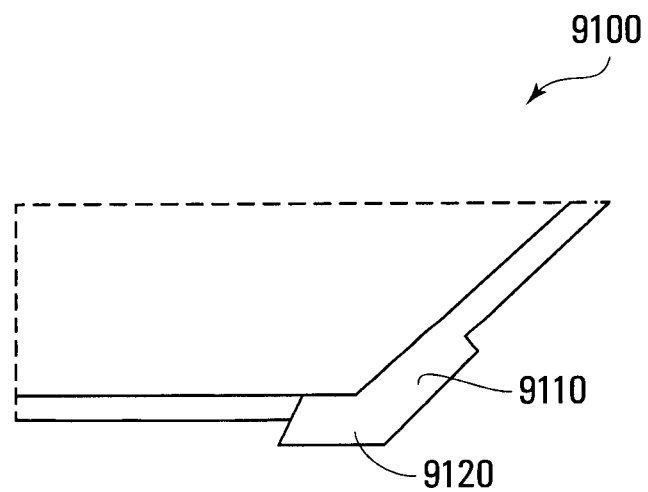

FIG. 91 depicts an example tongue 9100. As depicted in FIG. 91, the tongue 9100 may have a first portion 9110 and a second portion 9120 that may be offset from the first portion 9110. In some embodiments, the first portion 9110 and the second portion 9120 may not be offset, and may be generally level and extend from a side of a tile or a plate.

Figure 92:
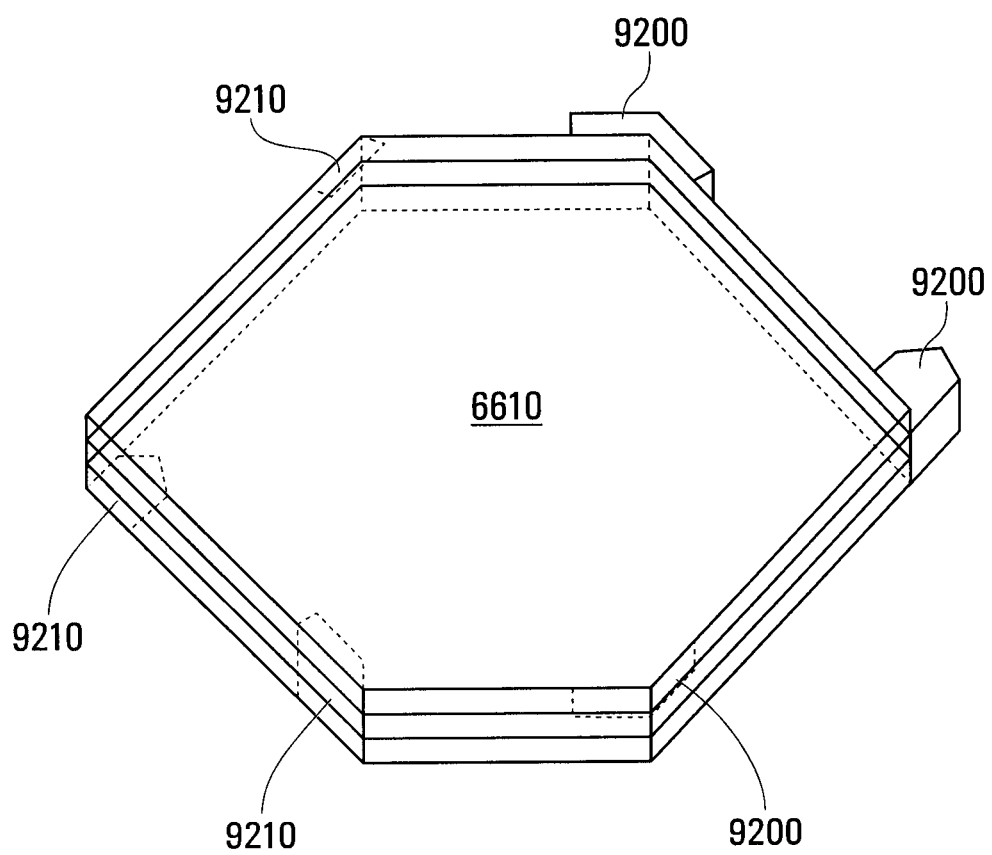

FIG. 92 depicts a plate 6610 having tongues 9200 and grooves 9210 for receiving the tongues 9210 from another plate 6610. As depicted in FIG. 92, the plate 6610 has three tongues 9200 and three grooves 9210. The tongues 9200 may extend from three corners of the plate 6610, and the grooves 9210 may extend into three corners of the plate. In some embodiments, the plate 6610 may have one or more tongues 9200 or one or more grooves 9210. As depicted in FIG. 92, the three tongues 9200 are next to each other, and the three grooves 9210 are next to each other. In some embodiments, the tongues 9200 and grooves 9210 may be in other positions for connecting a plate 6610 to another plate 6610.

Figure 93:
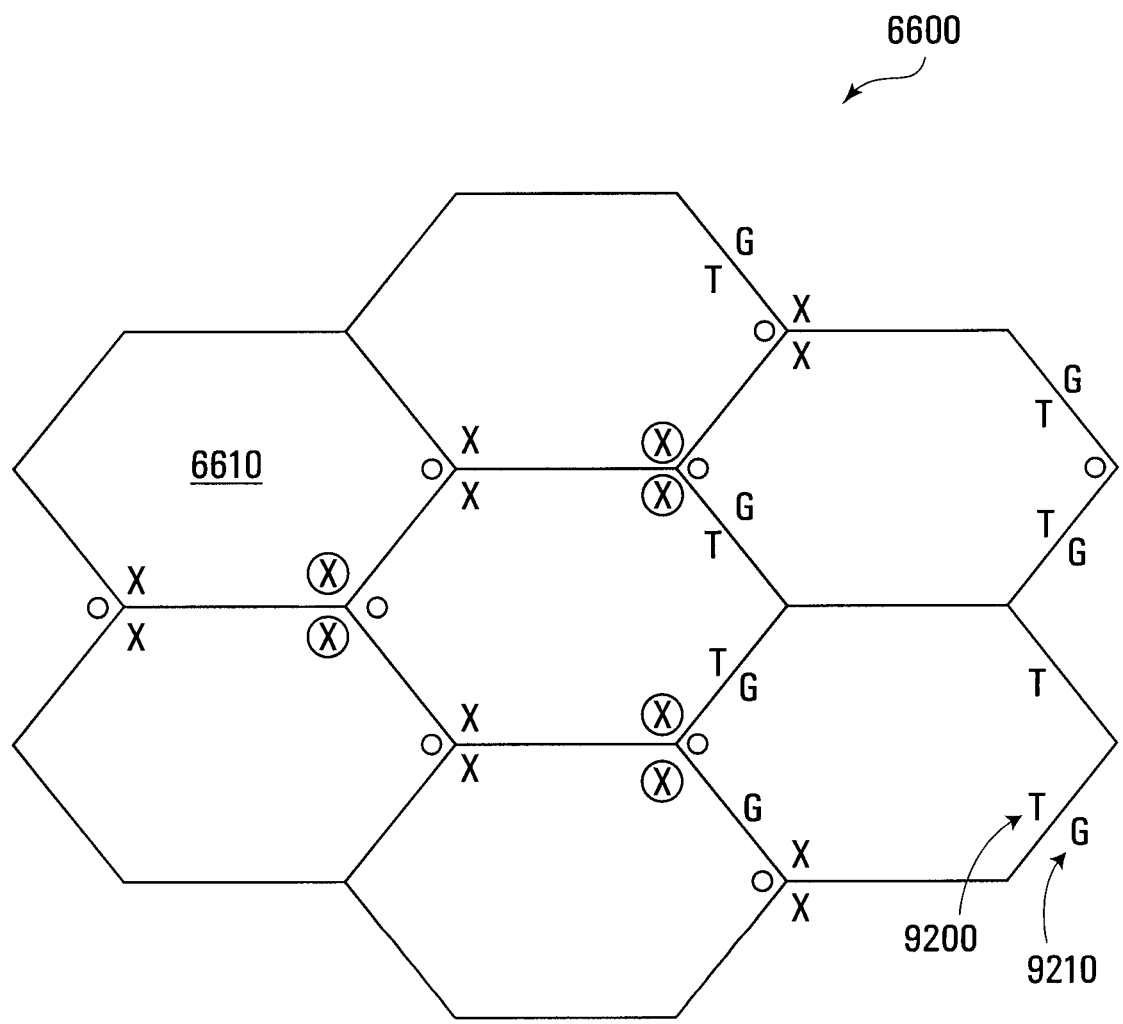
FIGS. 93-95 are schematics of assembling a mount assembly.

FIG. 93 is a schematic for assembling a mount assembly 6600. As depicted in FIG. 93, each of the plates 6610 may have the same and proper orientation. The plates 6610 may have tongues 9200 and grooves 9210 for connecting with other plates 6610. As depicted in FIG. 93, the tongues 9200 and grooves 9210 may be at a side of the plate 6610. In some embodiments, the tongues 9200 and grooves 9210 may be at corners of the plate 6610. The plates 6610, in the same and proper orientation, may be joined together such that the proper corners of the plates 6610 are brought together, so the tongues and grooves of the plates 6610 may be aligned to connect the plates 6610 together.

Figure 94:
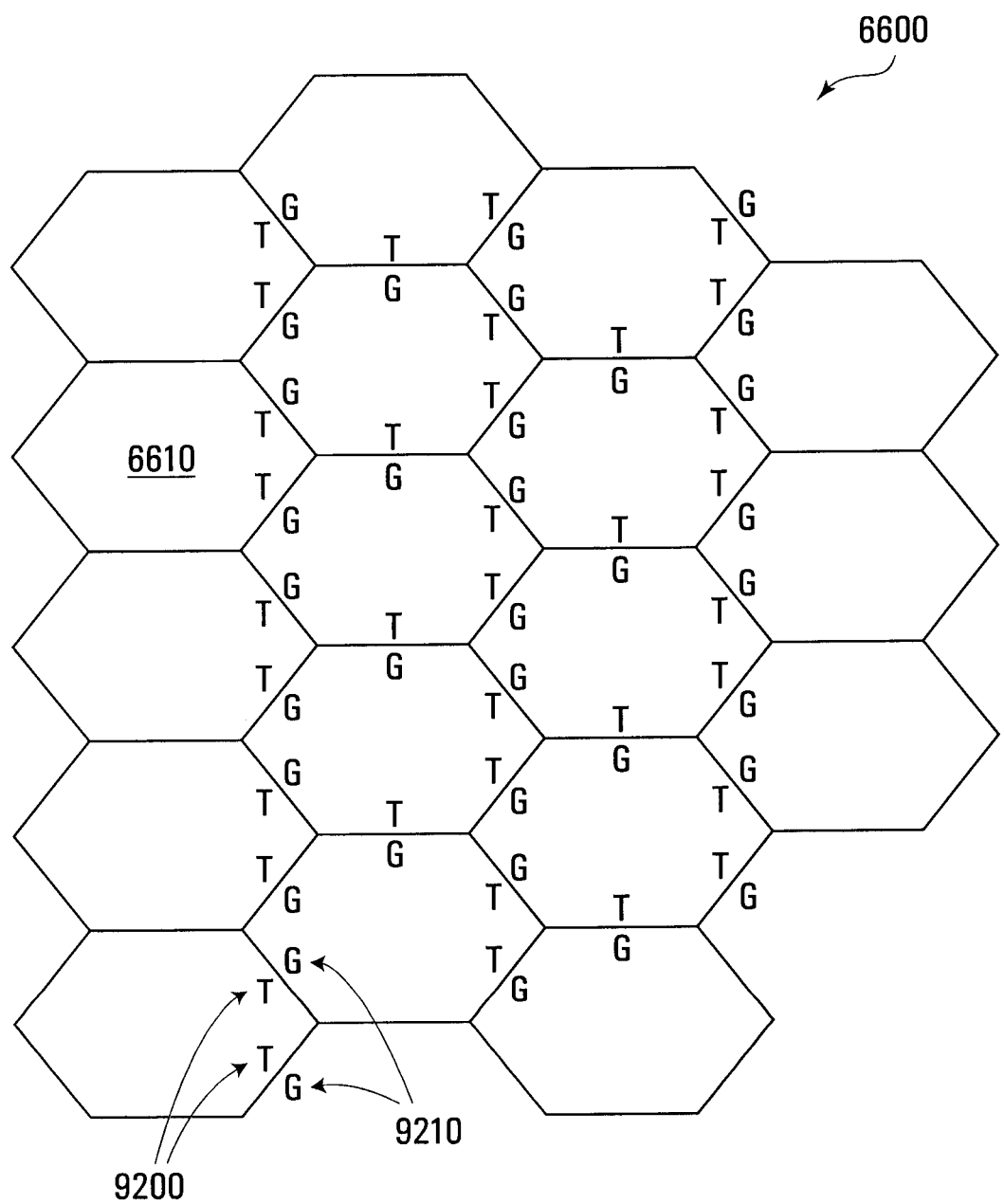

FIG. 94 is a schematic for assembling a mount assembly 6600. As depicted in FIG. 94, similar to FIG. 93, each of the plates 6610 may have the same and proper orientation. The plates 6610 may have tongues and grooves for connecting with other plates 6610. The plates 6610, in the same and proper orientation, may be joined together such that the proper corners of the plates 6610 are brought together, so the tongues and grooves of the plates 6610 may be aligned to connect the plates 6610 together.

As depicted in FIG. 94, the plates 6610 may have tongues 9200 extending from the side of the plate 6610 and also tongues 9200 extending from the corners of the plate 6610. The plates 6610 may have grooves 9210 at corners of plates 6610 for receiving the tongues 9200 extending from the corners of the plates 6610.

Figure 95:
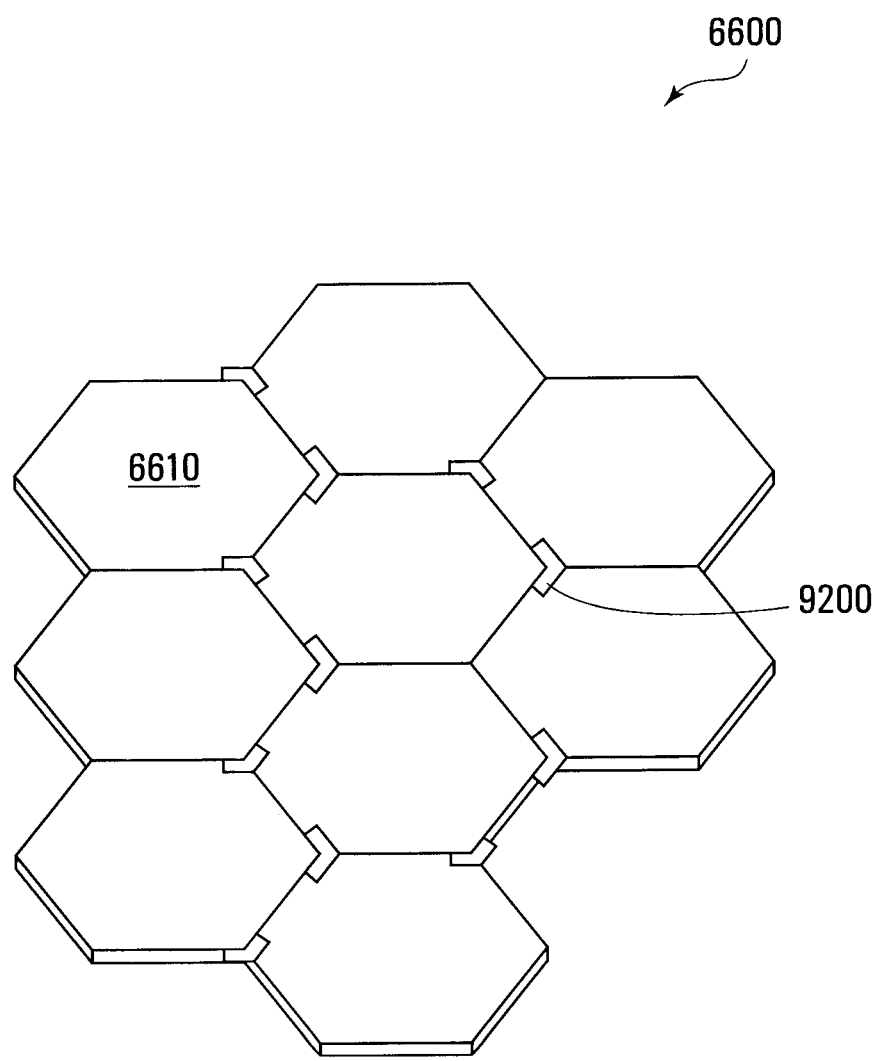

FIG. 95 is a schematic for assembling a mount assembly 6600. As depicted in FIG. 95, the plates 6610 may have tongues 9200 extending from the corners of the plate 6610. The plates 6610 may have grooves 9210 at corners of plates 6610 for receiving the tongues 9200 extending from the corners of the plates 6610.

Figure 96:
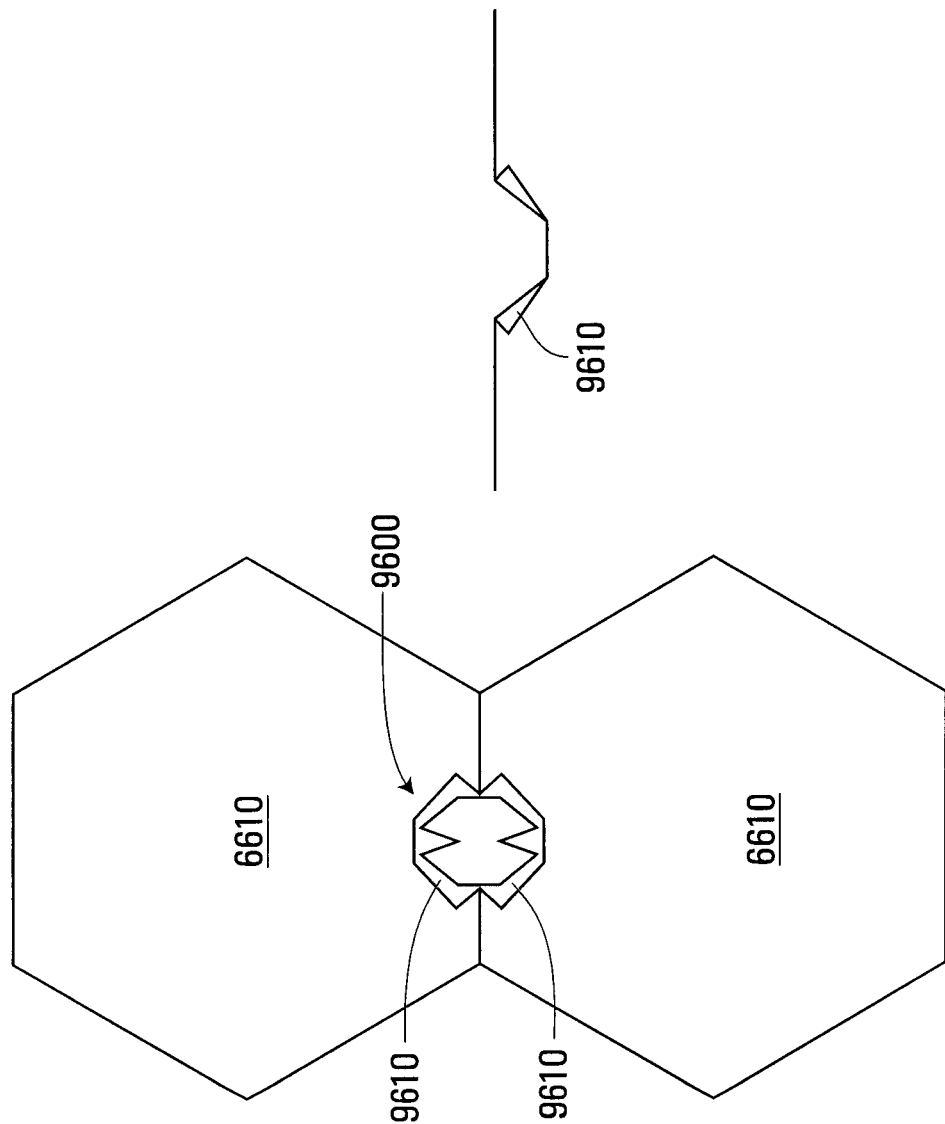
FIGS. 96-97 are schematics of a mount assembly having another attachment feature.
Figure 96:
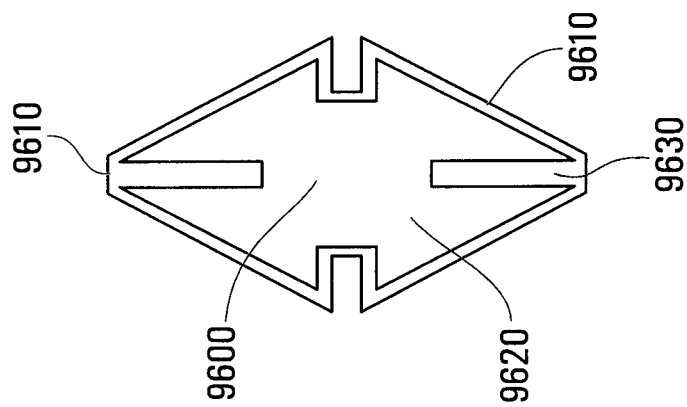
Figure 97:
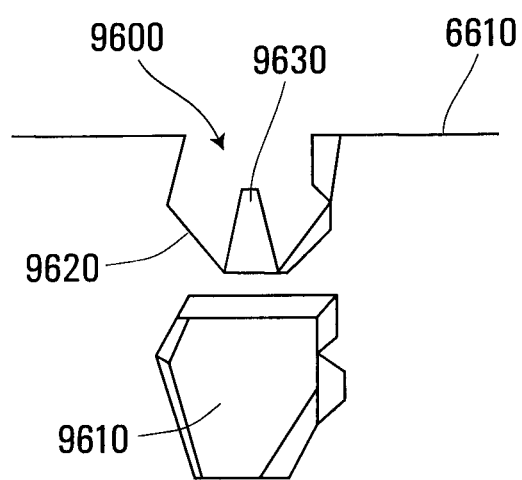

FIGS. 96-97 are schematics of a mount assembly having another attachment feature.

As depicted in FIG. 96, the attachment feature may be a clip 9600. As depicted in FIG. 96, a clip 9600 joins two plates 6610. In some embodiments, the clip 9600 may be separate from the plate 6610. That is, the clip 9600 may be a separate attachment feature. As depicted in FIG. 96, the ends of the clip 9600 may be angled, bevelled, chamfered, or otherwise shaped to be received in a corresponding recess 9610 of a plate 6610. The clip 9600 may be elastically deformable, such that, when being inserted into the recess 9610, the clip 9600 may elastically deform to promote insertion into the recess 9610. After the clip 9600 is inserted into the recess 9610, the clip 9600 may return to its original position.

As depicted in FIG. 96, the clip 9600 connects two plates 6610 along the sides of the plates 6610. In some embodiments, the clip 9600 may join corners of plates 6610 together.

In some embodiments, the clip 9600 may comprise one or more prongs 9620 for inserting the clip 9600 into the recess 9610. The clip 9600 depicted in FIG. 96 may comprise four prongs 9620. In some embodiments, a gap 9630 may be defined between two prongs 9620 to promote elastic deformation of the prongs 9620 when inserting the clip 9600 into the recess 9610.

In some embodiments, the clip 9600 may be integrally formed with or joined to the plate 6610. As depicted in FIG. 97, the clip 9600 is joined to a side of the plate 6610. In some embodiments, the clip 9600 may be joined to a corner of the plate 6610. The clip 9600 depicted in FIG. 97 has two prongs 9620 with a gap 9630 defined in between the two prongs 9620.

Figure 98:
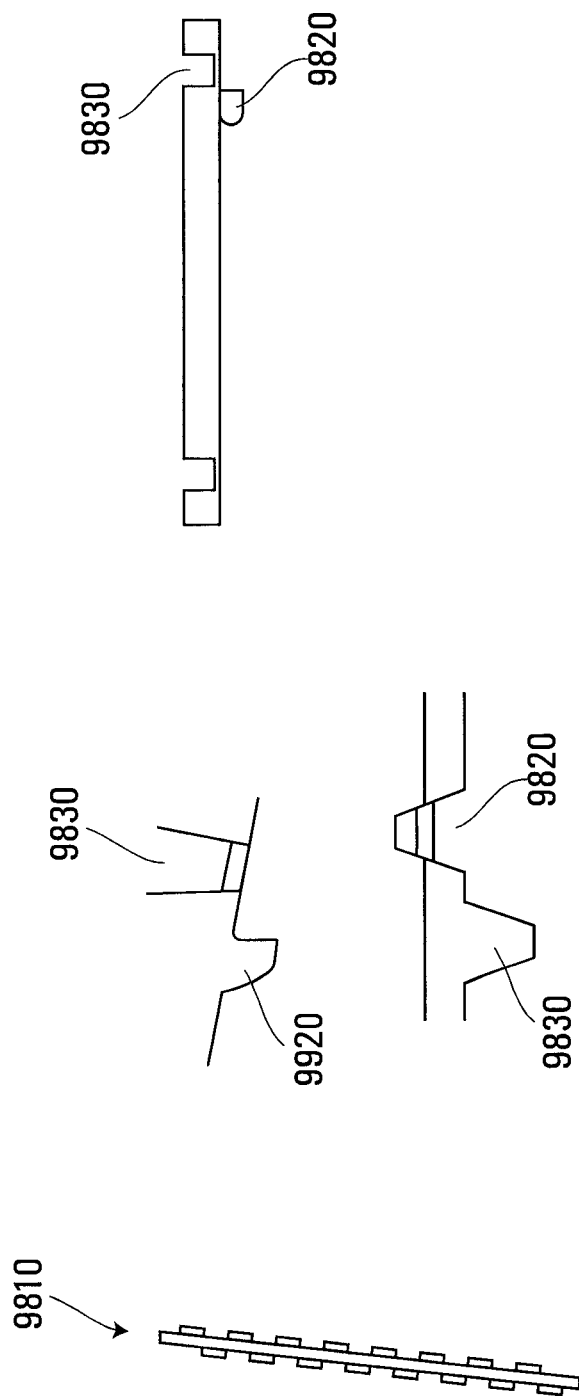
FIGS. 98-101 are schematics of attachment features of mount assemblies.

FIG. 98 is a schematic of attachment features of mount assemblies 6600. In some embodiments, the attachment feature may be a series of interlocking pins 9810 for connecting plates 6610 together.

In some embodiments, the attachment features may be cooperatively configured protrusions 9820 and recesses 9830 for receiving the protrusions 9820 for connecting plates 6610 together. The protrusions 9820 and recesses 9830 may be along the sides or edges of the plates 6610, or may be along the top or bottom surfaces of the plates 6610.

Figure 99:
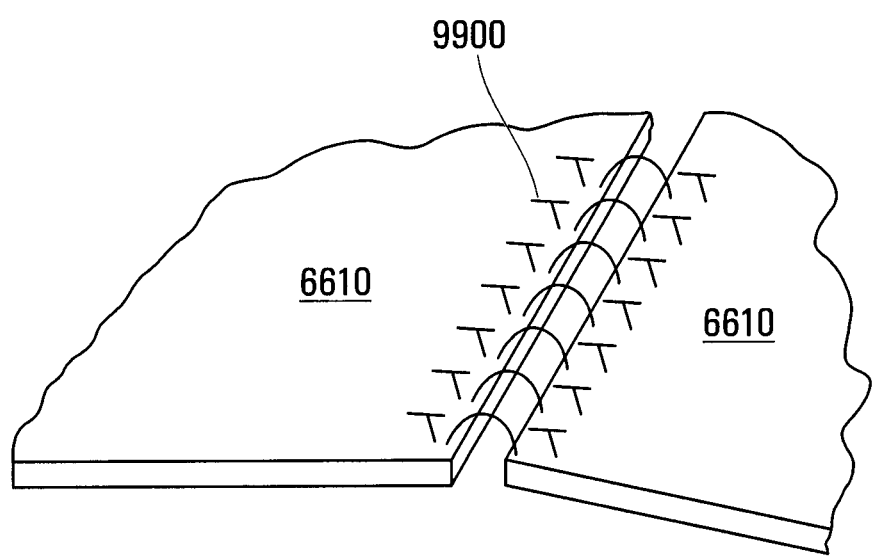

FIG. 99 is a schematic of an attachment feature of mount assemblies 6600. In some embodiments, the attachment feature may be a series of interlocking pins 9900 for connecting plates 6610 together. In some embodiments, the pins 9900 may be vertical hook pins. In some embodiments, the pins 9900 may be angular pins that may form a bridge over a gap defined between two plates 6610.

Figure 100:
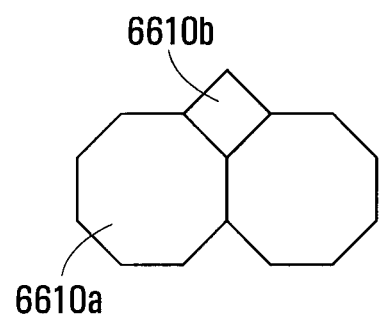
Figure 100:
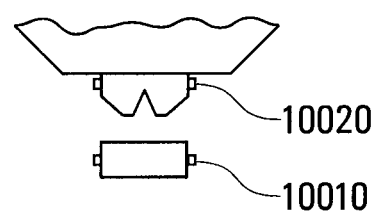

FIG. 100 is a schematic for attachment features of a mount assembly. In some embodiments, an adhesive sheet 10000 may be used to connect two plates together 6610 or to connect a plate 6610 to a surface. The adhesive sheet 10000 may have one or more protective covers on either side of the sheet 10000 that may be peeled off. The adhesive sheet 10000 may be connected to a top surface, bottom surface, or side or edge of the plate 6610.

In some embodiments, the attachment feature may be a clip 10010. The clip 10010 may be similar to clip 9600, except the clip 10010 may have a lock mechanism 10020. The lock mechanism 10020 may have a default outward position, as depicted in FIG. 100 (e.g. spring loaded outward). When the clip 10010 is being inserted into a recess, the recess may push the lock mechanism 10020 inward, allowing the clip 10010 to be inserted into the recess. When the clip 10010 is received in the recess, the lock mechanism 10020 may extend outwards, thereby locking the clip 10010 in the recess.

In some embodiments, the attachment feature may be a clip 10040. The clip 10040 may be similar to the clip 9600. As depicted in FIG. 100, the clip 10040 may be dimensioned and shaped with angled sides to promote insertion into a recess 10030.

As depicted in FIG. 100, the plates 6610 of a mount assembly 6600 may not all be the same shape. For example, the plate 6610a may have a generally octagon shape, and the plate 6610b may have a generally square shape. Plates 6610a and plates 6610b may be connected together to form a mount assembly 6600.

Figure 101:
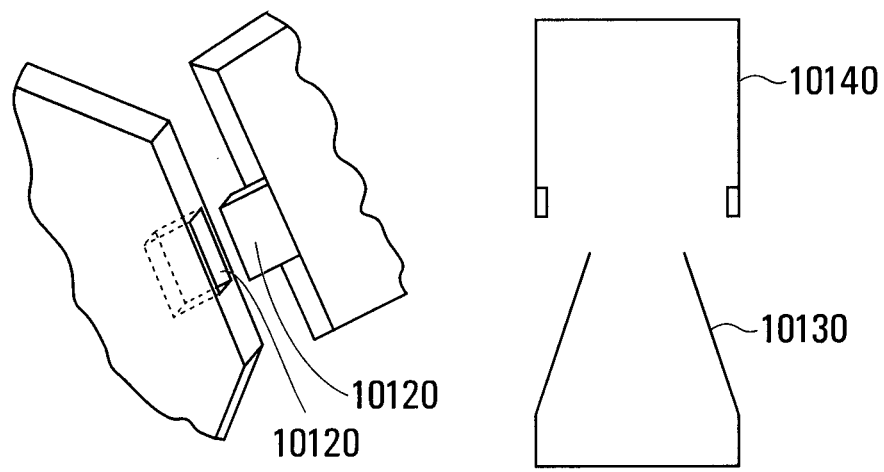

FIG. 101 is a schematic for attachment features of a mount assembly.

In some embodiments, the attachment feature may be a tongue 10110 and groove 10120. In some embodiments, the thickness of the tongue 10110 and the groove 10120 may be approximately 1/16". In some embodiments, the distance from the top surface of the plate 6610 to the top edge of the groove 10120 may be approximately 1/32". In some embodiments, the distance from the bottom surface of the plate 6610 to the bottom edge of the groove 10120 may be approximately 1/32".

In some embodiments, the attachment feature may be a clip 10130. The clip 10130 may be similar to the clip 9600, except the clip 10130 may have flexible sides that may be inserted into a recess 10140. When being inserted into the recess 10140, the flexible sides of the clip 10130 may elastically deform until the clip 10130 is received in the recess 10140. Then, the clip 10130 returns to its original shape.

Figure 102:
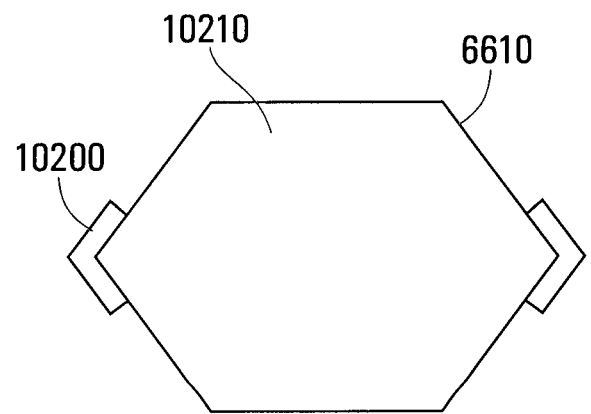
FIG. 102 is a schematic of another plate of the mount assembly.
Figure 102:
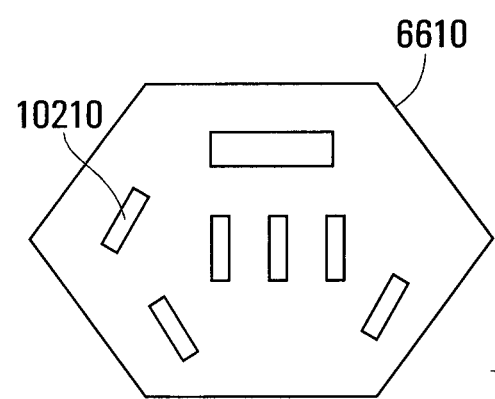

FIG. 102 is a schematic of another plate 6610 of the mount assembly 6600.

In some embodiments, the plate 6610 may have opposing tongues or flanges 10200 extending from opposing corners of the plate 6610. In some embodiments, the plate 6610 may have opposing tongues or flanges 10200 extending from opposing sides of the plate 6610.

In some embodiments, the plate 6610 may comprise one or more through holes or recesses 10210 for reducing the overall weight of the plate 6610, or for reducing expansion or contraction of the plate 6610 (e.g. due to temperature). Through hole may extend through the plate 6610 from the top surface of the plate 6610 to the bottom surface of the plate 6610. Recesses may be similar to through holes, but may not extend through the plate 6610. The recess may begin at the top surface or the bottom surface of the plate 6610.

In some embodiments, the joining component 6620 may have one or more through holes or recesses 10210.

Figure 103:
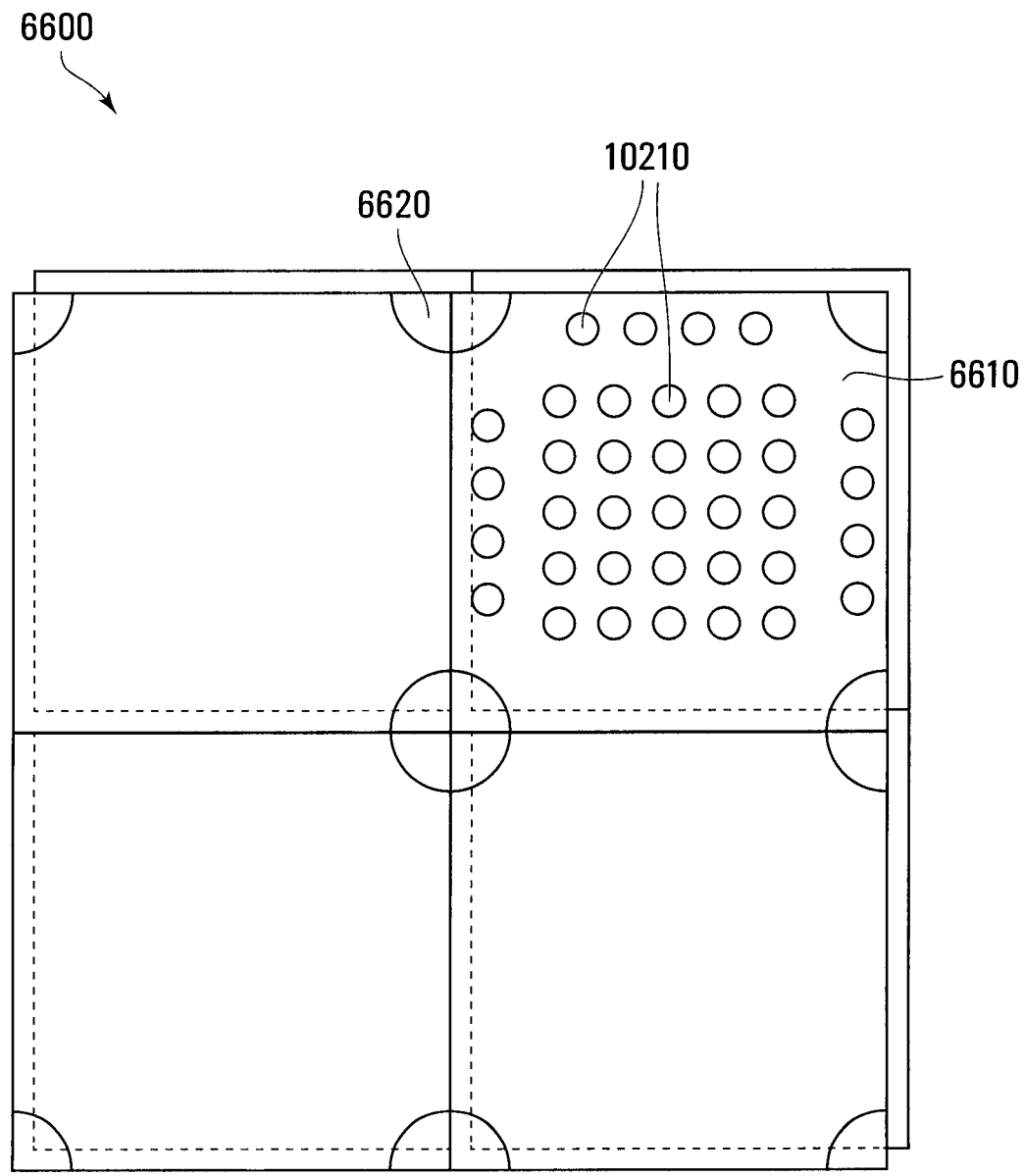
FIG. 103 is a schematic of four plates of a mount assembly connected by joining components.

FIG. 103 is a schematic of four plates 6610 of a mount assembly 6600 connected by joining components 6620. As depicted in FIG. 103, one of the plates 6610 has through holes or recesses 10210. The through holes or recesses 10210 may be circular, or may be another shape, such as triangle, square, rectangle, pentagon, hexagon, octagon, irregular shapes, and the like. The plate 6610 may have one or more through holes or recesses 10210. The number and size of through holes or recesses 10210 may depend on the amount of weight of the plate 6610 to reduce, and how the expansion or contraction of the plate 6610 is to be controlled.

The through holes or recesses 10210 may reduce weight of the plate 6610. For example, the through holes or recesses 10210 may reduce approximately 30% weight of the plate 6610.

The through holes or recesses 10210 may reduce the contact area for surface coverage. For example, the through holes or recesses 10210 may reduce approximately 50% surface coverage.

The through holes or recesses 10210 may reduce contact area without increasing possibility of telegraphing. The design of the through holes or recesses 10210 may avoid lineation or raised or recessed lineal direction.

The through holes or recesses 10210 may reduce the cost of materials used to manufacture the plates 6610 and joining components 6620.

The through holes or recesses 10210 may create atmospheric stability so as to produce for the "closing" of gaps between the plates 6610 and the joining components 6620.

In some embodiments, moulds (e.g. cavity moulds) for manufacturing the plates 6610 may be refurbished to manufacture plates 6610 if through holes or recesses 10210. In some embodiments, overlap may be rationalized and designed.

The through holes or recesses 10210 may lead to a cost savings when manufacturing the mount assembly 6600.

For example, the estimated weight of a mount assembly 6600 may be approximately 4 pounds per square yard.

For an example calculation, the through holes or recesses 10210 may reduce the weight of the mount assembly 6600 by approximately 30%. Accordingly, the weight reduction of the mount assembly 6600 with through holes or recesses 10210 may be 4 pounds per square yard x 30%=1.2 lbs reduction per square yard, leaving 2.8 pounds per square yard for balance of weight.

For example, for cost reduction (and increase in base weight of plate if needed), filler may be used. For example, 30% filler may be used. 30% filler=30%x2.8 pounds per square yard=0.84 pounds per square yard. Estimating the cost of filler at 0.20 cents, then the cost of filler=0.0.84 pounds per square yard x 0.20 cents per pound=0.168 cents per square yard. The remaining weight of the mount assembly 6600 may be made using a polymer, such as recycled polymer. Estimating that the cost of the polymer is 0.45 cents per pound, then the cost of the polymer is 1.96 pounds per square yard x 0.45 cents per pound=0.882 cents per square yard. Therefore; the estimated cost of the mount assembly 6600 with through holes or recesses 10210 may be 0.168 cents per square yard+0.882 cents per square yard=1.05 cents per square yard=0.116 cents per square foot.

A mount assembly 6600 without through holes or recesses 10210 may cost more than a mount assembly 6600 with through holes or recesses 10210 as more material needs to be used to manufacture the mount assembly 6600 without through holes or recesses 10210.

The weight of the mount assembly 6600 may include additional thickness for joining the plates 6610 and the joining component 6620 to eliminate telegraphy.

For an example calculation, the weight of the mount assembly 6600 may be between 4.75-5.33 pounds per square yard. Approximately 30% of that weight may be reduced by through holes or recesses 10210. Of the remaining 70% weight, 30% may be filler (which may cost 0.20 cents per pound), and 70% may be recycled polymer (which may cost 0.40 cents per pound).

For the mount assembly 6600 weighing 4.75 pounds per square yard initially, the weight reduction from the through holes or recesses 10210 would be 4.75 pounds per square yard x 30%=1.2 pounds per square yard, so the weight of the mount assembly 6600 would be 2.8 pounds per square yard. If 30% of this weight is filler, then the cost is 30% x 2.8 pounds per square yard x 0.20 cents per pound=0.168 cents per square yard. If 70% of this weight is recycled polymer, then the cost is 70% x 2.8 pounds per square yard x 0.40 cents per pound=0.784 cents per square yard. The total cost would be (0.168 cents per square yard+0.784 cents per square yard)/9 square foot per square yard=0.105 cents per square foot.

A similar calculation may be done for the mount assembly 6600 weighing 5.33 pounds per square yard initially. This would lead to a cost of 0.14 cents per square foot.

Figure 104:
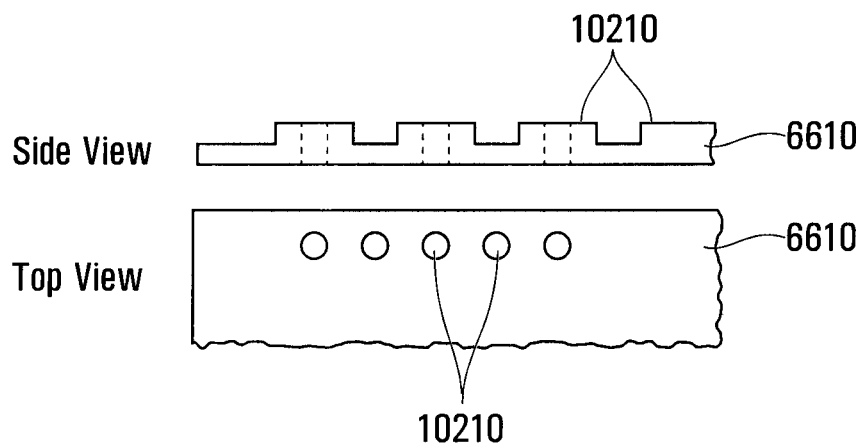
FIG. 104 is a schematic of a plate of a mount assembly having recesses and through-holes.

FIG. 104 is a schematic of a plate 6610 of a mount assembly 6600 having recesses and through-holes 10210.

Figure 105:
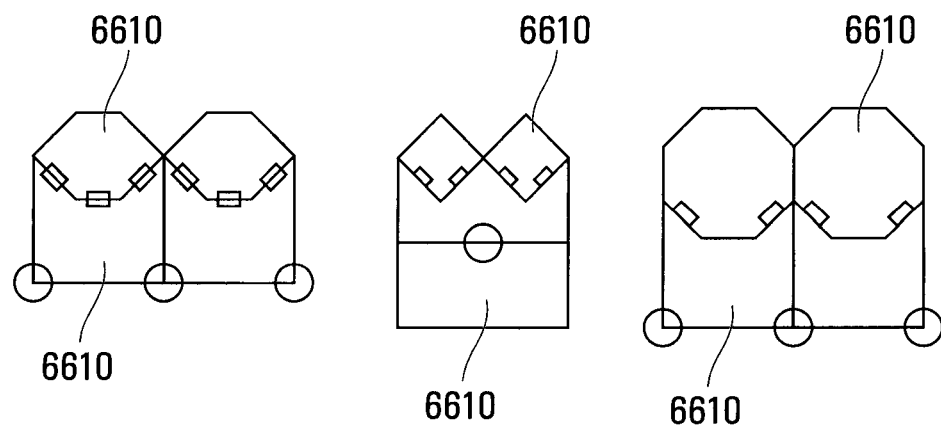
FIG. 105 is a schematic of plates of the mount assembly.

FIG. 105 is a schematic of plates 6610 of the mount assembly 6600. As depicted in FIG. 105, plates 6610 may be an irregular shape, hexagon, square, or octagon. The plates

6610 may have another shape not depicted in FIG. 105 (e.g. triangle, pentagon, heptagon, circle, oval, polygon, etc.).

As depicted in FIG. 105, plates 6610 of different shapes may be joined together to form the mount assembly. In some embodiments, the plates 6610 on the bottom row may be irregularly shaped to fit the edge of the surface on which the plates 6610 are installed.

Figure 106:
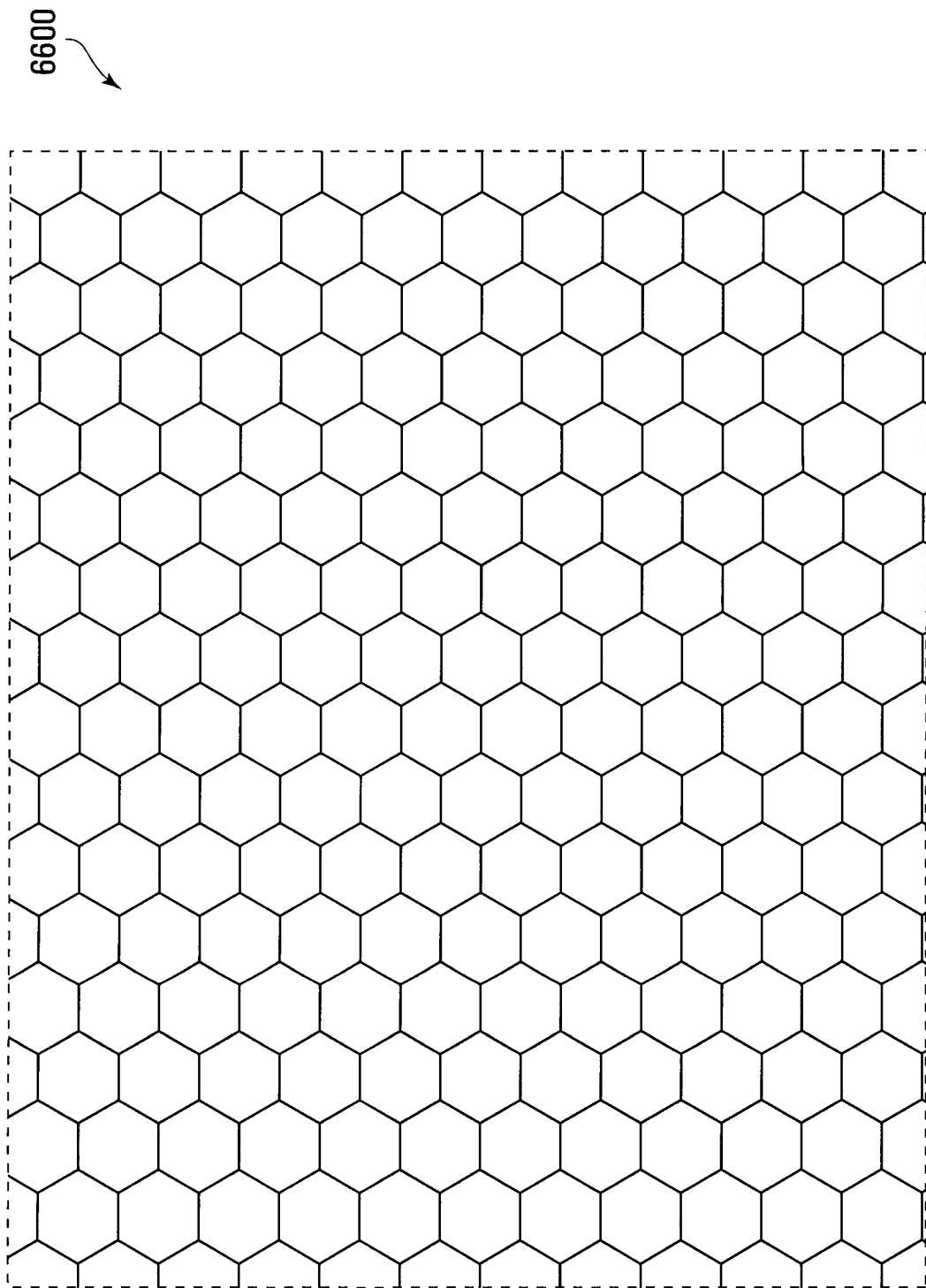
FIGS. 106-109 are schematics of mounting a mount assembly to a surface.

FIG. 106 is a schematic of mounting a mount assembly 6600 to a surface.

Figure 107:
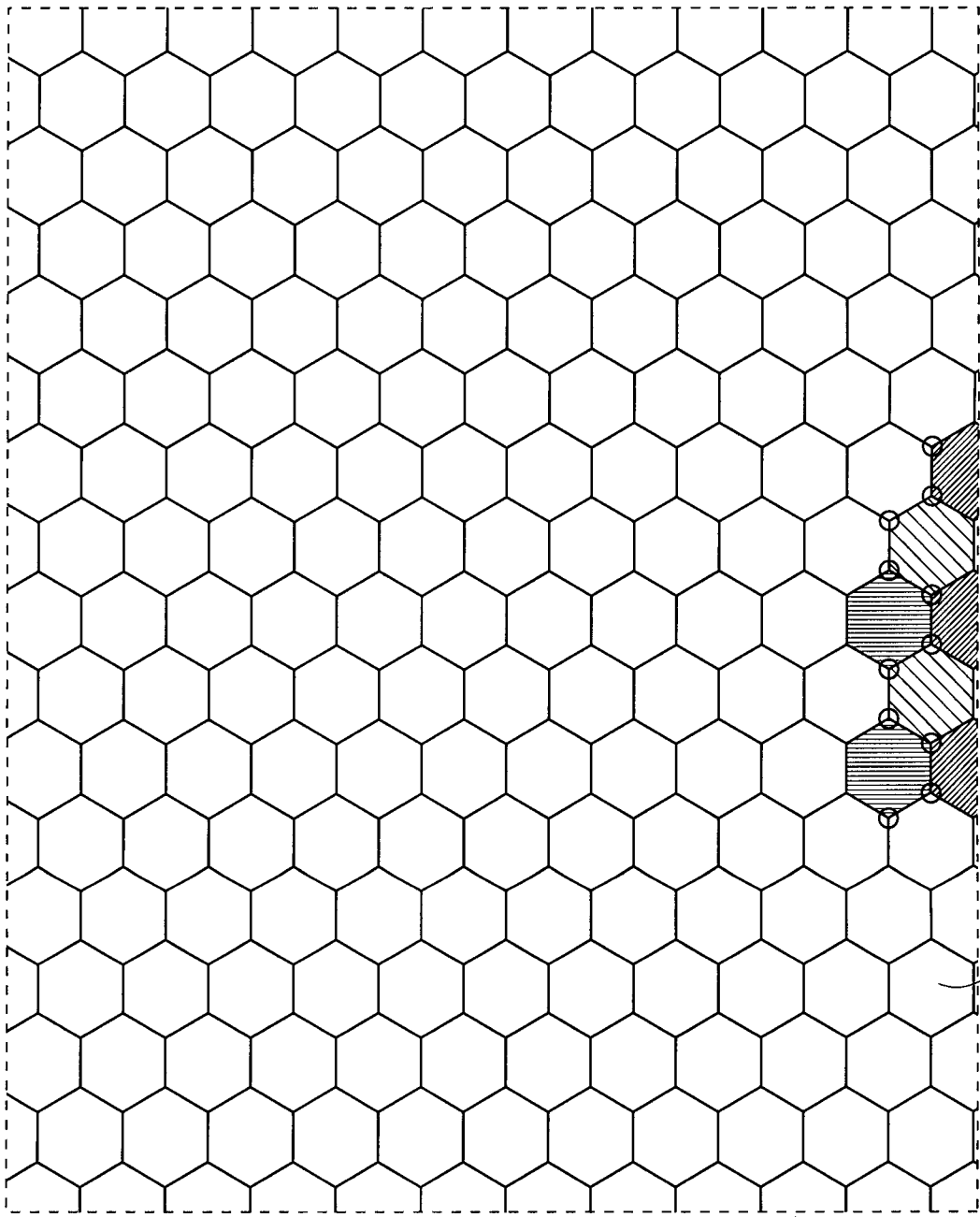

FIG. 107 is a schematic of mounting a mount assembly 6600 to a surface. In some embodiments, as depicted in FIG. 107, the first plates 6610 and joining components 6620 may be installed at the bottom of the surface, and then more plates 6610 and joining components 6620 may be used to build the mount assembly 6600 upwards.

Figure 108:
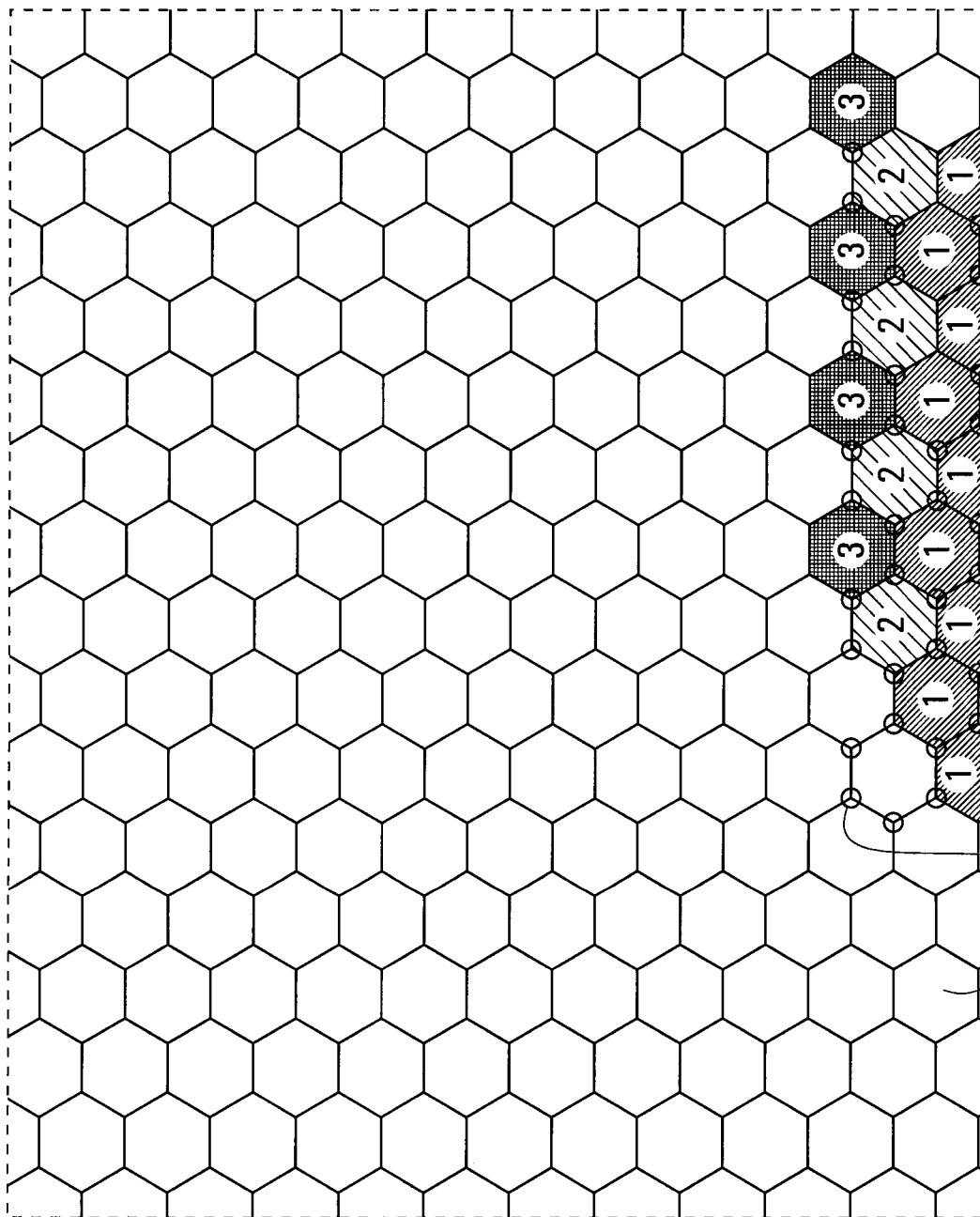

FIG. 108 is a schematic of mounting a mount assembly 6600 to a surface. As depicted in FIG. 108, there may be a sequence for installing the plates 6610. In some embodiments, the plates 6610 may be installed in rows. For example, as depicted in FIG. 108, plates 6610 labelled with "1" may be installed first. Then, plates 6610 labelled with "2" may be installed second. Then, plates 6610 labelled with "3" may be installed third, and so on. The joining components 6620 may be used to connect plates 6610 together or to connect the plates 6610 to the surface.

Figure 109:
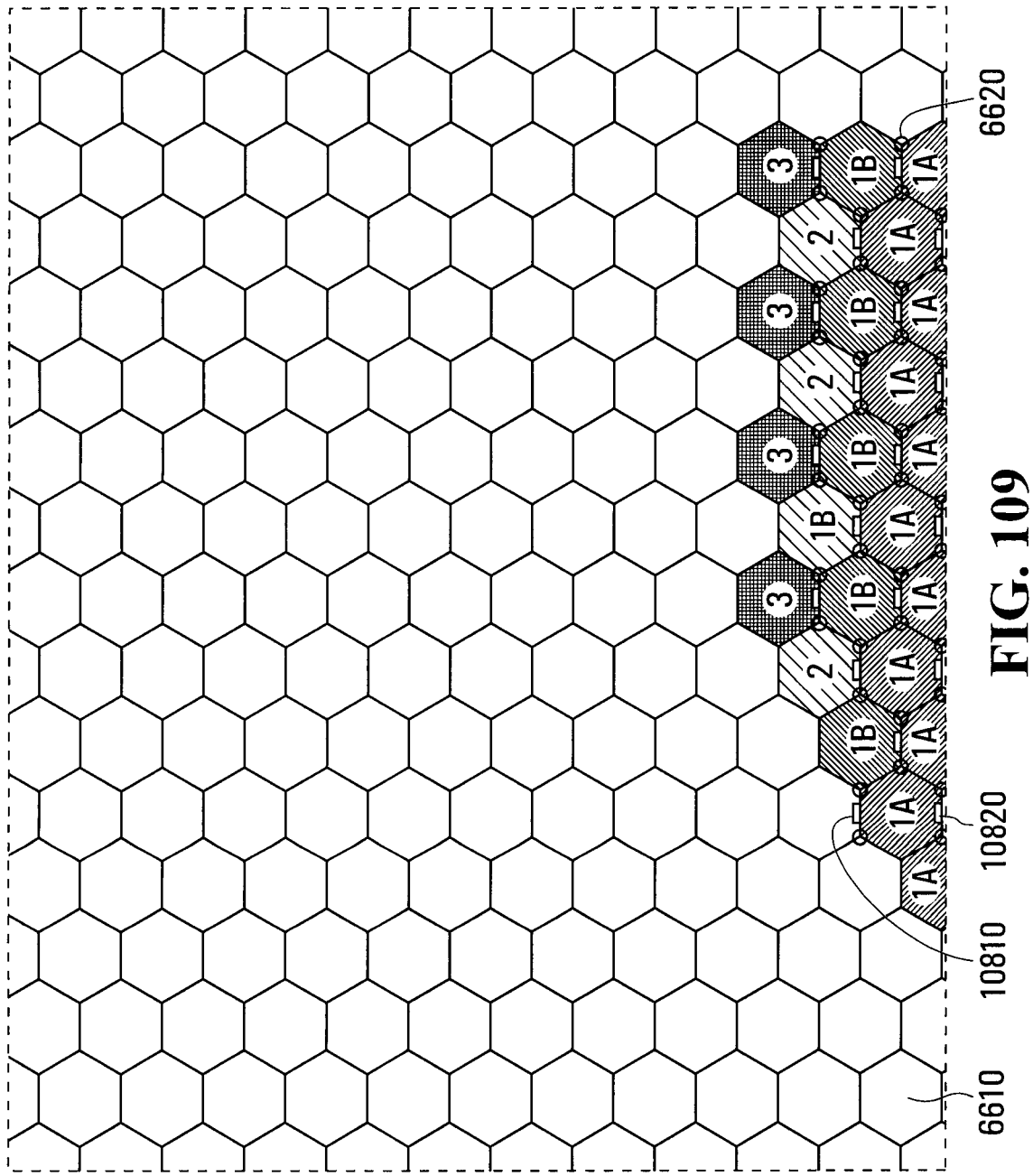

FIG. 109 is a schematic of mounting a mount assembly 6600 to a surface. As depicted in FIG. 109, there may be a sequence for installing the plates 6610. In some embodiments, the plates 6610 may be installed in rows. For example, as depicted in FIG. 108, plates 6610 labelled with "1A" may be installed first. Then, plates 6610 labelled with "1B" may be installed second. Then, plates 6610 labelled with "2" may be installed third. Then, plates 6610 labelled with "3" may be installed fourth, and so on. The joining components 6620 may be used to connect plates 6610 together or to connect the plates 6610 to the surface.

As depicted in FIG. 109, the plates 6610 may have tongues 10810 and grooves 10820 for aligning the plates 6610. The plates 6610 or joining components 6620 may be connected to the surface, for example, using screws or a double-sized adhesive.

The bottom most row of plates 6610 may be level of the edge of the surface on which the mount assembly 6600 may be installed.

Figure 110:
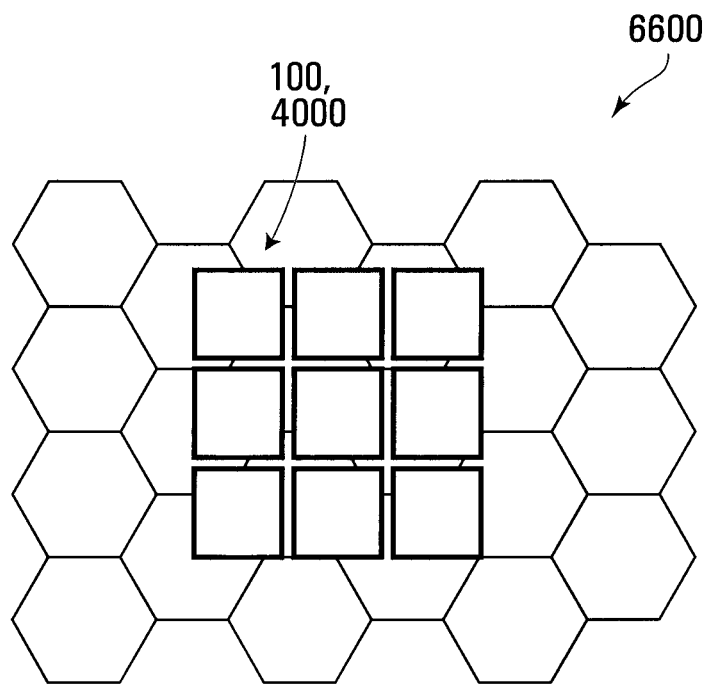
FIG. 110 is a schematic of mounting a tile system to a mount assembly.

FIG. 110 is a schematic of mounting a tile system to a mount assembly 6600. The tile system may be defined by tile assemblies 100 or 4000, as described herein.

In some embodiments, the mount assembly 6600 has hooks on the top surface of the mount assembly 6600. In some embodiments, the tile system has corresponding loops on the bottom surface. The tile system may be mounted to the mount assembly 6600 using the hooks and loops. In some embodiments, other mechanical connections may connect the tile system to the mount assembly 6600.

Figure 111:
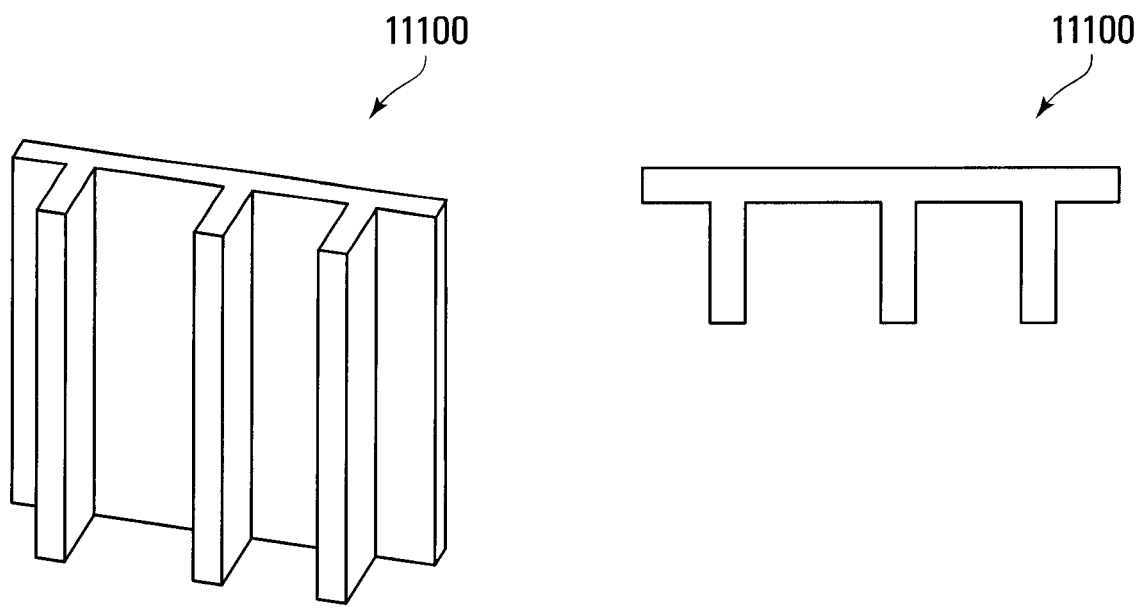
FIG. 111 is a schematic of a wall for mounting the mount assembly.

FIG. 111 is a schematic of a wall 11100 for mounting the mount assembly 6600.

The wall 11100 may have corners and projecting walls.

In some embodiments, the mount assembly 6600 may be connected to a wall, and tile assemblies may be connected to the mount assembly 6600 using hooks and loops. In some embodiments, the tile assembly may use 2.5 mm thick vinyl material. In some embodiments, the tile assembly or the tile system may be 1.22 m wide and 3.6 m high. The vinyl material may be pre-shaped on a thermal bending machine before being installed.

The tile assemblies, tile systems, and mount assembly described herein may be used in harsh environments. For example, the temperature may be between −25° C. to 60° C.

In some embodiments, the mount assembly may be secured to the surface using screws.

Where hooks and loops may be used to connect the mount assembly to the tile systems, a portion of the bottom surface of the tile system may have hooks or loops, or a portion of the top surface of the mount assembly may have the other of hooks or loops.

In some embodiments, the plates 6610 or joining components 6620 may be made with recycled PET. The thickness of the plates 6610 or joining components 6620 may be a minimum thickness that may allow the plates 6610 or joining components 6620 to function.

By using recycled PET, expansion features may be removed as it is more stable regarding temperature.

Figure 112:
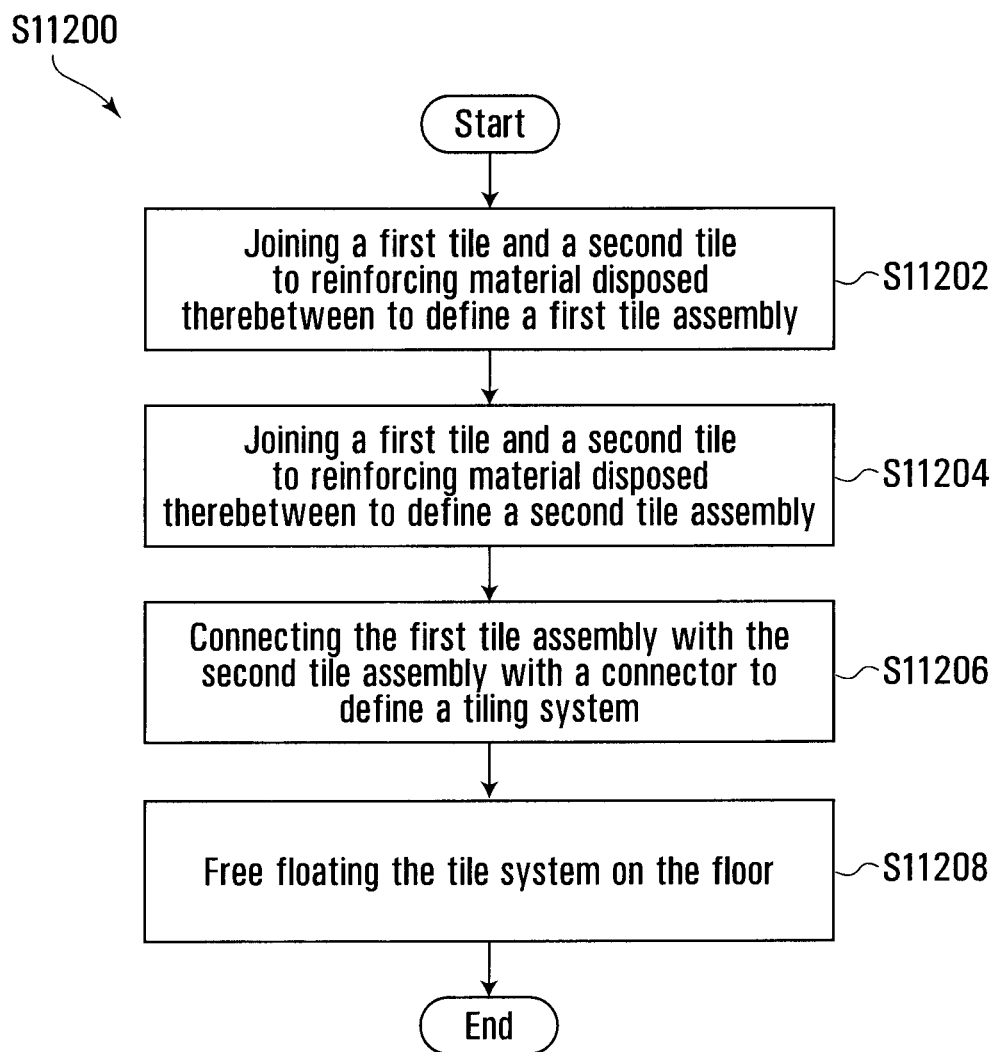
FIG. 112 is a flow chart depicting a method for assembling and using a tile system to cover a surface.

FIG. 112 is a flow chart S11200 depicting a method for assembling and using a tile system to cover a floor. The tile system may comprise two tiles stacked together with a reinforcing material therebetween.

In S11202, joining a first tile and second tile to reinforcing material disposed therebetween. The first tile may be stacked on the second tile. This may define a first tile assembly.

In S11204, similar to S11202, joining a first tile and a second tile to reinforcing material disposed therebetween. The first tile may be stacked on the second tile. This may define a second tile assembly.

In S11206, connecting the first tile assembly with the second tile assembly with a connector to define a tiling system. The connector may have a first component and a second component that is complementary to the first component, wherein the first tile assembly has the first component and the second tile assembly has the second component.

In S11208, free floating the tile system on the floor. When the tile system is laid on the floor, the tile system may free float on the floor. In some embodiments, the tile system may level itself based on the texture or contours of the floor or surface on which the tile system is laid on. In some embodiments, the tile system may be installed on top of an existing floor or substrate. In some embodiments, sand may be used to partially level the existing floor or substrate when uneven. In some embodiments, the tile system may be installed on top of an existing floor or substrate which is not level, without the use of any levelling material between the existing floor/substrate and the tile system. That is, the tile system is installed in a "free floating" manner, unattached to the existing floor or substrate below. Such a configuration may be relatively easy to remove when compared to tiling systems which require that the tiles be secured or fastened to the floor or substrate in some manner.

Figure 113:
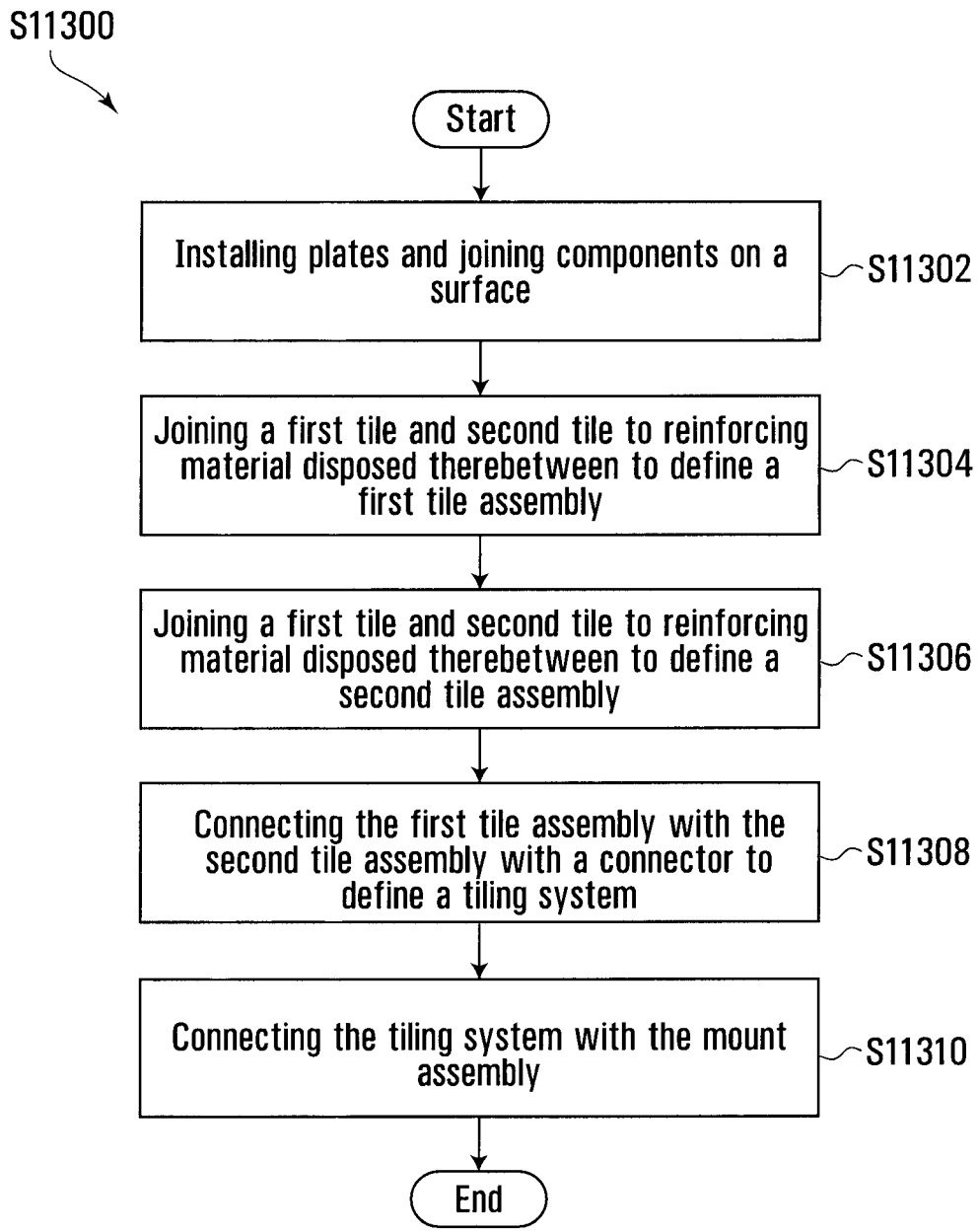
FIG. 113 is a flow chart depicting a method for mounting a tile system to a surface using a mount assembly.

FIG. 113 is a flow chart S11300 depicting a method for mounting a tile system to a surface using a mount assembly.

In S11302, installing plates and joining components on a surface. The joining components may join a plurality of plates together. The plates and joining components may be connected to the surface using fasteners, such as screws, nails, plugs, adhesive, and the like. In some embodiments, a bottom row of plates and joining components may be installed first. Then, more plates and joining components may be used to install more of the mount assembly upwards.

In S11304, joining a first tile and second tile to reinforcing material disposed therebetween. The first tile may be stacked on the second tile. This may define a first tile assembly.

In S11306, similar to S11304, joining a first tile and a second tile to reinforcing material disposed therebetween.

The first tile may be stacked on the second tile. This may define a second tile assembly.

In S11308, connecting the first tile assembly with the second tile assembly with a connector to define a tiling system. The connector may have a first component and a second component that is complementary to the first component, wherein the first tile assembly has the first component and the second tile assembly has the second component.

In S11310, connecting the tiling system with the mount assembly. The tiling system and the mount assembly may be connected together using hooks and loops. For example, a surface of the tiling system has hooks or loops, and a surface of the mount assembly has the other of hooks or loops. The surfaces of the tiling system and mount assembly having the hooks and loops may be joined together such that the hooks and loops engage, and the tiling system connects with the mount assembly.

Figure 114:
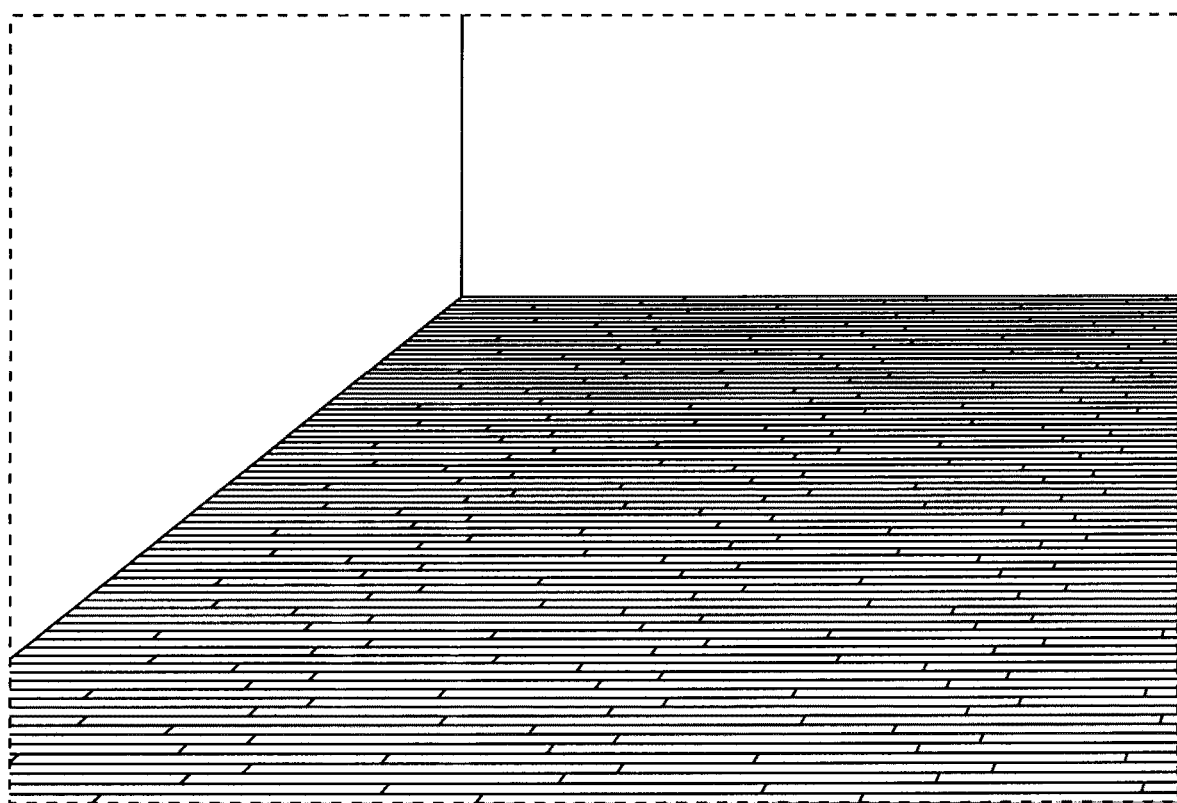
FIG. 114 is a schematic of telegraphing on a floor when using roll-out vinyl.

FIG. 114 is a schematic of telegraphing on a floor when using roll-out vinyl. In some embodiments, telegraphing may happen on roll-out vinyl. As depicted in FIG. 114, the seams of hook plates may be seen. In some embodiments, the joining component may be seen. The vinyl may be standing up on the seams defined between the plates. This may be caused because the hookless area on the edges of the hook plates plus the expansion gaps, which may create a relatively large area where there are no hooks.

Figure 115:
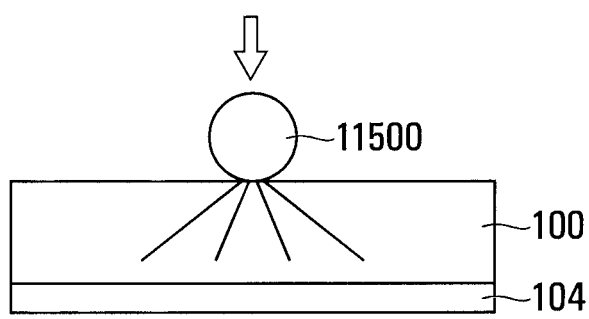
FIG. 115 is a schematic of a round object on a tile assembly.
Figure 116:
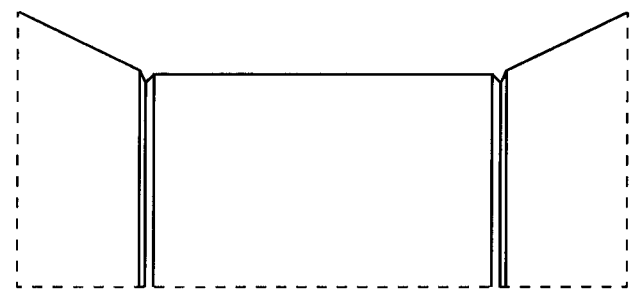
FIG. 116 is a schematic of a corner of a tile.
Figure 116:
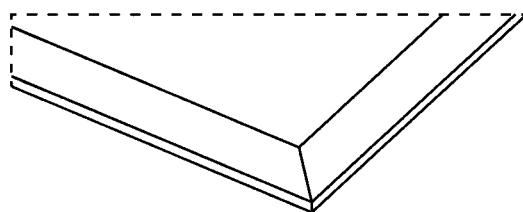

FIG. 115 is a schematic of a round object 11500 on a tile assembly 100. The force applied to the tile assembly, and the stress experienced by the tile assembly, may be distributed over the tile assembly, which may improve the strength of the tile assembly. FIG. 116 is a schematic of a corner of a tile.

Figure 117:
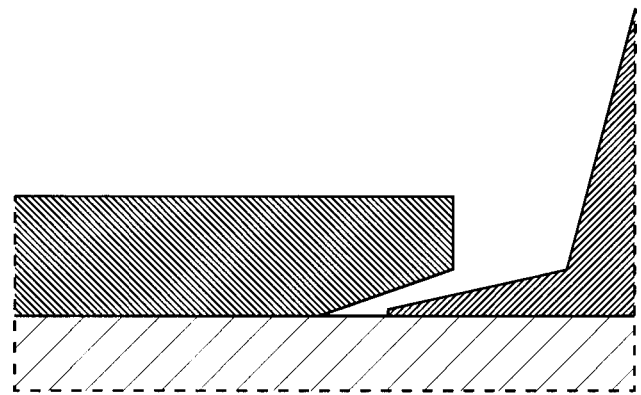
FIG. 117 is a schematic of a tile assembly.
Figure 117:
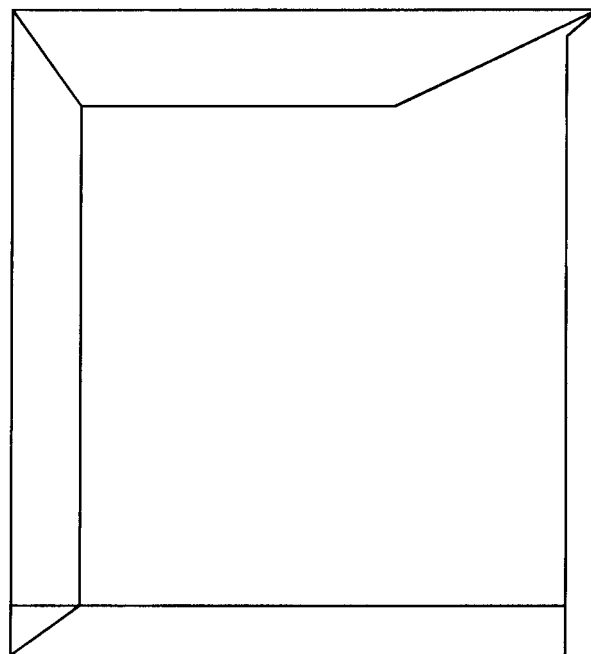

FIG. 117 is a schematic of a tile assembly.

In some embodiments, tiles with a flat back and tiles for the support back may be used, and laminated with a suitable fibre fabric material therebetween.

In some embodiments, there may be air pockets between the two tiles of a tile assembly having two tiles stacked above each other. The tile assembly may have a feature to reduce the amount of air pockets or mitigate formation of the air pockets between the two tiles.

In some embodiments, the material used to bond the tiles together of a two-tile tile assembly may be particular to the types of tile used. For example, if Laminam® tiles are used, then bond used for bonding Laminam® tiles should be used. This allows appropriate transfer of stress through the tiles and through the reinforcing layer (e.g. fibre glass layer).

In some embodiments, one or more steps of the manufacturing process for the tile assembly may be automated, for example, using a robot. For example, the pallet for the rolls and tiles, glue, and jig, may be automated using a robot.

In some embodiments, the tile assemblies and mount assemblies described herein may be tested using a Robinson test. A machine may apply a load repeatedly using a wheel, which may represent years of traffic. During the testing, the tile assemblies and mount assemblies may be evaluated for cracking, attachment feature deterioration or grout deterioration, and degree of waterproofing.

In some embodiments, a machine for manufacturing the tile assembly may comprise microles.

In some embodiments, the grout may be conventional grout. When repairing the attachment feature or grout, a chisel or chop may be used in the affected area and the grout may be removed. In some embodiments, the tile assemblies may still be connected together when the grout is applied.

In some embodiments, a tile made with marble may be laminated to a tile made with ceramic.

The tile assembly and mount assembly described herein may not require extensive technical skills or experience to install. The parts may be easy to assemble together and easy to install on the surface. The tile assembly and mount assembly may be installed on a surface without use of a subsurface or support surface, such as mesh, beds, mortar, or grout.

As the tile assembly and mount assembly may be installed on a surface without use of a subsurface or support surface, such as mesh, beds, mortar, or grout, inconveniences associated with using these subsurfaces or support surfaces may be avoid. For example, no mortar needs to be kept flat prior to installing a tile assembly or mount assembly on a surface.

As no mortar needs to be set or no grout finishing needs to be applied, time may be saved when installing the tile assembly or mount assembly to a surface.

In some embodiments, the reinforcing material between the two tiles of a tile assembly may be changed based on the application of the tile assembly. As discussed herein, the reinforcing material may be fibre glass. In some embodiments, the reinforcing material may be Kevlar®. Accordingly, the tile assembly may have a military application.

In some embodiments, the tile assembly may be used on nautical crafts, such as boats or cruise ships, as a free floating and self-levelling flooring.

The tile system, comprising tile assemblies connected together, may level itself when installed on a floor. This may improve or promote walking on the tile system.

In some embodiments, the tile assemblies may have sound proofing or noise reduction capabilities.

In some embodiments, if grout is installed on the tile system having the tile assemblies, the tile system may prevent or reduce the frequency of the popping of the grout.

In some embodiments, the tile assembly and mount assembly may reduce re-modelling costs. For example, if a floor laid with conventional tile is damaged, then the entire floor may have to be replaced. If the floor was laid with the tile assemblies described herein, then only the damaged tile assemblies may be replaced.

In some embodiments, holes may be cut in the tile assembly or mount assembly.

In some embodiments, marble or another top surface may be on the laminate.

There may be a reduction in labour cost and reduction in skill cost as it may be relatively easy to use, assemble, or install the tile assembly and the mount assembly.

In some embodiments, the systems and methods described herein may allow for the pre-packaging of total floor areas and walls. For example, with conventional equipment (e.g. an application on a mobile computing device that might contain optical measurement devices), precise dimensions of a wall, room or area thereof may be obtained quickly and without difficulty. Alternatively, precise measurements may be provided by the customer or collected. Pictures may also be used to calculate room dimensions. Using these dimensions, tiles may be pre-assembled and pre-cut by the manufacturer. These pre-assembled and pre-cut tiles can be packaged for delivery and delivered for on-site installation. Rather than requiring the services of a skilled professional (who would have to make decisions and cut tiles on-site), the systems, methods and products disclosed herein may allow for relatively simple installation of the pre-assembled tiles in free floating fashion. As such, significant savings in labour may be obtained relative to conventional tiling systems, which would require expert labour.

The tile assembly or mount assembly may present environmental benefits. During installation, no attachment cement or grout finishing may be necessary, which may reduce mess during installation of the tile assembly. As individual tile assemblies may be removed, little mess may be created when uninstalling the tile assembly. The tile assemblies may also be uninstalled easily and reused. In some embodiments, using the tile assembly does not generate much dust or require additional adhesives or materials to join the tile assembly together. When using the tile assembly, pre-working of the subsurface (e.g. applying mortar on floor, sanding down a wall, redoing a drywall, etc.) may not be required.

The preceding discussion provides many example embodiments. Although each embodiment represents a single combination of inventive elements, other examples may include all suitable combinations of the disclosed elements. Thus if one embodiment comprises elements A, B, and C, and a second embodiment comprises elements B and D, other remaining combinations of A, B, C, or D, may also be used.

The term "connected" or "coupled to" may include both direct coupling (in which two elements that are coupled to each other contact each other) and indirect coupling (in which at least one additional element is located between the two elements).

Although the embodiments have been described in detail, it should be understood that various changes, substitutions and alterations can be made herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

As can be understood, the examples described above and illustrated are intended to be examples only. The invention is defined by the appended claims.

What is claimed is:

1. A tile connector system for connecting a first tile having a plurality of sides to at least a second tile having a plurality of sides, the tile connector system comprising:
    one or more magnetic elements on one or more sides of the first tile and one or more magnetic elements on one or more sides of the second tile, the one or more magnetic elements on a first side of the first tile being configured to engage magnetically with the one or more magnetic elements on a corresponding second side of the second tile, which second side of the second tile is configured in shape to be complementary in shape to the first side of the first tile;
    an artificial grout on one or more of the sides of the first tile and an artificial grout on one or more sides of the second tile, the artificial grout on the first side of the first tile and the artificial grout on the second side of the second tile configured so as to allow magnetic engagement between the one or more magnetic elements on the first side of the first tile and the one or more magnetic elements on the second side of the second tile;
    wherein, when the one or more magnetic elements on the first side of the first tile and the one or more magnetic elements on the second side of the second tile magnetically engage with each other, the first side of the first tile and the second side of the second tile are connected to, and aligned with, each other.

2. The tile connector system of claim 1, wherein the artificial grout on a side of the first tile is configured to engage with the artificial grout on a complementary side of the second tile to assist in the magnetic engagement and alignment of the first tile with the second tile.

3. The tile connector system of claim 1, wherein the artificial grout is made from a malleable material.

4. The tile connector system of claim 1, wherein the connection between the first tile and the second tile is waterproof.

5. The tile connector system of claim 1, wherein the artificial grout is configured on the first side of the first tile and the second side of the second tile such that when the one or more magnetic elements on the first side of the first tile are in magnetic engagement with the one or more magnetic elements on the second side of the second tile, the artificial grout on the first side of the first tile and the artificial grout on the second side of the second tile are frictionally engaged with and in physical contact with each other, but the one or more magnetic elements on the first side of the first tile are not in physical contact with the one or more magnetic elements on the second side of the second tile.

6. The tile connector system of claim 1 further comprising one or more structural attachment or alignment components on the first side of the first tile and one or more complementary structural attachment or alignment components on the second side of the second tile, wherein the one or more structural or alignment components on the first side of the first tile are configured to engage with the corresponding one or more structural or alignment components on the second side of the second tile.

7. A tile connector system for connecting a first tile having a plurality of sides to at least a second tile having a plurality of sides, the tile connector system comprising:
    an artificial grout on one or more of the sides of the first tile and an artificial grout on one or more sides of the second tile,
    one or more magnetic elements attached to the artificial grout on one or more sides of the first tile and one or more magnetic elements attached to the artificial grout on one or more sides of the second tile, the one or more magnetic elements on the artificial grout of the first side of the first tile being configured to engage magnetically with the one or more magnetic elements on the artificial grout on the corresponding second side of the second tile, which second side of the second tile is configured in shape to be complementary in shape to the first side of the first tile;
    wherein, when the one or more magnetic elements on the first side of the first tile and the one or more magnetic elements on the second side of the second tile magnetically engage with each other, the first side of the first tile and the second side of the second tile are connected to, and aligned with, each other.

8. The tile connector system of claim 7, wherein the artificial grout on a side of the first tile is configured to engage with the artificial grout on a complementary side of the second tile to assist in the magnetic engagement and alignment of the first tile with the second tile.

9. The tile connector system of claim 7, wherein the artificial grout is made from a malleable material.

10. The tile connector system of claim 7, wherein the connection between the first tile and the second tile is waterproof.

11. The tile connector system of claim 7, wherein the artificial grout is configured on the first side of the first tile and the second side of the second tile such that when the one or more magnetic elements on the first side of the first tile are in magnetic engagement with the one or more magnetic elements on the second side of the second tile, the artificial grout on the first side of the first tile and the artificial grout on the second side of the second tile are frictionally engaged with and in physical contact with each other, but the one or more magnetic elements on the first side of the first tile are not in physical contact with the one or more magnetic elements on the second side of the second tile.

12. The tile connector system of claim 7, further comprising one or more structural attachment or alignment components on the first side of the first tile and one or more complementary structural attachment or alignment components on the second side of the second tile, wherein the one or more structural or alignment components on the first side of the first tile are configured to engage with the one or more corresponding structural or alignment components on the second side of the second tile.

* * * * *